＊

US006456608B1

(12) United States Patent
Lomp

(10) Patent No.: US 6,456,608 B1
(45) Date of Patent: Sep. 24, 2002

(54) ADAPTIVE VECTOR CORRELATOR USING WEIGHTING SIGNALS FOR SPREAD-SPECTRUM COMMUNICATIONS

(75) Inventor: Gary R. Lomp, Centerport, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 0 days.

(21) Appl. No.: 09/765,048

(22) Filed: Jan. 18, 2001

Related U.S. Application Data

(63) Continuation-in-part of application No. 08/956,740, filed on Oct. 23, 1997, now Pat. No. 6,215,778, which is a continuation of application No. 08/669,775, filed on Jun. 27, 1996, now Pat. No. 5,799,010, application No. 09/765,048, which is a continuation-in-part of application No. 09/003,104, filed on Jan. 6, 1998, now Pat. No. 6,181,949, which is a continuation of application No. 08/670,162, filed on Jun. 27, 1996, now Pat. No. 5,841,768, application No. 09/765,048, which is a continuation-in-part of application No. 09/304,286, filed on May 3, 1999, now Pat. No. 6,252,866, which is a continuation of application No. 08/671,068, filed on Jun. 27, 1996, now Pat. No. 5,940,382, application No. 09/765,048, which is a continuation-in-part of application No. 09/354,042, filed on Jul. 15, 1999, which is a continuation of application No. 08/671,067, filed on Jun. 27, 1996, now Pat. No. 5,953,346, application No. 09/765,048, which is a continuation-in-part of application No. 09/129,850, filed on Aug. 6, 1998, now abandoned, which is a continuation of application No. 08/670,160, filed on Jun. 27, 1996, application No. 09/765,048, which is a continuation of application No. 09/079,600, filed on May 15, 1998, which is a continuation of application No. 08/671,221, filed on Jun. 27, 1996, now Pat. No. 5,754,803.

(60) Provisional application No. 60/000,775, filed on Jun. 30, 1995.

(51) Int. Cl.[7] ............................................... H04B 7/216
(52) U.S. Cl. ..................... 370/335; 370/342; 375/150
(58) Field of Search .................... 370/335, 465, 370/310, 318, 320, 328, 329, 342, 468, 208, 209; 375/150, 152, 140, 142, 143

(56) References Cited

U.S. PATENT DOCUMENTS 3,761,610 A 9/1973 Krallinger et al.

(List continued on next page.)

FOREIGN PATENT DOCUMENTS

DE 3743731 A 7/1989

(List continued on next page.)

OTHER PUBLICATIONS

Patent Abstracts of Japan, vol. 015, No. 003 (E–1019), Jan. 7, 1991 & JP 02 256331 A (Sharp Corp.), Oct. 17, 1990, see abstract.

(List continued on next page.)

*Primary Examiner*—Salvatore Cangialosi
*Assistant Examiner*—Ken Vanderpuye
(74) *Attorney, Agent, or Firm*—Volpe and Koenig, P.C.

(57) ABSTRACT

A pilot adaptive vector correlator for estimating channel-impulse response and for obtaining a reference value of received multipath signals in a spread-spectrum system. A code generator generates a plurality of replicas of a pilot-spreading-code signal, with each replica of the pilot-spreading-code signal having a different phase from other replicas in a plurality of replicas of pilot-spreading-code signals. Each correlator in a plurality of correlators uses a replica of the pilot-spreading-code signal with a different phase from the other correlators in the plurality of correlators. The plurality of correlators correlates the spread-spectrum signal with the plurality of replicas of the pilot-spreading-code signals. The plurality of correlators generates a noise-power level when a pilot-spreading-code signal is not in phase with a replica of the pilot-spreading-code signal, and a pilot signal-power level plus noise-power level when a pilot-spreading-code signal is in phase with a replica of the pilot-spreading-code signal. Using the detected-pilot signal and output signals from the plurality of correlators, a derotation-phaser circuit generates a derotation-phaser signal. Using the derotation-phaser signal, a correction circuit corrects the despread, multipath signals for effects of carrier-phase rotation.

18 Claims, 89 Drawing Sheets

U.S. PATENT DOCUMENTS

| | | |
|---|---|---|
| 4,069,392 A | 1/1978 | Goldenberg et al. |
| 4,156,277 A | 5/1979 | Seitz et al. |
| 4,292,623 A | 9/1981 | Eswaran et al. |
| 4,384,307 A | 5/1983 | Kuzmik et al. |
| 4,385,206 A | 5/1983 | Bradshaw et al. |
| 4,425,665 A | 1/1984 | Stauffer |
| 4,458,314 A | 7/1984 | Grimes |
| 4,480,307 A | 10/1984 | Budde et al. |
| 4,570,220 A | 2/1986 | Tetrick et al. |
| 4,583,124 A | 4/1986 | Tsuji et al. |
| 4,608,700 A | 8/1986 | Kirtley, Jr. et al. |
| 4,630,126 A | 12/1986 | Kaku et al. |
| 4,646,232 A | 2/1987 | Chang et al. |
| 4,667,192 A | 5/1987 | Schmid et al. |
| 4,675,865 A | 6/1987 | DeVries et al. |
| 4,709,343 A | 11/1987 | Van Cang |
| 4,744,079 A | 5/1988 | Csapo et al. |
| 4,768,145 A | 8/1988 | Wheelwright et al. |
| 4,811,262 A | 3/1989 | White |
| 4,811,421 A | 3/1989 | Havel et al. |
| 4,862,402 A | 8/1989 | Shah et al. |
| 4,901,307 A | 2/1990 | Gilhousen et al. |
| 4,914,574 A | 4/1990 | Terada et al. |
| 5,022,049 A | 6/1991 | Abrahamson et al. |
| 5,050,004 A | 9/1991 | Morton, Jr. |
| 5,056,109 A | 10/1991 | Gilhousen et al. |
| 5,084,900 A | 1/1992 | Taylor |
| 5,093,840 A | 3/1992 | Schilling |
| 5,103,459 A | 4/1992 | Gilhousen et al. |
| 5,105,423 A | 4/1992 | Tanaka et al. |
| 5,109,390 A | 4/1992 | Gilhousen et al. |
| 5,113,525 A | 5/1992 | Andoh |
| 5,115,429 A | 5/1992 | Hluckyj et al. |
| 5,117,385 A | 5/1992 | Gee |
| 5,140,613 A | 8/1992 | Birgenheier et al. |
| 5,159,283 A | 10/1992 | Jensen |
| 5,159,551 A | 10/1992 | Brunnett et al. |
| 5,166,951 A | 11/1992 | Schilling |
| 5,193,094 A | 3/1993 | VIterbi |
| 5,199,061 A | 3/1993 | Kim |
| 5,204,876 A | 4/1993 | Bruckert et al. |
| 5,224,120 A | 6/1993 | Schilling |
| 5,228,054 A | 7/1993 | Rueth et al. |
| 5,228,056 A | 7/1993 | Schilling |
| 5,235,614 A | 8/1993 | Bruckert et al. |
| 5,237,586 A | 8/1993 | Bottomley |
| 5,241,690 A | 8/1993 | Larsson et al. |
| 5,245,629 A | 9/1993 | Hall |
| 5,253,268 A | 10/1993 | Omura et al. |
| 5,253,347 A | 10/1993 | Bagnoli et al. |
| 5,257,283 A | 10/1993 | Gilhousen et al. |
| 5,258,940 A | 11/1993 | Coker et al. |
| 5,260,967 A | 11/1993 | Schilling |
| 5,262,974 A | 11/1993 | Hausman et al. |
| 5,265,119 A | 11/1993 | Gilhousen et al. |
| 5,267,262 A | 11/1993 | Wheatley, III |
| 5,274,474 A | 12/1993 | Medina |
| 5,276,684 A | 1/1994 | Pearson |
| 5,283,536 A | 2/1994 | Wheatley, III |
| 5,287,299 A | 2/1994 | Lin |
| 5,287,463 A | 2/1994 | Frame et al. |
| 5,295,152 A | 3/1994 | Gudmundson et al. |
| 5,297,162 A | 3/1994 | Lee et al. |
| 5,299,228 A | 3/1994 | Hall |
| 5,305,349 A | 4/1994 | Dent |
| 5,309,474 A | 5/1994 | Gilhousen et al. |
| 5,311,459 A | 5/1994 | D'Luna et al. |
| 5,327,455 A | 7/1994 | DeGaudenzi et al. |
| 5,327,467 A | 7/1994 | DeGaudenzi et al. |
| 5,339,174 A | 8/1994 | Harris |
| 5,341,396 A | 8/1994 | Higgins et al. |
| 5,343,335 A | 8/1994 | Hara |
| 5,345,598 A | 9/1994 | Dent |
| 5,347,536 A | 9/1994 | Meehan |
| 5,349,606 A | 9/1994 | Lovell et al. |
| 5,351,134 A | 9/1994 | Yaguchi et al. |
| 5,353,302 A | 10/1994 | Bi |
| 5,353,352 A | 10/1994 | Dent et al. |
| 5,355,453 A | 10/1994 | Row et al. |
| 5,363,377 A | 11/1994 | Sharpe |
| 5,367,533 A | 11/1994 | Schilling |
| 5,373,502 A | 12/1994 | Turban |
| 5,377,183 A | 12/1994 | Dent |
| 5,379,242 A | 1/1995 | Rose et al. |
| 5,392,287 A | 2/1995 | Tiedemann, Jr. et al. |
| 5,396,516 A | 3/1995 | Padovani et al. |
| 5,398,243 A | 3/1995 | Aguilhon et al. |
| 5,404,376 A | 4/1995 | Dent |
| 5,406,559 A | 4/1995 | Edem et al. |
| 5,414,728 A | 5/1995 | Zehavi |
| 5,414,729 A | 5/1995 | Fenton |
| 5,414,732 A | 5/1995 | Kaufmann |
| 5,416,797 A | 5/1995 | Gilhousen et al. |
| 5,418,624 A | 5/1995 | Ahmed |
| 5,420,896 A | 5/1995 | Schilling |
| 5,430,724 A | 7/1995 | Fall et al. |
| 5,430,760 A | 7/1995 | Dent |
| 5,440,597 A | 8/1995 | Chung et al. |
| 5,442,662 A | 8/1995 | Fukasawa et al. |
| 5,446,683 A | 8/1995 | Mullen et al. |
| 5,446,756 A | 8/1995 | Mallinckrodt |
| 5,459,759 A | 10/1995 | Schilling |
| 5,483,549 A | 1/1996 | Weinberg et al. |
| 5,487,089 A | 1/1996 | Misaizu et al. |
| 5,488,629 A | 1/1996 | Takahashi et al. |
| 5,509,126 A | 4/1996 | Oprescu et al. |
| 5,519,736 A | 5/1996 | Ishida |
| 5,528,593 A | 6/1996 | English et al. |
| 5,544,156 A | 8/1996 | Teder et al. |
| 5,548,613 A | 8/1996 | Kaku et al. |
| 5,550,811 A | 8/1996 | Kaku et al. |
| 5,559,790 A | 9/1996 | Yano et al. |
| 5,561,669 A | 10/1996 | Lenny et al. |
| 5,563,912 A | 10/1996 | Yasunaga |
| 5,594,718 A | 1/1997 | Weaver, Jr. et al. |
| 5,596,570 A | 1/1997 | Soliman |
| 5,619,524 A | 4/1997 | Ling et al. |
| 5,657,343 A | 8/1997 | Schilling |
| 5,673,286 A | 9/1997 | Lomp |
| 5,712,869 A | 1/1998 | Lee et al. |
| 5,745,484 A | 4/1998 | Scott |
| 5,841,768 A | 11/1998 | Ozluturk et al. |
| 5,898,665 A * | 4/1999 | Sawahashi et al. ......... 370/342 |
| 5,940,382 A | 8/1999 | Haim |
| 5,953,346 A | 9/1999 | Luddy |
| 5,991,332 A * | 11/1999 | Lomp et al. ................ 375/206 |
| 6,018,528 A | 1/2000 | Gitlin et al. |
| 6,072,787 A | 6/2000 | Hamalainen et al. |
| 6,088,335 A | 7/2000 | I et al. |
| 6,122,292 A | 9/2000 | Watanabe et al. |
| 6,229,043 B1 * | 5/2001 | Lomp et al. ................ 375/150 |

FOREIGN PATENT DOCUMENTS

| | | | |
|---|---|---|---|
| DE | 3743732 | A | 7/1989 |
| EP | 0022170 | A2 | 1/1981 |
| EP | 0372350 | | 6/1990 |
| EP | 0372359 | A2 | 6/1990 |

| | | |
|---|---|---|
| EP | 0464839 | 1/1992 |
| EP | 0476215 | 3/1992 |
| EP | 0525860 A2 | 2/1993 |
| EP | 0526106 | 2/1993 |
| EP | 0565507 | 10/1993 |
| EP | 0654913 | 5/1995 |
| EP | 0656716 | 6/1995 |
| EP | 0668662 | 8/1995 |
| EP | 0744876 | 11/1996 |
| GB | 2301746 | 12/1996 |
| JP | 62-256516 | 11/1987 |
| JP | 2-256331 | 10/1990 |
| JP | H2-287874 | 11/1990 |
| JP | H4222111 | 8/1992 |
| JP | H4-287593 | 10/1992 |
| JP | H5144128 | 6/1993 |
| JP | H6104694 | 4/1994 |
| JP | H7273600 | 10/1995 |
| WO | 9200639 | 1/1992 |
| WO | 9307702 | 4/1993 |
| WO | 9503652 | 2/1995 |
| WO | 9507578 | 3/1995 |
| WO | 9702665 | 1/1997 |

OTHER PUBLICATIONS

Raymond W. Nettleton, "Spectral Efficiency in Cellular Land–Mobile Communications: A Spread–Spectrum Approach," UMI Dissertation Information Service, (1978), 204 pp.

Hossein Al Avi, "Power Control and Interference Management in a Spread–Spectrum Cellular Mobile Radio System," UMI Dissertation Information Services, (1984), 129pp.

"Code Division Multiple Access (CDMA)", Franz Josef Hagmanns, Volker Hespelt, 8273 ANT Nachrichtentechnische Berichte (1993) Aug., No. 10, Backnang, DE, pp. 64–71.

"CDMA and ATM–zwei Technologien, ein Ziel", 2323 Telcom Report (Siemens) 18 (1995) Maerz/Apr., No. 2, Munchen, DE, pp. 60–63.

Zhao Liu et al., "SIR–Based Call Admission Control for DS–CDMA Cellular Systems", IEEE Journal on Selected Areas in Communications, US, IEEE Inc. New York, vol. 12, No. 4, May 1, 1994, pp. 638–644.

* cited by examiner

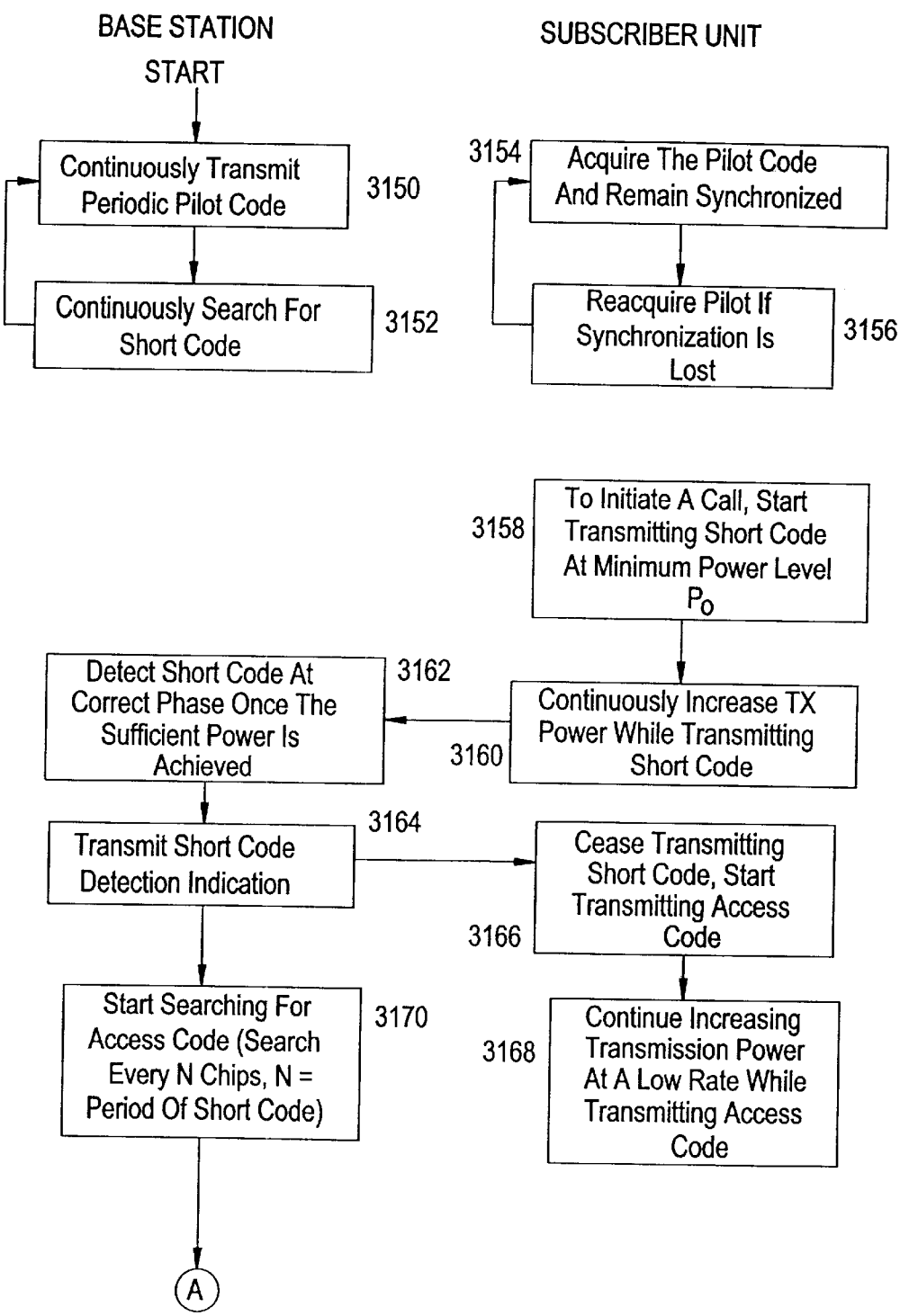

FIG. 55
PRIOR ART

| BUS | RAW bandwidth (Mbyte/s) | Data width | Address width | Block xfer? | MUXed data/adr? | Multimaster? | Sync/Async | IRQ Lines a | Drivers | Connector b | Comments |
|---|---|---|---|---|---|---|---|---|---|---|---|
| STD bus | 1.2 | 8 | 16 | — | — | — | S | 1 | TTL | CE | controller-type applications |
| PC/XT | 5.3 | 8 | 20 | — | — | — | S | 5E | TTL | CE | original IBM PC & compatibles |
| PC/AT | 33 | 8,16 | 20,24 | — | — | (c) | S | 10E | TTL | CE | accepts PC/XT cards |
| EISA | 33 | 8,16,32 | 20,24,32 | • | — | • | S | 11P | TTL | CE | enhanced PC/AT; auto-configure |
| MicroChannel | 20 | 8,16,(32) | 24,(32) | • | — | • | A | 11 | TTL | CE | IBM PS/2; auto-configure |
| Q - bus | 2 | 16 | 22 | • | • | • | A | 4 | (d) | CE | LSI-11, μVAX-I, II; daisy-chained IACK |
| Multibus I | 10 | 8,16 | 20,24 | — | — | • | A | 8 | TTL | CE | Intel; SUN-I and others |
| CAMAC | 3 | 24 | 9 | — | — | — | S | L | TTL/OC | CE | data acqusition & control bus |
| VAX BI | 13.3 | 8,16,24,32 | 32 | • | • | • | S | 4 | TTL | CE | VAX 780, 8600 series; parity |
| Multibus II | 40 | 8,16,24,32 | 16,32 | • | • | • | S | M | TTL | ZIF | parity; 40MB/s for blk xfer, 20M otherwise |
| NuBus | 40 | 32 | 32 | • | • | • | S | M | TTL | DIN | Macintosh II adds 1 dedicated INT per slot; "" |
| VME | 40 | 8,16,32 | 16,24,32 | • | — | • | A | 7 | TTL | DIN | daisy-chained IACK; SUN-3 |
| Futurebus | 120 | | | • | • | • | A | — | (d) | DIN | |
| Fastbus | 160 | 32 | 32 | • | • | • | A | M | ECL | H | communication across many crates |

(a) E-edge-sensitive; L-LAM ("look at me"); M-"int" via bus mastership; P-programmable edge-or level-sensitive interrupts.
(b) CE-card-edge; DIN-2-part "Eurocard" 96-pin connector; H-high density 2-part conn. (c) almost. (d) National Semi special.

COMMUNICATION SYSTEM

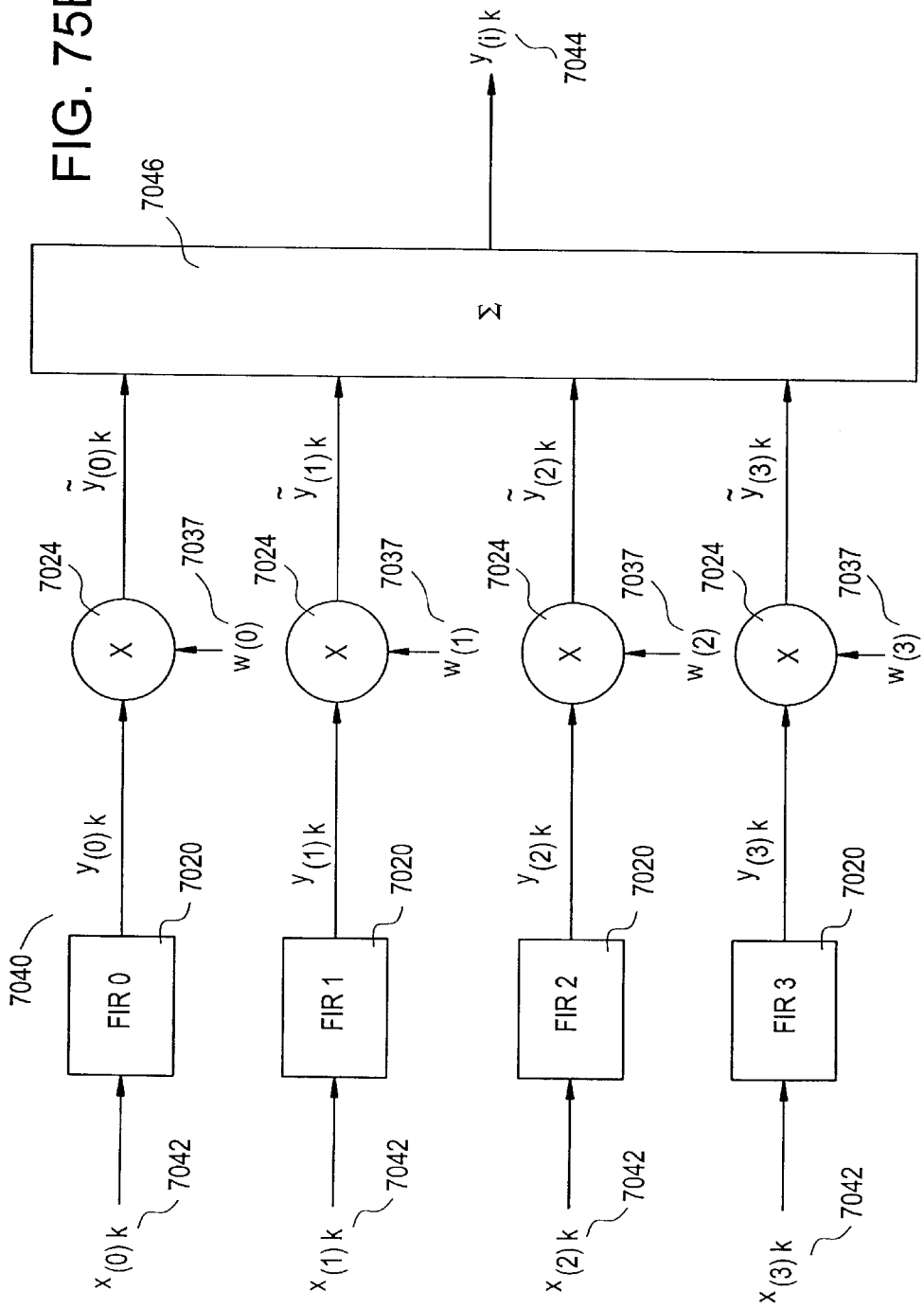

ADAPTIVE VECTOR CORRELATOR USING WEIGHTING SIGNALS FOR SPREAD-SPECTRUM COMMUNICATIONS

CROSS-REFERENCE TO RELATED APPLICATIONS

This application is a continuation-in-part to U.S. patent application Ser. No. 08/956,740 filed on Oct. 23, 1997, which issued on Apr. 10, 2001 as U.S. Pat. No. 6,215,778; which is a continuation of U.S. patent application Ser. No. 08/669,775 filed on Jun. 27, 1996, which issued on Aug. 25, 1998 as U.S. Pat. No. 5,799,010; which claims benefit of U.S. Provisional Application No. 60/000,775 filed on Jun. 30, 1995. This application is also a continuation-in-part to U.S. patent application Ser. No. 09/003,104 filed on Jan. 6, 1998, which issued on Jan. 30, 2001 as U.S. Pat. No. 6,181,949; which is a continuation of U.S. patent application Ser. No. 08/670,162 filed on Jun. 27, 1996, which issued on Nov. 24, 1998 as U.S. Pat. No. 5,841,768. This application is also a continuation-in-part to U.S. patent application Ser. No. 09/304,286 filed on May 3, 1999 now U.S. Pat. No. 6,252,856; which is a continuation of U.S. patent application Ser. No. 08/671,068 filed on Jun. 27, 1996, which issued on Aug. 17, 1999 as U.S. Pat. No. 5,940,382. This application is also a continuation-in-part to U.S. patent application Ser. No. 09/354,042 filed on Jul. 15, 1999, which is a continuation of U.S. patent application Ser. No. 08/671,067 filed on Jun. 27, 1996, which issued on Sep. 14, 1999 as U.S. Pat. No. 5,953,346. This application is also a continuation-in-part to U.S. patent application Ser. No. 09/129,850 filed on Aug. 6, 1998 now abandoned; which is a continuation of U.S. patent application Ser. No. 08/670,160 filed on Jun. 27, 1996. This application is also a continuation of U.S. patent application Ser. No. 09/079,600 filed on May 15, 1998; which is a continuation of U.S. patent application Ser. No. 08/671,221 filed on Jun. 27, 1996, which issued on May 19, 1998 as U.S. Pat. No. 5,754,803.

BACKGROUND OF THE INVENTION

The present invention generally pertains to Code Division Multiple Access (CDMA) communications, also known as spread-spectrum communications. More particularly, the present invention pertains to a system and method for providing a high capacity, CDMA communications system which provides for one or more simultaneous user bearer channels over a given radio frequency, allowing dynamic allocation of bearer channel rate while rejecting multipath interference.

DESCRIPTION OF THE RELEVANT ART

Providing quality telecommunication services to user groups which are classified as remote, such as rural telephone systems and telephone systems in underdeveloped countries, has proven to be a challenge in recent years. These needs have been partially satisfied by wireless radio services, such as fixed or mobile frequency division multiplex (FDM) systems, frequency division multiple access (FDMA) systems, time division multiplex (TDM) systems, time division multiple access (TDMA) systems, combination frequency and time division (FD/TDMA) systems, and other land mobile radio systems. Usually, these remote services are faced with more potential users than can be supported simultaneously by their frequency or spectral bandwidth capacity.

Recognizing these limitations, recent advances in wireless communications have used spread spectrum modulation techniques to provide simultaneous communication by multiple users. Spread spectrum modulation refers to modulating an information signal with a spreading code signal; the spreading code signal being generated by a code generator where the period Tc of the spreading code is substantially less than the period of the information data bit or symbol signal. The code may modulate the carrier frequency upon which the information has been sent, called frequency-hopped spreading, or may directly modulate the signal by multiplying the spreading code with the information data signal, called direct-sequence (DS) spreading. Spread-spectrum modulation produces a signal with bandwidth substantially greater than that required to transmit the information signal. Synchronous reception and despreading of the signal at the receiver recovers the original information. A synchronous demodulator in the receiver uses a reference signal to synchronize the despreading circuits to the input spread-spectrum modulated signal to recover the carrier and information signals. The reference signal can be a spreading code which is not modulated by an information signal. Such use of a synchronous spread-spectrum modulation and demodulation for wireless communication is described in U.S. Pat. No. 5,228,056 entitled SYNCHRONOUS SPREAD-SPECTRUM COMMUNICATIONS SYSTEM AND METHOD by Donald L. Schilling, which techniques are incorporated herein by reference.

Spread-spectrum modulation in wireless networks offers many advantages because multiple users may use the same frequency band with minimal interference to each user's receiver. Spread-spectrum modulation also reduces effects from other sources of interference. In addition, synchronous spread-spectrum modulation and demodulation techniques may be expanded by providing multiple message channels for a single user, each spread with a different spreading code, while still transmitting only a single reference signal to the user. Such use of multiple message channels modulated by a family of spreading codes synchronized to a pilot spreading code for wireless communication is described in U.S. Pat. No. 5,166,951 entitled HIGH CAPACITY SPREAD-SPECTRUM CHANNEL by Donald L. Schilling, which is incorporated herein by reference.

One area in which spread-spectrum techniques are used is in the field of mobile cellular communications to provide personal communication services (PCS). Such systems desirably support large numbers of users, control Doppler shift and fade, and provide high speed digital data signals with low bit error rates. These systems employ a family of orthogonal or quasi-orthogonal spreading codes, with a pilot spreading code sequence synchronized to the family of codes. Each user is assigned one of the spreading codes as a spreading function. Related problems of such a system are: supporting a large number of users with the orthogonal codes, handling reduced power available to remote units, and handling multipath fading effects. Solutions to such problems include using phased-array antennas to generate multiple steerable beams and using very long orthogonal or quasi-orthogonal code sequences. These sequences may be reused by cyclic shifting of the code synchronized to a central reference and diversity combining of multipath signals. Such problems associated with spread spectrum communications, and methods to increase the capacity of a multiple access, spread-spectrum system are described in U.S. Pat. No. 4,901,307 entitled SPREAD SPECTRUM MULTIPLE ACCESS COMMUNICATION SYSTEM USING SATELLITE OR TERRESTRIAL REPEATERS by Gilhousen et al. which is incorporated herein by reference.

The problems associated with the prior art systems focus around reliable reception and synchronization of the receiver despreading circuits to the received signal. The presence of multipath fading introduces a particular problem with spread spectrum receivers in that a receiver must somehow track the multipath components to maintain code-phase lock of the receiver's despreading means with the input signal. Prior art receivers generally track only one or two of the multipath signals, but this method is not satisfactory because the combined group of low power multipath signal components may actually contain far more power than the one or two strongest multipath components. The prior art receivers track and combine the strongest components to maintain a predetermined bit error rate (BER) of the receiver. Such a receiver is described, for example, in U.S. Pat. No. 5,109,390 entitled DIVERSITY RECEIVER IN A CDMA CELLULAR TELEPHONE SYSTEM by Gilhousen et al. A receiver that combines all multipath components, however, is able to maintain the desired BER with a signal power that is lower than that of prior art systems because more signal power is available to the receiver. Consequently, there is a need for a spread spectrum communication system employing a receiver that tracks substantially all of the multipath signal components, so that substantially all multipath signals may be combined in the receiver, and hence the required transmit power of the signal for a given BER maybe reduced.

Another problem associated with multiple access, spread-spectrum communication systems is the need to reduce the total transmitted power of users in the system, since users may have limited available power. An associated problem requiring power control in spread-spectrum systems is related to the inherent characteristic of spread-spectrum systems that one user's spread-spectrum signal is received by another user's receiver as noise with a certain power level. Consequently, users transmitting with high levels of signal power may interfere with other users' reception. Also, if a user moves relative to another user's geographic location, signal fading and distortion require that the users adjust their transmit power level to maintain a particular signal quality. At the same time, the system should keep the power that the base station receives from all users relatively constant. Finally, because it is possible for the spread-spectrum system to have more remote users than can be supported simultaneously, the power control system should also employ a capacity management method which rejects additional users when the maximum system power level is reached.

Prior spread-spectrum systems have employed a base station that measures a received signal and sends an adaptive power control (APC) signal to the remote users. Remote users include a transmitter with an automatic gain control (AGC) circuit which responds to the APC signal. In such systems the base station monitors the overall system power or the power received from each user, and sets the APC signal accordingly. Such a spread-spectrum power control system and method is described in U.S. Pat. No. 5,299,226 entitled ADAPTIVE POWER CONTROL FOR A SPREAD SPECTRUM COMMUNICATION SYSTEM AND METHOD, and U.S. Pat. No. 5,093,840 entitled ADAPTIVE POWER CONTROL FOR A SPREAD SPECTRUM TRANSMITTER, both by Donald L. Schilling and incorporated herein by reference. This open loop system performance may be improved by including a measurement of the signal power received by the remote user from the base station, and transmitting an APC signal back to the base station to effectuate a closed loop power control method. Such closed loop power control is described, for example, in U.S. Pat. No. 5,107,225 entitled HIGH DYNAMIC RANGE CLOSED LOOP AUTOMATIC GAIN CONTROL CIRCUIT to Charles E. Wheatley, III et al. and incorporated herein by reference.

These power control systems, however, exhibit several disadvantages. First, the base station must perform complex power control algorithms, increasing the amount of processing in the base station. Second, the system actually experiences several types of power variation: variation in the noise power caused by the variation in the number of users and variations in the received signal power of a particular bearer channel. These variations occur with different frequency, so simple power control algorithms can be optimized to compensate for only one of the two types of variation. Finally, these power algorithms tend to drive the overall system power to a relatively high level. Consequently, there is a need for a spread-spectrum power control method that rapidly responds to changes in bearer channel power levels, while simultaneously making adjustments to all users' transmit power in response to changes in the number of users. Also, there is a need for an improved spread-spectrum communication system employing a closed loop power control system which minimizes the system's overall power requirements while maintaining a sufficient BER at the individual remote receivers. In addition, such a system should control the initial transmit power level of a remote user and manage total system capacity.

Spread-spectrum communication systems desirably should support large numbers of users, each of which has at least one communication channel. In addition, such a system should provide multiple generic information channels to broadcast information to all users and to enable users to gain access to the system. Using prior art spread-spectrum systems this could only be accomplished by generating large numbers of spreading code sequences.

Further, spread-spectrum systems should use sequences that are orthogonal or nearly orthogonal to reduce the probability that a receiver locks to the wrong spreading code sequence or phase. The use of such orthogonal codes and the benefits arising therefrom are outlined in U.S. Pat. No. 5,103,459 entitled SYSTEM AND METHOD FOR GENERATING SIGNAL WAVEFORMS IN A CDMA CELLULAR TELEPHONE SYSTEM, by Gilhousen et al. and U.S. Pat. No. 5,193,094 entitled METHOD AND APPARATUS FOR GENERATING SUPER-ORTHOGONAL CONVOLUTIONAL CODES AND THE DECODING THEREOF, by Andrew J. Viterbi, both of which are incorporated herein by reference. However, generating such large families of code sequences with such properties is difficult. Also, generating large code families requires generating sequences which have a long period before repetition. Consequently, the time a receiver takes to achieve synchronization with such a long sequence is increased. Prior art spreading code generators often combine shorter sequences to make longer sequences, but such sequences may no longer be sufficiently orthogonal. Therefore, there is a need for an improved method for reliably generating large families of code sequences that exhibit nearly orthogonal characteristics and have a long period before repetition, but also include the benefit of a short code sequence that reduces the time to acquire and lock the receiver to the correct code phase. In addition, the code generation method should allow generation of codes with any period, since the spreading code period is often determined by parameters used such as data rate or frame size.

Another desirable characteristic of spreading code sequences is that the transition of the user data values occur at a transition of the code sequence values. Since data typically has a period which is divisible by $2^N$, such a characteristic usually requires the code-sequence to be an even length of $2^N$. However, code generators, as is well known in the art, generally use linear feedback shift registers which generate codes of length $2^N-1$. Some generators include a method to augment the generated code sequence by inserting an additional code value, as described, for example, in U.S. Pat. No. 5,228,054 entitled POWER-OF-TWO LENGTH PSEUDONOISE SEQUENCE GENERATOR WITH FAST OFFSET ADJUSTMENT by Timothy Rueth et al. and incorporated herein by reference. Consequently, the spread-spectrum communication system should also generate spreading code sequences of even length.

Finally, the spread-spectrum communication system should be able to handle many different types of data, such as FAX, voiceband data and ISDN, in addition to traditional voice traffic. To increase the number of users supported, many systems employ encoding techniques such as ADPCM to achieve "compression" of the digital telephone signal. FAX, ISDN and other data, however, require the channel to be a clear channel. Consequently, there is a need for a spread spectrum communication system that supports compression techniques that also dynamically modify the spread spectrum bearer channel between an encoded channel and a clear channel in response to the type of information contained in the user's signal.

SUMMARY OF THE INVENTION

The present invention is embodied in a multiple access, spread spectrum communication system which processes a plurality of information signals received simultaneously over telecommunication lines for simultaneous transmission over a radio frequency (RF) channel as a code-division-multiplexed (CDM) signal. The system includes a radio carrier station (RCS) which receives a call request signal that corresponds to a telecommunication line information signal, and a user identification signal that identifies a user to which the call request and information signal are addressed. The receiving apparatus is coupled to a plurality of code division multiple access (CDMA) modems, one of which provides a global pilot code signal and a plurality of message code signals, and each of the CDMA modems combines one of the plurality of information signals with its respective message code signal to provide a spread-spectrum processed signal. The plurality of message code signals of the plurality of CDMA modems are synchronized to the global pilot code signal. The system also includes assignment apparatus that is responsive to a channel assignment signal for coupling the respective information signals received on the telecommunication lines to indicated ones of the plurality of modems. The assignment apparatus is coupled to a time-slot exchange means. The system further includes a system channel controller coupled to a remote call-processor and to the time-slot exchange means. The system channel controller is responsive to the user identification signal, to provide the channel assignment signal. In the system, an RF transmitter is connected to all of the modems to combine the plurality of spread-spectrum processed message signals with the global pilot code signal to generate a CDM signal. The RF transmitter also modulates a carrier signal with the CDM signal and transmits the modulated carrier signal through an RF communication channel.

The transmitted CDM signal is received from the RF communication channel by a subscriber unit (SU) which processes and reconstructs the transmitted information signal assigned to the subscriber. The SU includes a receiving means for receiving and demodulating the CDM signal from the carrier. In addition, the SU comprises a subscriber unit controller and a CDMA modem which includes a processing means for acquiring the global pilot code and despreading the spread-spectrum processed signal to reconstruct the transmitted information signal.

The RCS and the SUs each contain CDMA modems for transmission and reception of telecommunication signals including information signals and connection control signals. The CDMA modem comprises a modem transmitter having: a code generator for providing an associated pilot code signal and for generating a plurality of message code signals; a spreading means for combining each of the information signals, with a respective one of the message code signals to generate spread-spectrum processed message signals; and a global pilot code generator which provides a global pilot code signal to which the message code signals are synchronized.

The CDMA modem also comprises a modem receiver having associated pilot code acquisition and tracking logic. The associated pilot code acquisition logic includes an associated pilot code generator; a group of associated pilot code correlators for correlating code-phase delayed versions of the associated pilot signal with a receive CDM signal for producing a despread associated pilot signal. The code phase of the associated pilot signal is changed responsive to an acquisition signal value until a detector indicates the presence of the despread associated pilot code signal by changing the acquisition signal value. The associated pilot code signal is synchronized to the global pilot signal. The associated pilot code tracking logic adjusts the associated pilot code signal in phase responsive to the acquisition signal so that the signal power level of the despread associated pilot code signal is maximized. Finally, the CDMA modem receiver includes a group of message signal acquisition circuits. Each message signal acquisition circuit includes a plurality of receive message signal correlators for correlating one of the local receive message code signals with the CDM signal to produce a respective despread receive message signal.

To generate large families of nearly mutually orthogonal codes used by the CDMA modems, the present invention includes a code sequence generator. The code sequences are assigned to a respective logical channel of the spread-spectrum communication system, which includes In-phase (I) and quadrature (Q) transmission over RF communication channels. One set of sequences is used as pilot sequences which are code sequences transmitted without modulation by a data signal. The code sequence generator circuit includes a long code sequence generator including a linear feedback shift register, a memory which provides a short, even code sequence, and a plurality of cyclic shift, feedforward sections which provide other members of the code family which exhibit minimal correlation with the code sequence applied to the feedforward circuit. The code sequence generator further includes a group of code sequence combiners for combining each phase shifted version of the long code sequence with the short, even code sequence to produce a group, or family, of nearly mutually orthogonal codes.

Further, the present invention includes several methods for efficient utilization of the spread-spectrum channels. First, the system includes a bearer channel modification system which comprises a group of message channels between a first transceiver and second transceiver. Each of the group of message channels supports a different information signal transmission rate. The first transceiver monitors a received information signal to determine the type of information signal that is received, and produces a coding signal relating to the coding signal. If a certain type of information signal is present, the first transceiver switches transmission from a first message channel to a second message channel to support the different transmission rate. The coding signal is transmitted by the first transceiver to the second transceiver, and the second transceiver switches to the second message channel to receive the information signal at a different transmission rate.

Another method to increase efficient utilization of the bearer message channels is the method of idle-code suppression used by the present invention. The spread-spectrum transceiver receives a digital data information signal including a predetermined flag pattern corresponding to an idle period. The method includes the steps of: 1) delaying and monitoring the digital data signal; 2) detecting the predetermined flag pattern; 3) suspending transmission of the digital data signal when the flag pattern is detected; and 4) transmitting the data signal as a spread-spectrum signal when the flag pattern is not detected.

The present invention includes a system and method for closed loop automatic power control (APC) for the RCS and SUs of the spread-spectrum communication system. The SUs transmit spread-spectrum signals, the RCS acquires the spread-spectrum signals, and the RCS detects the received power level of the spread-spectrum signals plus any interfering signal including noise. The APC system includes the RCS and a plurality of SUs, wherein the RCS transmits a plurality of forward channel information signals to the SUs as a plurality of forward channel spread-spectrum signals having a respective forward transmit power level, and each SU transmits to the base station at least one reverse spread-spectrum signal having a respective reverse transmit power level and at least one reverse channel spread-spectrum signal which includes a reverse channel information signal.

The APC includes an automatic forward power control (AFPC) system, and an automatic reverse power control (ARPC) system. The AFPC system operates by measuring, at the SU, a forward signal-to-noise ratio of the respective forward channel information signal, generating a respective forward channel error signal corresponding to a forward error between the respective forward signal-to-noise ratio and a pre-determined signal-to-noise value, and transmitting the respective forward channel error signal as part of a respective reverse channel information signal from the SU to the RCS. The RCS includes a plural number of AFPC receivers for receiving the reverse channel information signals and extracting the forward channel error signals from the respective reverse channel information signals. The RCU also adjusts the respective forward transmit power level of each one of the respective forward spread-spectrum signals responsive to the respective forward error signal.

The ARPC system operates by measuring, in the RCS, a reverse signal-to-noise ratio of each of the respective reverse channel information signals, generating a respective reverse channel error signal representing an error between the respective reverse channel signal-to-noise ratio and a respective pre-determined signal-to-noise value, and transmitting the respective reverse channel error signal as a part of a respective forward channel information signal to the SU. Each SU includes an ARPC receiver for receiving the forward channel information signal and extracting the respective reverse error signal from the forward channel information signal. The SU adjusts the reverse transmit power level of the respective reverse spread-spectrum signal responsive to the respective reverse error signal.

BRIEF DESCRIPTION OF THE DRAWINGS

FIGS. 36A and 36B are flow diagrams of the establishment of a communication channel between a base station and a subscriber unit in accordance with the preferred embodiment of the present invention using short codes;

FIG. 55 is a table of prior art data bus architectures.

FIG. 75B is a detailed block diagram of a multichannel FIR filter.

GLOSSARY OF ACRONYMS

Figure 1:
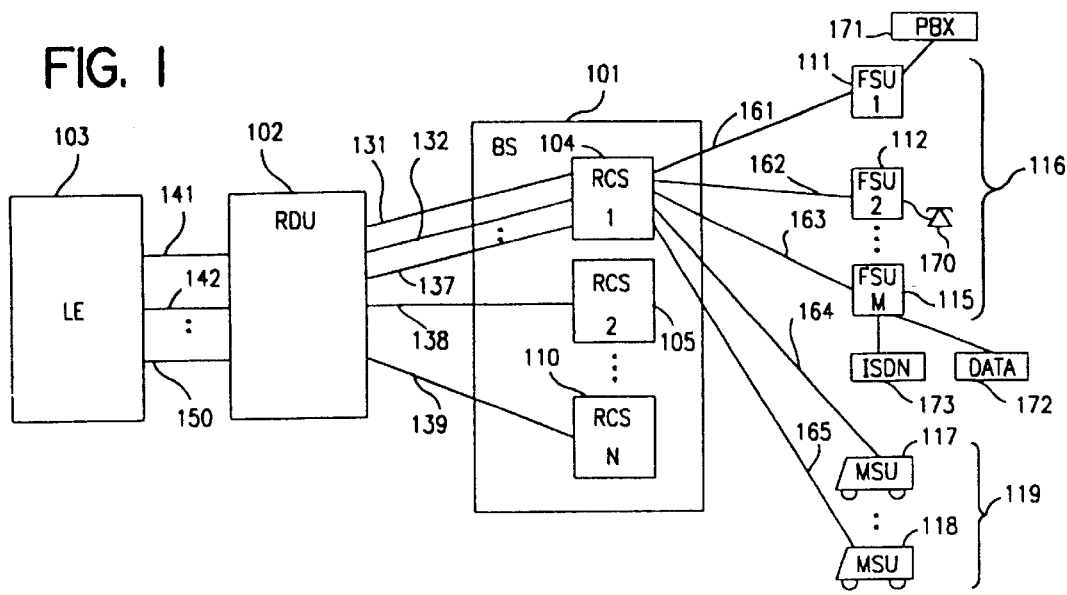
FIG. 1 is a block diagram of a code division multiple access communication system according to the present invention.

| Acronym | Definition |
| --- | --- |
| AC | Assigned Channels |
| A/D | Analog-to-Digital |
| ADPCM | Adaptive Differential Pulse Code Modulation |
| AFPC | Automatic Forward Power Control |
| AGC | Automatic Gain Control |
| AMF | Adaptive Matched Filter |
| APC | Automatic Power Control |
| ARPC | Automatic Reverse Power Control |
| ASPT | Assigned Pilot |
| AVC | Adaptive Vector Correlator |
| AXCH | Access Channel |
| B-CDMA | Broadband Code Division Multiple Access |
| BCM | Bearer Channel Modification |
| BER | Bit Error Rate |
| BS | Base Station |
| CC | Call Control |
| CDM | Code Division Multiplex |
| CDMA | Code Division Multiple Access |
| CLK | Clock Signal Generator |
| CO | Central Office |
| CTCH | Control Channel |
| CUCH | Check-Up Channel |
| dB | Decibels |
| DCC | Data Combiner Circuitry |
| DI | Distribution Interface |
| DLL | Delay Locked Loop |
| DM | Delta Modulator |
| DS | Direct Sequence |
| EPIC | Extended PCM Interface Controller |
| FBCH | Fast Broadcast Channel |
| FDM | Frequency Division Multiplex |
| FD/TDMA | Frequency & Time Division Systems |
| FDMA | Frequency Division Multiple Access |
| FEC | Forward Error Correction |
| FSK | Frequency Shift Keying |
| FSU | Fixed Subscriber Unit |
| GC | Global Channel |
| GLPT | Global Pilot |

-continued
GLOSSARY OF ACRONYMS

| Acronym | Definition |
| --- | --- |
| GPC | Global Pilot Code |
| GPSK | Gaussian Phase Shift Keying |
| GPS | Global Positioning System |
| HPPC | High Power Passive Components |
| HSB | High Speed Bus |
| I | In-Phase |
| IC | Interface Controller |
| ISDN | Integrated Services Digital Network |
| ISST | Initial System Signal Threshold |
| LAXPT | Long Access Pilot |
| LAPD | Link Access Protocol |
| LCT | Local Craft Terminal |
| LE | Local Exchange |
| LFSR | Linear Feedback Shift Register |
| LI | Line Interface |
| LMS | Least Mean Square |
| LOL | Loss of Code Lock |
| LPF | Low Pass Filter |
| LSR | Linear Shift Register |
| MISR | Modem Input Signal Receiver |
| MIU | Modem Interface Unit |
| MM | Mobility Management |
| MOI | Modem Output Interface |
| MPC | Maintenance Power Control |
| MPSK | M-ary Phase Shift Keying |
| MSK | Minimum Shift Keying |
| MSU | Mobile Subscriber Unit |
| NE | Network Element |
| OMS | Operation and Maintenance System |
| OS | Operations System |
| OQPSK | Offset Quadrature Phase Shift Keying |
| OW | Order Wire |
| PARK | Portable Access Rights Key |
| PBX | Private Branch Exchange |
| PCM | Pulse Coded Modulation |
| PCS | Personal Communication Services |
| PG | Pilot Generator |
| PLL | Phase Locked Loop |
| PLT | Pilot |
| PN | Pseudonoise |
| POTS | Plain Old Telephone Service |
| STN | Public Switched Telephone Network |
| Q | Quadrature |
| QPSK | Quadrature Phase Shift Keying |
| RAM | Random Access Memory |
| RCS | Radio Carrier Station |
| RDI | Receiver Data Input Circuit |
| RDU | Radio Distribution Unit |
| RF | Radio Frequency |
| RLL | Radio Local Loop |
| SAXPT | Short Access Channel Pilots |
| SBCH | Slow Broadcast Channel |
| SHF | Super High Frequency |
| SIR | Signal Power to Interface Noise Power Ratio |
| SLIC | Subscriber Line Interface Circuit |
| SNR | Signal-to-Noise Ratio |
| SPC | Service PC |
| SPRT | Sequential Probability Ratio Test |
| STCH | Status Channel |
| SU | Subscriber Unit |
| TDM | Time Division Multiplexing |
| TMN | Telecommunication Management Network |
| TRCH | Traffic Channels |
| TSI | Time-Slot Interchanger |
| TX | Transmit |
| TXIDAT | I-Modem Transmit Data Signal |
| TXQDAT | Q-Modem Transmit Data Signal |
| UHF | Ultra High Frequency |
| VCO | Voltage Controlled Oscillator |
| VDC | Video Distribution Circuit |
| VGA | Variable Gain Amplifier |
| VHF | Very High Frequency |
| WAC | Wireless Access Controller |

DESCRIPTION OF THE EXEMPLARY EMBODIMENT

I. General System Description

The system of the present invention provides local-loop telephone service using radio links between one or more base stations and multiple remote subscriber units. In the exemplary embodiment, a radio link is described for a base station communicating with a fixed subscriber unit (FSU), but the system is equally applicable to systems including multiple base stations with radio links to both FSUs and mobile subscriber units (MSUs). Consequently, the remote subscriber units are referred to herein as subscriber units (SUs).

Referring to FIG. 1, base station (BS) 101 provides call connection to a local exchange (LE) 103 or any other telephone network switching interface, such as a private branch exchange (PBX) and includes a radio carrier station (RCS) 104. One or more RCSs 104, 105, 110 connect to a radio distribution unit (RDU) 102 through links 131, 132, 137, 138, 139, and RDU 102 interfaces with LE 103 by transmitting and receiving call set-up, control, and information signals through telco links 141, 142, 150. SUs 116, 119 communicate with the RCS 104 through radio links 161, 162, 163, 164, 165. Alternatively, another embodiment of the invention includes several SUs and a "master" SU with functionality similar to the RCS 104. Such an embodiment may or may not have connection to a local telephone network.

The radio links 161 to 165 operate within the frequency bands of the DCS1800 standard (1.71–1.785 Ghz and 1.805–1.880 GHz); the US-PCS standard (1.85–1.99 Ghz); and the CEPT standard (2.0–2.7 GHz). Although these bands are used in described embodiment, the invention is equally applicable to the entire UHF to SHF bands, including bands from 2.7 GHz to 5 GHz. The transmit and receive bandwidths are multiples of 3.5 MHz starting at 7 MHz, and multiples of 5 MHz starting at 10 MHz, respectively. The described system includes bandwidths of 7, 10, 10.5, 14 and 15 MHz. In the exemplary embodiment of the invention, the minimum guard band between the uplink and downlink is 20 MHz, and is desirably at least three times the signal bandwidth. The duplex separation is between 50 to 175 MHz, with the described invention using 50, 75, 80,95, and 175 MHz. Other frequencies may also be used.

Although the described embodiment uses different spread-spectrum bandwidths centered around a carrier for the transmit and receive spread-spectrum channels, the present method is readily extended to systems using multiple spread-spectrum bandwidths for the transmit channels and multiple spread-spectrum bandwidths for the receive channels. Alternatively, because spread-spectrum communication systems have the inherent feature that one user's transmission appears as noise to another user's despreading receiver, an embodiment may employ the same spread-spectrum channel for both the transmit and receive path channels. In other words, uplink and downlink transmissions can occupy the same frequency band. Furthermore, the present method may be readily extended to multiple CDMA frequency bands, each conveying a respectively different set of messages, uplink, downlink or uplink and downlink.

The spread binary symbol information is transmitted over the radio links 161 to 165 using quadrature phase shift keying (QPSK) modulation with Nyquist Pulse Shaping in the present embodiment, although other modulation techniques may be used, including, but not limited to, offset QPSK (OQPSK), minimum shift keying (MSK). Gaussian phase shift keying (GPSK) and M-ary phase shift keying (MPSK)

The radio links 161 to 165 incorporate Broadband Code Division Multiple Access (B-CDMA™) as the mode of transmission in both the uplink and downlink directions. CDMA (also known as spread spectrum) communication techniques used in multiple access systems are well-known, and are described in U.S. Pat. No. 5,228,056 entitled SYNCHRONOUS SPREAD-SPECTRUM COMMUNICATION SYSTEM AND METHOD by Donald T Schilling. The system described utilizes the direct sequence (DS) spreading technique. The CDMA modulator performs the spread-spectrum spreading code sequence generation, which can be a pseudonoise (PN) sequence; and complex DS modulation of the QPSK signals with spreading code sequences for the in-phase (I) and quadrature (Q) channels. Pilot signals are generated and transmitted with the modulated signals, and pilot signals of the present embodiment are spreading codes not modulated by data. The pilot signals are used for synchronization, carrier phase recovery and for estimating the impulse response of the radio channel. Each SU includes a single pilot generator and at least one CDMA modulator and demodulator, together known as a CDMA modem. Each RCS 104, 105, 110 has a single pilot generator plus sufficient CDMA modulators and demodulators for all of the logical channels in use by all SUs.

The CDMA demodulator despreads the signal with appropriate processing to combat or exploit multipath propagation effects. Parameters concerning the received power level are used to generate the automatic power control (APC) information which, in turn, is transmitted to the other end of the communication link. The APC information is used to control transmit power of the automatic forward power control (AFPC) and automatic reverse power control (ARPC) links. In addition, each RCS 104, 105 and 110 can perform maintenance power control (MPC), in a manner similar to APC, to adjust the initial transmit power of each SU 111, 112, 115, 117 and 118. Demodulation is coherent where the pilot signal provides the phase reference.

The described radio links support multiple traffic channels with data rates of 8, 16, 32, 64, 128, and 144 kbs. The physical channel to which a traffic channel is connected operates with a 64 k symbol/sec rate. Other data rates may be supported, and forward error correction (FEC) coding can be employed. For the described embodiment, FEC with coding rate of ½ and constraint length 7 is used. Other rates and constraint lengths can be used consistent with the code generation techniques employed.

Diversity combining at the radio antennas of RCS 104, 105 and 110 is not necessary because CDMA has inherent frequency diversity due to the spread bandwidth. Receivers include adaptive matched filters (AMFs) (not shown in FIG. 1) which combine the multipath signals. In the present embodiment, the exemplary AMFs perform maximal ratio combining.

Referring to FIG. 1, RCS 104 interfaces to RDU 102 through links 131, 132, 137, 139 with, for example, 1.544 Mb/s DS1, 2.048 Mb/s E1; or HDSL formats to receive and send digital data signals. While these are typical telephone company standardized interfaces, the present invention is not limited to these digital data formats only. The exemplary RCS line interface (not shown in FIG. 1) translates the line coding (such as HDB3, B8ZS, AMI) and extracts or produces framing information, performs alarms and facility signaling functions, as well as channel specific loop-back and parity check functions. The interfaces for this description provide 64 kbs PCM encoded or 32 kbs ADPCM encoded telephone traffic channels or ISDN channels to the RCS for processing. Other ADPCM encoding techniques can be used consistent with the sequence generation techniques.

The system of the present invention also supports bearer rate modification between the RCS 104 and each SU 111, 112, 115, 117 and 118 communicating with the RCS 104 in which a CDMA message channel supporting 64 kbs may be assigned to voiceband data or FAX when rates above 4.8 kbs are present. Such 64 kbs bearer channel is considered an unencoded channel. For ISDN, bearer rate modification may be done dynamically, based upon the D channel messages.

In FIG. 1, each SU 111, 112, 115, 117 and 118 either includes or interfaces with a telephone unit 170, or interfaces with a local switch (PBX) 171. The input from the telephone unit may include voice, voiceband data and signaling. The SU translates the analog signals into digital sequences, and may also include a data terminal 172 or an ISDN interface 173. The SU can differentiate voice input, voiceband data or FAX and digital data. The SU encodes voice data with techniques such as ADPCM at 32 kbs or lower rates, and detects voiceband data or FAX with rates above 4.8 kbs to modify the traffic channel (bearer rate modification) for unencoded transmission. Also, A-law, u-law or no compounding of the signal may be performed before transmission. For digital data, data compression techniques, such as idle flag removal, may also be used to conserve capacity and minimize interference.

The transmit power levels of the radio interface between RCS 104 and SUs 111, 112, 115, 117 and 118 are controlled using two different closed loop power control methods. The automatic forward power control (AFPC) method determines the downlink transmit power level, and the automatic reverse power control (ARPC) method determines the Uplink transmit power level. The logical control channel by which SU 111 and RCS 104, for example, transfer power control information operates at least a 16 kHz update rate. Other embodiments may use a faster or slower update rate, for example 64 kHz. These algorithms ensure that the transmit power of a user maintains an acceptable bit-error rate (BER), maintains the system power at a minimum to conserve power and maintains the power level of all SUs 111, 112, 115, 117 and 118 received by RCS 104 at a nearly equal level.

In addition, the system uses an optional maintenance power control method during the inactive mode of a SU. When SU 111 is inactive or powered-down to conserve power, the unit occasionally activates to adjust its initial transmit power level setting in response to a maintenance power control signal from RCS 104. The maintenance power signal is determined by the RCS 104 by measuring the received power level of SU 111 and present system power level and, from this, calculates the necessary initial transmit power. The method shortens the channel acquisition time of SU 111 to begin a communication. The method also prevents the transmit power level of SU 111 from becoming too high and interfering with other channels during the initial transmission before the closed loop power control reduces the transmit power.

RCS 104 obtains synchronization of its clock from an interface line such as, but not limited to, E1, T1, or HDSL interfaces. RCS 104 can also generate its own internal clock signal from an oscillator which may be regulated by a global positioning system (GPS) receiver. RCS 104 generates a global pilot code, a channel with a spreading code but no data modulation, which can be acquired by remote SUs 111 through 118. All transmission channels of the RCS are synchronized to the pilot channel, and spreading code phases of code generators (not shown) used for logical communication channels within RCS 104 are also synchronized to the pilot channel's spreading code phase. Similarly, SUs 111 through 118 which receive the global pilot code of RCS 104 synchronize the spreading and despreading code phases of the code generators (not shown) of the SUs to the global pilot code.

RCS 104, SU 111 and RDU 102 may incorporate system redundancy of system elements and automatic switching between internal functional system elements upon a failure event to prevent loss or drop-out of a radio link, power supply, traffic channel or group of traffic channels.

II. Logical Communication Channels

A 'channel' of the prior art is usually regarded as a communications path which is part of an interface and which can be distinguished from other paths of that interface without regard to its content. However, in the case of CDMA, separate communications paths are distinguished only by their content. The term 'logical channel' is used to distinguish the separate data streams, which are logically equivalent to channels in the conventional sense. All logical channels and sub-channels of the present invention are mapped to a common 64 kilo-symbols per second (ksym/s) QPSK stream. Some channels are synchronized to associated pilot codes which are generated from, and perform a similar function to the system global pilot code (GPC). The system pilot signals are not, however, considered logical channels.

Several logical communication channels are used over the RF communication link between the RCS and SU. Each logical communication channel either has a fixed, pre-determined spreading code or a dynamically assigned spreading code. For both pre-determined and assigned codes, the code phase is synchronized with the pilot code. Logical communication channels are divided into two groups: the global channel (GC) group includes channels which are either transmitted from the base station RCS to all remote SUs or from any SU to the RCS of the base station regardless of the SU's identity. The channels in the GC group may contain information of a given type for all users including those channels used by SUs to gain system access. Channels in the assigned channels (AC) group are those channels dedicated to communication between the RCS and a particular SU.

The global channels (GC) group provides for 1) broadcast control logical channels, which provide point-to-multipoint services for broadcasting messages to all SUs and paging messages to SUs; and 2) access control logical channels which provide point-to-point services on global channels for SUs to access the system and obtain assigned channels. The RCS of the present invention has multiple access control logical channels, and one broadcast control group. An SU of the present invention has at least one access control channel and at least one broadcast control logical channel.

The global logical channels controlled by the RCS are the fast broadcast channel (FBCH) which broadcasts fast changing information concerning which services and which access channels are currently available, and the slow broadcast channel (SBCH) which broadcasts slow changing system information and paging messages. The access channel (AXCH) is used by the SUs to access an RCS and gain access to assigned channels. Each AXCH is paired with a control channel (CTCH). The CTCH is used by the RCS to acknowledge and reply to access attempts by SUs. The long access pilot (LAXPT) is transmitted synchronously with AXCH to provide the RCS with a time and phase reference. An assigned channel (AC) group contains the logical channels that control a single telecommunication connection between the RCS and a SU. The functions developed when an AC group is formed include a pair of power control logical message channels for each of the uplink and downlink connections, and depending on the type of connection, one or more pairs of traffic channels. The bearer control function performs the required forward error control, bearer rate modification, and encryption functions.

Each SU 111, 112, 115, 117 and 118 has at least one AC group formed when a telecommunication connection exists, and each RCS 104, 105 and 110 has multiple AC groups formed, one for each connection in progress. An AC group of logical channels is created for a connection upon successful establishment of the connection. The AC group includes encryption, FEC coding and multiplexing on transmission, and FEC decoding, decryption and demultiplexing on reception.

Each AC group provides a set of connection oriented point-to-point services and operates in both directions between a specific RCS, for example, RCS 104 and a specific SU, for example, SU 111. An AC group formed for a connection can control more than one bearer over the RF communication channel associated with a single connection. Multiple bearers are used to carry distributed data such as, but not limited to, ISDN. An AC group can provide for the duplication of traffic channels to facilitate switch over to 64 kbs PCM for high speed facsimile and modem services for the bearer rate modification function.

The assigned logical channels formed upon a successful call connection and included in the AC group are a dedicated signaling channel [order wire (OW)], an APC channel, and one or more traffic channels (TRCH) which are bearers of 8, 16, 32, or 64 kbs depending on the service supported. For voice traffic, moderate rate coded speech, ADPCM or PCM can be supported on the traffic channels. For ISDN service types, two 64 kbs TRCHs form the B channels and a 16 kbs TRCH forms the D channel. Alternatively, the APC subchannel may either be separately modulated on its own CDMA channel, or may be time division multiplexed with a traffic channel or OW channel.

Each SU 111, 112, 115, 117 and 118 of the present invention supports up to three simultaneous traffic channels. The mapping of the three logical channels for TRCHs to the user data is shown below in Table 1:

TABLE 1

Mapping of service types to the three available TRCH channels

| Service | TRCH(0) | TRCH(1) | TRCH(2) |
|---|---|---|---|
| 16 kbs POTS | TRCH/16 | not used | not used |
| 32 + 64 kbs POTS (during BCM) | TRCH/32 | TRCH/64 | not used |
| 32 kbs POTS | TRCH/32 | not used | not used |
| 64 kbs POTS | not used | TRCH/64 | not used |
| ISDN D | not used | not used | TRCH/16 |
| ISDN B + D | TRCH/64 | not used | TRCH/16 |
| ISDN 2B + D | TRCH/64 | TRCH/64 | TRCH/16 |
| Digital LL @ 64 kbs | TRCH/64 | not used | not used |
| Digital LL @ 2 × 64 kbs | TRCH/64 | TRCH/64 | not used |
| Analog LL @ 64 kbs | TRCH/64 | not used | not used |

The APC data rate is sent at 64 kbs. The APC logical channel is not FEC coded to avoid delay and is transmitted at a relatively low power level to minimize capacity used for APC. Alternatively, the APC and OW may be separately modulated using complex spreading code sequences or they may be time division multilplexed.

The OW logical channel is FEC coded with a rate ½ convolutional code. This logical channel is transmitted in bursts when signaling data is present to reduce interference. After an idle period, the OW signal begins with at least 35 symbols prior to the start of the data frame. For silent maintenance call data, the OW is transmitted continuously between frames of data. Table 2 summarizes the logical channels used in the exemplary embodiment:

TABLE 2

Logical Channels and sub-channels of the B-CDMA Air Interface

| Channel name | Abbr. | Brief Description | Direction (forward or reverse) | Bit rate | Max BER | Power level | Pilot |
|---|---|---|---|---|---|---|---|
| Global Channels | | | | | | | |
| Fast Broadcast Channel | FBCH | Broadcasts fast-changing system information | F | 16 kbs | 1e−4 | Fixed | GLPT |
| Slow Broadcast Channel | SBCH | Broadcasts paging messages to FSUs and slow-changing system information | F | 16 kbs | 1e−7 | Fixed | GLPT |
| Access Channels | AXCH(i) | For initial access attempts by FSUs | R | 32 kbs | 1e−7 | Controlled by APC | LAXPT(i) |
| Control Channels | CTCH(i) | For granting access | F | 32 kbs | 1e−7 | Fixed | GLPT |
| Assigned Channels | | | | | | | |
| 16 kbs POTS | TRCH/16 | General POTS use | F/R | 16 kbs | 1e−4 | Controlled by APC | F-GLPT R-ASPT |
| 32 kbs POTS | TRCH/32 | General POTS use | F/R | 32 kbs | 1e−4 | Controlled by APC | F-GLPT R-ASPT |

TABLE 2-continued

Logical Channels and sub-channels of the B-CDMA Air Interface

| Channel name | Abbr. | Brief Description | Direction (forward or reverse) | Bit rate | Max BER | Power level | Pilot |
|---|---|---|---|---|---|---|---|
| 64 kbs POTS | TRCH/64 | POTS use for in-band modems/fax | F/R | 64 kbs | 1e−4 | Controlled by APC | F-GLPT R-ASPT |
| D channel | TRCH/16 | ISDN D channel | F/R | 16 kbs | 1e−7 | Controlled by APC | F-GLPT R-ASPT |
| Order wire channel | OW | assigned signaling channel | F/R | 32 kbs | 1e−7 | Controlled by APC | F-GLPT R-ASPT |
| APC channel | APC | carries APC commands | F/R | 64 kbs | 2e−1 | Controlled by APC | F-GLPT R-ASPT |

III. The Spreading Codes

The CDMA code generators used to encode the logical channels of the present invention employ linear shift registers (LSRs) with feedback logic which is a method well known in the art. The code generators of the present embodiment of the invention generate 64 synchronous unique sequences. Each RF communication channel uses a pair of these sequences for complex spreading (in-phase and quadrature) of the logical channels, so the generator gives 32 complex spreading sequences. The sequences are generated by a single seed which is initially loaded into a shift register circuit.

IV. The Generation of Spreading Code Sequences and Seed Selection

The spreading code period of the present invention is defined as an integer multiple of the symbol duration, and the beginning of the code period is also the beginning of the symbol. The relation between bandwidths and the symbol lengths chosen for the exemplary embodiment of the present invention is:

| BW (MHZ) | L (chips/symbol) |
|---|---|
| 7 | 91 |
| 10 | 130 |
| 10.5 | 133 |
| 14 | 182 |
| 15 | 195 |

The spreading code length is also a multiple of 64 and of 96 for ISDN frame support. The spreading code is a sequence of symbols, called chips or chip values. The general methods of generating pseudorandom sequences using Galois Field mathematics is known to those skilled in the art; however, a unique set or family of code sequences has been derived for the present invention. First, the length of the LFSR to generate a code sequence is chosen, and the initial value of the register is called a "seed". Second, the constraint is imposed that no code sequence generated by a code seed may be a cyclic shift of another code sequence generated by the same code seed. Finally, no code sequence generated from one seed may be a cyclic shift of a code sequence generated by another seed. It has been determined that the spreading code length of chip values of the present invention is:

$$128 \times 233{,}415 = 29{,}877{,}120 \quad \text{Equation (1)}$$

The spreading codes are generated by combining a linear sequence of period 233415 and a nonlinear sequence of period 128.

The FBCH channel of the exemplary embodiment is an exception because it is not coded with the 128 length sequence, so the FBCH channel spreading code has period 233415.

The nonlinear sequence of length 128 is implemented as a fixed sequence loaded into a shift register with a feed-back connection. The fixed sequence can be generated by an m-sequence of length 127 padded with an extra logic 0, 1, or random value as is well known in the art.

The linear sequence of length L=233415 is generated using an LFSR circuit with 36 stages. The feedback connections correspond to a irreducible polynomial h(n) of degree 36. The polynomial h(x) chosen for the exemplary embodiment of the present invention is $$h(x) = x^{36} + x^{35} + x^{30} + x^{28} + x^{26} + x^{25} + x^{22} + x^{20} + x^{19} + x^{17} + x^{16} + x^{15} + x^{14} + x^{12} + x^{11} + x^9 + x^8 + x^4 + x^3 + x^2 + 1$$

or, in binary notation $$h(x) = (1100001010110010110111101101100011101) \quad \text{Equation (2)}$$

A group of "seed" values for a LFSR representing the polynomial h(x) of Equation (2) which generates code sequences that are nearly orthogonal with each other is determined. The first requirement of the seed values is that the seed values do not generate two code sequences which are simply cyclic shifts of each other.

The seeds are represented as elements of $GF(2^{36})$ which is the field of residue classes modulo h(x). This field has a primitive element $\delta = x^2 + x + 1$. The binary representation of $\delta$ is:

$$\delta = 00000000000000000000000000000000111 \quad \text{Equation (3)}$$

Every element of $GF(2^{36})$ can also be written as a power of $\delta$ reduced modulo h(x). Consequently, the seeds are represented as powers of $\delta$, the primitive element.

The solution for the order of an element does not require a search of all values; the order of an element divides the order of the field $(GF(2^{36}))$. When $\delta$ is any element of $GF(2^{36})$ with $$x^e \equiv 1 \quad \text{Equation (4)}$$

for some e, then $e \backslash 2^{36} - 1$. Therefore, the order of any element in $GF(2^{36})$ divides $2^{36} - 1$. Using these constraints, it has been determined that a numerical search generates a group of seed values, n, which are powers of $\delta$, the primitive element of h(x).

The present invention includes a method to increase the number of available seeds for use in a CDMA communication system by recognizing that certain cyclic shifts of the previously determined code sequences may be used simultaneously. The round trip delay for the cell sizes and bandwidths of the present invention are less than 3000 chips. In one embodiment of the present invention, sufficiently separated cyclic shifts of a sequence can be used within the same cell without causing ambiguity for a receiver attempting to determine the code sequence. This method enlarges the set of sequences available for use. By implementing the tests previously described, a total of 3879 primary seeds were determined through numerical computation. These seeds are given mathematically as:

$$\delta^n \text{ modulo } h(x) \quad \text{Equation (5)}$$

where 3879 values of n, with $\delta=(00, \ldots 00111)$ as in (3), is a series incrementing by 1, starting at 1 and continuing to 1101, resuming at 2204 and continuing to 3305, resuming at 4408 and continuing to 5509, and resuming at 6612 and ending at 7184.

When all primary seeds are known, all secondary seeds of the present invention are derived from the primary seeds by shifting them multiples of 4095 chips modulo h(x). Once a family of seed values is determined, these values are stored in memory and assigned to logical channels as necessary. Once assigned, the initial seed value is simply loaded into LFSR to produce the required spreading code associated with the seed value.

V. Rapid Acquisition Feature of Long and Short Codes

Rapid acquisition of the correct code phase by a spread-spectrum receiver is improved by designing spreading codes which are faster to detect. It should be noted that spreading code, code sequence, spreading code sequence, chip code, chip sequence or chip code sequence may be used interchangeably to refer to a moduling signal used to modulate an information signal whereby the period of the modulation signal is substantially less than the period of the information signal. For simplicity, the term spreading code will be used. The present embodiment of the invention includes a new method of generating spreading codes that have rapid acquisition properties by using one or more of the following methods. First, a long code may be constructed from two or more short codes. The new implementation uses many spreading codes, one or more of which are rapid acquisition sequences of length L that have average acquisition phase searches r=log2L. Sequences with such properties are well known to those practiced in the art. The average number of acquisition test phases of the resulting long sequence is a multiple of r=log2L rather than half of the number of phases of the long sequence.

Second, a method of transmitting complex valued spreading codes (in-phase (I) and quadrature (Q) sequences) in a pilot spreading code signal may be used rather than transmitting real valued sequences. Two or more separate spreading codes may be transmitted over the complex channels. If the codes have different phases, an acquisition may be done by acquisition circuits in parallel over the different spreading codes when the relative phase shift between the two or more code channels is known. For example, for two spreading codes, one can be sent on an in phase (I) channel and one on the quadrature (Q) channel. To search the spreading codes, the acquisition detection means searches the two channels, but begins the Q channel with an offset equal to one-half of the spreading code length. With code length of N, the acquisition means starts the search at N/2 on the Q channel. The average number of tests to find acquisition is N/2 for a single code search, but searching the I and phase delayed Q channel in parallel reduces the average number of tests to N/4. The codes sent on each channel could be the same code, the same code with one channel's code phase delayed or different spreading codes.

VI. Epoch and Sub-epoch Structures

The long complex spreading codes used for the exemplary system of the present invention have a number of chips after which the code repeats. The repetition period of the spreading code is called an epoch. To map the logical channels to CDMA spreading codes, the present invention uses an epoch and sub-epoch structure. The code period for the CDMA spreading code to modulate logical channels is 29877120 chips/code period, which is the same number of chips for all bandwidths. The code period is the epoch of the present invention, and Table 3 below defines the epoch duration for the supported chip rates. In addition, two sub-epochs are defined over the spreading code epoch and are 233415 chips and 128 chips long.

The 233415 chip sub-epoch is referred to as a long sub-epoch, and is used for synchronizing events on the RF communication interface such as encryption key switching and changing from global to assigned codes. The 128 chip short epoch is defined for use as an additional timing reference. The highest symbol rate used with a single CDMA code is 64 ksym/s. There is always an integer number of chips in a symbol duration for the supported symbol rates 64, 32, 16, and 8 ksym/s.

TABLE 3

Bandwidths, Chip Rates, and Epochs

| Bandwidth (MHz) | Chip Rate, Complex (Mchip/sec) | number of chips in a 64 kbit/sec symbol | 128 chip sub-epoch duration* (ms) | 233415 chip sub-epoch duration* (ms) | Epoch duration (sec) |
|---|---|---|---|---|---|
| 7 | 5.824 | 91 | 21.978 | 40.078 | 5.130 |
| 10 | 8.320 | 130 | 15.385 | 28.055 | 3.591 |
| 10.5 | 8.512 | 133 | 15.038 | 27.422 | 3.510 |
| 14 | 11.648 | 182 | 10.989 | 20.039 | 2.565 |
| 15 | 12.480 | 195 | 10.256 | 18.703 | 2.394 |

*numbers in these columns are rounded to 5 digits.

VII. Mapping of the Logical Channels to Epochs and Sub-epochs

The complex spreading codes are designed such that the beginning of the code epoch coincides with the beginning of a symbol for all of the bandwidths supported. The present invention supports bandwidths of 7, 10, 10.5, 14, and 15 MHz. Assuming nominal 20% roll-off, these bandwidths correspond to the following chip rates in Table 4.

TABLE 4

Supported Bandwidths and Chip Rates for CDMA.

| BW (MHz) | $R_c$ (Complex Mchips/sec) | Excess BW, % | L:($R_c$/L) = 64k | Factorization of L |
|---|---|---|---|---|
| 7 | 5.824 | 20.19 | 91 | 7 × 13 |
| 10 | 8.320 | 20.19 | 130 | 2 × 5 × 13 |
| 10.5 | 8.512 | 23.36 | 133 | 7 × 19 |
| 14 | 11.648 | 20.19 | 182 | 2 × 7 × 13 |
| 15 | 12.480 | 20.19 | 195 | 3 × 5 × 13 |

The number of chips in an epoch is:

$$N=29877120=2^7 \times 3^3 \times 5 \times 7 \times 13 \times 19 \quad \text{Equation (6)}$$

If interleaving is used, the beginning of an interleaver period coincides with the beginning of the sequence epoch.

The spreading sequences generated using the method of the present invention can support interleaver periods that are multiples of 1.5 ms for various bandwidths.

Figure 2A:
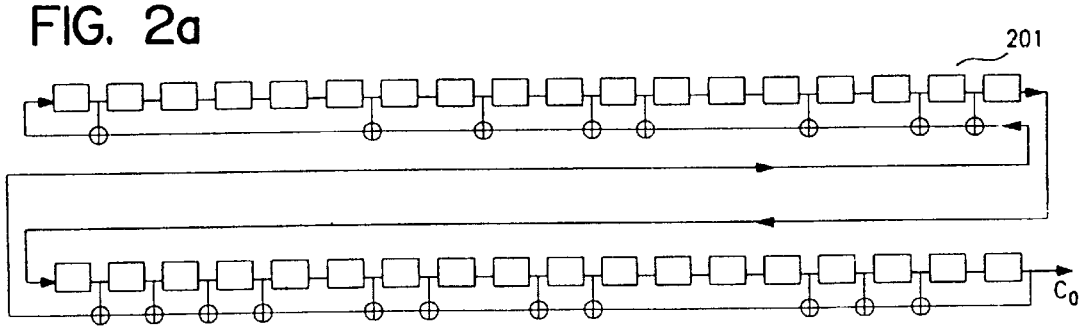
FIG. 2a is a block diagram of a 36 stage linear shift register suitable for use with long spreading code of the code generator of the present invention.
Figure 2B:
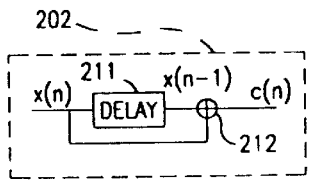
FIG. 2b is a block diagram of circuitry which illustrates the feed-forward operation of the code generator.
Figure 2C:
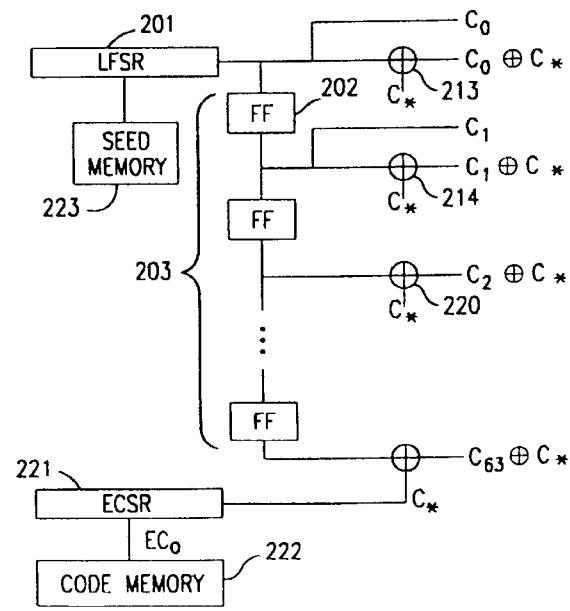
FIG. 2c is a block diagram of an exemplary code generator of the present invention including circuitry for generating spreading codes from the long spreading codes and the short spreading codes.

Cyclic sequences of the prior art are generated using LFSR circuits. However, this method does not generate sequences of even length. One embodiment of the spreading code generator using the code seeds generated previously is shown in FIG. 2a, FIG. 2b, and FIG. 2c. The present invention uses a 36 stage LFSR 201 to generate a sequence of period N'=233415=$3^3$×5×7×13×19, which is $C_o$ in FIG. 2a. In FIGS. 2a, 2b, and 2c, the symbol ⊕ represents a binary addition (EXCLUSIVE-OR). A spreading code generator designed as above generates the in-phase and quadrature parts of a set of complex sequences. The tap connections and initial state of the 36 stage LFSR determine the sequence generated by this circuit. The tap coefficients of the 36 stage LFSR are determined such that the resulting sequences have the period 233415. Note that the tap connections shown in FIG. 2a correspond to the polynomial given in Equation (2). Each resulting sequence is then overlaid by binary addition with the 128 length sequence $C_*$ to obtain the epoch period 29877120.

FIG. 2b shows a feed forward (FF) circuit 202 which is used in the code generator. The signal X[n−1] is output of the chip delay 211, and the input of the chip delay 211 is X[n]. The code chip C[n] is formed by the logical adder 212 from the input X[n] and X[n−1]. FIG. 2c shows the complete spreading code generator. From the LFSR 201, output signals go through a chain of up to 63 single stage FFs 203 cascaded as shown. The output of each FF is overlaid with the short, even code sequence C. period 128=$2^7$ which is stored in code memory 222 and which exhibits spectral characteristics of a pseudorandom sequence to obtain the epoch N=29877120. This sequence of 128 is determined by using an m-sequence (PN sequence) of length 127=$2^7$−1 and adding a bit-value, such as logic 0, to the sequence to increase the length to 128 chips. The even code sequence $C_*$ is input to the even code shift register 221, which is a cyclic register, that continually outputs the sequence. The short sequence is then combined with the long sequence using an EXCLUSIVE-OR operation 213, 214, 220.

Figure 2D:
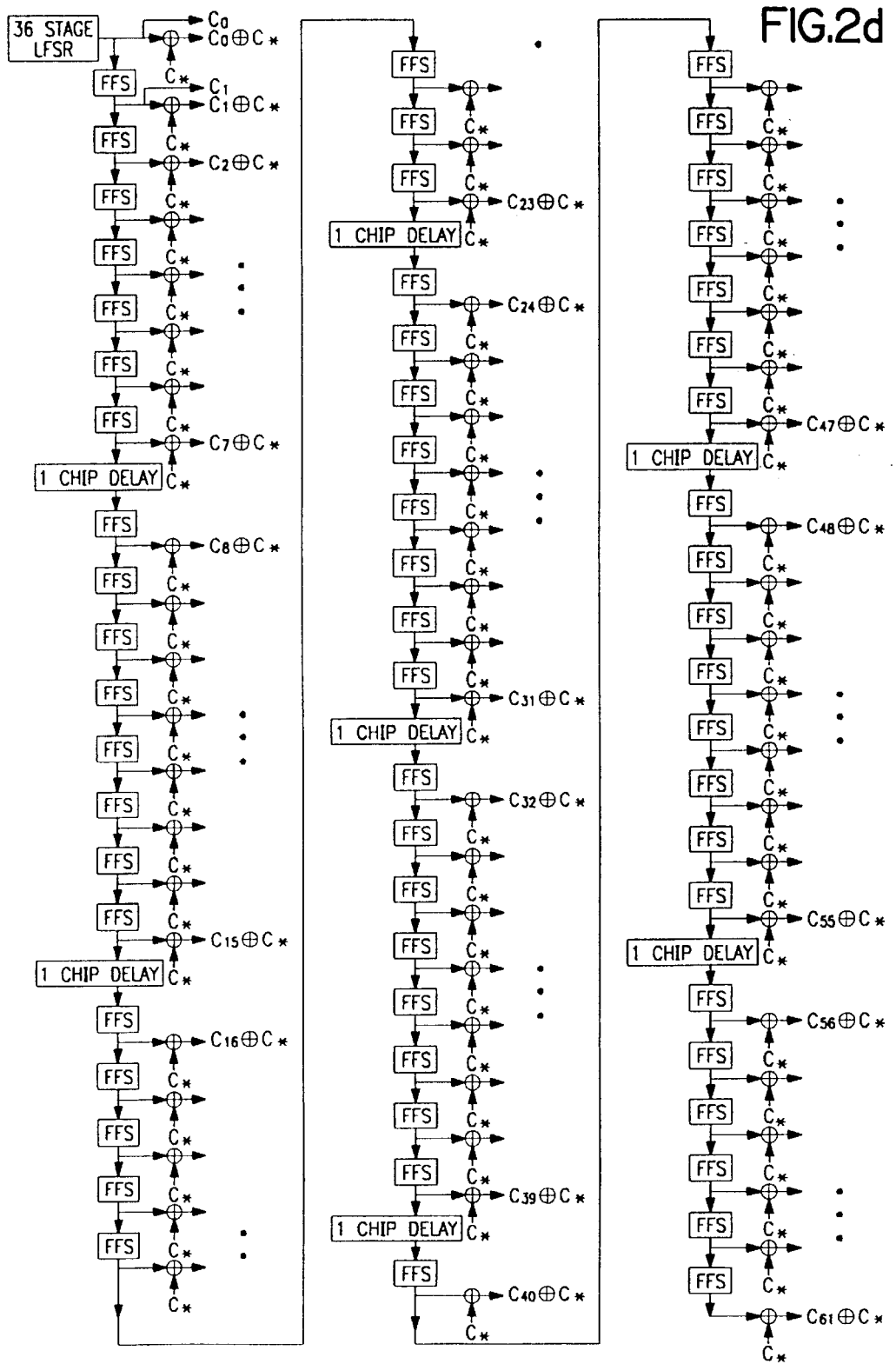
FIG. 2d is an alternate embodiment of the code generator circuit including delay elements to compensate for electrical circuit delays.

As shown in FIG. 2c, up to 63 spreading codes $C_o$ through $C_{63}$ are generated by tapping the output signals of FFs 203 and logically adding the short sequence $C_*$ in binary adders 213, 214, and 220, for example. One skilled in the art would realize that the implementation of FF 203 will create a cumulative delay effect for the spreading codes produced at each FF stage in the chain. This delay is due to the nonzero electrical delay in the electronic components of the implementation. The timing problems associated with the delay can be mitigated by inserting additional delay elements into the FF chain in one version of the embodiment of the invention. The FF chain of FIG. 2c with additional delay elements is shown in FIG. 2d.

The code-generators in the exemplary embodiment of the present invention are configured to generate either global codes or assigned codes. Global codes are CDMA codes that can be received or transmitted by all users of the system. Assigned codes are CDMA codes that are allocated for a particular connection. When a set of spreading codes are generated from the same generator as described, only the seed of the 36 stage LFSR is specified to generate a family of spreading codes. Spreading codes for all of the global codes are generated using the same LFSR circuit. Therefore, once an SU has synchronized to the global pilot signal from an RCS and knows the seed for the LFSR circuit for the global channel codes, it can generate not only the pilot spreading code but also all other global codes used by the RCS.

The signal that is upconverted to RF is generated as follows. The output signals of the above shift register circuits are converted to an antipodal sequence (0 maps into +1, 1 maps into −1). The logical channels are initially converted to QPSK signals, which are mapped as constellation points as is well known in the art. The in-phase and quadrature channels of each QPSK signal form the real and imaginary parts of the complex data value. Similarly, two spreading codes are used to form complex spreading chip values. The complex data are spread by being multiplied by the complex spreading code. Similarly, the received complex data is correlated with the conjugate of the complex spreading code to recover despread data.

VIII. Short Codes

Short codes are used for the initial ramp-up process when a SU accesses an RCS. The period of the short codes is equal to the symbol duration and the start of each period is aligned with a symbol boundary. Both SU and RCS derive the real and imaginary parts of the short codes from the last eight feed-forward sections of the code generator producing the global codes for that cell.

The short codes that are in use in the exemplary embodiment of the invention are updated every 3 ms. Other update times that are consistent with the symbol rate may be used. Therefore, a change-over occurs every 3 ms starting from the epoch boundary. At a change-over, the next symbol length portion of the corresponding feed-forward output becomes the short code. When the SU needs to use a particular short code, it waits until the first 3 ms boundary of the next epoch and stores the next symbol length portion output from the corresponding FF section. This shall be used as the short code until the next change- over, which occurs 3 ms later.

The signals represented by these short codes are known as short access channel pilots (SAXPTs).

IX. Mapping of Logical Channels to Spreading Codes

The exact relationship between the spreading codes and the CDMA logical channels and pilot signals is documented in Table 5a and Table 5b. Those signal names ending in '-CH' correspond to logical channels. Those signal names ending in '-PT' correspond to pilot signals, which are described in detail below.

TABLE 5a

Spreading code sequences and global CDMA codes

| Sequence | Quadrature | Logical Channel or Pilot Signal | Direction |
| --- | --- | --- | --- |
| $C_0$ | I | FBCH | Forward(F) |
| $C_1$ | Q | FBCH | F |
| $C_2 \oplus C^*$ | I | GLPT | F |
| $C_3 \oplus C^*$ | Q | GLPT | F |
| $C_4 \oplus C^*$ | I | SBCH | F |
| $C_5 \oplus C^*$ | Q | SBCH | F |
| $C_6 \oplus C^*$ | I | CTCH(0) | F |
| $C_7 \oplus C^*$ | Q | CTCH(0) | F |
| $C_8 \oplus C^*$ | I | APCH(1) | F |
| $C_9 \oplus C^*$ | Q | APCH(1) | F |
| $C_{10} \oplus C^*$ | I | CTCH(1) | F |
| $C_{11} \oplus C^*$ | Q | CTCH(1) | F |
| $C_{12} \oplus C^*$ | I | APCH(1) | F |
| $C_{13} \oplus C^*$ | Q | APCH(1) | F |
| $C_{14} \oplus C^*$ | I | CTCH(2) | F |
| $C_{15} \oplus C^*$ | Q | CTCH(2) | F |
| $C_{16} \oplus C^*$ | I | APCH(2) | F |
| $C_{17} \oplus C^*$ | Q | APCH(2) | F |
| $C_{18} \oplus C^*$ | I | CTCH(3) | F |
| $C_{19} \oplus C^*$ | Q | CTCH(3) | F |
| $C_{20} \oplus C^*$ | I | APCH(3) | F |

TABLE 5a-continued

Spreading code sequences and global CDMA codes

| Sequence | Quadrature | Logical Channel or Pilot Signal | Direction |
|---|---|---|---|
| $C_{21} \oplus C*$ | Q | APCH(3) | F |
| $C_{22} \oplus C*$ | I | reserved | — |
| $C_{23} \oplus C*$ | Q | reserved | — |
| ... | ... | ... | ... |
| ... | ... | ... | ... |
| $C_{40} \oplus C*$ | I | reserved | — |
| $C_{41} \oplus C*$ | Q | reserved | — |
| $C_{42} \oplus C*$ | I | AXCH(3) | Reverse(R) |
| $C_{43} \oplus C*$ | Q | AXCH(3) | R |
| $C_{44} \oplus C*$ | I | LAXPT(3) SAXPT(3) seed | R |
| $C_{45} \oplus C*$ | Q | LAXPT(3) SAXPT(3) seed | R |
| $C_{46} \oplus C*$ | I | AXCH(2) | R |
| $C_{47} \oplus C*$ | Q | AXCH(2) | R |
| $C_{48} \oplus C*$ | I | LAXPT(2) SAXPT(2) seed | R |
| $C_{49} \oplus C*$ | Q | LAXPT(2) SAXPT(2) seed | R |
| $C_{50} \oplus C*$ | I | AXCH(1) | R |
| $C_{51} \oplus C*$ | Q | AXCH(1) | R |
| $C_{52} \oplus C*$ | I | LAXPT(1) SAXPT(1) seed | R |
| $C_{53} \oplus C*$ | Q | LAXPT(1) SAXPT(1) seed | R |
| $C_{54} \oplus C*$ | I | AXCH(0) | R |
| $C_{55} \oplus C*$ | Q | AXCH(0) | R |
| $C_{56} \oplus C*$ | I | LAXPT(0) SAXPT(0) seed | R |
| $C_{57} \oplus C*$ | Q | LAXPT(0) SAXPT(0) seed | R |
| $C_{58} \oplus C*$ | I | IDLE | — |
| $C_{59} \oplus C*$ | Q | IDLE | — |
| $C_{60} \oplus C*$ | I | AUX | R |
| $C_{61} \oplus C*$ | Q | AUX | R |
| $C_{62} \oplus C*$ | I | reserved | — |
| $C_{63} \oplus C*$ | Q | reserved | — |

TABLE 5b

Spreading code sequences and assigned CDMA codes.

| Sequence | Quadrature | Logical Channel or Pilot Signal | Direction |
|---|---|---|---|
| $C_0 \oplus C*$ | I | ASPT | Reverse(R) |
| $C_1 \oplus C*$ | Q | ASPT | R |
| $C_2 \oplus C*$ | I | APCH | R |
| $C_3 \oplus C*$ | Q | APCH | R |
| $C_4 \oplus C*$ | I | OWCH | R |
| $C_5 \oplus C*$ | Q | OWCH | R |
| $C_6 \oplus C*$ | I | TRCH(0) | R |
| $C_7 \oplus C*$ | Q | TRCH(0) | R |
| $C_8 \oplus C*$ | I | TRCH(1) | R |
| $C_9 \oplus C*$ | Q | TRCH(1) | R |
| $C_{10} \oplus C*$ | I | TRCH(2) | R |
| $C_{11} \oplus C*$ | Q | TRCH(2) | R |
| $C_{12} \oplus C*$ | I | TRCH(3) | R |
| $C_{13} \oplus C*$ | Q | TRCH(3) | R |
| $C_{14} \oplus C*$ | I | reserved | — |
| $C_{15} \oplus C*$ | Q | reserved | — |
| ... | ... | ... | ... |
| ... | ... | ... | ... |
| $C_{44} \oplus C*$ | I | reserved | — |
| $C_{45} \oplus C*$ | Q | reserved | — |
| $C_{46} \oplus C*$ | I | TRCH(3) | Forward(F) |
| $C_{47} \oplus C*$ | Q | TRCH(3) | F |
| $C_{48} \oplus C*$ | I | TRCH(2) | F |
| $C_{49} \oplus C*$ | Q | TRCH(2) | F |
| $C_{50} \oplus C*$ | I | TRCH(1) | F |
| $C_{51} \oplus C*$ | Q | TRCH(1) | F |

TABLE 5b-continued

Spreading code sequences and assigned CDMA codes.

| Sequence | Quadrature | Logical Channel or Pilot Signal | Direction |
|---|---|---|---|
| $C_{52} \oplus C*$ | I | TRCH(0) | F |
| $C_{53} \oplus C*$ | Q | TRCH(0) | F |
| $C_{54} \oplus C*$ | I | OWCH | F |
| $C_{55} \oplus C*$ | Q | OWCH | F |
| $C_{56} \oplus C*$ | I | APCH | F |
| $C_{57} \oplus C*$ | Q | APCH | F |
| $C_{58} \oplus C*$ | I | IDLE | — |
| $C_{59} \oplus C*$ | Q | IDLE | — |
| $C_{60} \oplus C*$ | I | reserved | — |
| $C_{61} \oplus C*$ | Q | reserved | — |
| $C_{62} \oplus C*$ | I | reserved | — |
| $C_{63} \oplus C*$ | Q | reserved | — |

For global codes, the seed values for the 36 bit shift register are chosen to avoid using the same code, or any cyclic shift of the same code, within the same geographical area to prevent ambiguity or harmful interference. No assigned code is equal to, or a cyclic shift of, a global code.

X. Pilot Signals

The pilot signals are used for synchronization, carrier phase recovery and for estimating the impulse response of the radio channel. The RCS 104 transmits a forward link pilot carrier reference as a complex pilot code sequence to provide time and phase reference for all SUs 111, 112, 115, 117 and 118 in its service area. The power level of the global pilot (GLPT) signal is set to provide adequate coverage over the whole RCS service area, which area depends on the cell size. With only one pilot signal in the forward link, the reduction in system capacity due to the pilot energy is negligible.

The SUs 111, 112, 115, 117 and 118 each transmit a pilot carrier reference as a quadrature modulated (complex-valued) pilot spreading code sequence to provide a time and phase reference to the RCS for the reverse link. The pilot signal transmitted by the SU of one embodiment of the invention is 6 dB lower than the power of the 32 kbs POTS traffic channel. The reverse pilot channel is subject to APC. The reverse link pilot associated with a particular connection is called the assigned pilot (ASPT). In addition, there are pilot signals associated with access channels. These are called the long access channel pilots (LAXPTs). Short access channel pilots (SAXPTs) are also associated with the access channels and used for spreading code acquisition and initial power ramp-up. All pilot signals are formed from complex codes, as defined below:

$$\text{GLPT (forward)} = \{C_2 \oplus C_* ) + j \cdot (C_3 \oplus C_*)\} \cdot \{(1) + j \cdot (0)\}$$

$$\{\text{ Complex Code }\} \cdot \{\text{ Carrier }\}$$

Figure 3A:
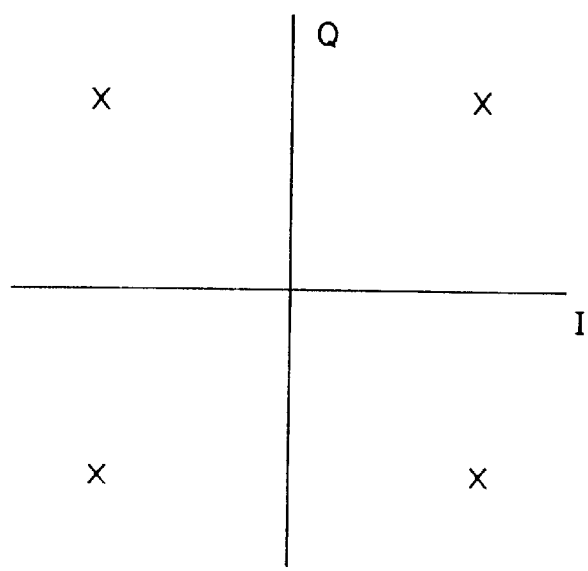
FIG. 3a is a graph of the constellation points of the pilot spreading code QPSK signal.
Figure 3B:
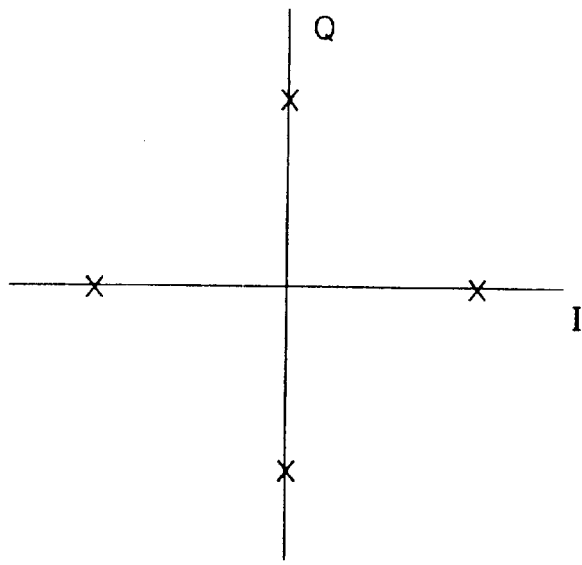
FIG. 3b is a graph of the constellation points of the message channel QPSK signal.

The complex pilot signals are de-spread by multiplication with conjugate spreading codes: $\{(C_2 \oplus C.) - j \cdot (C_3 \oplus C.)\}$. By contrast, traffic channels are of the form:

$$\text{TRCH}_n \text{ (forward/reverse)} = \{(C_k \oplus C_*) + j \cdot (C_1 \oplus C_*)\} \cdot \{(\pm 1) + j(\pm 1)\}$$

$$\{\text{ Complex Codes }\} \cdot \{\text{ Data Symbol }\}$$

which thus form a constellation set at $$\frac{\pi}{4}$$

radians with respect to the pilot signal constellations. The GLPT constellation is shown in FIG. 3a, and the TRCH, traffic channel constellation is shown in FIG. 3b.

XI. Logical Channel Assignment of the FBCH, SBCH, and Traffic Channels

The FBCH is a global forward link channel used to broadcast dynamic information about the availability of services and AXCHs. Messages are sent continuously over this channel, and each message lasts approximately 1 ms. The FBCH message is 16 bits long, repeated continuously, and is epoch aligned. The FBCH is formatted as defined in Table 6.

TABLE 6

FBCH format

| Bit | Definition |
| --- | --- |
| 0 | Traffic Light 0 |
| 1 | Traffic Light 1 |
| 2 | Traffic Light 2 |
| 3 | Traffic Light 3 |
| 4–7 | service indicator bits |
| 8 | Traffic Light 0 |
| 9 | Traffic Light 1 |
| 10 | Traffic Light 2 |
| 11 | Traffic Light 3 |
| 12–15 | service indicator bits |

For the FBCH, bit 0 is transmitted first. As used in Table 6, a traffic light corresponds to an access channel (AXCH) and indicates whether the particular access channel is currently in use (a red) or not in use (a green). A logic '1' indicates that the traffic light is green, and a logic '0' indicates the traffic light is red. The values of the traffic light bits may change from octet to octet and each 16 bit message contains distinct service indicator bits which describe the types of services that are available for the AXCHs.

One embodiment of the present invention uses service indicator bits as follows to indicate the availability of services or AXCHs. The service indicator bits {4,5,6,7,12, 13,14,15 } taken together may be an unsigned binary number, with bit 4 as the MSB and bit 15 as the LSB. Each service type increment has an associated nominal measure of the capacity required, and the FBCH continuously broadcasts the available capacity. This is scaled to have a maximum value equivalent to the largest single service increment possible. When a SU requires a new service or an increase in the number of bearers it compares the capacity required to that indicated by the FBCH and then considers itself blocked if the capacity is not available. The FBCH and the traffic channels are aligned to the epoch.

Slow broadcast information frames contain system or other general information that is available to all SUs and paging information frames contain information about call requests for particular SUs. Slow broadcast information frames and paging information frames are multiplexed together on a single logical channel which forms the slow broadcast channel (SBCH). As previously defined, the code epoch is a sequence of 29,877,120 chips having an epoch duration which is a function of the chip rate defined in Table 7 below. In order to facilitate power saving, the channel is divided into N "Sleep" cycles, and each cycle is subdivided into M slots, which are 19 ms long, except for 10.5 Mhz bandwidth which has slots of 18 ms.

TABLE 7

SBCH Channel Format Outline

| Bandwidth (MHz) | Spreading Code Rate (MHz) | Epoch Length (ms) | Cycles/ Epoch N | Cycle Length (ms) | Slots/ Cycle M | Slot Length (ms) |
| --- | --- | --- | --- | --- | --- | --- |
| 7.0 | 5.824 | 5130 | 5 | 1026 | 54 | 19 |
| 10.0 | 8.320 | 3591 | 3 | 1197 | 63 | 19 |
| 10.5 | 8.512 | 3510 | 3 | 1170 | 65 | 18 |
| 14.0 | 11.648 | 2565 | 3 | 855 | 45 | 19 |
| 15.0 | 12.480 | 2394 | 2 | 1197 | 63 | 19 |

Sleep cycle slot #1 is always used for slow broadcast information. Slots #2 to #M−1 are used for paging groups unless extended slow broadcast information is inserted. The pattern of cycles and slots in one embodiment of the present invention run continuously at 16 kbs.

Within each sleep cycle the SU powers-up the receiver and re-acquires the pilot code. It then achieves carrier lock to a sufficient precision for satisfactory demodulation and Viterbi decoding. The settling time to achieve carrier lock may be up to 3 slots in duration. For example, an SU assigned to Slot #7 powers up the receiver at the start of slot #4. Having monitored its slot the SU will have either recognized its paging address and initiated an access request, or failed to recognize its paging address in which case it reverts to the sleep mode. Table 8 shows duty cycles for the different bandwidths, assuming a wake-up duration of 3 slots.

TABLE 8

Sleep-Cycle Power Saving

| Bandwidth (MHz) | Slots/Cycle | Duty Cycle |
| --- | --- | --- |
| 7.0 | 54 | 7.4% |
| 10.0 | 63 | 6.3% |
| 10.5 | 65 | 6.2% |
| 14.0 | 45 | 8.9% |
| 15.0 | 63 | 6.3% |

XII. Spreading code Tracking and AMF Detection in Multipath Channels

Three CDMA spreading code tracking methods in multipath fading environments are described which track the code phase of a received multipath spread-spectrum signal. The first is the prior art tracking circuit which simply tracks the spreading code phase with the highest detector output signal value, the second is a tracking circuit that tracks the median value of the code phase of the group of multipath signals, and the third is the centroid tracking circuit which tracks the code-phase of an optimized, least mean squared weighted average of the multipath signal components. The following describes the algorithms by which the spreading code phase of the received CDMA signal is tracked.

A tracking circuit has operating characteristics that reveal the relationship between the time error and the control voltage that drives a voltage controlled oscillator (VCO) of a spreading code phase tracking circuit. When there is a positive timing error, the tracking circuit generates a negative control voltage to offset the timing error. When there is a negative timing error, the tracking circuit generates a positive control voltage to offset the timing error. When the tracking circuit generates a zero value, this value corresponds to the perfect time alignment called the 'lock-point'.

Figure 3C:
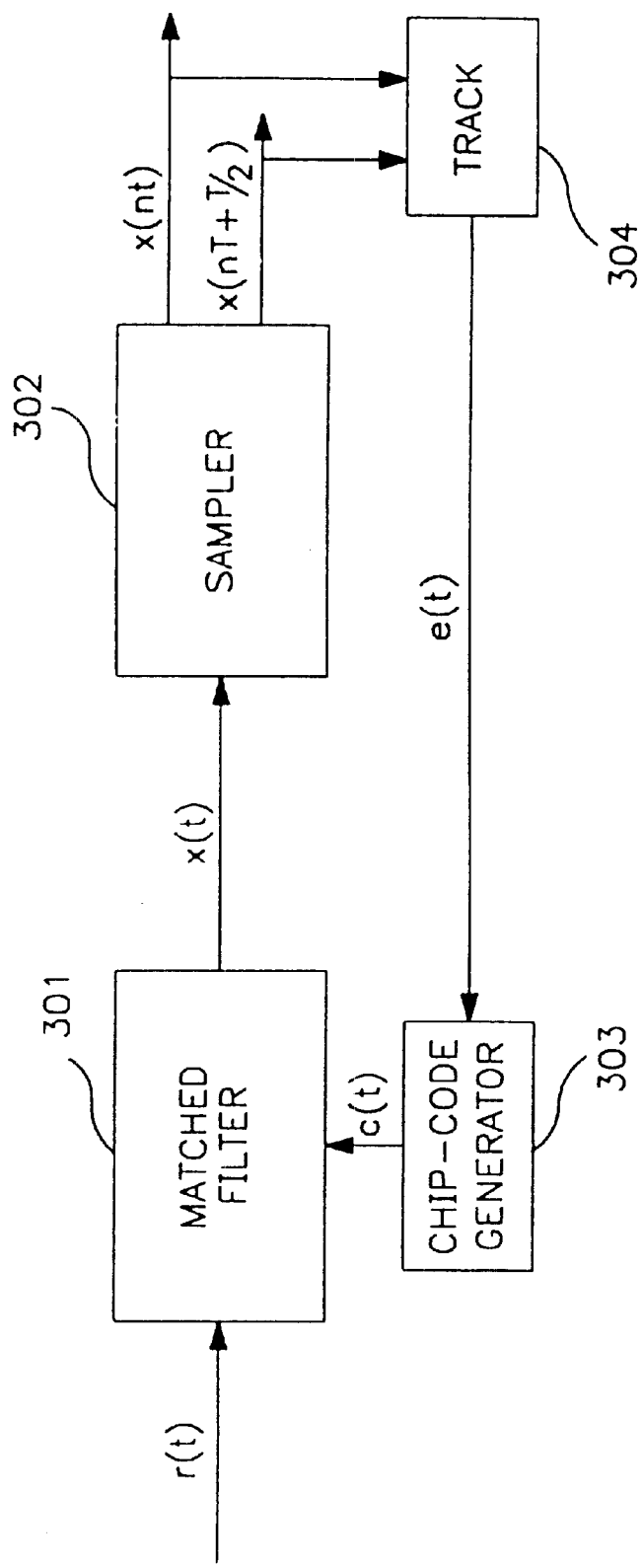
FIG. 3c is a block diagram of exemplary circuitry which implements the method of tracking the received spreading code phase of the present invention.

FIG. 3c shows the basic tracking circuit. Received signal r(t) is applied to matched filter 301, which correlates r(t) with a local code-sequence c(t) generated by code generator 303. The output signal of the matched filter x(t) is sampled at the sampler 302 to produce samples x[nT] and x[nT+T/2]. The samples x[nT] and x[nT+T/2] are used by a tracking circuit 304 to determine if the phase of the spreading code c(t) of the code generator 303 is correct. The tracking circuit 304 produces an error signal e(t) as an input to the code generator 303. The code generator 303 uses this signal e(t) as an input signal to adjust the code-phase it generates.

In a CDMA system, the signal transmitted by the reference user is written in the low-pass representation as:

$$s(t) = \sum_{k=-\infty}^{\infty} C_k P_{Tc}(t - kT_c) \quad \text{Equation (7)}$$

where $c_k$ represents the spreading code coefficients, $P_{Tc}(t)$ represents the spreading code chip waveform and $T_c$ is the chip duration. Assuming that the reference user is not transmitting data so that only the spreading code modulates the carrier. Referring to FIG. 3c, the received signal is:

$$r(t) = \sum_{i=1}^{M} a_i s(t - \tau_i) \quad \text{Equation (8)}$$

Here, $a_i$ is due to fading effect of the multipath channel on the i-th path and $\tau_i$ is the random time delay associated with the same path. The receiver passes the received signal through a matched filter, which is implemented as a correlation receiver and is described below. This operation is done in two steps: first the signal is passed through a chip matched filter and sampled to recover the spreading code chip values; then this spreading code is correlated with the locally generated spreading code.

FIG. 3c shows the chip matched filter 301, matched to the chip waveform $P_{Tc}(t)$, and the sampler 302. Ideally, the signal x(t) at the output terminal of the chip matched filter 301 is:

$$x(t) = \sum_{i=k}^{M} \sum_{k=-\infty}^{\infty} a_i c_k g(t - \tau_i - kT_c) \quad \text{Equation (9)}$$

where:

$$g(t) = P_{Tc}(t) * h_R(t) \quad \text{Equation (10)}$$

M is the number of multipath components. Here, $h_R(t)$ is the impulse response of the chip matched filter 301 and '*' denotes convolution. The order of the summations can be rewritten as:

$$x(t) = \sum_{k=-8}^{\infty} c_k f(t - kT_c) \quad \text{Equation (11)}$$

where:

$$f(t) = \sum_{i=1}^{M} a_i g(t - \tau_i) \quad \text{Equation (12)}$$

In the multipath channel described above, the sampler 302 samples the output signal of the chip matched filter 301 to produce x(nT) at the maximum power level points of g(t). In practice, however, the waveform g(t) is severely distorted because of the effect of the multipath signal reception, and a perfect time alignment of the signals is not available.

When the multipath distortion in the channel is negligible and a perfect estimate of the timing is available, i.e., $a_1=1$, $t_1=0$, and $a_i=0$, i=2, ..., M, the received signal is r(t)=s(t). Then, with this ideal channel model, the output of the chip matched filter becomes:

$$x(t) = \sum_{k=-\infty}^{\infty} c_k g(t - kT_c) \quad \text{Equation (13)}$$

When there is multipath fading, however, the received spreading code waveform is distorted, and has a number of local maxima that can change from one sampling interval to another depending on the channel characteristics. For multipath fading channels with quickly changing channel characteristics, it is not practical to try to locate the maximum of the waveform(t) in every chip period interval. Instead, a time reference may be obtained from the characteristics of f(t) that may not change as quickly. Three tracking methods are described based on different characteristics of f(t).

XIII. Prior Art Spreading Code Tracking Method

Prior art tracking methods include a code tracking circuit in which the receiver attempts to determine the timing of the maximum matched filter output value of the chip waveform occurs and samples the signal accordingly. However, in multipath fading channels, the receiver despread code waveform can have a number of local maxima, especially in a mobile environment. In the following, f(t) represents the received signal waveform of the spreading code chip convolved with the channel impulse response. The frequency response characteristic of f(t) and the maximum of this characteristic can change rather quickly making it impractical to track the maximum off(t).

Define $\tau$ to be the time estimate that the tracking circuit calculates during a particular sampling interval. Also, define the following error function as:

$$\varepsilon \begin{cases} \int_{\{t:|\tau-t|>\delta\}} f(t)dt & |\tau - t| > \delta \\ \varepsilon = 0 & |\tau - t| < \delta \end{cases} \quad \text{Equation (14)}$$

The tracking circuits of the prior art calculate a value of the input signal that minimizes the error $\epsilon$. One can write:

$$\min \varepsilon = 1 - \max_\tau \int_{\tau-\delta}^{\tau+\delta} f(t) \quad \text{Equation (15)}$$

Assuming $f(\tau)$ has a smooth shape in the values given, the value of $\tau$ for which $f(\tau)$ is maximum minimizes the error $\epsilon$, so the tracking circuit tracks the maximum point of f(t).

XIV. Median Weighted Value Tracking Method

The median weighted tracking method of one embodiment of the present invention, minimizes the absolute weighted error, defined as:

$$\varepsilon = \int_{-\infty}^{\infty} |t - \tau| f(t) dt \quad \text{Equation (16)}$$

This tracking method calculates the 'median' signal value of $f(\tau)$ by collecting information from all paths, where $f(\tau)$ is as in Equation 12. In a multipath fading environment, the waveform f(τ) can have multiple local maxima, but only one median. To minimize ε, the derivative of Equation (16) is taken with respect to τ and the result is equated to zero, which provides:

$$\int_{-\infty}^{\tau} f(t)\,dt = \int_{\tau}^{\infty} f(t)\,dt \qquad \text{Equation (17)}$$

The value of τ that satisfies Equation (17) is called the 'median' of f(t). Therefore, the median tracking method of the present embodiment tracks the median of f(t).

Figure 4:
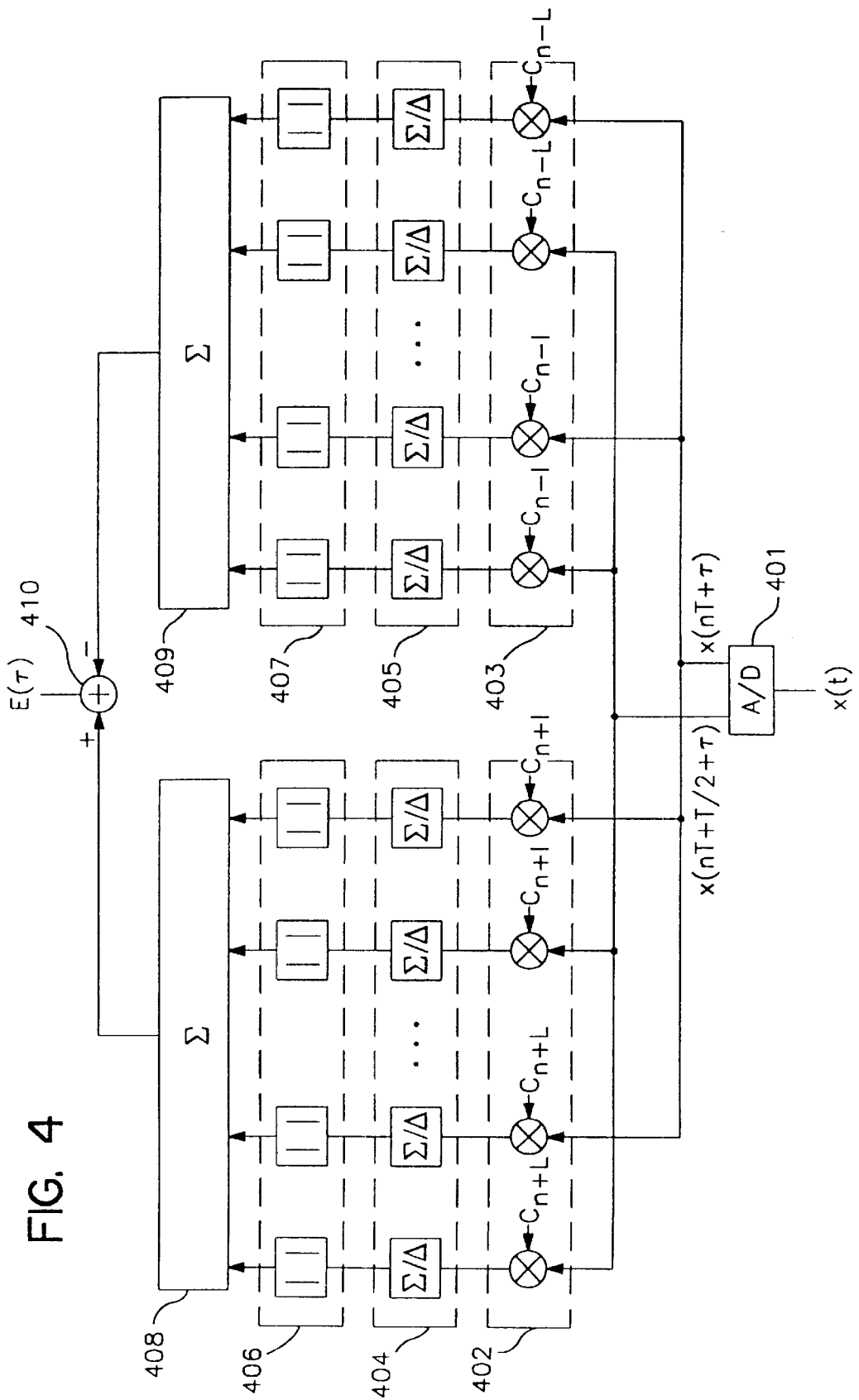
FIG. 4 is a block diagram of the tracking circuit that tracks the median of the received multipath signal components.

FIG. 4 shows an implementation of the tracking circuit based on minimizing the absolute weighted error defined above. The signal x(t) and its one-half chip offset version x(t+T/2) are sampled by the A/D 401 at a rate 1/T. The following Equation determines the operating characteristic of the circuit in FIG. 4:

$$\varepsilon\tau = \sum_{n=1}^{2L} |f(\tau - nT/2)| - |f(\tau + nT/2)| \qquad \text{Equation (18)}$$

Tracking the median of a group of multipath signals keeps the received energy of the multipath signal components substantially equal on the early and late sides of the median point of the correct locally generated spreading code phase $c_n$. The tracking circuit consists of an A/D 401 which samples an input signal x(t) to form the half-chip offset samples. The half chip offset samples are grouped into an early set of samples and a late set of samples. The first correlation bank adaptive matched filter 402 multiplies each early sample by the spreading code phases c(n+1), c(n+2), ..., c(n+L), where L is small compared to the code length and approximately equal to half the number of chips of delay between the earliest and latest multipath signal. The output of each correlator is applied to a respective first sum-and-dump bank 404. The magnitudes of the output values of the L sum-and-dumps are calculated in the calculator 406 and then summed in summer 408 to give an output value proportional to the signal energy in the early multipath signals. Similarly, a second correlation bank adaptive matched filter 403 operates on the late samples, using code phases c(n−1), c(n−2), ..., c(n−L), and each output signal is applied to a respective sum-and-dump circuit in an integrator 405. The magnitudes of the L sum-and-dump output signals are calculated in calculator 407 and then summed in summer 409 to give a value for the late multipath signal energy. Finally, the subtractor 410 calculates the difference and produces error signal ε(t) of the early and late signal energy values.

The tracking circuit adjusts by means of error signal ε(t) the locally generated code phases c(t) to cause the difference between the early and late values to tend toward 0.

XV. Centroid Tracking Method

The optimal spreading code tracking circuit of one embodiment of the present invention is called the squared weighted tracking (or centroid) circuit. Defining t to denote the time estimate that the tracking circuit calculates, based on some characteristic of f(t), the centroid tracking circuit minimizes the squared weighted error defined as:

$$\varepsilon = \int_{-\infty}^{\infty} |t - \tau|^2 f(t)\,dt \qquad \text{Equation (19)}$$

This function inside the integral has a quadratic form, which has a unique minimum. The z value of t that minimizes e can be found by taking the derivative of the above Equation 19 with respect to t and equating to zero, which gives:

$$\int_{-\infty}^{\infty} (-2t + 2\tau) f(t)\,dt = 0 \qquad \text{Equation (20)}$$

Therefore, the value of t that satisfies Equation (21) is:

$$\tau - \frac{1}{\beta} \int_{-\infty}^{\infty} t f(t)\,dt = 0 \qquad \text{Equation (21)}$$

is the timing estimate that the tracking circuit calculates, where β is a constant value.

Figure 5A:
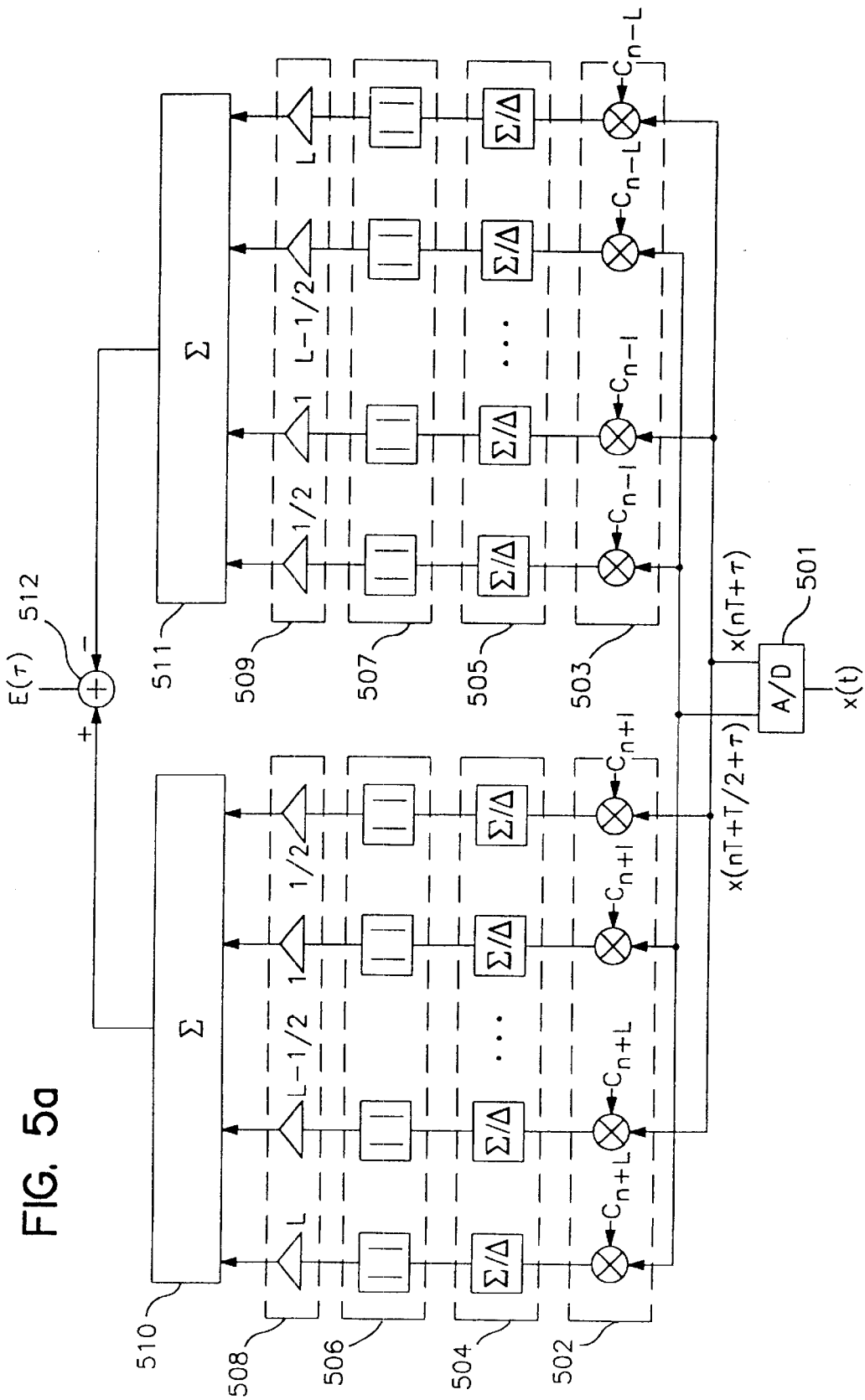
FIG. 5a is a block diagram of the tracking circuit that tracks the centroid of the received multipath signal components.

Based on these observations, a realization of an exemplary tracking circuit which minimizes the squared weighted error is shown in FIG. 5a. The following Equation determines the error signal e(t) of the centroid tracking circuit:

$$\varepsilon(\tau) = \sum_{n=1}^{2L} n[|f(\tau - nT/2)| - |f(\tau + nT/2)|] = 0 \qquad \text{Equation (22)}$$

The value that satisfies ε(t)=0 is the perfect estimate of the timing.

The early and late multipath signal energy on each side of the centroid point are equal. The centroid tracking circuit shown in FIG. 5a consists of an A/D converter 501 which samples an input signal x(t) to form the half-chip offset samples. The half chip offset samples are grouped as an early set of samples and a late set of samples. The first correlation bank adaptive matched filter 502 multiplies each early sample and each late sample by the positive spreading code phases c(n+1), c(n+2), ..., c(n+L), where L is small compared to the code length and approximately equal to half the number of chips of delay between the earliest and latest multipath signal. The output signal of each correlator is applied to a respective one of L sum-and-dump circuits of the first sum and dump bank 504. The magnitude value of each sum-and-dump circuit of the sum and dump bank 504 is calculated by the respective calculator in the calculator bank 506 and applied to a corresponding weighting amplifier of the first weighting bank 508. The output signal of each weighting amplifier represents the weighted signal energy in a multipath component signal.

The weighted early multipath signal energy values are summed in sample adder 510 to give an output value proportional to the signal energy in the group of multipath signals corresponding to positive code phases which are the early multipath signals. Similarly, a second correlation bank adaptive matched filter 503 operates on the late samples, using the negative spreading code phases c(n−1), c(n−2), ..., c(n−L); each output signal is provided to a respective sum-and-dump circuit of discrete integrator 505. The magnitude value of the L sum-and-dump output signals are calculated by the respective calculator of calculator bank 507 and then weighted in weighting bank 509. The weighted late multipath signal energy values are summed in sample adder 511 to give an energy value for the group of multipath signals corresponding to the negative code phases which are the late multipath signals. Finally, the adder 512 calculates the difference of the early and late signal energy values to produce error sample value ε(t).

The tracking circuit of FIG. 5a produces error signal ε(t) which is used to adjust the locally generated code phase c(nT) to keep the weighted average energy in the early and late multipath signal groups equal. The embodiment shown uses weighting values that increase as the distance from the centroid increases. The signal energy in the earliest and latest multipath signals is probably less than the multipath signal values near the centroid. Consequently, the difference calculated by the adder 510 is more sensitive to variations in delay of the earliest and latest multipath signals.

XVI. Quadratic Detector for Tracking

In this embodiment of the tracking method, the tracking circuit adjusts the sampling phase to be "optimal" and robust to multipath. Let f(t) represent the received signal waveform as in Equation 12 above. The particular method of optimizing starts with a delay locked loop with an error signal $\epsilon(t)$ that drives the loop. The function $\epsilon(t)$ must have only one zero at $\tau=\tau_0$ where $\tau_0$ is optimal. The optimal form for $\epsilon(\tau)$ has the canonical form:

$$\varepsilon(\tau) = \int_{-\infty}^{\infty} w(t, \tau) |f(t)|^2 \, dt \qquad \text{Equation (23)}$$

where w(t, t) is a weighting function relating f(t) to the error $\epsilon(\tau)$, and the relationship indicated by Equation (24) also holds:

$$\varepsilon(\tau + \tau_0) = \int_{-\infty}^{\infty} w(t, \tau + \tau_0) |f(t)|^2 \, dt \qquad \text{Equation (24)}$$

It follows from Equation (24) that w(t, τ) is equivalent to w(t–τ). Considering the slope M of the error signal in the neighborhood of a lock point $\tau_0$:

$$M = \frac{d\varepsilon(\tau)}{d\tau}\bigg|_{\tau_0} = -\int_{-\infty}^{\infty} w'(t - \tau_0) g(t) \, dt \qquad \text{Equation (25)}$$

where w'(t, τ) is the derivative of w(t, τ) with respect to τ, and g(t) is the average of $|f(t)|^2$.

The error $\epsilon(t)$ has a deterministic part and a noise part. Let z denote the noise component in $\epsilon(t)$, then $|z|^2$ is the average noise power in the error function $\epsilon(t)$. Consequently, the optimal tracking circuit maximizes the ratio $$F = \frac{M^2}{|z|^2} \qquad \text{Equation (26)}$$

Figure 5B:
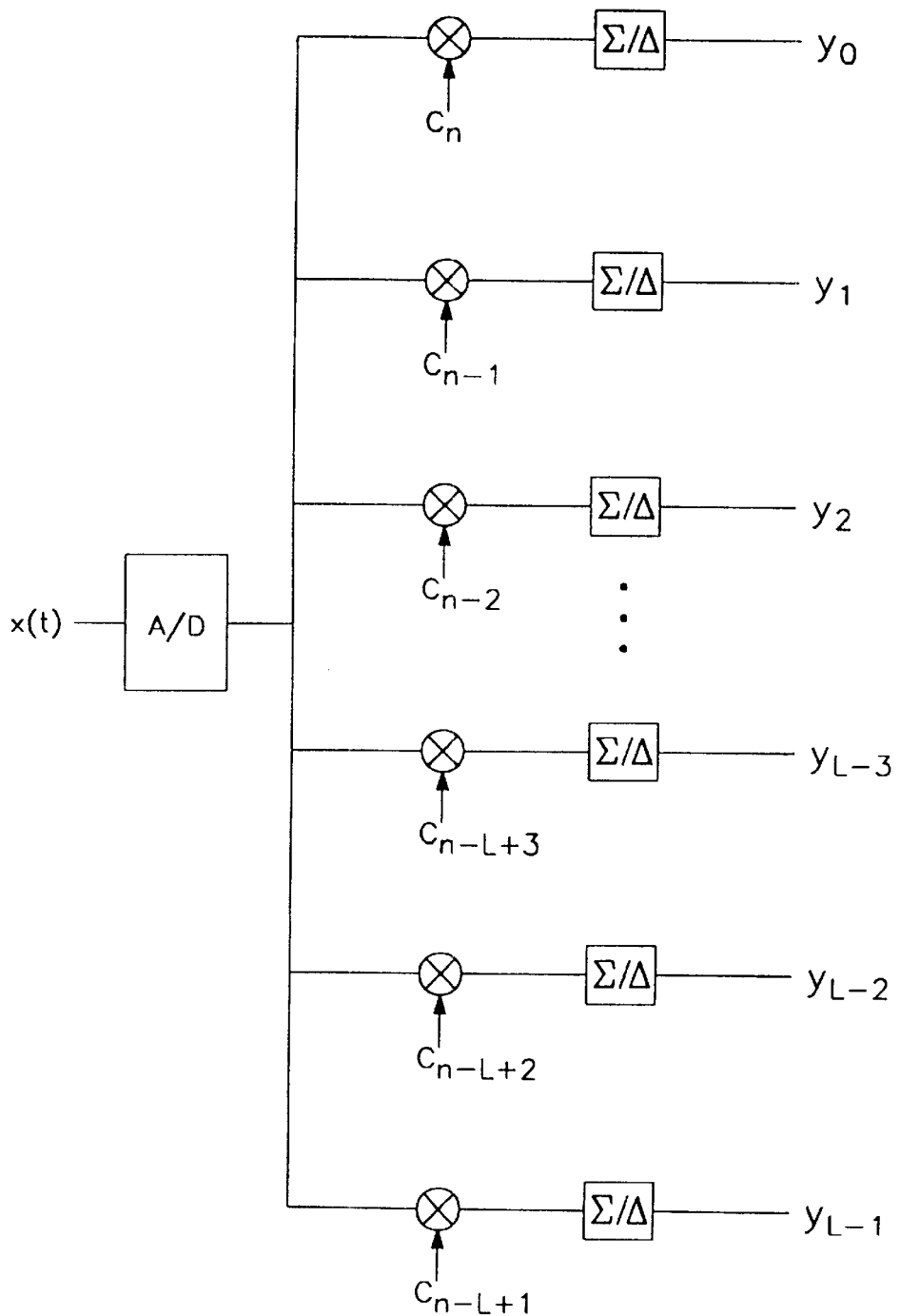
FIG. 5b is a block diagram of the Adaptive Vector Correlator.

The implementation of the quadratic detector is now described. The discrete error value e of an error signal $\epsilon(t)$ is generated by performing the operation $$\epsilon = y^T B y \qquad \text{Equation (27)}$$

where the vector y represents the received signal components yi, i=0, 1, . . . L−1, as shown in FIG. 5b. The matrix B is an L by L matrix and the elements are determined by calculating values such that the ratio F of Equation (26) is maximized. The quadratic detector described above may be used to implement the centroid tracking system described above with reference to FIG. 5a. For this implementation, the vector y is the output signal of the sum and dump circuits 504: y={f(τ−LT), f(τ−LT+T/2), f(τ−(L−1)T), . . . f(τ), f(τ+T/2), f(τ+T), . . . f(τ+LT)} and the matrix B is set forth in Table 9.

TABLE 9

B matrix for quadratic form of Centroid Tracking System

| L | 0 | 0 | 0 | 0 | 0 | 0 | 0 | 0 | 0 | 0 |
|---|---|---|---|---|---|---|---|---|---|---|---|
| 0 | L−1/2 | 0 | 0 | 0 | 0 | 0 | 0 | 0 | 0 | 0 |
| 0 | 0 | L−1 | 0 | 0 | 0 | 0 | 0 | 0 | 0 | 0 |
| ⋮ | ⋮ | ⋮ | ⋱ | ⋮ | ⋮ | ⋮ | ⋮ | ⋮ | ⋮ | ⋮ |
| 0 | 0 | 0 | 0 | 1/2 | 0 | 0 | 0 | 0 | 0 | 0 |
| 0 | 0 | 0 | 0 | 0 | 0 | 0 | 0 | 0 | 0 | 0 |
| 0 | 0 | 0 | 0 | 0 | 0 | −1/2 | 0 | 0 | 0 | 0 |
| ⋮ | ⋮ | ⋮ | ⋮ | ⋮ | ⋮ | ⋮ | ⋱ | ⋮ | ⋮ | ⋮ |
| 0 | 0 | 0 | 0 | 0 | 0 | 0 | 0 | −L+1 | 0 | 0 |
| 0 | 0 | 0 | 0 | 0 | 0 | 0 | 0 | 0 | −L+1/2 | 0 |
| 0 | 0 | 0 | 0 | 0 | 0 | 0 | 0 | 0 | 0 | −L |

XVII. Determining the Minimum Value of L Needed

The value of L in the previous section determines the minimum number of correlators and sum-and-dump elements. L is chosen as small as possible without compromising the functionality of the tracking circuit.

The multipath characteristic of the channel is such that the received chip waveform f(t) is spread over $QT_c$ seconds, or the multipath components occupy a time period of Q chips duration. The value of L chosen is L=Q. Q is found by measuring the particular RF channel transmission characteristics to determine the earliest and latest multipath component signal propagation delay. $QT_c$ is the difference between the earliest and latest multipath component time at a receiver.

XVIII. Adaptive Vector Correlator

An embodiment of the present invention uses an adaptive vector correlator (AVC) to estimate the channel impulse response and to obtain a reference value for coherent combining of received multipath signal components. The described embodiment employs an array of correlators to estimate the complex channel response affecting each multipath component. The receiver compensates for the channel response and coherently combines the received multipath signal components. This approach is referred to as maximal ratio combining.

Figure 6:
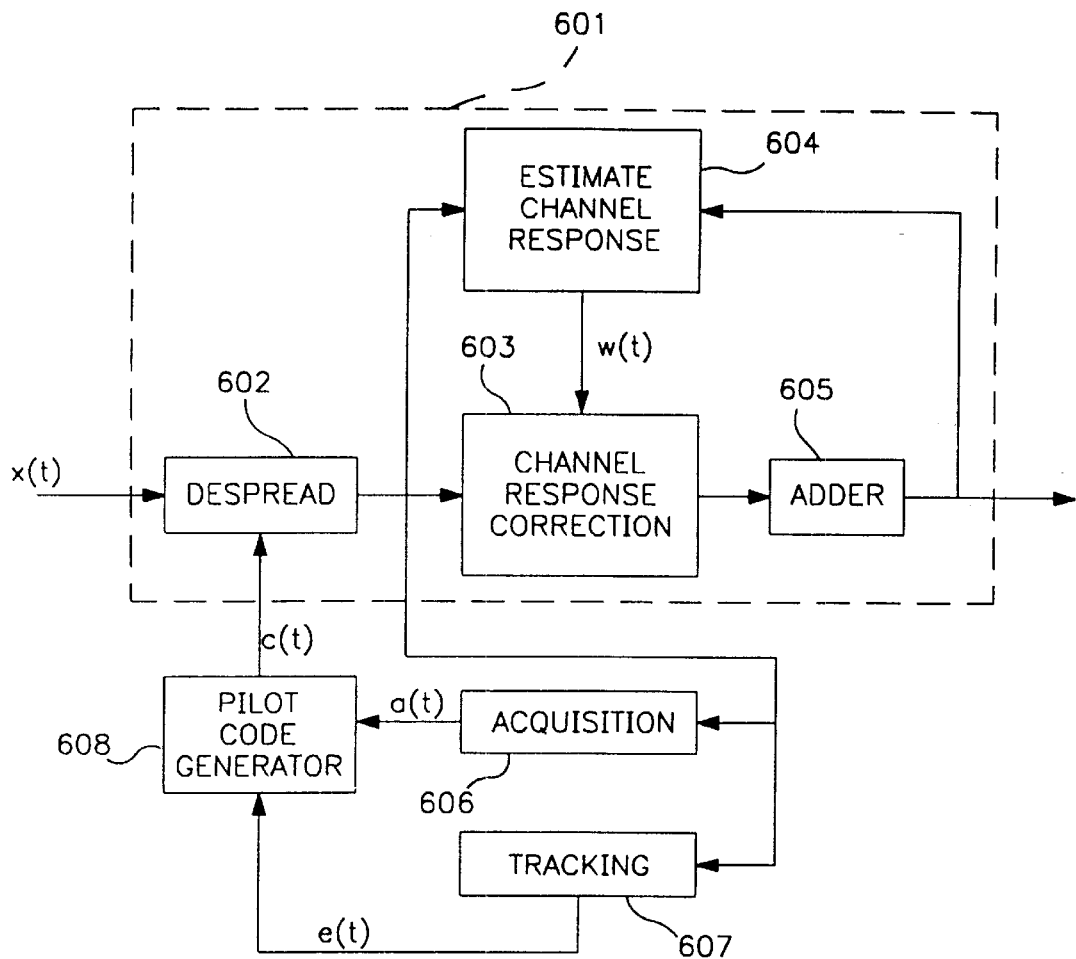
FIG. 6 is a block diagram of exemplary circuitry which implements the acquisition decision method of the correct spreading code phase of the received pilot code of the present invention.

Referring to FIG. 6, the input signal x(t) to the system includes interference noise of other message channels, multipath signals of the message channels, thermal noise, and multipath signals of the pilot signal. The signal is provided to AVC 601 which, in the exemplary embodiment, includes a despreading means 602, channel estimation means for estimating the channel response 604, correction means for correcting a signal for effects of the channel response 603 and adder 605. The AVC despreading means 602 is composed of multiple code correlators, with each correlator using a different phase of the pilot code c(t) provided by the pilot code generator 608. The output signal of this despreading means corresponds to a noise power level if the local pilot code of the despreading means is not in phase with the input code signal. Alternatively, it corresponds to a received pilot signal power level plus noise power level if the phases of the input pilot code and locally generated pilot code are the same. The output signals of the correlators of the despreading means are corrected for the channel response by the correction means 603 and are applied to the adder 605 which collects all multipath pilot signal power. The channel response estimation means 604 receives the combined pilot signal and the output signals of the despreading means 602, and provides a channel response estimate signal, w(t), to the correction means 603 of the AVC, and the estimate signal w(t) is also available to the adaptive matched filter (AMF) described below. The output signal of the despreading means 602 is also provided to the acquisition decision means 606 which decides, based on a particular algorithm such as a sequential probability ratio test (SPRT), if the present output levels of the despreading circuits correspond to synchronization of the locally generated spreading code to the desired input code phase. If the detector finds no synchronization, then the acquisition decision means sends a control signal a(t) to the local pilot code generator 608 to offset its phase by one or more chip period. When synchronization is found, the acquisition decision means informs tracking circuit 607, which achieves and maintains a close synchronization between the received and locally generated spreading codes.

Figure 7:
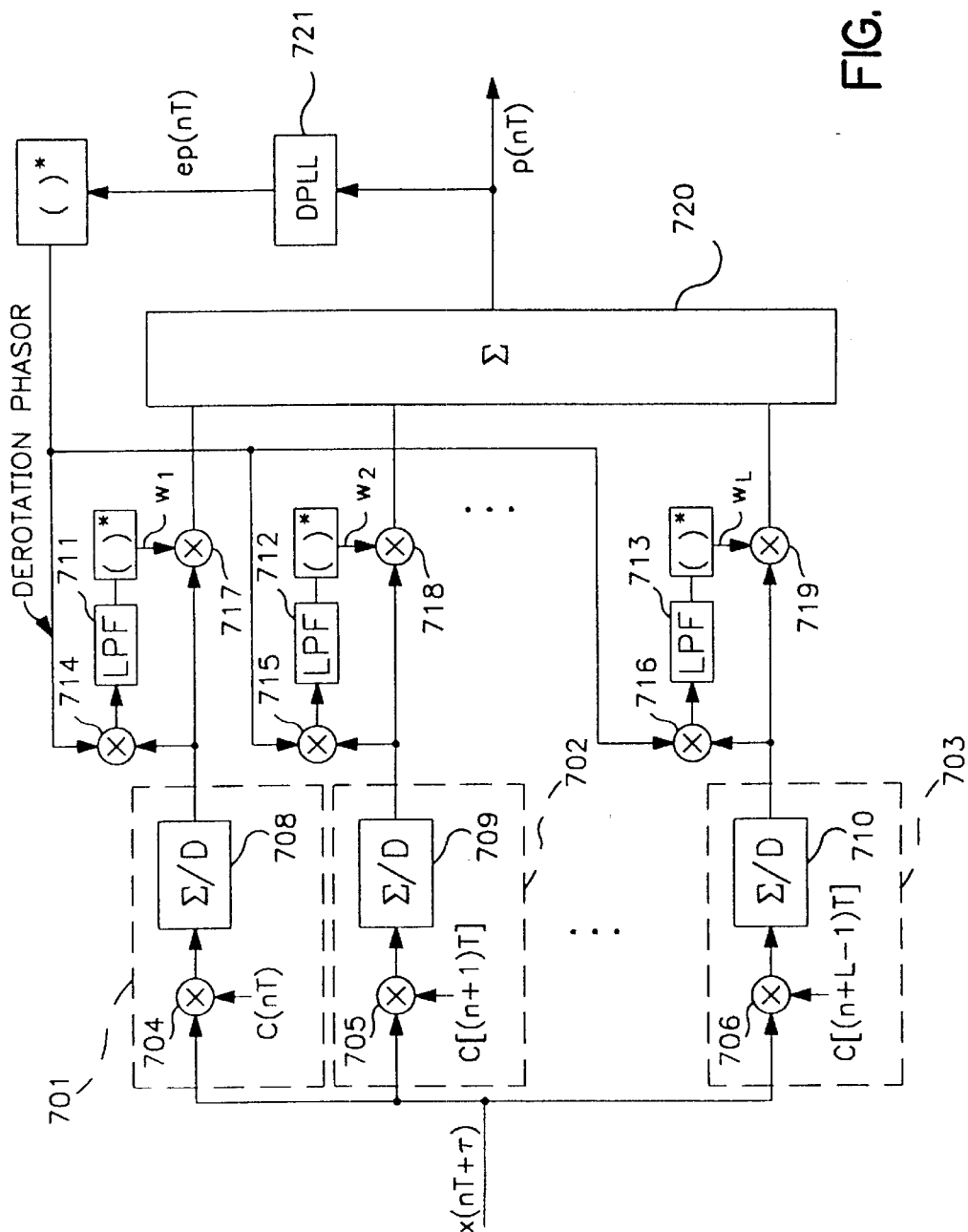
FIG. 7 is a block diagram of an exemplary pilot rake filter which includes the tracking circuit and digital phase locked loop for despreading the pilot spreading code, and generator of the weighting factors of the present invention.

An exemplary implementation of the pilot AVC used to despread the pilot spreading code is shown in FIG. 7. The described embodiment assumes that the input signal x(τ) has been sampled with sampling period T to form samples x(nT+τ), and is composed of interference noise of other message channels, multipath signals of message channels, thermal noise and multipath signals of the pilot code. The signal x(nT+τ) is applied to L correlators, where L is the number of code phases over which the uncertainty within the multipath signals exists. Each correlator 701, 702, 703 comprises a multiplier 704, 705, 706, which multiples the input signal with a particular phase of the pilot spreading code signal c((n+i)T) and sum-and-dump circuits 708, 709, 710. The output signal of each multiplier 704, 705, 706 is applied to a respective sum-and dump circuit 708, 709, 710 to perform discrete integration. Before summing the signal energy contained in the outputs of the correlators, the AVC compensates for the channel response and the carrier phase rotation of the different multipath signals. Each output of each sum-and-dump 708, 709, 710 is multiplied with a derotation phaser [complex conjugate of ep(nT)] from digital phase lock loop (DPLL) 721 by the respective multiplier 714, 715, 716 to account for the phase and frequency offset of the carrier signal. The pilot rake AMF calculates the weighting factors wk, k=1, . . . , L, for each multipath signal by passing the output of each multiplier 714, 715, 716 through a low pass filter (LPF) 711, 712, 713. Each despread multipath signal is multiplied by its corresponding weighting factor in a respective multiplier 717, 718, 719. The output signals of the multipliers 717, 718, 719 are summed in a master adder 720, and the output signal p(nT) of the accumulator 720 consists of the combined despread multipath pilot signals in noise. The output signal p(nT) is also input to the DPLL 721 to produce the error signal ep(nT) for tracking of the carrier phase.

Figure 8A:
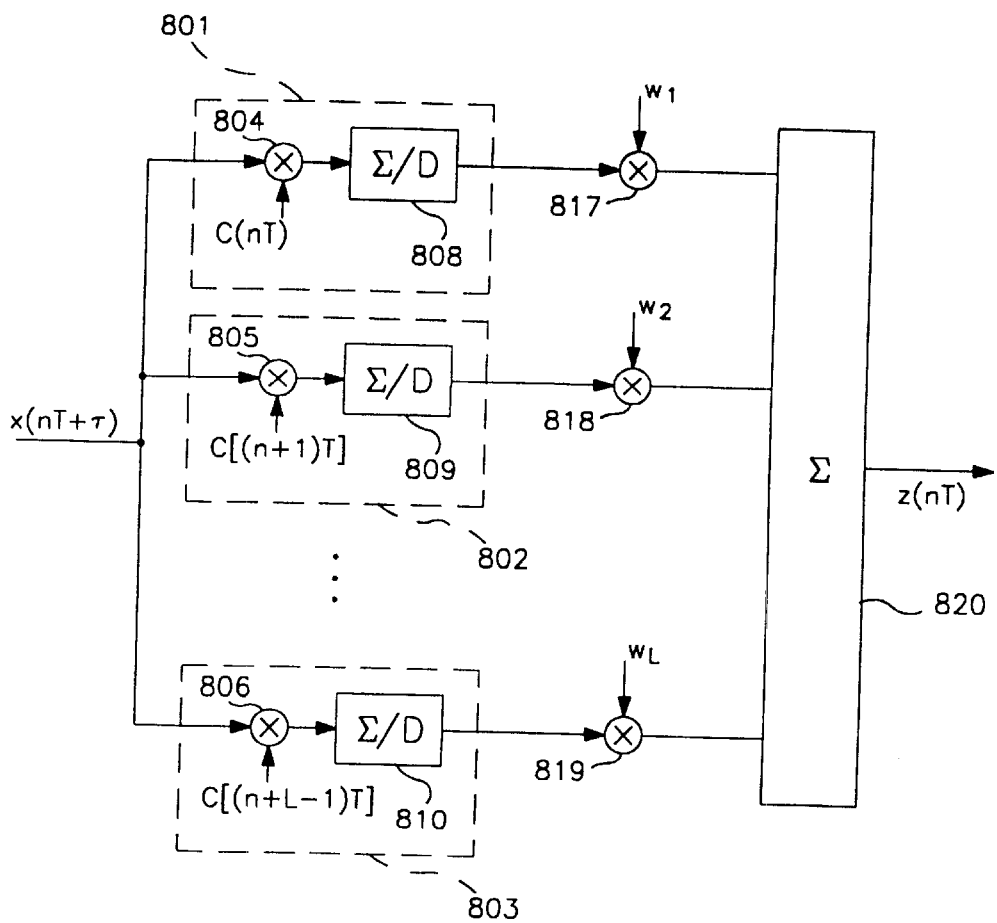
FIG. 8a is a block diagram of an exemplary adaptive vector correlator and matched filter for despreading and combining the multipath components of the present invention.
Figure 8B:
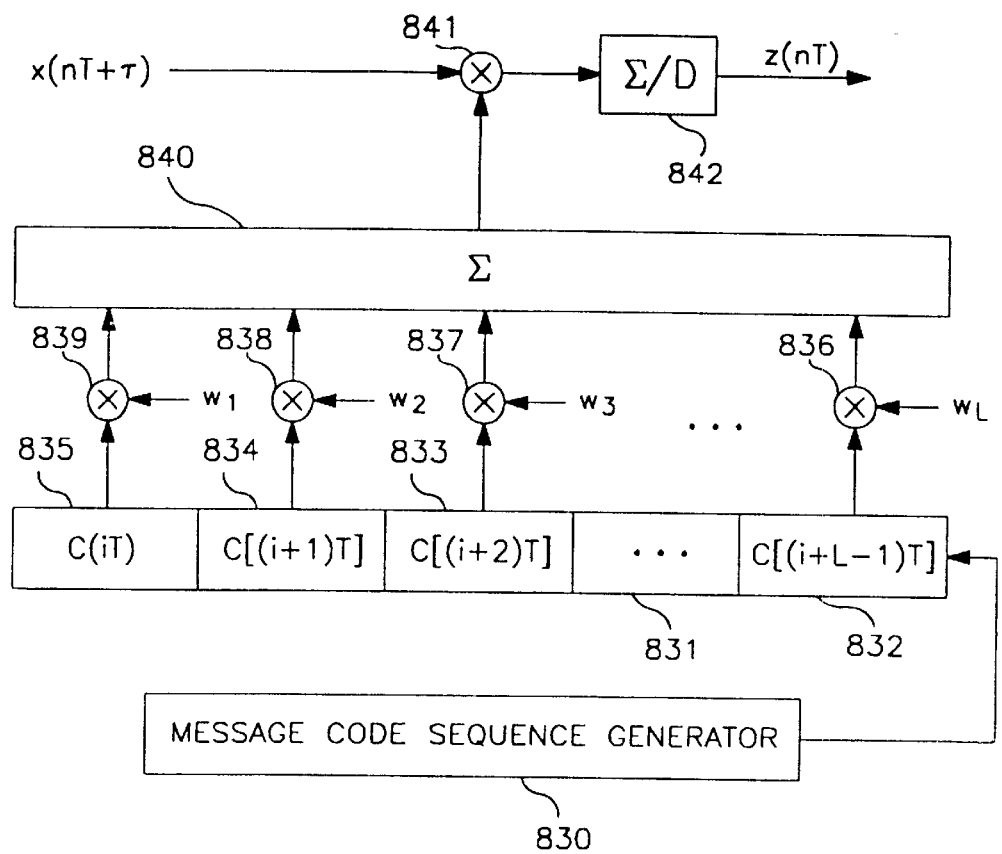
FIG. 8b is a block diagram of an alternative implementation of the adaptive vector correlator and adaptive matched filter for despreading and combining the multipath components of the present invention.

FIGS. 8a and 8b show alternate embodiments of the AVC which can be used for detection and multipath signal component combining. The message signal AVCs of FIGS. 8a and 8b use the weighting factors produced by the pilot AVC to correct the message data multipath signals. The spreading code signal, c(nT) is the spreading code spreading sequence used by a particular message channel and is synchronous with the pilot spreading code signal. The value L is the number of correlators in the AVC circuit.

The circuit of FIG. 8a calculates the decision variable Z which is given by:

$$Z = w_1 \sum_{i=1}^{N} x(iT + \tau)c(iT) +$$ Equation (28)

$$w_2 \sum_{i=1}^{N} x(iT + \tau)c((i+1)T) + \ldots +$$

$$w_L \sum_{i=1}^{L} x(iT + \tau) + c((i+L)T)$$

where N is the number of chips in the correlation window. Equivalently, the decision statistic is given by:

$$Z = x(T + \tau)\sum_{i=1}^{L} w_1 c(iT) +$$ Equation (29)

$$x(2T + \tau)\sum_{i=1}^{L} w_1 c((i+1)T) + \ldots +$$

$$x(NT + \tau)\sum_{i=1}^{L} w_N c((i+N)T) =$$

$$\sum_{k=1}^{N} x(kT - \tau)\sum_{i=1}^{L} w_k c((i+k-1)T)$$

The alternative implementation that results from Equation (29) is shown in FIG. 8b.

Referring to FIG. 8a, the input signal x(t) is sampled to form x(nT+t), and is composed of interference noise of other message channels, multipath signals of message channels, thermal noise, and multipath signals of the pilot code. The signal x(nT+t) is applied to L correlators, where L is the number of code phases over which the uncertainty within the multipath signals exists. Each correlator 801, 802, 803 comprises a multiplier 804, 805, 806, which multiples the input signal by a particular phase of the message channel spreading code signal, and a respective sum-and-dump circuit 808, 809, 810. The output signal of each multiplier 804, 805, 806 is applied to a respective sum-and dump circuit 808, 809, 810 which performs discrete integration. Before summing the signal energy contained in the output signals of the correlators, the AVC compensates for the different multipath signals. Each despread multipath signal and its corresponding weighting factor, which is obtained from the corresponding multipath weighting factor of the pilot AVC, are multiplied in a respective multiplier 817, 818, 819. The output signals of multipliers 817, 818, 819 are summed in a master adder 820, and the output signal z(nT) of the accumulator 820 consists of sampled levels of a despread message signal in noise.

The alternative embodiment of the invention includes a new implementation of the AVC despreading circuit for the message channels which performs the sum-and-dump for each multipath signal component simultaneously. The advantage of this circuit is that only one sum-and dump circuit and one adder is necessary. Referring to FIG. 8b, the message code sequence generator 830 provides a message code sequence to shift register 831 of length L. The output signal of each register 832, 833, 834, 835 of the shift register 831 corresponds to the message code sequence shifted in phase by one chip. The output value of each register 832, 833, 834, 835 is multiplied in multipliers 836, 837, 838, 839 with the corresponding weighting factor $w_k$, k=1, . . . , L obtained from the pilot AVC. The output signals of the L multipliers 836, 837, 838, 839 are summed by the adding circuit 840. The adding circuit output signal and the receiver input signal x(nT+τ) are then multiplied in the multiplier 841 and integrated by the sum-and-dump circuit 842 to produce message signal z(nT).

Figure 8C:
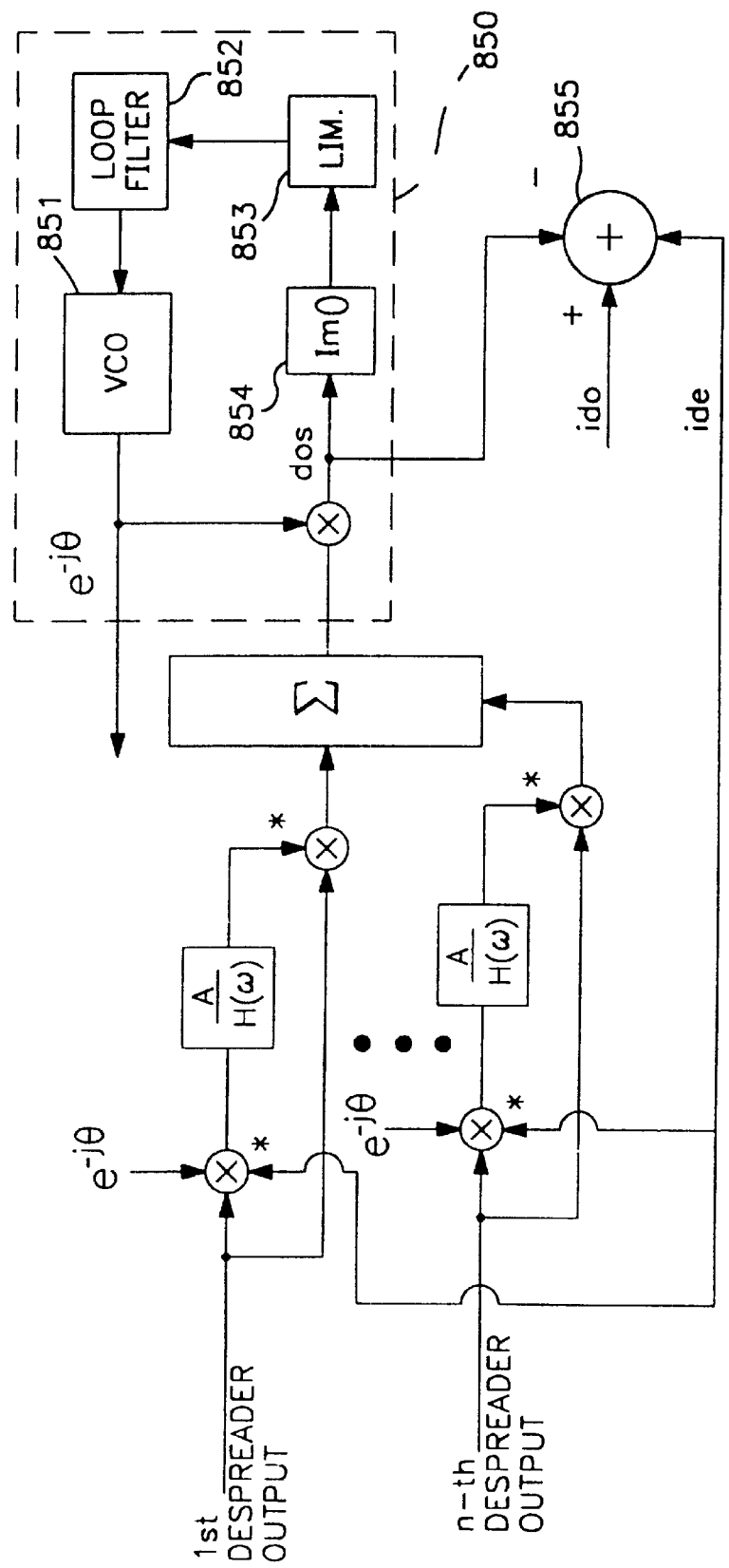
FIG. 8c is a block diagram of an alternative embodiment of the adaptive vector correlator and adaptive matched filter for despreading and combining the multipath components of the present invention.

A third embodiment of the adaptive vector correlator is shown in FIG. 8c. The embodiment shown uses the least mean square (LMS) statistic to implement the vector correlator and determines the decoration factors for each multipath component from the received multipath signal. The AVC of FIG. 8c is similar to the exemplary implementation of the Pilot AVC used to despread the pilot spreading code shown in FIG. 7. The digital phase locked loop 721 is replaced by the phase locked loop 850 having voltage controlled oscillator 851, loop filter 852, limiter 853 and imaginary component separator 854. The difference between the corrected despread output signal ido and an ideal despread output signal is provided by adder 8 5 5, and the difference signal is a despread error value ide which is further used by the decoration circuits to compensate for errors in the decoration factors.

In a multipath signal environment, the signal energy of a transmitted symbol is spread out over the multipath signal components. The advantage of multipath signal addition is that a substantial portion of signal energy is recovered in an output signal from the AVC. Consequently, a detection circuit has an input signal from the AVC with a higher signal-to-noise ratio (SNR), and so can detect the presence of a symbol with a lower bit-error ratio (BER). In addition, measuring the output of the AVC is a good indication of the transmit power of the transmitter, and a good measure of the system's interference noise.

XIX. Adaptive Matched Filter

Figure 8D:
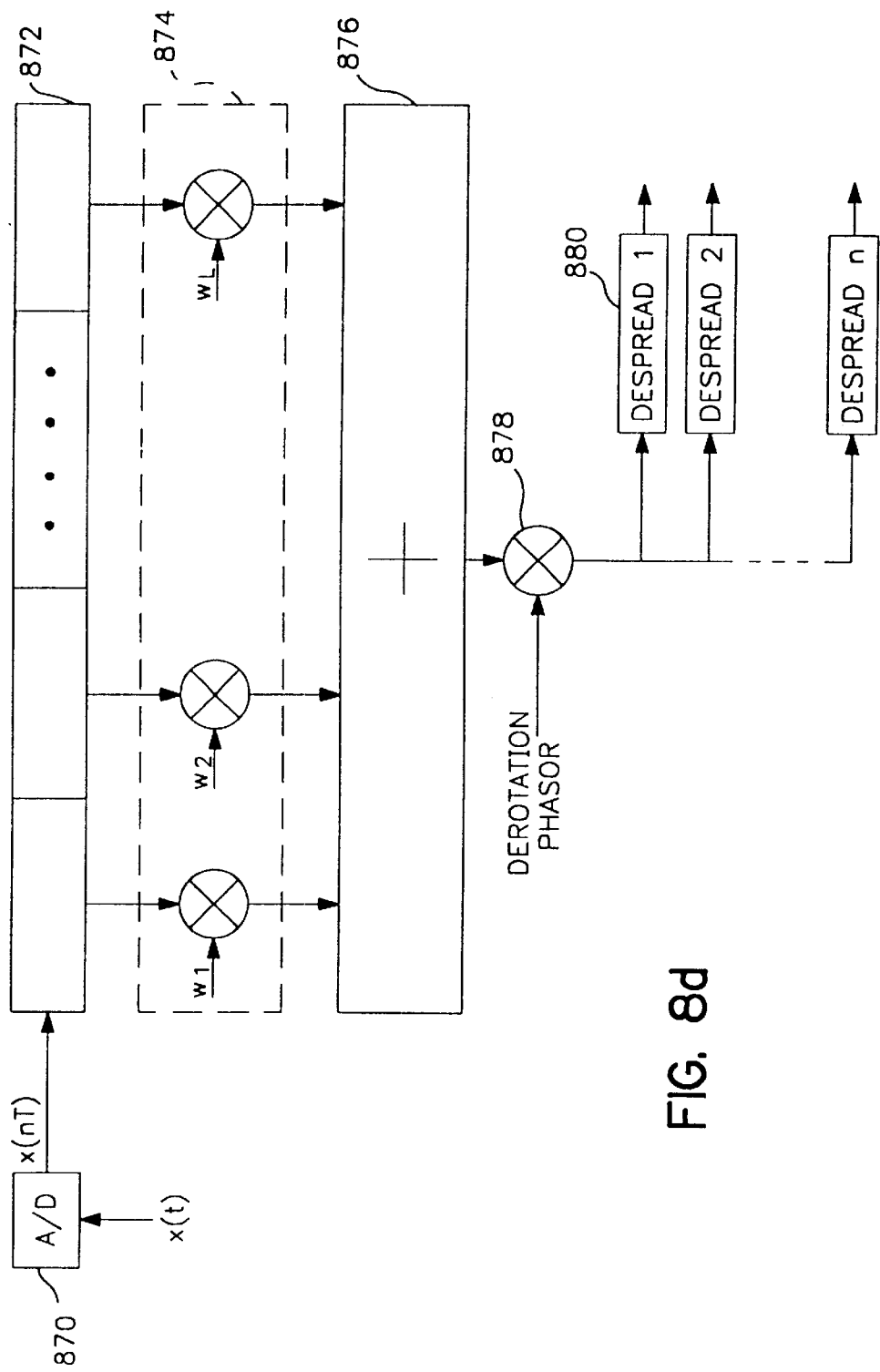
FIG. 8d is a block diagram of the Adaptive Matched Filter of one embodiment of the present invention.

One embodiment of the current invention includes an adaptive matched filter (AMF) to optimally combine the multipath signal components in a received spread spectrum message signal. The AMF is a tapped delay line which holds shifted values of the sampled message signal and combines these after correcting for the channel response. The correction for the channel response is done using the channel response estimate calculated in the AVC which operates on the pilot sequence signal. The output signal of the AMF is the combination of the multipath components which are summed to give a maximum value. This combination corrects for the distortion of multipath signal reception. The various message despreading circuits operate on this combined multipath component signal from the AMF. FIG. 8d shows an exemplary embodiment of the AMF. The sampled signal from the A/D converter 870 is applied to the L-stage delay line 872. Each stage of this delay line 872 holds the signal corresponding to a different multipath signal component. Correction for the channel response is applied to each delayed signal component by multiplying the component in the respective multiplier of multiplier bank 874 with the respective weighting factor $w_1, w_2, \ldots, w_L$ from the AVC corresponding to the delayed signal component. All weighted signal components are summed in the adder 876 to give the combined multipath component signal y(t).

The combined multipath component signal y(t) does not include the correction due to phase and frequency offset of the carrier signal. The correction for the phase and frequency offset of the carrier signal is made to y(t) by multiplying y(t) with carrier phase and frequency correction (derotation phaser) in multiplier 878. The phase and frequency correction is produced by the AVC as described previously. FIG. 8d shows the correction as being applied before the despreading circuits 880, but alternate embodiments of the invention can apply the correction after the despreading circuits.

XX. Method to Reduce Re-Acquisition Time with Virtual Location

One consequence of determining the difference in code phase between the locally generated pilot code sequence and a received spreading code sequence is that an approximate value for the distance between the base station and a subscriber unit can be calculated. If the SU has a relatively fixed position with respect to the RCS of the base station, the uncertainty of received spreading code phase is reduced for subsequent attempts at re-acquisition by the SU or RCS. The time required for the base station to acquire the access signal of a SU that has gone "off-hook" contributes to the delay between the SU going off-hook and the receipt of a dial tone from the PSTN. For systems that require a short delay, such as 150 msec for dial tone after off-hook is detected, a method which reduces the acquisition and bearer channel establishment time is desirable. One embodiment of the present invention uses such a method of reducing re-acquisition by use of virtual locating. Additional details of this technique are described in Section XXXXIII hereinafter entitled "Virtual Locating Of A Fixed Subscriber Unit To Reduce Re-Acquisition Time".

The RCS acquires the SU CDMA signal by searching only those received code phases corresponding to the largest propagation delay of the particular system. In other words, the RCS assumes that all SUs are at a predetermined, fixed distance from the RCS. The first time the SU establishes a channel with the RCS, the normal search pattern is performed by the RCS to acquire the access channel. The normal method starts by searching the code phases corresponding to the longest possible delay, and gradually adjusts the search to the code phases with the shortest possible delay. However, after the initial acquisition, the SU can calculate the delay between the RCS and the SU by measuring the time difference between sending a short access signal to the RCS and receiving an acknowledgment signal, and using the received global pilot channel as a timing reference. The SU can also receive the delay value by having the RCS calculate the round trip delay difference from the code phase difference between the global pilot code generated at the RCS and the received assigned pilot code from the SU, and then sending the SU the value on a predetermined control channel. Once the round trip delay is known to the SU, the SU may adjust the code phase of the locally generated assigned pilot and spreading codes by adding the delay required to make the SU appear to the RCS to be at the predetermined fixed distance from the RCS. Although the method is explained for the largest delay, a delay corresponding to any predetermined location in the system can be used.

A second advantage of the method of reducing re-acquisition by virtual locating is that a conservation in SU power use can be achieved. Note that a SU that is "powered down" or in a sleep mode needs to start the bearer channel acquisition process with a low transmit power level and ramp-up power until the RCS can receive its signal in order to minimize interference with other users. Since the subsequent re-acquisition time is shorter, and because the SU's location is relatively fixed in relation to the RCS, the SU can ramp-up transmit power more quickly because the SU will wait a shorter period of time before increasing transmit power. The SU waits a shorter period because it knows, within a small error range, when it should receive a response from the RCS if the RCS has acquired the SU signal.

XXI. The Radio Carrier Station (RCS)

The Radio Carrier Station (RCS) of the present invention acts as a central interface between the SU and the remote processing control network element, such as a radio distribution unit (RDU). The interface to the RDU of the present embodiment follows the G.704 standard and an interface according to a modified version of DECT V5.1, but the present invention can support any interface that can exchange call control and traffic channels. The RCS receives information channels from the RDU including call control data, and traffic channel data such as, but not limited to, 32 kbs ADPCM, 64 kbs PCM and ISDN, as well as system configuration and maintenance data. The RCS also terminates the CDMA radio interface bearer channels with SUs, which channels include both control data, and traffic channel data. In response to the call control data from either the RDU or a SU, the RCS allocates traffic channels to bearer channels on the RF communication link and establishes a communication connection between the SU and the telephone network through an RDU.

Figure 9:
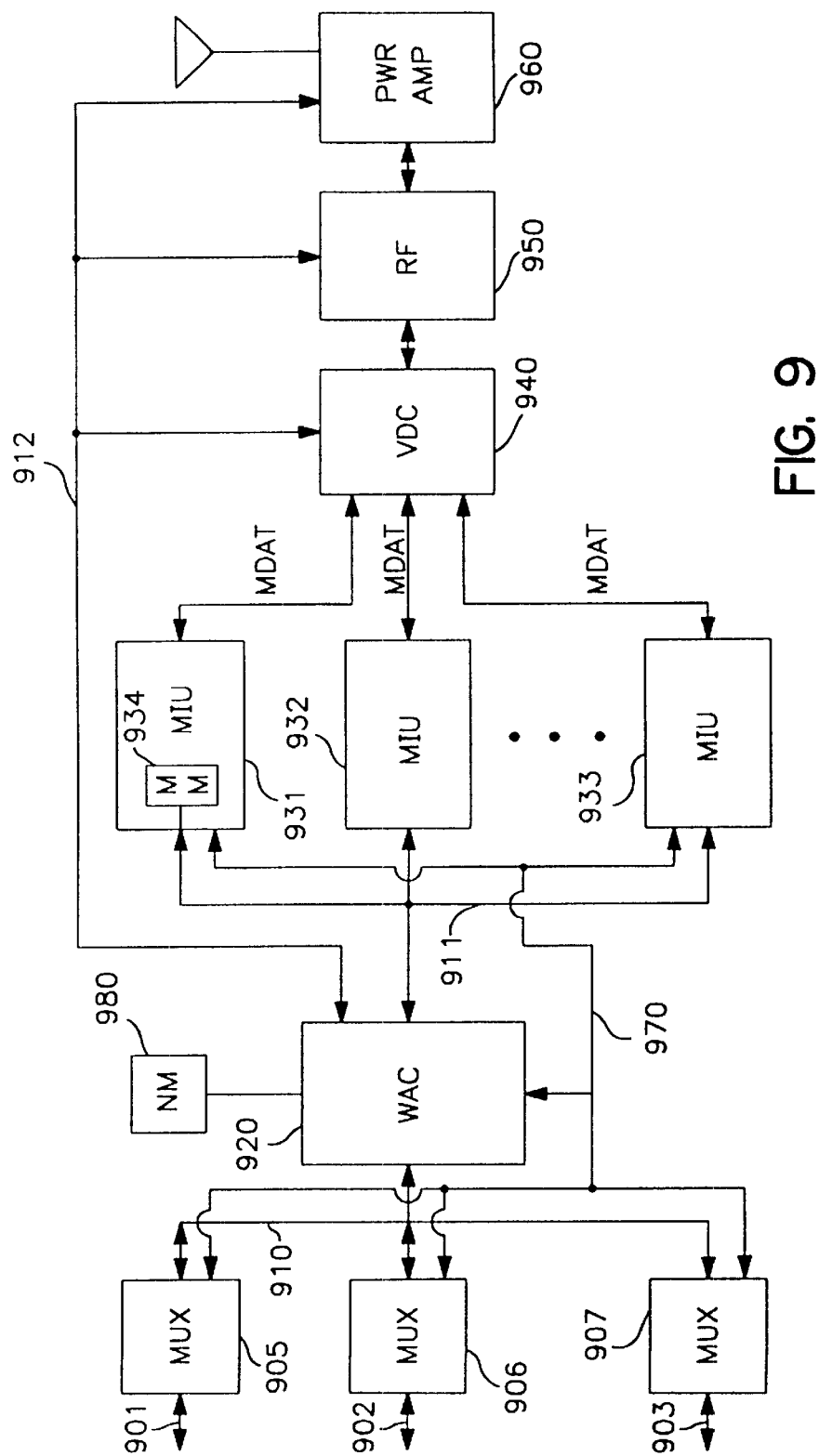
FIG. 9 is a block diagram of the elements of an exemplary radio carrier station (RCS) of the present invention.

As shown in FIG. 9, the RCS receives call control and message information data into the MUXs 905, 906 and 907 through interface lines 901, 902 and 903. Although E1 format is shown, other similar telecommunication formats can be supported in the same manner as described below. The MUXs shown in FIG. 9 may be implemented using circuits similar to that shown in FIG. 10. The MUX shown in FIG. 10 includes system clock signal generator 1001 consisting of phase locked oscillators (not shown) which generate clock signals for the line PCM highway 1002 (which is part of PCM highway 910 ), and high speed bus (HSB) 970; and the MUX controller 1010 which synchronizes the system clock 1001 to interface line 1004. It is contemplated that the phase lock oscillators can provide timing signals for the RCS in the absence of synchronization to a line. The MUX line interface 1011 separates the call control data from the message information data. Referring to FIG. 9, each MUX provides a connection to the wireless access controller (WAC) 920 through the PCM highway 910. The MUX controller 1010 also monitors the presence of different tones present in the information signal by means of tone detector 1030. Additionally, the MUX Controller 1010 provides the ISDN D channel network signaling locally to the RDU.

The MUX line interface 1011, such as a FALC 54, includes an E1 interface 1012 which consists of a transmit connection pair (not shown) and a receive connection pair (not shown) of the MUX connected to the RDU or central office (CO) ISDN switch at the data rate of 2.048 Mbps. The transmit and receive connection pairs are connected to the E1 interface 1012 which translates differential tri-level transmit/receive encoded pairs into levels for use by the framer 1015. The line interface 1011 uses internal phase-locked-loops (not shown) to produce E1-derived 2.048 MHz and 4.096 MHz clocks as well as an 8 KHz frame-sync pulse. The line interface can operate in clock-master or clock-slave mode. While the exemplary embodiment is shown as using an E1 interface, it is contemplated that other types of telephone lines which convey multiple calls may be used, for example, T1 lines or lines which interface to a private branch exchange (PBX).

The line interface framer 1015 frames the data streams by recognizing the framing patterns on channel-1 (time-slot 0) of the incoming line, inserts and extracts service bits and generates/checks line service quality information.

As long as a valid E1 signal appears at the E1 interface 1012, the FALC 54, recovers a 2.048 MHz PCM clock signal from the E1 line. This clock, via system clock 1001, is used system wide as a PCM highway clock signal. If the E1 line fails, the FALC 54 continues to deliver a PCM clock derived from an oscillator signal o(t) connected to the sync input (not shown) of the FALC 54. This PCM clock serves the RCS system until another MUX with an operational E1 line assumes responsibility for generating the system clock signals.

The framer 1015 generates a received frame sync pulse, which in turn can be used to trigger the PCM Interface 1016 to transfer data onto the line PCM highway 1002 and into the RCS system for use by other elements. Since all E1 lines are frame synchronized, all line PCM highways are also frame synchronized. From this 8 kHz PCM Sync pulse, the system clock signal generator 1001 of the MUX uses a phase locked loop (not shown) to synthesize the PNx2 clock (e.g., 15.96 MHz)($W_0(t)$). The frequency of this clock signal is different for different transmission bandwidths as described in Table 7.

The MUX includes a MUX controller 1010, such as a 25 MHz quad integrated communications controller, containing a microprocessor 1020, program memory 1021, and time division multiplexer.(TDM) 1022. The TDM 1022 is coupled to receive the signal provided by the framer 1015, and extracts information placed in time slots 0 and 16. The extracted information governs how the MUX controller 1010 processes the link access protocol-D (LAPD) data link. The call control and bearer modification messages, such as those defined as V5.1 network layer messages, are either passed to the WAC, or used locally by the MUX controller 1010.

The RCS line PCM highway 1002 is connected to and originates with the framer 1015 through PCM Interface 1016, and comprises of a 2.048 MHz stream of data in both the transmit and receive direction. The RCS also contains a high speed bus (HSB) 970 which is the communication link between the MUX, WAC, and MIUs. The HSB 970 supports a data rate of, for example, 100 Mbit/sec. Each of the MUX, WAC, and MIU access the HSB using arbitration. The RCS of the present invention also can include several MUXs requiring one board to be a "master" and the rest "slaves". Details on the implementation of the HSB may be found in Section XXXXIV hereinafter entitled PARALLEL PACKETIZED INTERMODULE ARBITRATED HIGH SPEED CONTROL AND DATA BUS.

Figure 11:
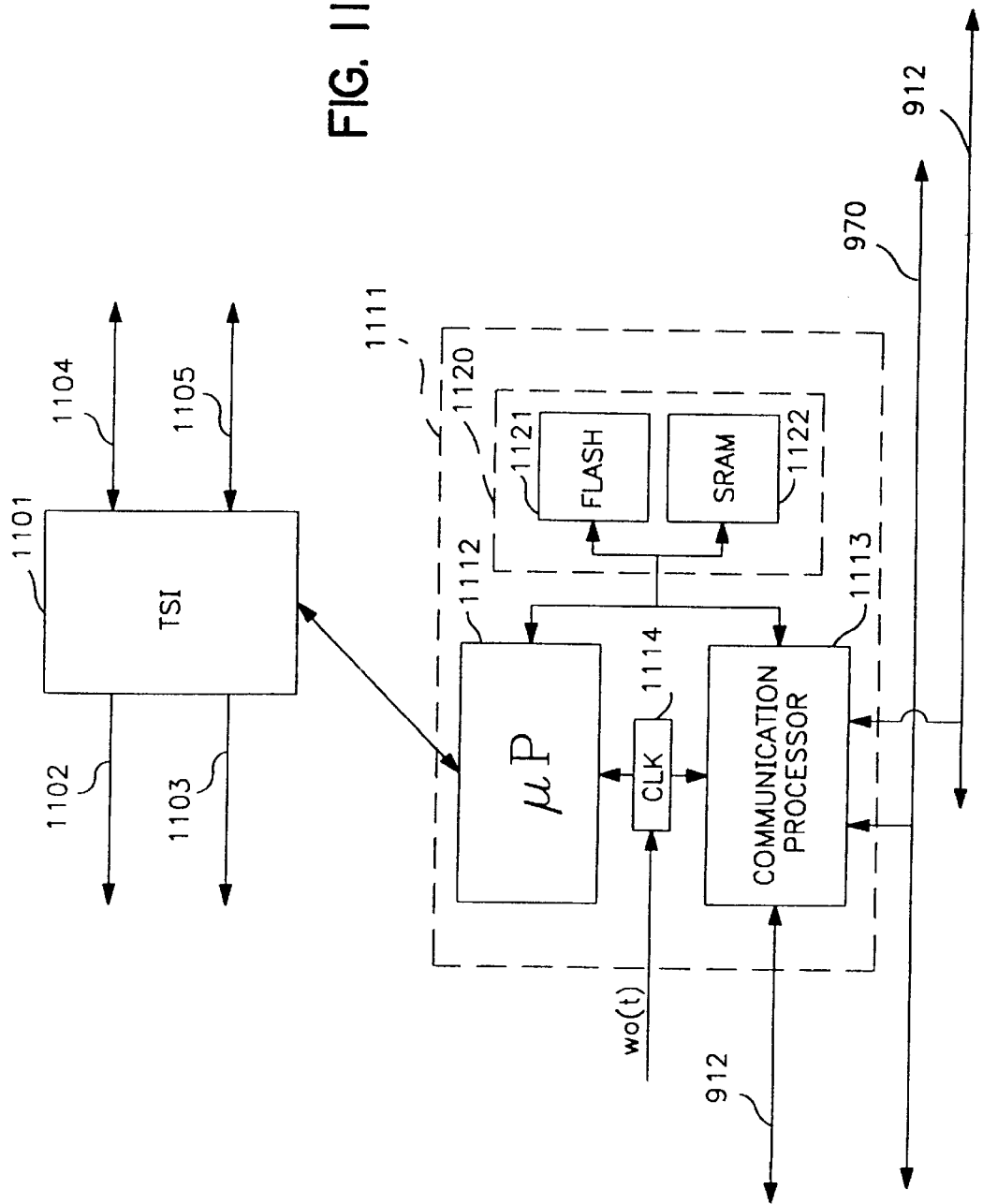
FIG. 11 is a block diagram of the elements of an exemplary wireless access controller (WAC) of the RCS shown in FIG. 9.

Referring to FIG. 9, the wireless access controller (WAC) 920 is the RCS system controller which manages call control functions and interconnection of data streams between the MUXs 905, 906, 907, modem interface units (MIUs) 931, 932, 933. The WAC 920 also controls and monitors other RCS elements such as the VDC 940, RF 950, and power amplifiers 960. The WAC 920 as shown in FIG. 11, allocates bearer channels to the modems on each MIU 931, 932, 933 and allocates the message data on line PCM Highway 910 from the MUXs 905, 906, 907 to the modems on the MIUs 931, 932, 933. This allocation is made through the System PCM Highway 911 by means of a time slot interchange on the WAC 920. If more than one WAC is present for redundancy purposes, the WACs determines the master-slave relationship with a second WAC. The WAC 920 also generates messages and paging information responsive to call control signals from the MUXs 905, 906, 907 received from a remote processor, such as an RDU; generates broadcast data which is transmitted to the MIU master modem 934; and controls the generation by the MIU MM 934 of the Global system Pilot spreading code sequence. The WAC 920 also is connected to an external network manager (NM) 980 for craftsperson or user access.

Referring to FIG. 11, the WAC includes a time-slot interchanger (TSI) 1101 which transfers information from one time slot in a line PCM highway or system PCM highway to another time slot in either the same or different line PCM highway or system PCM highway. The TSI 1101 is connected to the WAC controller 1111 of FIG. 11 which controls the assignment or transfer of information from one time slot to another time slot and stores this information in memory 1120. The exemplary embodiment of the invention has four PCM Highways 1102, 1103, 1104, 1105 connected to the TSI. The WAC also is connected to the HSB 970, through which WAC communicates to a second WAC (not shown), to the MUXs and to the MIUs.

Referring to FIG. 11, the WAC 920 includes a WAC controller 1111 employing, for example, a microprocessor 1112, such as a Motorola MC 68040 and a communications processor 1113, such as the Motorola MC68360 QUICC communications processor, and a clock oscillator 1114 which receives a clock synch signal wo(t) from the system clock generator. The clock generator is located on a MUX (not shown) to provide timing to the WAC controller 1111. The WAC controller 1111 also includes memory 1120 including flash PROM 1121 and SRAM memory 1122. The flash PROM 1121 contains the program code for the WAC controller 1111 and is reprogrammable for new software programs downloaded from an external source. The SRAM 1122 is provided to contain the temporary data written to and read from memory 1120 by the WAC controller 1111.

A low speed bus 912 is connected to the WAC, 920 for transferring control and status signals between the RF transmitter/receiver 950, VDC 940, RF 950 and power amplifier 960 as shown in FIG. 9. The control signals are sent from the WAC 920 to enable or disable the RF transmitters/receiver 950 or power amplifier 960, and the status signals are sent from the RF transmitters/receiver 950 or power amplifier 960 to monitor the presence of a fault condition.

Figure 12:
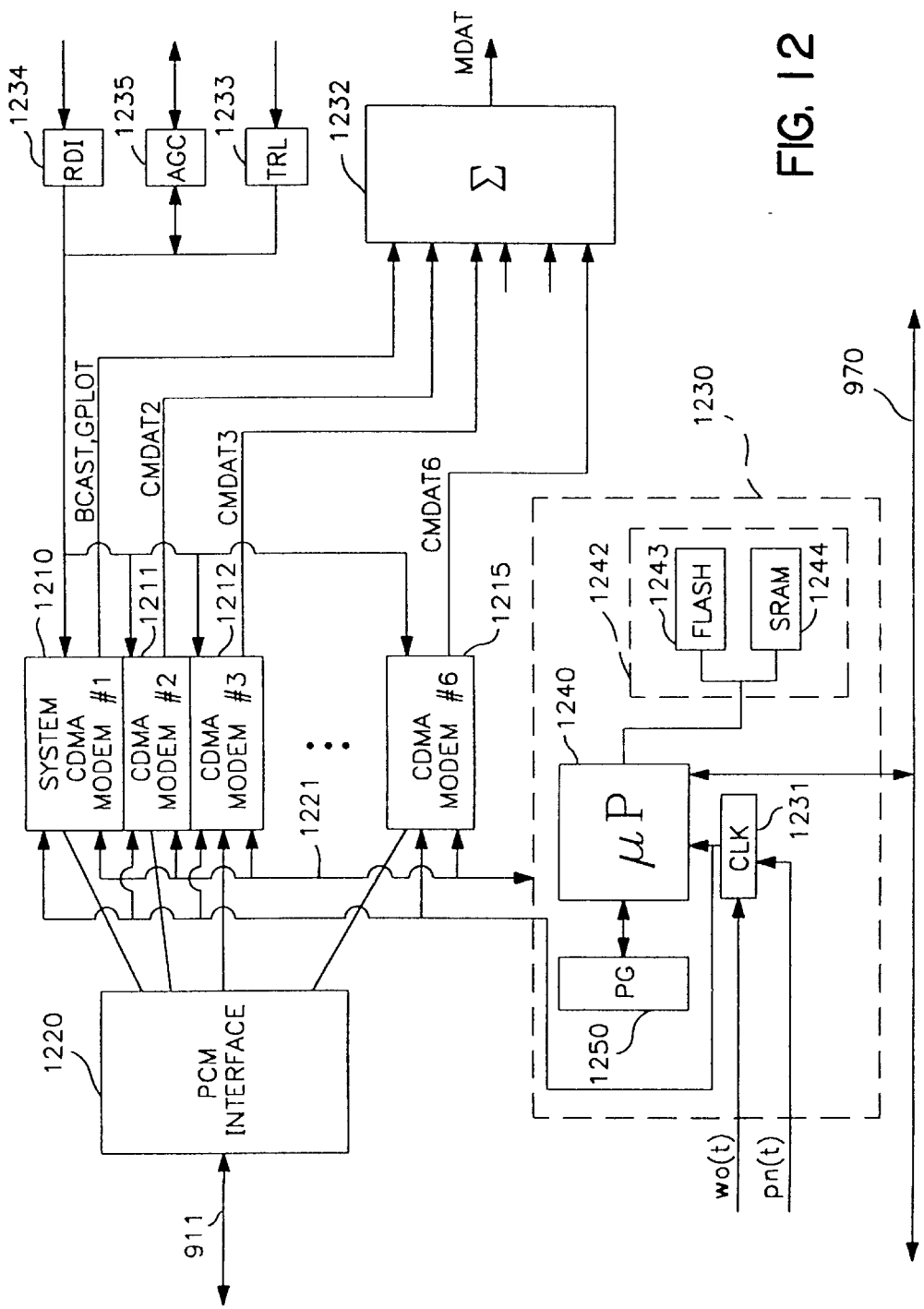
FIG. 12 is a block diagram of the elements of an exemplary modem interface unit (MIU) of the RCS shown in FIG. 9.

The exemplary RCS contains at least one MIU 931, which is shown in FIG. 12 and now described in detail. The MIU of the exemplary embodiment includes six CDMA modems, but the invention is not limited to this number of modems. The MIU includes a system PCM highway 1201 connected to each of the CDMA Modems 1210, 1211, 1212, 1215 through a PCM Interface 1220, a control channel bus 1221 connected to MIU controller 1230 and each of the CDMA modems 1210, 1211, 1212, 1213, an MIU clock signal generator (CLK) 1231, and a modem output combiner 1232. The MIU provides the RCS with the following functions: the MIU controller receives CDMA channel assignment instructions from the WAC and assigns a modem to a user information signal which is applied to the line interface of the MUX and a modem to receive the CDMA channel from the SU; it also combines the CDMA transmit modem data for each of the MIU CDMA modems; multiplexes I and Q transmit message data from the CDMA modems for transmission to the VDC; receives analog I and Q receive message data from the VDC; distributes the I and Q data to the CDMA modems; transmits and receives digital AGC data; distributes the AGC data to the CDMA modems; and sends MIU board status and maintenance information to the WAC 920.

The MIU controller 1230 of the exemplary embodiment of the present invention contains one communication microprocessor 1240, such as the MC68360 "QUICC" processor, and includes a memory 1242 having a Flash PROM memory 1243 and a SRAM memory 1244. Flash PROM 1243 is provided to contain the program code for the microprocessors 1240, and the memory 1243 is downloadable and reprogrammable to support new program versions. SRAM 1244 is provided to contain the temporary data space needed by the MC68360 microprocessor 1240 when the MIU controller 1230 reads or writes data to memory.

The MIU CLK circuit 1231 provides a timing signal to the MIU controller 1230, and also provides a timing signal to the CDMA modems. The MIU CLK circuit 1231 receives, and is synchronized to, the system clock signal wo(t). The controller clock signal generator 1213 also receives and synchronizes to the spreading code clock signal pn(t) which is distributed to the CDMA modems 1210, 1211, 1212, 1215 from the MUX.

The RCS of the present embodiment includes a system modem 1210 contained on one MIU. The system modem 1210 includes a broadcast spreader (not shown) and a pilot generator (not shown). The broadcast modem provides the broadcast information used by the exemplary system, and the broadcast message data is transferred from the MIU controller 1230 to the system modem 1210. The system modem also includes four additional modems (not shown) which are used to transmit the signals CT1 through CT4 and AX1 through AX4. The system modem 1210 provides unweighted I and Q broadcast message data signals which are applied to the VDC. The VDC adds the broadcast message data signal to the MIU CDMA modem transmit data of all CDMA modems 1210, 1211, 1212, 1215 and the global pilot signal.

The pilot generator (PG) 1250 provides the global pilot signal which is used by the present invention, and the global pilot signal is provided to the CDMA modems 1210, 1211, 1212, 1215 by the MIU controller 1230. However, other embodiments of the present invention do not require the MIU controller to generate the global pilot signal, but include a global pilot signal generated by any form of CDMA spreading code generator. In the described embodiment of the invention, the unweighted I and Q global pilot signal is also sent to the VDC where it is assigned a weight, and added to the MIU CDMA modem transmit data and broadcast message data signal.

System timing in the RCS is derived from the E1 interface. There are four MUXs in an RCS, three of which (905, 906 and 907) are shown in FIG. 9. Two MUXs are located on each chassis. One of the two MUXs on each chassis is designated as the master, and one of the masters is designated as the system master. The MUX which is the system master derives a 2.048 MHz PCM clock signal from the E1 interface using a phase-locked loop (not shown). In turn, the system master MUX divides the 2.048 Mhz PCM clock signal in frequency by 16 to derive a 128 KHz reference clock signal. The 128 KHz reference clock signal is distributed from the MUX that is the system master to all the other MUXs. In turn, each MUX multiplies the 128 KHz reference clock signal in frequency to synthesize the system clock signal which has a frequency that is twice the frequency of the PN-clock signal. The MUX also divides the 128 KHz clock signal in frequency by 16 to generate the 8 KHz frame synch signal which is distributed to the MIUs. The system clock signal for the exemplary embodiment has a frequency of 11.648 Mhz for a 7 MHz bandwidth CDMA channel Each MUX also divides the system clock signal in frequency by 2 to obtain the PN-clock signal and further divides the PN-clock signal in frequency by 29 877 120 (the PN sequence length) to generate the PN-synch signal which indicates the epoch boundaries. The PN-synch signal from the system master MUX is also distributed to all MUXs to maintain phase alignment of the internally generated clock signals for each MUX. The PN-synch signal and the frame synch signal are aligned. The two MUXs that are designated as the master MUXs for each chassis then distribute both the system clock signal and the PN-clock signal to the MIUs and the VDC.

The PCM highway interface 1220 connects the system PCM highway 911 to each CDMA modem 1210, 1211,

1212, 1215. The WAC controller transmits modem control information, including traffic message control signals for each respective user information signal to the MIU controller 1230 through the HSB 970. Each CDMA modem 1210, 1211, 1212, 1215 receives a traffic message control signal, which includes signaling information, from the MIU controller 1111. Traffic message control signals also include call control (CC) information and spreading code and despreading code sequence information.

The MIU also includes the transmit data combiner 1232 which adds weighted CDMA modem transmit data including in-phase (I) and quadrature (Q) modem transmit data from the CDMA modems 1210, 1211, 1212, 1215 on the MIU. The I modem transmit data is added separately from the Q modem transmit data. The combined I and Q modem transmit data output signal of the transmit data combiner 1232 is applied to the I and Q multiplexer 1233 that creates a single CDMA transmit message channel composed of the I and Q modem transmit data multiplexed into a digital data stream.

The receiver data input Circuit (RDI) 1234 receives the analog differential I and Q Data from the video distribution circuit (VDC) 940 shown in FIG. 9 and distributes analog differential I and Q data to each of the CDMA modems 1210, 1211, 1212, 1215 of the MIU. The automatic gain control (AGC) distribution circuit 1235 receives the AGC data signal from the VDC and distributes the AGC data to each of the CDMA modems of the MIU. The TRL circuit 1233 receives the traffic lights information and similarly distributes the Traffic light data to each of the Modems 1210,1211, 1212, 1215.

XXII. The CDMA Modem

The CDMA modem provides for generation of CDMA spreading codes and synchronization between transmitter and receiver. It also provides four fill duplex channels (TR0, TR1, TR2, TR3) programmable to 64, 32, 16, and 8 ksym/sec. each, for spreading and transmission at a specific power level. The CDMA modem measures the received signal strength to allow automatic power control, it generates and transmits pilot signals, and encodes and decodes using the signal for forward error correction (FEC). The modem in an SU also performs transmitter spreading code pulse shaping using an FIR filter. The CDMA modem is also used by the subscriber unit (SU), and in the following discussion those features which are used only by the SU are distinctly pointed out. The operating frequencies of the CDMA modem are given in Table 10.

TABLE 10

Operating Frequencies

| Bandwidth (MHz) | Chip Rate (MHz) | Symbol Rate (KHz) | Gain (Chips/Symbol) |
|---|---|---|---|
| 7 | 5.824 | 64 | 91 |
| 10 | 8.320 | 64 | 130 |
| 10.5 | 8.512 | 64 | 133 |
| 14 | 11.648 | 64 | 182 |
| 15 | 12.480 | 64 | 195 |

Figure 13:
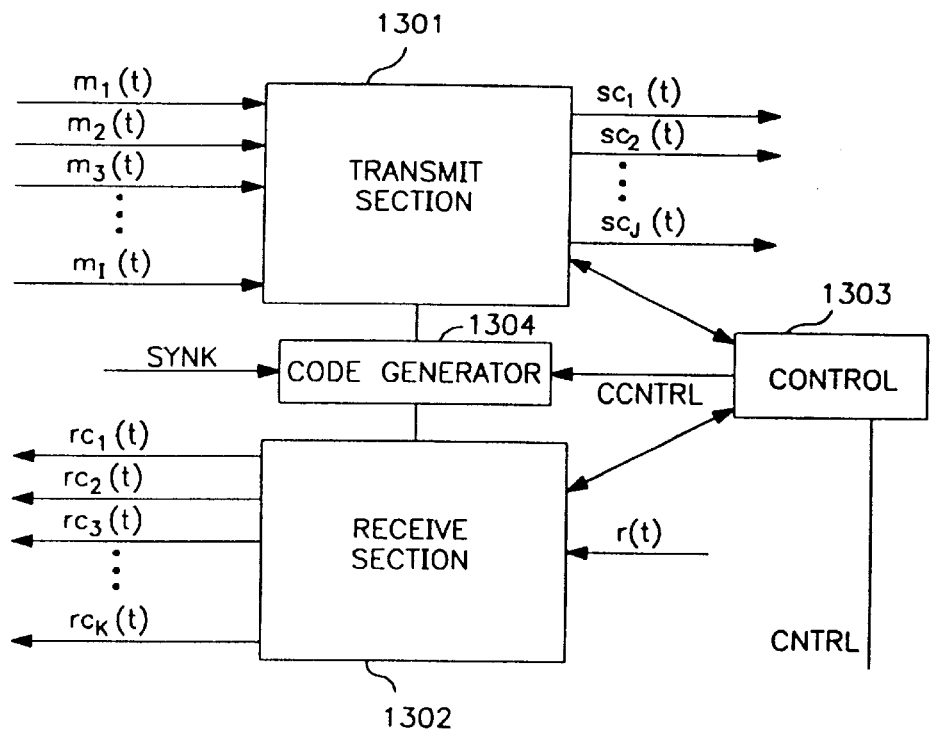
FIG. 13 is a high level block diagram showing the transmit, receive, control and code generation circuitry of the CDMA modem.

Each CDMA modem 1210, 1211, 1212, 1215 of FIG. 12, and as shown in FIG. 13, is composed of a transmit section 1301 and a receive section 1302. Also included in the CDMA modem is a control center 1303 which receives control messages CNTRL from the external system. These messages are used, for example, to assign particular spreading codes, activate the spreading or despreading or to assign transmission rates. In addition, the CDMA modem has a code generator means 1304 used to generate the various spreading and despreading codes used by the CDMA modem. The transmit section 1301 is for transmitting the input information and control signals $m_i(t)$, i=1,2, ... I as spread-spectrum processed user information signals $sc_j(t)$, j=1,2, ... J. The transmit section 1301 receives the global pilot code from the code generator 1304 which is controlled by the control means 1303. The spread spectrum processed user information signals are ultimately added to other similar processed signals and transmitted as CDMA channels over the CDMA RF forward message link, for example to the SUs. The receive section 1302 receives CDMA channels as r(t) and despreads and recovers the user information and control signals $rc_k(t)$, k=1,2, ... K transmitted over the CDMA RF reverse message link, for example to the RCS from the SUs.

XXIII. CDMA Modem Transmitter Section

Figure 14:
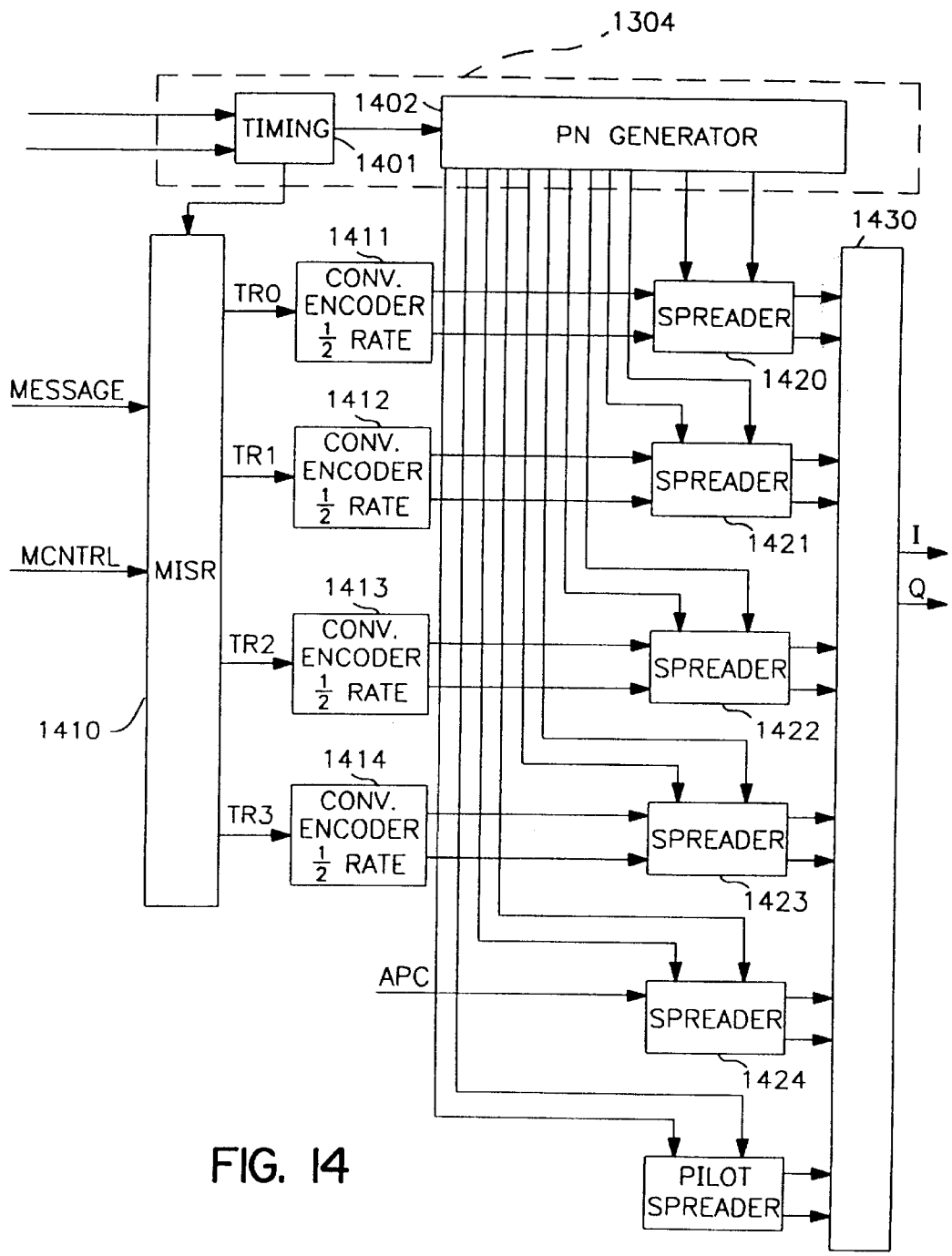
FIG. 14 is a block diagram of the transmit section of the CDMA modem.

Referring to FIG. 14, the code generator means 1304 includes transmit timing control logic 1401 and spreading code PN-generator 1402, and the transmit section 1301 includes modem input signal receiver (MISR) 1410, convolution encoders 1411, 1412, 1413, 1414, spreaders 1420, 1421, 1422, 1423, 1424 and combiner 1430. The transmit section 1301 receives the message data channels MESSAGE, convolutionally encodes each message data channel in the respective convolutional encoder 1411, 1412, 1413, 1414, modulates the data with random spreading code sequence in the respective spreader 1420, 1421, 1422, 1423, 1424, and combines modulated data from all channels, including the pilot code received in the described embodiment from the code generator, in the combiner 1430 to generate I and Q components for RF transmission. The transmitter section 1301 of the present embodiment supports four (TR0, TR1, TR2, TR3) 64, 32, 16, 8 kbs programmable channels. The message channel data is a time multiplexed signal received from the PCM highway 1201 through PCM interface 1220 and input to the MISR 1410.

Figure 15:
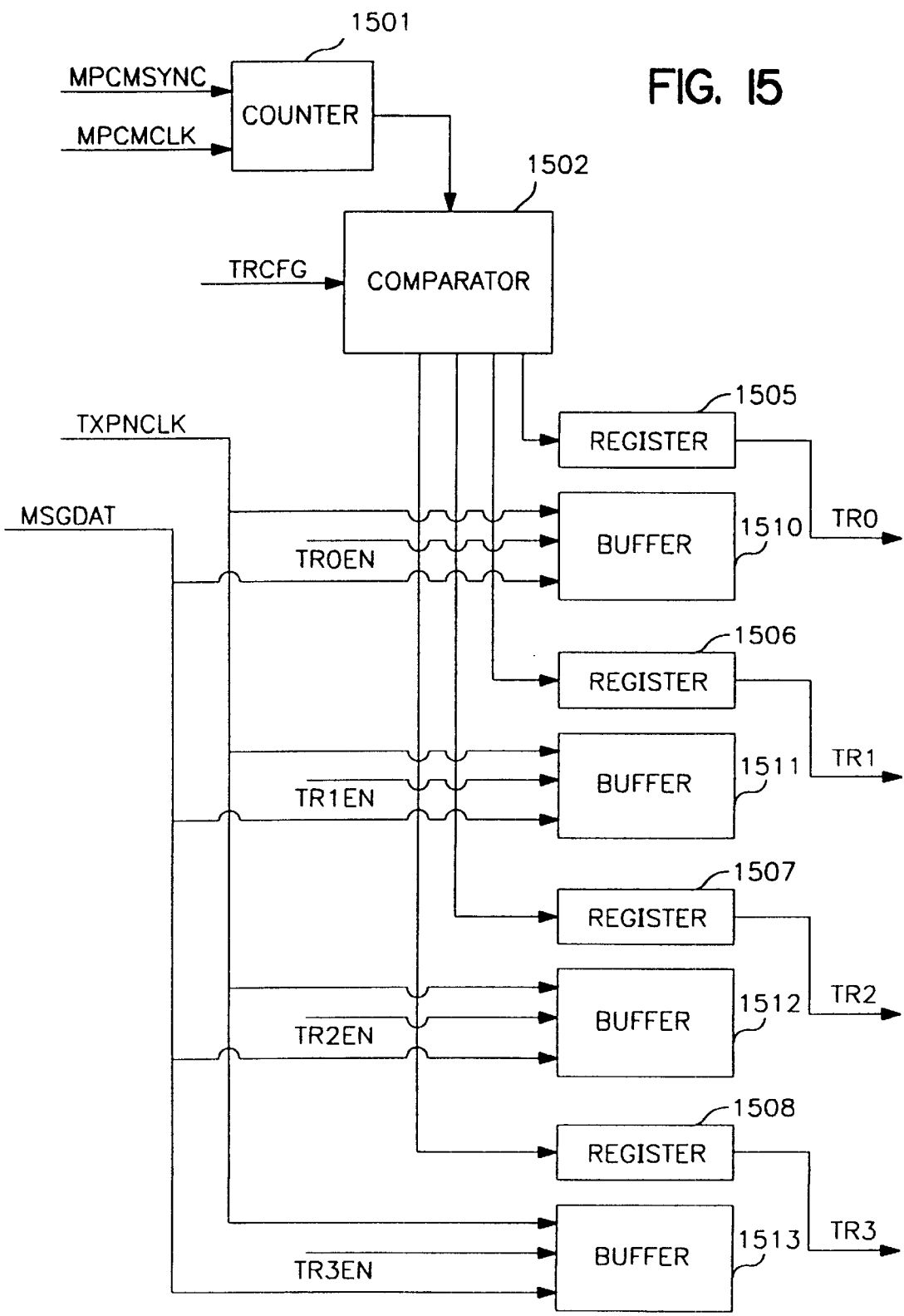
FIG. 15 is a block diagram of an exemplary modem input signal receiver.

FIG. 15 is a block diagram of an exemplary MISR 1410. For the exemplary embodiment of the present invention, a counter is set by the 8 KHz frame synchronization signal MPCMSYNC and is incremented by 2.048 MHz MPCM-CLK from the timing circuit 1401. The counter output is compared by comparator 1502 against TRCFG values corresponding to slot time location for TR0, TR1, TR2, TR3 message channel data; and the TRCFG values are received from the MIU controller 1230 in MCTRL. The comparator sends count signal to the registers 1505, 1506, 1507 and 1508 which clocks message channel data into buffers 1510, 1511, 1512, 1513 using the TXPCNCLK timing signal derived from the system clock, The message data is provided from the signal MSGDAT from the PCM highway signal MESSAGE when enable signals TR0EN, TR1EN, TR2EN and TR3EN from timing control logic 1401 are active. In further embodiments, MESSAGE may also include signals that enable registers depending upon an encryption rate or data rate. If the counter output is equal to one of the channel location addresses, the specified transmit message data in registers 1510, 1511, 1512, 1513 are input to the convolutional encoders 1411, 1412, 1413, 1414 shown in FIG. 14.

The convolutional encoder enables the use of forward error correction (FEC) techniques, which are well known in the art. FEC techniques depend on introducing redundancy in generation of data in encoded form. Encoded data is transmitted and the redundancy in the data enables the receiver decoder device to detect and correct errors. One embodiment of the present invention employs convolutional encoding. Additional data bits are added to the data in the encoding process and are the coding overhead. The coding rate is expressed as the ratio of data bits transmitted to the total bits (code data+redundant data) transmitted and is called the rate "R" of the code.

Convolution codes are codes where each code bit is generated by the convolution of each new uncoded bit with a number of previously coded bits. The total number of bits used in the encoding process is referred to as the constraint length (K) of the code. In convolutional coding, data is clocked into a shift register of K bits length so that an incoming bit is clocked into the register, and it and the existing K−1 bits are convolutionally encoded to create a new symbol. The convolution process consists of creating a symbol consisting of a module-2 sum of a certain pattern of available bits, always including the first bit and the last bit in at least one of the symbols.

Figure 16:
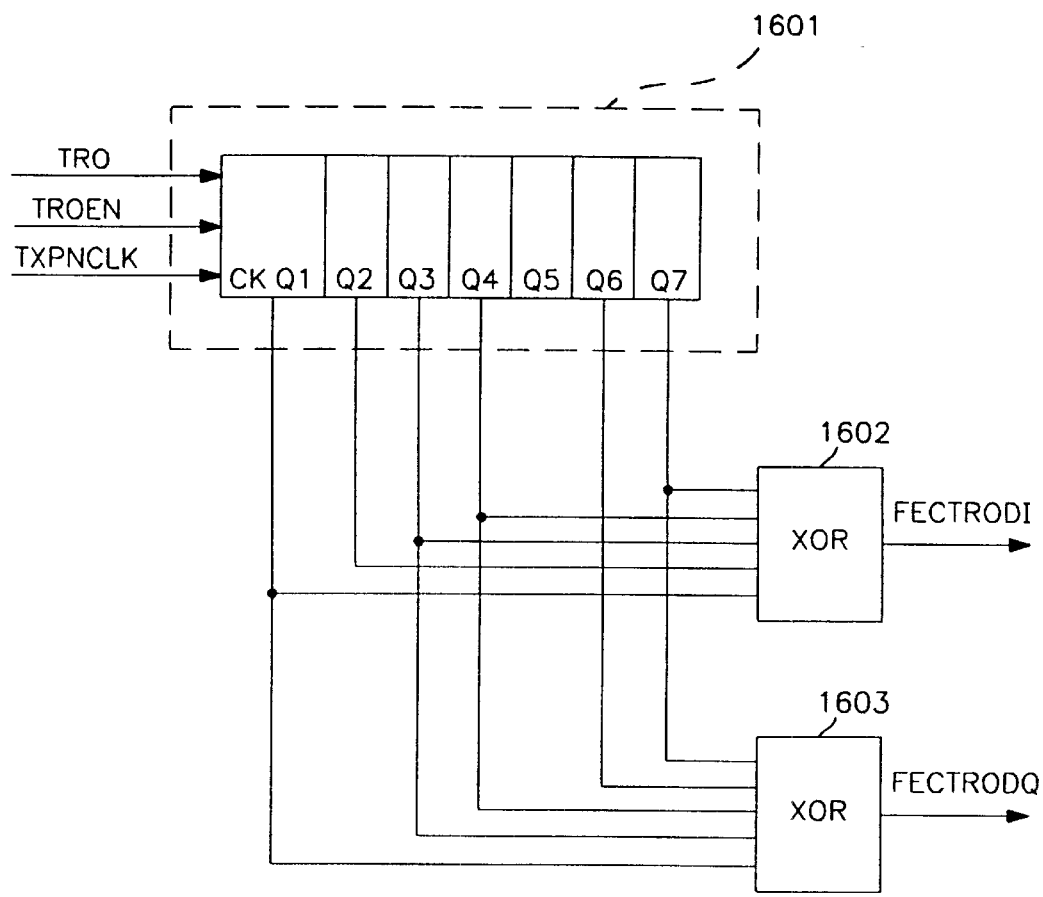
FIG. 16 is a block diagram of an exemplary convolutional encoder as used in the present invention.

FIG. 16 shows the block diagram of a K=7, R=½ convolution encoder suitable for use as the encoder 1411 shown in FIG. 14. This circuit encodes the TR0 channel as used in one embodiment of the present invention. Seven-bit register 1601 with stages Q1 through Q7 uses the signal TXPNCLK to clock in TR0 data when the TR0EN signal is asserted. The output value of stages Q1, Q2, Q3, Q4, Q6, and Q7 are each combined using EXCLUSIVE-OR Logic 1602, 1603 to produce respective I and Q channel FEC data for the TR0 channel FECTR0DI and FECTR0DQ.

Two output symbol streams FECTR0DI and FECTR0DQ are generated. The FECTR0DI symbol stream is generated by EXCLUSIVE OR logic 1602 of shift register outputs corresponding to bits 6, 5, 4,3, and 0, (Octal 171) and is designed as In phase component "I" of the transmit message channel data. The symbol stream FECTR0DQ is likewise generated by EXCLUSIVE-OR logic 1603 of shift register outputs from bits 6, 4 3, 1 and 0, (Octal 133) and is designated as Quadrature component "Q" of the transmit message channel data. Two symbols are transmitted to represent a single encoded bit creating the redundancy necessary to enable error correction to take place on the receiving end.

Referring to FIG. 14, the shift enable clock signal for the transmit message channel data is generated by the control timing logic 1401. The convolutionally encoded transmit message channel output data for each channel is applied to the respective spreader 1420, 1421, 1422, 1423, 1424 which multiplies the transmit message channel data by its preassigned spreading code from code generator 1402. This spreading code is generated by control 1303 as previously described, and is called a random pseudonoise signature code (PN-code).

The output signal of each spreader 1420, 1421, 1422, 1423, 1424 is a spread transmit data channel. The operation of the spreader is as follows: the spreading of channel output (I+jQ) multiplied by a random sequence (PNI+jPNQ) yields the in-phase component I of the result being composed of (I xor PNI) and (−Q xor PNQ). Quadrature component Q of the result is (Q xor PNI) and (I xor PNQ). Since there is no channel data input to the pilot channel logic (I=1, Q values are prohibited), the spread output signal for pilot channels yields the respective sequences PNI for I component and PNQ for Q component.

The combiner 1430 receives the I and Q spread transmit data channels and combines the channels into an I modem transmit data signal (TXIDAT) and a Q modem transmit data signal (TXQDAT). The I-spread transmit data and the Q spread transmit data are added separately.

For an SU, the CDMA modem transmit section 1301 includes the FIR filters to receive the I and Q channels from the combiner to provide pulse shaping, close-in spectral control and x/sin (x) correction for the transmitted signal. Separate but identical FIR filters receive the I and Q spread transmit data streams at the chipping rate, and the output signal of each of the filters is at twice the chipping rate. The exemplary FIR filters are 28 tap even symmetrical filters, which upsample (interpolate) by 2. The upsampling occurs before the filtering, so that 28 taps refers to 28 taps at twice the chipping rate, and the upsampling is accomplished by setting every other sample a zero. Exemplary coefficients are shown in Table 11.

TABLE 11

| | | | | | | Coefficient Values | | | | | | | |
|---|---|---|---|---|---|---|---|---|---|---|---|---|---|
| Coeff. No.: | 0 | 1 | 2 | 3 | 4 | 5 | 6 | 7 | 8 | 9 | 10 | 11 | 12 | 13 |
| Value: | 3 | −11 | −34 | −22 | 19 | 17 | −32 | −19 | 52 | 24 | −94 | −31 | 277 | 468 |
| Coeff. No.: | 14 | 15 | 16 | 17 | 18 | 19 | 20 | 21 | 22 | 24 | 25 | 26 | 27 | |
| Value | 277 | −31 | −94 | 24 | 52 | −19 | −32 | 17 | 19 | −22 | −34 | −11 | 3 | |

XXIV. CDMA Modem Receiver Section

Referring to FIGS. 9 and 12, the RF receiver 950 of the present embodiment accepts analog input I and Q CDMA channels, which are transmitted to the CDMA modems 1210, 1211, 1212, 1215 through the MIUs 931, 932, 933 from the VDC 940. These I and Q CMDA channel signals are sampled by the CDMA modem receive section 1302 (shown in FIG. 13) and converted to I and Q digital receive message signal using an analog to digital (A/D) converter 1730, shown in FIG. 17. The sampling rate of the A/D converter of the exemplary embodiment of the present invention is equivalent to the despreading code rate. The I and Q digital receive message signals are then despread with correlators using six different complex spreading code sequences corresponding to the despreading code sequences of the four channels (TR0, TR1, TR2, TR3), APC information and the pilot code.

Time synchronization of the receiver to the received signal is separated into two phases; there is an initial acquisition phase and then a tracking phase after the signal timing has been acquired. The initial acquisition is done by shifting the phase of the locally generated pilot code sequence relative to the received signal and comparing the output of the pilot despreader to a threshold. The method used is called sequential search. Two thresholds (match and dismiss) are calculated from the auxiliary despreader. Once the signal is acquired, the search process is stopped and the tracking process begins. The tracking process maintains the code generator 1304 (shown in FIGS. 13 and 17) used by the receiver in synchronization with the incoming signal. The tracking loop used is the delay-locked loop (DLL) and is implemented in the acquisition & track 1701 and the IPM 1702 blocks of FIG. 17.

Figure 17:
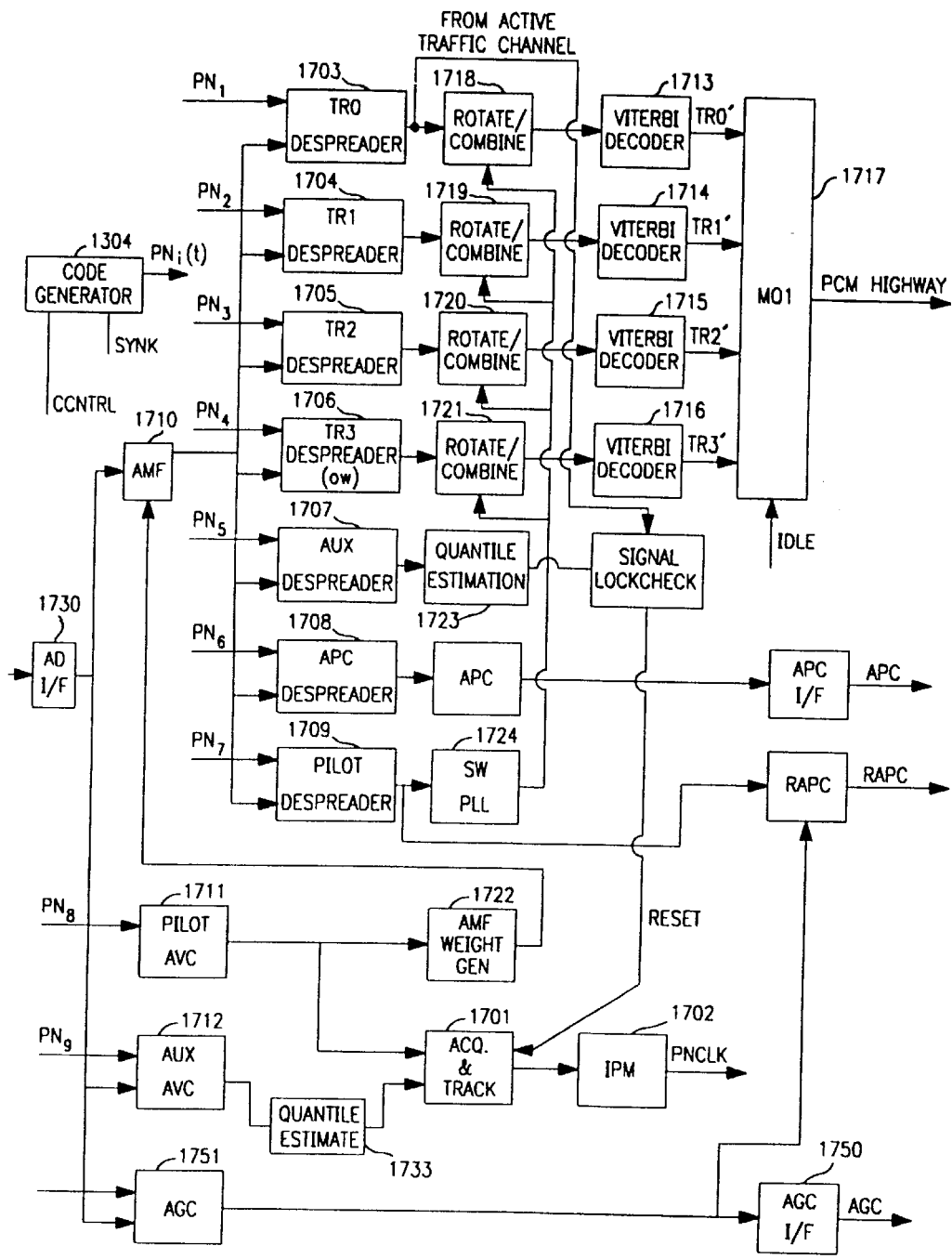
FIG. 17 is a block diagram of the receive section of the CDMA modem.

In FIG. 13, the modem controller 1303 implements the phase lock loop (PLL) as a software algorithm in SW PLL logic 1724 of FIG. 17 that calculates the phase and frequency shift in the received signal relative to the transmitted signal. The calculated phase shifts are used to derotate the phase shifts in rotate and combine blocks 1718, 1719, 1720, 1721 of the multipath data signals for combining to produce output signals corresponding to receive channels TR0', TR1', TR2', TR3'. The data is then Viterbi decoded in Viterbi decoders 1713, 1714, 1715, 1716 to remove the convolutional encoding in each of the received message channels.

FIG. 17 indicates that the Code Generator 1304 provides the code sequences $Pn_i(t)$, i=1,2, . . . I used by the receive channel despreaders 1703, 1704, 1705, 1706, 1707, 1708, 1709. The code sequences generated are timed in response to the SYNK signal of the system clock signal and are determined by the CCNTRL signal from the modem controller 1303 shown in FIG. 13. Referring to FIG. 17, the CDMA modem receiver section 1302 includes adaptive matched filter (AMF) 1710, channel despreaders 1703, 1704,1705, 1706, 1707, 1708, 1709, pilot AVC 1711, auxiliary AVC 1712, Viterbi decoders 1713, 1714, 1715, 1716, modem output interface (MOI) 1717, rotate and combine logic 1718, 1719, 1720, 1721, AMF weight generator 1722, and quantile estimation logic 1723.

In another embodiment of the invention, the CDMA modem receiver also includes a bit error integrator to measure the BER of the channel and idle code insertion logic between the Viterbi decoders 1713, 1714, 1715, 1716 and the MOI 1717 to insert idle codes in the event of loss of the message data.

Figure 18:
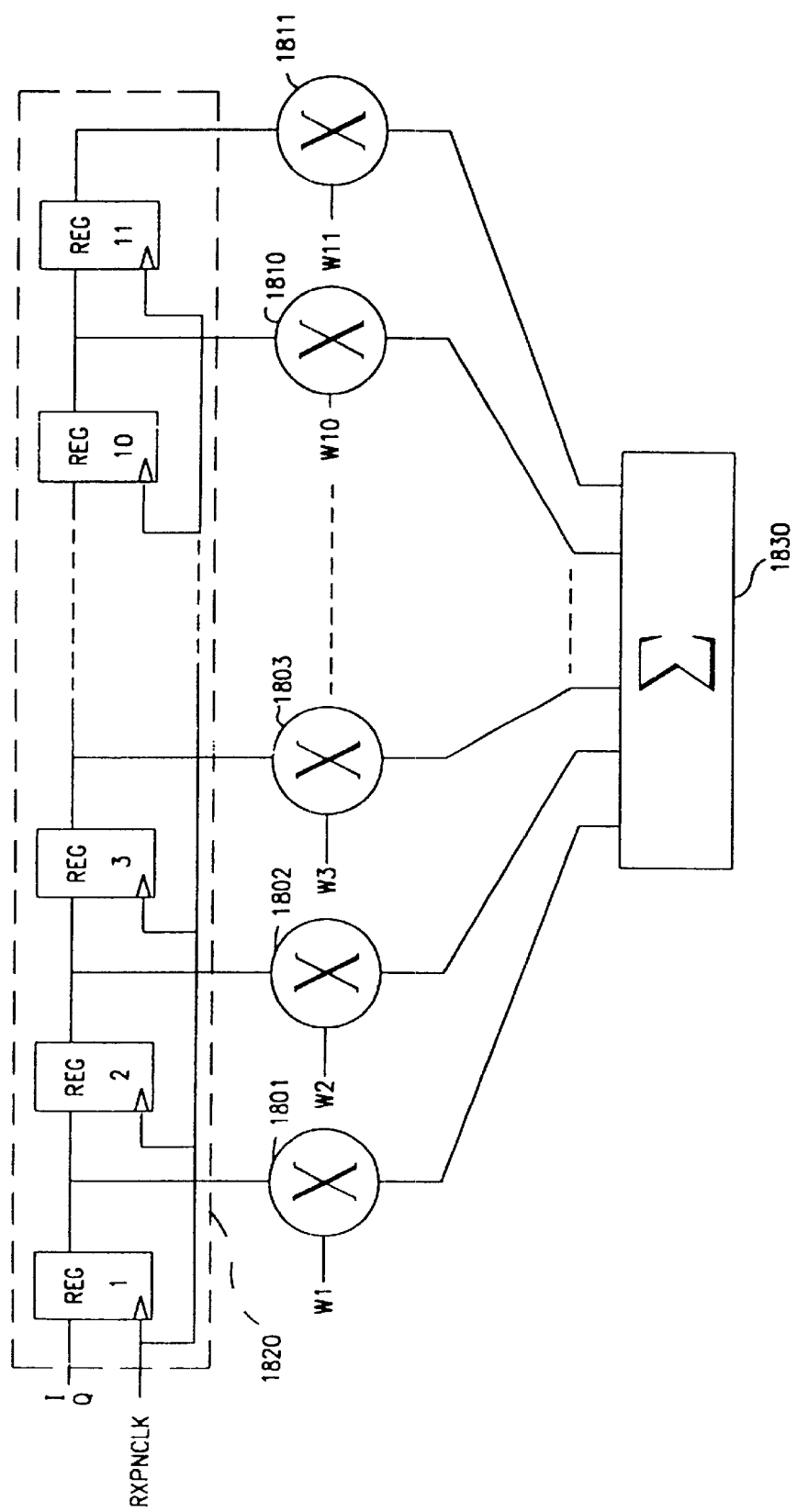
FIG. 18 is a block diagram of an exemplary adaptive matched filter as used in the CDMA modem receive section.

The AMF 1710 resolves multipath interference introduced by the air channel. The exemplary AMF 1710 uses an 11 stage complex FIR filter as shown in FIG. 18. The received I and Q digital message signals are received at the register 1820 from the A/D 1730 of FIG. 17 and are multiplied in multipliers 1801, 1802, 1803, 1810, 1811 by I and Q channel weights W1 to W11 received from AMF weight generator 1722 of FIG. 17. In the exemplary embodiment, the A/D 1730 provides the I and Q digital receive message signal data as 2's complement values, 6 bits for I and 6 bits for Q which are clocked through an 11 stage shift register 1820 responsive to the receive spreading-code clock signal RXPNCLK. The signal RXPNCLK is generated by the timing section 1401 of code generation logic 1304. Each stage of the shift register is tapped and complex multiplied in the multipliers 1801, 1802, 1803, 1810, 1811 by individual (6-bit I and 6-bit Q) weight values to provide 11 tap-weighted products which are summed in adder 1830, and limited to 7-bit I and 7-bit Q values.

The CDMA modem receive section 1302 (shown in FIG. 13) provides independent channel despreaders 1703, 1704, 1705, 1706, 1707, 1708, 1709 (shown in FIG. 17) for despreading the message channels. The described embodiment despreads 7 message channels, each despreader accepting a 1-bit I b 1-bit Q despreading code signal to perform a complex correlation of this code against a 8-bit I by 8-bit Q data input. The 7 despreaders correspond to the 7 channels: traffic channel 0 (TR0'), TR1', TR2', TR3', AUX (a spare channel), APC and pilot (PLT).

Figure 19:
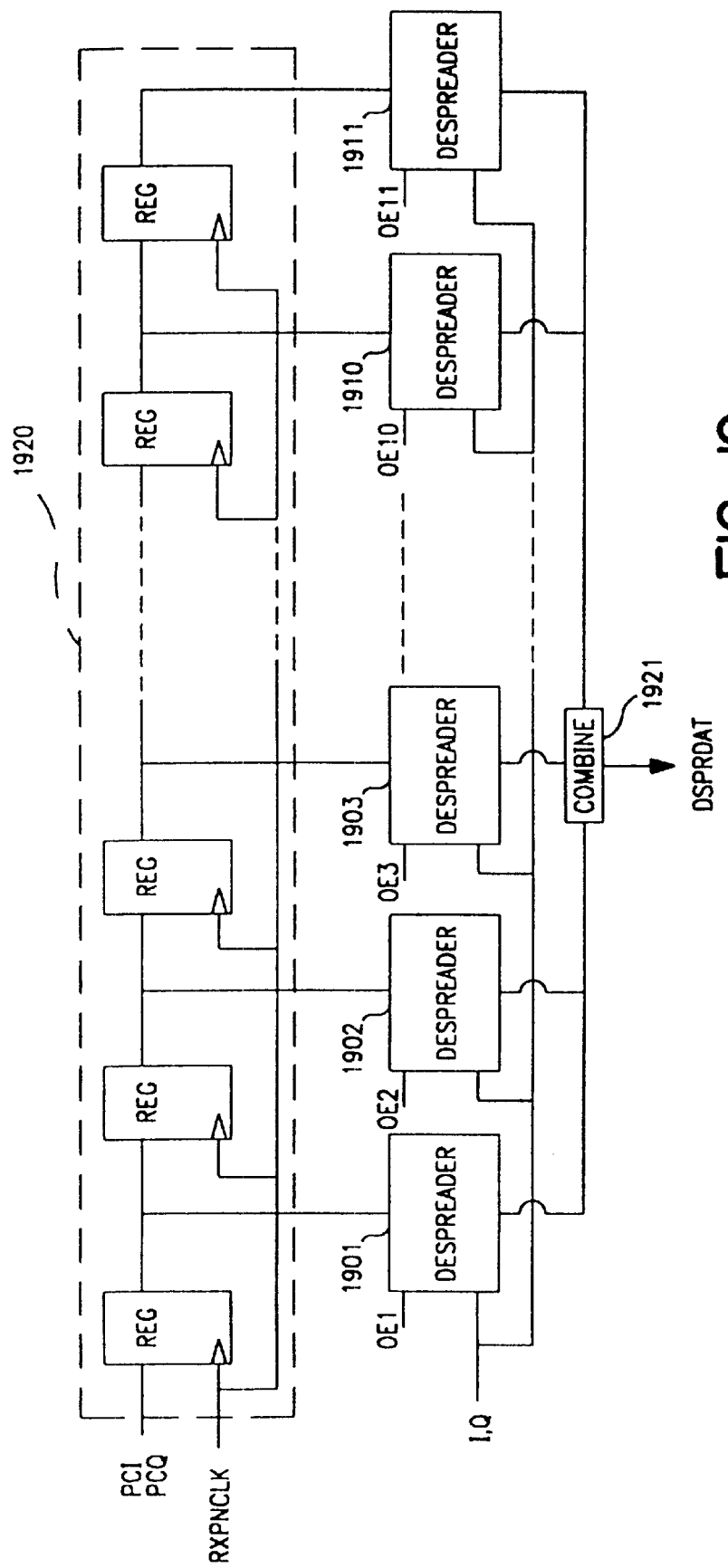
FIG. 19 is a block diagram of an exemplary pilot rake as used in the CDMA modem receive section.

The pilot AVC 1711 shown in FIG. 19 receives the I and Q pilot spreading code sequence values PCI and PCQ into shift register 1920 responsive to the timing signal RXPNCLK, and includes 11 individual despreaders 1901 through 1911 each correlating the I and Q digital receive message signal data with a one chip delayed version of the same pilot code sequence. Signals OE1, OE2, . . . OE11 are used by the modem control 1303 to enable the despreading operation. The output signals of the despreaders are combined in combiner 1920 forming correlation signal DSPRDAT of the Pilot AVC 1711, which is received by the ACQ & track logic 1701 (shown in FIG. 17), and ultimately by modem controller 1303 (shown in FIG. 13). The ACQ & track logic 1701 uses the correlation signal value to determine if the local receiver is synchronized with its remote transmitter.

Figure 20:
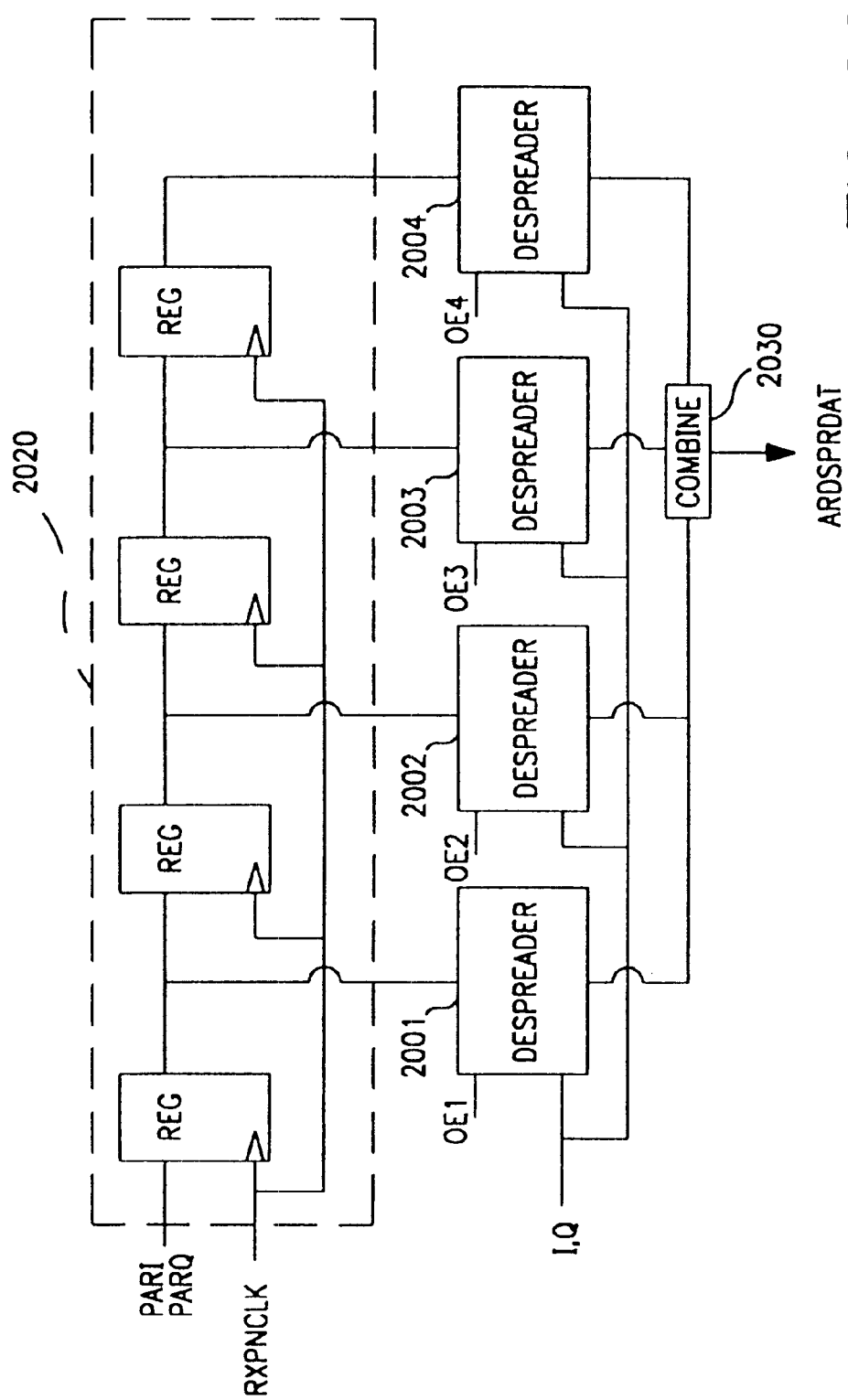
FIG. 20 is a block diagram of an exemplary auxiliary pilot rake as used in the CDMA modem receive section.

The auxiliary AVC 1712 also receives the I and Q digital receive message signal data and, in the described embodiment, includes four separate despreaders 2001, 2002, 2003, 2004 as shown in FIG. 20. Each despreader receives and correlates the I and Q digital receive message data with delayed versions of the same despreading code sequence PARI and PARQ which are provided by code generator 1304 input to and contained in shift register 2020. The output signals of the despreaders 2001, 2002, 2003, 2004 are combined in combiner 2030 which provides noise correlation signal ARDSPRDAT. The auxiliary AVC spreading code sequence does not correspond to any transmit spreading code sequence of the system. Signals OE1, OE2, . . . OE4 are used by the modem control 1303 to enable the despreading operation. The Auxiliary AVC 1712 provides a noise correlation signal ARDSPRDAT from which quantile estimates are calculated by the Quantile estimator 1733, and provides a noise level measurement to the ACQ & Track logic 1701 (shown in FIG. 17) and modem controller 1303 (shown in FIG. 13).

Each despread channel output signal corresponding to the received message channels TR0', TR1', TR2', and TR3' is input to a corresponding Viterbi decoder 1713, 1714, 1715, 1716 shown in FIG. 17 which performs forward error correction on convolutionally encoded data. The Viterbi decoders of the exemplary embodiment have a constraint length of K=7 and a rate of R=½. The decoded despread message channel signals are transferred from the CDMA modem to the PCM Highway 1201 through the MOI 1717. The operation of the MOI is essentially the same as the operation of the MISR of the transmit section 1301 (shown in FIG. 13) except in reverse.

The CDMA modem receiver section 1302 implements several different algorithms during different phases of the acquisition, tracking and despreading of the receive CDMA message signal.

When the received signal is momentarily lost (or severely degraded) the idle code insertion algorithm inserts idle codes in place of the lost or degraded receive message data to prevent the user from hearing loud noise bursts on a voice call. The idle codes are sent to the MOI 1717 (shown in FIG. 17) in place of the decoded message channel output signal from the Viterbi decoders 1713, 1714, 1715, 1716. The idle code used for each traffic channel is programmed by the Modem Controller 1303 by writing the appropriate pattern IDLE to the MOI, which in the present embodiment is a 8 bit word for a 64 kbs stream, 4 bit word for a 32 kbs stream.

XXV. Modem Algorithms for Acquisition and Tracking of Received Pilot Signal

The acquisition and tracking algorithms are used by the receiver to determine the approximate code phase of a received signal, synchronize the local modem receiver despreaders to the incoming pilot signal, and track the phase of the locally generated pilot code sequence with the received pilot code sequence. Referring to FIGS. 13 and 17, the algorithms are performed by the modem controller 1303, which provides clock adjust signals to code generator 1304. These adjust signals cause the code generator for the despreaders to adjust locally generated code sequences in response to measured output values of the pilot rake 1711 and quantile values from quantile estimators 1723B. Quantile values are noise statistics measured from the in-phase and quadrature channels from the output values of the AUX vector correlator 1712 (shown in FIG. 17). Synchronization of the receiver to the received signal is separated into two phases; an initial acquisition phase and a tracking phase. The initial acquisition phase is accomplished by clocking the locally generated pilot spreading code sequence at a higher or lower rate than the received signal's spreading code rate, sliding the locally generated pilot spreading code sequence and performing sequential probability ratio test (SPRT) on the output of the pilot vector correlator 1711. The tracking phase maintains the locally generated spreading code pilot sequence in synchronization with the incoming pilot signal. Details of the quantile estimators 1723 B may be found in U.S. Pat. No. 5,535,238 entitled "ADAPTIVE POWER CONTROL FOR A SPREAD SPECTRUM COMMUNICATIONS SYSTEM" which is incorporated by reference herein for its teachings on adaptive power control systems.

The SU cold acquisition algorithm is used by the SU CDMA modem when it is first powered up, and therefore has no knowledge of the correct pilot spreading code phase, or when an SU attempts to reacquire synchronization with the incoming pilot signal but has taken an excessive amount of time. The cold acquisition algorithm is divided into two subphases. The first subphase consists of a search over the length 233415 code used by the FBCH. Once this sub-code phase is acquired, the pilot's 233415×128 length code is known to within an ambiguity of 128 possible phases. The second subphase is a search of these remaining 128 possible phases. In order not to lose synch with the FBCH, in the second phase of the search, it is desirable to switch back and forth between tracking of the FBCH code and attempting acquisition of the pilot code.

The RCS acquisition of short access pilot (SAXPT) algorithm is used by an RCS CDMA modem to acquire the SAXPT pilot signal of an SU. Additional details of this technique are described in Section XXXXII hereinafter entitled "A Method Of Controlling Initial Power Ramp-Up In CDMA Systems By Using Short Codes" filed on even date herewith and herein incorporated by reference. The algorithm is a fast search algorithm because the SAXPT is a short code sequence of length N, where N=chips/symbol, and ranges from 45 to 195, depending on the system's bandwidth. The search cycles through all possible phases until acquisition is complete.

The RCS acquisition of the long access pilot (LAXPT) algorithm begins immediately after acquisition of SAXPT. The SU's code phase is known within a multiple of a symbol duration, so in the exemplary embodiment of the invention there may be 7 to 66 phases to search within the round trip delay from the RCS. This bound is a result of the SU pilot signal being synchronized to the RCS global pilot signal.

The re-acquisition algorithm begins when loss of code lock (LOL) occurs. A Z-search algorithm is used to speed the process on the assumption that the code phase has not drifted far from where it was the last time the system was locked. The RCS uses a maximum width of the Z-search windows bounded by the maximum round trip propagation delay.

The pre-track period immediately follows the acquisition or re-acquisition algorithms and immediately precedes the tracking algorithm. Pre-track is a fixed duration period during which the receive data provided by the modem is not considered valid. The pre-track period allows other modem algorithms, such as those used by the ISW PLL 1724, ACQ & tracking, AMF weight GEN 1722, to prepare and adapt to the current channel. The pre-track period is two parts. The first part is the delay while the code tracking loop pulls in. The second part is the delay while the AMF tap weight calculations are performed by the AMF weight gen 1722 to produce settled weighting coefficients. Also in the second part of the pre-track period, the carrier tracking loop is allowed to pull in by the SW PLL 1724, and the scalar quantile estimates are performed in the quantile estimator 1723A.

The tracking process is entered after the pre-track period ends. This process is actually a repetitive cycle and is the only process phase during which receive data provided by the modem may be considered valid. The following operations are performed during this phase: AMF tap weight update, carrier tracking, code tracking, vector quantile update, scalar quantile update, code lock check, derotation and symbol summing and power control (forward and reverse)

If LOL is detected, the modem receiver terminates the track algorithm and automatically enters the reacquisition algorithm. In the SU, a LOL causes the transmitter to be shut down. In the RCS, LOL causes forward power control to be disabled with the transmit power held constant at the level immediately prior to loss of lock. It also causes the return power control information being transmitted to assume a 010101 ... pattern, causing the SU to hold its transmit power constant. This can be performed using the signal lock check function which generates the reset signal to the acquisition and tracking circuit 1701.

Two sets of quantile statistics are maintained, one by quantile estimator 1723B and the other by the scalar quantile estimator 1723A. Both are used by the modem controller 1303. The first set is the "vector" quantile information, so named because it is calculated from the vector of four complex values generated by the AUX AVC receiver 1712. The second set is the scalar quantile information, which is calculated from the single complex value AUX signal that is output from the AUX despreader 1707. The two sets of information represent different sets of noise statistics used to maintain a predetermined probability of false alarm ($P_{fa}$). The vector quantile data is used by the acquisition and reacquisition algorithms implemented by the modem controller 1303 to determine the presence of a received signal in noise, and the scalar quantile information is used by the code lock check algorithm.

For both the vector and scalar cases, quantile information consists of calculated values of lambda0 through lambda2, which are boundary values used to estimate the probability distribution function (p.d.f.) of the despread receive signal and determine whether the modem is locked to the PN code. The aux_power value used in the following C-subroutine is the magnitude squared of the AUX signal output of the scalar correlator array for the scalar quantiles, and the sum of the magnitudes squared for the vector case. In both cases the quantiles are then calculated using the following C-subroutine:

for (n=0; n<3; n++) {
  lambda [n]+=(lambda [n]<Aux_Power)?CG[n]: GM[n];
} where CG[n] are positive constants and GM[n] are negative constants, (different values are used for scalar and vector quantiles).

During the acquisition phase, the search of the incoming pilot signal with the locally generated pilot code sequence employs a series of sequential tests to determine if the locally generated pilot code has the correct code phase relative to the received signal. The search algorithms use the sequential probability ratio test (SPRT) to determine whether the received and locally generated code sequences are in phase. The speed of acquisition is increased by parallelism resulting from having a multi-fingered receiver. For example, in the described embodiment of the invention the main pilot rake 1711 has a total of 11 fingers representing a total phase period of 11 chip periods. For acquisition 8 separate SPRTs are implemented, with each SPRT observing a 4 chip window. Each window is offset from the previous window by one chip, and in a search sequence any given code phase is covered by 4 windows. If all 8 of the SPRT tests are rejected, then the set of windows is moved by 8 chips. If any of the SPRT's is accepted, then the code phase of the locally generated pilot code sequence is adjusted to attempt to center the accepted SPRT's phase within the pilot AVC. It is likely that more than one SPRT reaches the acceptance threshold at the same time. A table lookup is used cover all 256 possible combinations of accept/reject and the modem controller uses the information to estimate the correct center code phase within the pilot rake 1711. Each SPRT is implemented as follows (all operations occur at 64 k symbol rate): Denote the fingers' output level values as I_Finger[n] and Q_Finger[n], where n=0 . . . 10 (inclusive, 0 is earliest (most advanced) finger), then the power of each window is:

$$\text{Power Window}[i] = \sum_{n=0}^{10} (I\_Finger^2[n] + Q\_Finger^2[n])$$

To implement the SPRT's the modem controller then performs for each of the windows the following calculations which are expressed as a pseudo-code subroutine:
/* find bin for Power */
tmp=SIGMA[0];
for (k=0; k<3; k++) {
  if (Power>lambda [k]) tmp=SIGMA[k+1];
}
test_statistic+=tmp; /* update statistic */
if(test_statistic>ACCEPTANCE_THRESHOLD)you've got ACQ;
else if (test_statistic<DISMISSAL_THRESHOLD) {
  forget this code phase;
} else keep trying—get more statistics; where lambda[k] are as defined in the above section on quantile estimation, and SIGMA[k], ACCEPTANCE_THRESHOLD and DISMISSAL_THRESHOLD are predetermined constants. Note that SIGMA[k] is negative for values for low values of k, and positive for right values of k, such that the acceptance and dismissal thresholds can be constants rather than a function of how many symbols worth of data have been accumulated in the statistic.

The modem controller determines which bin delimited by the values of lambda[k] the power level falls into which allows the modem controller to develop an approximate statistic.

For the present algorithm, the control voltage is formed as $\epsilon = y^T By$, where y is a vector formed from the complex valued output values of the pilot vector correlator 1711, and B is a matrix consisting of the constant values pre-determined to maximize the operating characteristics while minimizing the noise as described previously with reference to the quadratic detector.

To understand the operation of the quadratic detector, it is useful to consider the following. A spread spectrum signal, s(t) is passed through a multipath channel with an impulse response $h_c(t)$. The baseband spread signal is described by Equation (30):

$$s(t) = \sum_i C_i p(t - iT_c) \quad \text{Equation (30)}$$

where $C_i$ is a complex spreading code symbol, p(t) is a predefined chip pulse and $T_c$ is the chip time spacing, where $T_c = 1/R_c$ and $R_c$ is the chip rate.

The received baseband signal is represented by Equation (31):

$$r(t) = \sum_i C_i q(t - iT_c - \tau) + n(t) \quad \text{Equation (31)}$$

where $q(t)=p(t)*h_c(t)$, t is an unknown delay and n(t) is additive noise. The received signal is processed by a filter, $h_R(t)$, so the waveform, x(t), to be processed is given by Equation (32):

$$x(t) = \sum_i C_i f(t - iT_c - \tau) + z(t) \quad \text{Equation (32)}$$

where $f(t)=q(t)*h_R(t)$ and $z(t)=n(t)*h_R(t)$.

In the exemplary receiver, samples of the received signal are taken at the chip rate, that is to say, $1/T_c$. These samples, $x(mT_c+\tau')$, are processed by an array of correlators that compute, during the $r^{th}$ correlation period, the quantities given by Equation (33):

$$v_k^{(r)} = \sum_{m=rL}^{rL+L-1} x(mT_c + \tau')C^*_{m+k} \quad \text{Equation (33)}$$

These quantities are composed of a noise component $w_k^{(r)}$ and a deterministic component $y_k^{(r)}$ given by Equation (34):

$$y_k^{(r)} = E[v_k^{(r)}] = Lf(kT_c + \tau' - \tau) \quad \text{Equation (34)}$$

In the sequel, the time index r may be suppressed for ease of writing, although it is to be noted that the function f(t) changes slowly with time.

The samples are processed to adjust the sampling phase, τ', in an optimum fashion for further processing by the receiver, such as matched filtering. This adjustment is described below. To simplify the representation of the process, it is helpful to describe it in terms of the function f(t+τ), where the time-shift, τ, is to be adjusted. It is noted that the function f(t+τ) is measured in the presence of noise. Thus, it may be problematical to adjust the phase τ' based on measurements of the signal f(t+τ). To account for the noise, the function v(τ): v(t)=f(t)+m(t) is introduced, where the term m(t) represents a noise process. The system processor may be derived based on considerations of the function v(t).

The process is non-coherent and therefore is based on the envelope power function $|v(t+\tau)|^2$. The functional $e(\tau')$ given in Equation (35) is helpful for describing the process:

$$e(\tau') = \int_{-\infty}^{0} |v(t + \tau' - \tau)|^2 dt - \int_{0}^{\infty} |v(t + \tau' - \tau)|^2 dt \quad \text{Equation (35)}$$

The shift parameter is adjusted for e(τ')=0, which occurs when the energy on the interval (−∞, τ'−τ] equals that on the interval [τ'−τ, ∞). The error characteristic is monotonic and therefore has a single zero crossing point. This is the desirable quality of the functional. A disadvantage of the functional is that it is ill-defined because the integrals are unbounded when noise is present. Nevertheless, the functional $e(\tau')$ may be cast in the form given by Equation (36):

$$e(\tau') = \int_{-\infty}^{0} w(t)|v(t+\tau'-\tau)|^2 dt \quad \text{Equation (36)}$$

where the characteristic function w(t) is equal to sgn(t), the signum function.

To optimize the characteristic function w(t), it is helpful to define a figure of merit, F, as set forth in Equation (37):

$$F = \frac{[e(\tau_0' + T_A) - e(\tau_0' - T_A)]^2}{VAR\{e(\tau_0')\}} \quad \text{Equation (37)}$$

The numerator of F is the numerical slope of the mean error characteristic on the interval $[-T_A, T_A]$ surrounding the tracked value, $\tau_0'$. The statistical mean is taken with respect to the noise as well as the random channel, $h_c(t)$. It is desirable to specify a statistical characteristic of the channel in order to perform this statistical average. For example, the channel may be modeled as a wide sense stationary uncorrelated scattering (WSSUS) channel with impulse response $h_c(t)$ and a white noise process U(t) that has an intensity function g(t) as shown in Equation (38):

$$h_c(t) = \sqrt{g(t)} U(t) \quad \text{Equation (38)}$$

The variance of $e(\tau)$ is computed as the mean square value of the fluctuation:

$$e'(\tau) = e(\tau) - \langle e(\tau) \rangle \quad \text{Equation (39)}$$

where $\langle e(\tau) \rangle$ is the average of $e(\tau)$ with respect to the noise.

Optimization of the figure of merit F with respect to the function w(t) may be carried out using well-known variational methods of optimization. Once the optimal w(t) is determined, the resulting processor may be approximated accurately by a quadratic sample processor which is derived as follows. By the sampling theorem, the signal v(t), band-limited to a bandwidth W may be expressed in terms of its samples as shown in Equation (40):

$$v(t) = \Sigma v(k/W) \operatorname{sinc}[(Wt-k)\pi] \quad \text{Equation (40)}$$

substituting this expansion into Equation 36 results in an infinite quadratic form in the samples $v(k/W+\tau'-\tau)$. Making the assumption that the signal bandwidth equals the chip rate allows the use of a sampling scheme that is clocked by the chip clock signal to be used to obtain the samples. These samples, $v_k$ are represented by Equation (41):

$$v_k = v(kT_c + \tau' - \tau) \quad \text{Equation (41)}$$

This assumption leads to a simplification of the implementation. It is valid if the aliasing error is small.

In practice, the quadratic form that is derived is truncated. An example normalized B matrix is given below in Table 12. For this example, an exponential delay spread profile $g(t) = \exp(-t/\tau)$ is assumed with $\tau$ equal to one chip. An aperture parameter $T_A$ equal to one and one-half chips has also been assumed. The underlying chip pulse has a raised cosine spectrum with a 20% excess bandwidth.

TABLE 12

Example B Matrix

| 0 | 0 | 0 | 0 | 0 | 0 | 0 | 0 | 0 | 0 | 0 |
|---|---|---|---|---|---|---|---|---|---|---|
| 0 | 0 | −0.1 | 0 | 0 | 0 | 0 | 0 | 0 | 0 | 0 |
| 0 | −0.1 | 0.22 | 0.19 | −0.19 | 0 | 0 | 0 | 0 | 0 | 0 |
| 0 | 0 | 0.19 | 1 | 0.45 | −0.2 | 0 | 0 | 0 | 0 | 0 |
| 0 | 0 | −0.19 | 0.45 | 0.99 | 0.23 | 0 | 0 | 0 | 0 | 0 |
| 0 | 0 | 0 | −0.2 | 0.23 | 0 | −0.18 | 0.17 | 0 | 0 | 0 |
| 0 | 0 | 0 | 0 | 0 | −0.18 | −0.87 | −0.42 | 0.18 | 0 | 0 |
| 0 | 0 | 0 | 0 | 0 | 0.17 | −0.42 | −0.92 | −0.16 | 0 | 0 |
| 0 | 0 | 0 | 0 | 0 | 0 | 0.18 | −0.16 | −0.31 | 0 | 0 |
| 0 | 0 | 0 | 0 | 0 | 0 | 0 | 0 | 0 | −0.13 | 0 |
| 0 | 0 | 0 | 0 | 0 | 0 | 0 | 0 | 0 | 0 | 0 |

Code tracking is implemented via a loop phase detector that is implemented as follows. The vector y is defined as a column vector which represents the 11 complex output level values of the pilot AVC 1711, and B denotes an 11×11 symmetric real valued coefficient matrix with pre-determined values to optimize performance with the non-coherent pilot AVC output values y. The output signal e of the phase detector is given by Equation (42):

$$e = y^T B y \quad \text{Equation (42)}$$

The following calculations are then performed to implement a proportional plus integral loop filter and the VCO:
x[n]=x[n−1]+be
z[n]=z[n−1]+x[n]+ae
for b and a which are constants chosen from modeling the system to optimize system performance for the particular transmission channel and application, and where x[n] is the loop filter's integrator output value and z[n] is the VCO output value. The code phase adjustments are made by the modem controller the following C-subroutine:
if (z>zmx) {
delay phase 1/16 chip;
z−=zmax;
} else if (z<−zmax) {
advance phase 1/16 chip;
z+=zmax;
}

A different delay phase could be used in the above pseudo-code consistant with the present invention.

The AMF tap-weight update algorithm of the AMF weight gen 1722 occurs periodically to de-rotate and scale the phase of each finger value of the pilot rake 1711 by performing a complex multiplication of the pilot AVC finger value with the complex conjugate of the current output value of the carrier tracking loop and applying the product to a low pass filter and form the complex conjugate of the filter values to produce AMF tap-weight values, which are periodically written into the AMF filters of the CDMA modem.

The lock check algorithm, shown in FIG. 17, is implemented by the modem controller 1303 performing SPRT operations on the output signal of the scalar correlator array. The SPRT technique is the same as that for the acquisition algorithms, except that the acceptance and rejection thresholds are changed to increase the probability of detection of lock.

Carrier tracking is accomplished via a second order loop that operates on the pilot output values of the scalar correlated array. The phase detector output is the hard limited version of the quadrature component of the product of the (complex valued) pilot output signal of the scalar correlated array and the VCO output signal. The loop filter is a proportional plus integral design. The VCO is a pure summation, accumulated phase error $\phi$, which is converted to the complex phaser $\cos \phi + j \sin \phi$ using a look-up table in memory.

The previous description of acquisition and tracking algorithm focuses on a non-coherent method because the acquisition and tracking algorithm described requires non-coherent acquisition following by non-coherent tracking because during acquisition a coherent reference is not available until the AMF, pilot AVC, aux AVC, and DPLL are in an equilibrium state. However, it is known in the art that coherent tracking and combining is always optimal because in non-coherent tracking and combining the output phase information of each pilot AVC finger is lost. Consequently, another embodiment of the invention employs a two step acquisition and tracking system, in which the previously described non-coherent acquisition and tracking algorithm is implemented first, and then the algorithm switches to a coherent tracking method. The coherent combining and tracking method is similar to that described previously, except that the error signal tracked is of the form:

$$\epsilon = y^T A y \quad \text{Equation (43)}$$

where y is defined as a column vector which represents the 11 complex output level values of the pilot AVC 1711, and A denotes an 11×11 symmetric real valued coefficient matrix with pre-determined values to optimize performance with the coherent pilot AVC outputs y. An exemplary A matrix is shown below.

$$A = \begin{bmatrix} 1 & 0 & 0 & 0 & 0 & 0 & 0 & 0 & 0 & 0 & 0 \\ 0 & 1 & 0 & 0 & 0 & 0 & 0 & 0 & 0 & 0 & 0 \\ 0 & 0 & 1 & 0 & 0 & 0 & 0 & 0 & 0 & 0 & 0 \\ 0 & 0 & 0 & 1 & 0 & 0 & 0 & 0 & 0 & 0 & 0 \\ 0 & 0 & 0 & 0 & 1 & 0 & 0 & 0 & 0 & 0 & 0 \\ 0 & 0 & 0 & 0 & 0 & 0 & 0 & 0 & 0 & 0 & 0 \\ 0 & 0 & 0 & 0 & 0 & 0 & -1 & 0 & 0 & 0 & 0 \\ 0 & 0 & 0 & 0 & 0 & 0 & 0 & -1 & 0 & 0 & 0 \\ 0 & 0 & 0 & 0 & 0 & 0 & 0 & 0 & -1 & 0 & 0 \\ 0 & 0 & 0 & 0 & 0 & 0 & 0 & 0 & 0 & -1 & 0 \\ 0 & 0 & 0 & 0 & 0 & 0 & 0 & 0 & 0 & 0 & -1 \end{bmatrix} \quad \text{Equation (44)}$$

Figure 21:
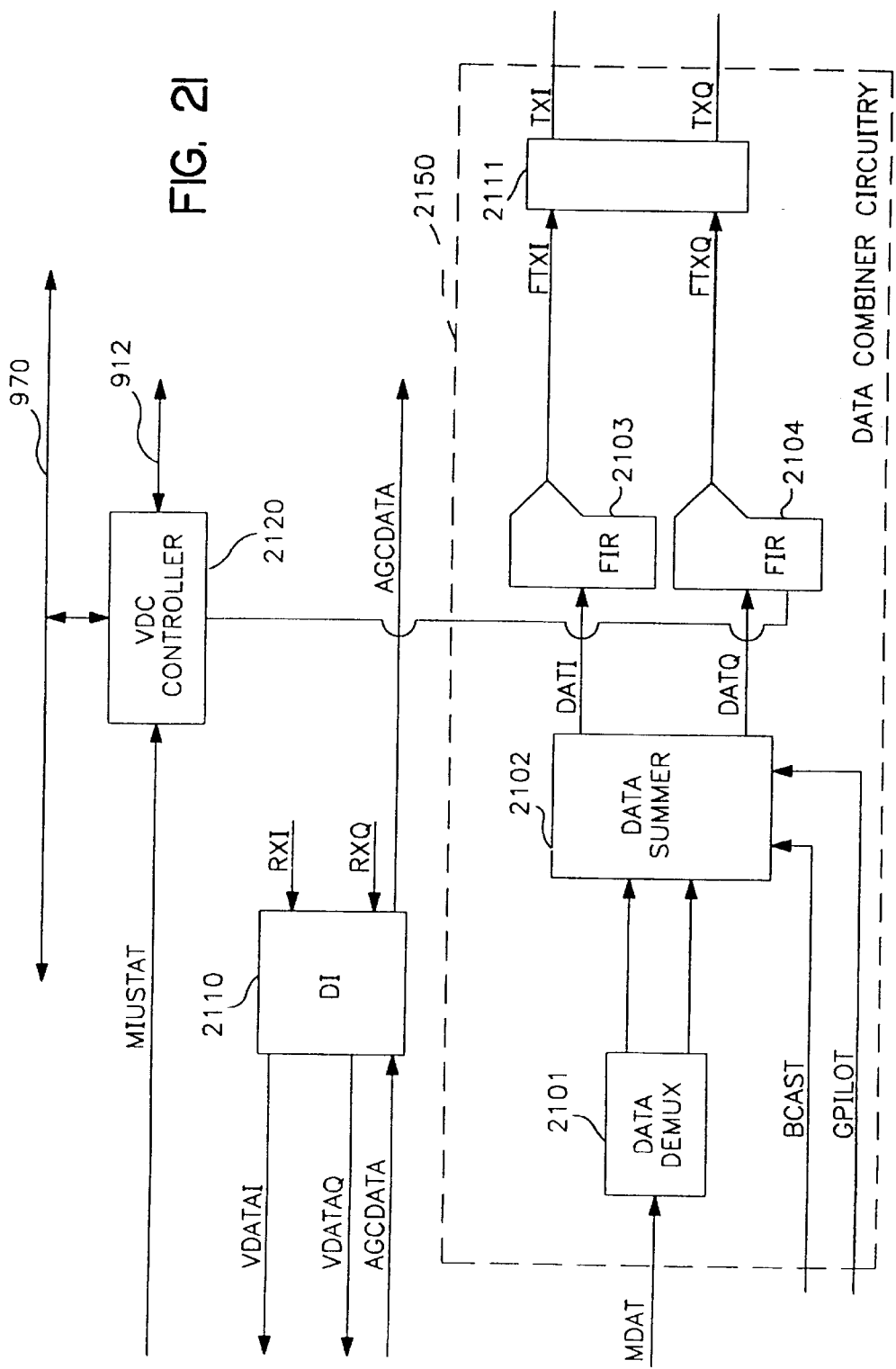
FIG. 21 is a block diagram of an exemplary video distribution circuit (VDC) of the RCS shown in FIG. 9.

Referring to FIG. 9, the video distribution controller board (VDC) 940 of the RCS is connected to each MIU 931, 932, 933 and the RF transmitters/receivers 950. The VDC 940 is shown in FIG. 21. The data combiner circuitry (DCC) 2150 includes a data demultiplexer 2101, data summer 2102, FIR filters 2103, 2104 and a driver 2111. The DCC 2150 1) receives the weighted CDMA modem I and Q data signal MDAT from each of the MIUs, 931, 932,933, 2) sums the I and Q data with the digital bearer channel data from each MIU 931, 932, 933, 3) and sums the result with the broadcast data message signal BCAST and the global pilot spreading code GPILOT provided by the master MIU modem 1210, 4) band shapes the summed signals for transmission, and 5) produces analog data signal for transmission to the RF transmitter/receiver.

FIR filters 2103, 2104 are used to modify the MIU CDMA transmit I and Q modem data before transmission. The WAC transfers FIR filter coefficient data through the serial port link 912 through the VDC controller 2120 and to the FIR filters 2103, 2104. Each FIR filter 2103, 2104 is configured separately. The FIR Filters 2103, 2104 employ upsampling to operate at twice the chip rate so zero data values are sent after every MIU CDMA transmit modem DATI and DATQ value to produce FTXI and FTXQ.

The VDC 940 distributes the AGC signal AGCDATA from the AGC 1750 of the MIUs 931, 932, 933 to the RF transmitter/receiver 950 through the distribution interface (DI) 2110. The VDC DI2110 receives data RXI and RXQ from the RF transmitter/receiver and distributes the signal as VDATAI and VDATAQ to MIUs 931, 932, 933.

Referring to FIG. 21, the VDC 940 also includes a VDC controller 2120 which monitors status and fault information signals MIUSTAT from MIUs and connects to the serial link 912 and HSBS 970 to communicate with WAC 920 shown in FIG. 9. The VDC controller 2120 includes a microprocessor, such as an Intel 8032 microcontroller, an oscillator (not shown) providing timing signals, and memory (not shown). The VDC controller memory includes a flash PROM (not shown) to contain the controller program code for the 8032 microprocessor, and an SRAM (not shown) to contain the temporary data written to and read from memory by the microprocessor.

Figure 22:
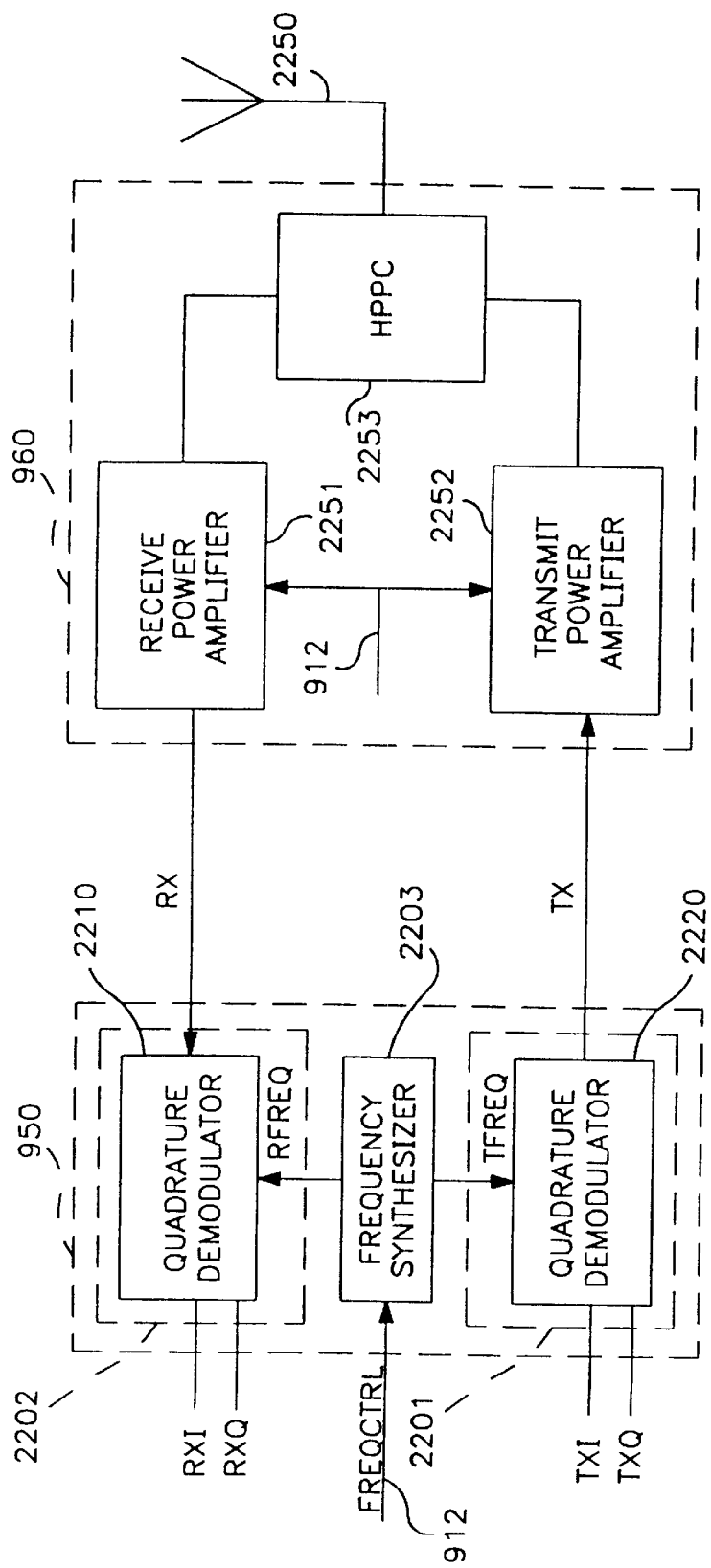
FIG. 22 is a block diagram of an exemplary RF transmitter/receiver and exemplary power amplifiers of the RCS shown in FIG. 9.

Referring to FIG. 9, the present invention includes a RF transmitter/receiver 950 and power amplifier section 960. Referring to FIG. 22, the RF transmitter/receiver 950 is divided into three sections: the transmitter module 2201, the receiver module 2202, and the frequency synthesizer 2203. Frequency synthesizer 2203 produces a transmit carrier frequency TFREQ and a receive carrier frequency RFREQ in response to a frequency control signal FREQCTRL received from the WAC 920 on the serial link 912. In the transmitter module 2201, the input analog I and Q data signals TXI and TXQ from the VDC are applied to the quadrature modulator 2220, which also receives a transmit carrier frequency signal TFREQ from the frequency synthesizer 2203 to produce a quadrature modulated transmit carrier signal TX. The analog transmit carrier modulated signal, an upconverted RF signal, TX is then applied to the transmit power amplifier 2252 of the power amplifier 960. The amplified transmit carrier signal is then passed through the high power passive components (HPPC) 2253 to the Antenna 2250, which transmits the upconverted RF signal to the communication channel as a CDMA RF signal. In one embodiment of the invention, the transmit power amplifier 2252 comprises eight amplifiers of approximately 60 watts peak-to-peak each.

The HPPC 2253 comprises a lightning protector, an output filter, a 10 dB directional coupler, an isolator, and a high power termination attached to the isolator.

A receive CDMA RF signal is received at the antenna 2250 from the RF channel and passed through the HPPC 2253 to the receive power amplifier 2251. The receive power amplifier 2251 includes, for example, a 30 watt power transistor driven by a 5 watt transistor. The RF receive module 2202 has quadrature modulated receive carrier signal RX from the receive power amplifier. The receive module 2202 includes a quadrature demodulator 2210 which takes the receive carrier modulated signal RX and the receive carrier frequency signal RFREQ from the frequency synthesizer 2203, synchronously demodulates the carrier and provides analog I and Q channels. These channels are filtered to produce the signals RXI and RXQ, which are transferred to the VDC 940.

XXVI. The Subscriber Unit

Figure 23:
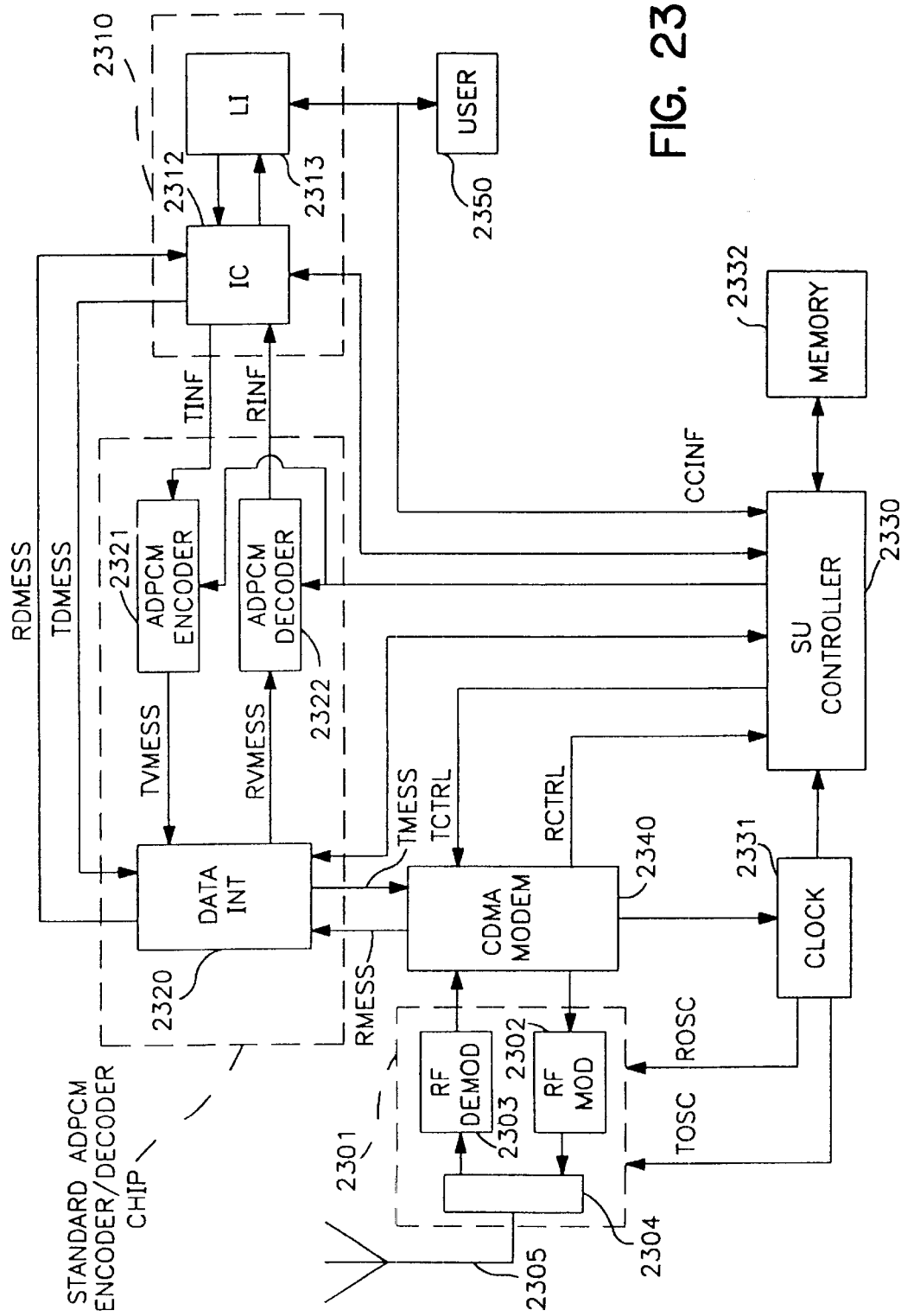
FIG. 23 is a block diagram of an exemplary subscriber unit (SU) of the present invention.

FIG. 23 shows the subscriber unit (SU) of one embodiment of the present invention. As shown, the SU includes an RF section 2301 including a RF modulator 2302, RF demodulator 2303 and splitter/isolator 2304 which receive global and assigned logical channels including traffic and control messages and global pilot signals in the forward link CDMA RF channel signal, and transmit assigned channels and reverse pilot signals in the reverse link CDMA RF channel. The forward and reverse links are received and transmitted respectively through antenna 2305. The RF section employs, in one exemplary embodiment, a conventional dual conversion superheterodyne receiver having a synchronous demodulator responsive to the signal ROSC. Selectivity of such a receiver is provided by a 70 MHz transversal SAW filter (not shown). The RF modulator includes a synchronous modulator (not shown) responsive to the carrier signal TOSC to produce a quadrature modulated carrier signal. This signal is stepped up in frequency by an offset mixing circuit (not shown).

The SU further includes a subscriber line interface 2310, including the functionality of a control (CC) generator, a data interface 2320, an ADPCM encoder 2321, an ADPCM decoder 2322, an SU controller 2330, an SU clock signal generator 2331, memory 2332 and a CDMA modem 2340, which is essentially the same as the CDMA modem 1210 described above with reference to FIG. 13. It is noted that data interface 2320, ADPCM encoder 2321 and ADPCM decoder 2322 are typically provided as a standard ADPCM encoder/decoder chip.

The forward link CDMA RF channel signal is applied to the RF demodulator 2303 to produce the forward link CDMA signal. The forward link CDMA signal is provided to the CDMA modem 2340, which acquires synchronization with the global pilot signal, produces global pilot synchronization signal to the clock 2331, to generate the system timing signals, and despreads the plurality of logical channels. The CDMA modem 2340 also acquires the traffic messages RMESS and control messages RCTRL and provides the traffic message signals RMESS to the data interface 2320 and receive control message signals RCTRL to the SU controller 2330.

The receive control message signals RCTRL include a subscriber identification signal, a coding signal and bearer modification signals. The RCTRL may also include control and other telecommunication signaling information. The receive control message signal RCTRL is applied to the SU controller 2330, which verifies that the call is for the SU from the subscriber identification value derived from RCTRL. The SU controller 2330 determines the type of user information contained in the traffic message signal from the coding signal and bearer rate modification signal. If the coding signal indicates the traffic message is ADPCM coded, the traffic message RVMESS is sent to the ADPCM decoder 2322 by sending a select message to the data interface 2320. The SU controller 2330 outputs an ADPCM coding signal and bearer rate signal derived from the coding signal to the ADPCM decoder 2322. The traffic message signal RVMESS is the input signal to the ADPCM decoder 2322, where the traffic message signal is converted to a digital information signal RINF in response to the values of the input ADPCM coding signal.

If the SU controller 2330 determines the type of user information contained in the traffic message signal from the coding signal is not ADPCM coded, then RDMESS passes through the ADPCM encoder transparently. The traffic message RDMESS is transferred from the data interface 2320 directly to the interface controller (IC) 2312 of the subscriber line interface 2310.

The digital information signal RINF or RDMESS is applied to the subscriber line interface 2310, including a interface controller (IC) 2312 and line interface (LI) 2313. For the exemplary embodiment the IC is an extended PCM interface controller (EPIC) and the LI is a subscriber line interface circuit (SLIC) for POTS which corresponds to RINF type signals and a ISDN Interface for ISDN which corresponds to RDMESS type signals. The EPIC and SLIC circuits are well known in the art. The subscriber line interface 2310 converts the digital information signal RINF or RDMESS to the user defined format. The user defined format is provided to the IC 2312 from the SU Controller 2330. The LI 2310 includes circuits for performing such functions as A-law or $\mu$-law conversion, generating dial tone and generating or interpreting signaling bits. The line interface also produces the user information signal to the SU user 2350 as defined by the subscriber line interface, for example POTS voice, voiceband data or ISDN data service.

For a reverse link CDMA RF channel, a user information signal is applied to the LI 2313 of the subscriber line interface 2310, which outputs a service type signal and an information type signal to the SU controller. The IC 2312 of the subscriber line interface 2310 produces a digital information signal TINF which is the input signal to the ADPCM encoder 2321 if the user information signal is to be ADPCM encoded, such as for POTS service. For data or other non-ADPCM encoded user information, the IC 2312 passes the data message TDMESS directly to the data interface 2320. The call control module (CC), including in the subscriber line interface 2310, derives call control information from the user information signal, and passes the call control information CCINF to the SU controller 2330. The ADPCM encoder 2321 also receives coding signal and bearer modification signals from the SU controller 2330 and converts the input digital information signal into the output message traffic signal TVMESS in response to the coding and bearer modification signals. The SU controller 2330 also outputs the reverse control signal which includes the coding signal call control information, and bearer channel modification signal, to the CDMA modem. The output message signal TVMESS is applied to the data interface 2320. The data interface 2320 sends the user information to the CDMA modem 2340 as transmit message signal TMESS. The CDMA modem 2340 spreads the output message and reverse control channels TCTRL received from the SU controller 2330 and produces the reverse link CDMA signal. The reverse link CDMA signal is provided to the RF transmit section 2301 and modulated by the RF modulator 2302 to produce the output reverse link CDMA RF channel signal transmitted from antenna 2305.

XXVII. Call Connection and Establishment Procedure

The process of bearer channel establishment consists of two procedures: the call connection process for a call connection incoming from a remote call processing unit such as an RDU (incoming call connection), and the call connection process for a call outgoing from the SU (outgoing call connection). Before any bearer channel can be established between an RCS and a SU, the SU must register its presence in the network with the remote call processor such as the RDU. When the off-hook signal is detected by the SU, the SU not only begins to establish a bearer channel; but also initiates the procedure for an RCS to obtain a terrestrial link between the RCS and the remote processor. As incorporated herein by reference, the process of establishing the RCS and RDU connection is detailed in the DECT V5.1 standard.

Figure 24:
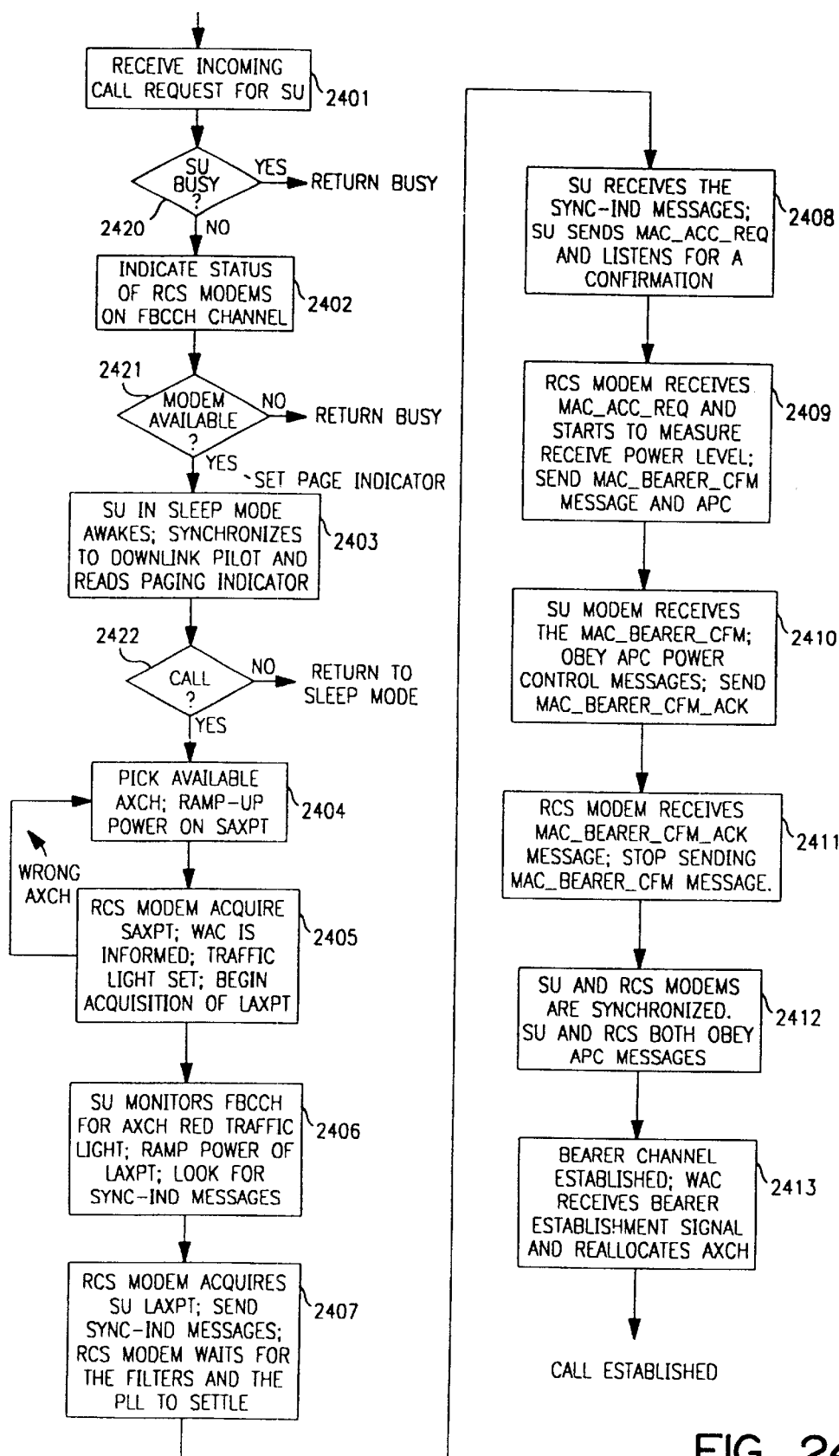
FIG. 24 is a flow-chart diagram of an exemplary call establishment algorithm for an incoming call request used by the present invention for establishing a bearer channel between an RCS and an SU.

For the incoming call connection procedure shown in FIG. 24, first 2401, the WAC 920 (shown in FIG. 9) receives, via one of the MUXs 905, 906 and 907, an incoming call request from a remote call processing unit. This request identifies the target SU and that a call connection to the SU is desired. The WAC periodically outputs the SBCH channel with paging indicators for each SU and periodically outputs the FBCH traffic lights for each access channel. In response to the incoming call request, the WAC, at step 2420, first checks to see if the identified SU is already active with another call. If so, the WAC returns a busy signal for the SU to the remote processing unit through the MUX, otherwise the paging indicator for the channel is set.

Next, at step 2402, the WAC checks the status of the RCS modems and, at step 2421, determines whether there is an available modem for the call. If a modem is available, the traffic lights on the FBCH indicate that one or more AXCH channels are available. If no channel is available after a certain period of time, then the WAC returns a busy signal for the SU to the remote processing unit through the MUX. If an RCS modem is available and the SU is not active (in sleep mode), the WAC sets the paging indicator for the identified SU on the SBCH to indicate an incoming call request. Meanwhile, the access channel modems continuously search for the short access pilot signal (SAXPT) of the SU.

At step 2403, an SU in sleep mode periodically enters awake mode. In awake mode, the SU modem synchronizes to the downlink pilot signal, waits for the SU modem AMF filters and phase locked loop to settle, and reads the paging indicator in the slot assigned to it on the SBCH to determine if there is a call for the SU 2422. If no paging indicator is set, the SU halts the SU modem and returns to sleep mode. If a paging indicator is set for an incoming call connection, the SU modem checks the service type and traffic lights on FBCH for an available AXCH.

Next, at step 2404, the SU modem selects an available AXCH and starts a fast transmit power ramp-up on the corresponding SAXPT. For a period the SU modem continues fast power ramp-up on SAXPT and the access modems continue to search for the SAXPT.

At step 2405, the RCS modem acquires the SAXPT of the SU and begins to search for the SU LAXPT. When the SAXPT is acquired, the modem informs the WAC controller, and the WAC controller sets the traffic lights corresponding to the modem to "red" to indicate the modem is now busy. The traffic lights are periodically output while continuing to attempt acquisition of the LAXPT.

The SU modem monitors, at step 2406, the FBCH AXCH traffic light. When the AXCH traffic light is set to red, the SU assumes the RCS modem has acquired the SAXPT and begins transmitting LAXPT. The SU modem continues to ramp-up power of the LAXPT at a slower rate until sync-ind messages are received on the corresponding CTCH. If the SU is mistaken because the traffic light was actually set in response to another SU acquiring the AXCH, the SU modem times out because no sync-ind messages are received. The SU randomly waits a period of time, picks a new AXCH channel, and steps 2404 and 2405 are repeated until the SU modem receives sync-ind messages. Details of the power ramp up method used in the exemplary embodiment of this invention may be found in Section XXXXII hereinafter entitled "Method Of Controlling Initial Power Ramp-Up In CDMA Systems By Using Short Codes."

Next, at step 2407, the RCS modem acquires the LAXPT of the SU and begins sending sync-ind messages on the corresponding CTCH. The modem waits 10 msec for the pilot and AUX Vector correlator filters and phase-locked loop to settle, but continues to send sync-ind messages on the CTCH. The modem then begins looking for a request message for access to a bearer channel (MAC_ACC_REQ), from the SU modem.

The SU modem, at step 2408, receives the sync-ind message and freezes the LAXPT transmit power level. The SU modem then begins sending repeated request messages for access to a bearer traffic channel (MAC_ACC_REQ) at fixed power levels, and listens for a request confirmation message (MAC_BEARER_CFM) from the RCS modem.

Next, at step 2409, the RCS modem receives a MAC_ACC_REQ message; the modem then starts measuring the AXCH power level, and starts the APC channel. The RCS modem then sends the MAC_BEARER_CFM message to the SU and begins listening for the acknowledgment MAC_BEARER_CFM_ACK of the MAC_BEARER_CFM message. At step 2410, the SU modem receives the MAC_BEARER_CFM message and begins obeying the APC power control messages. The SU stops sending the MAC_ACC_REQ message and sends the RCS modem the MAC_BEARER_CFM_ACK message. The SU begins sending the null data on the AXCH. The SU waits 10 msec for the uplink transmit power level to settle.

The RCS modem, at step 2411, receives the MAC_BEARER_CFM_ACK message and stops sending the MAC_BEARER_CFM messages. APC power measurements continue.

Next, at step 2412, both the SU and the RCS modems have synchronized the sub-epochs, obey APC messages, measure receive power levels, and compute and send APC messages. The SU waits 10 msec for downlink power level to settle.

Finally, at step 2413, the bearer channel is established and initialized between the SU and RCS modems. The WAC receives the bearer establishment signal from the RCS modem, re-allocates the AXCH channel and sets the corresponding traffic light to green.

Figure 25:
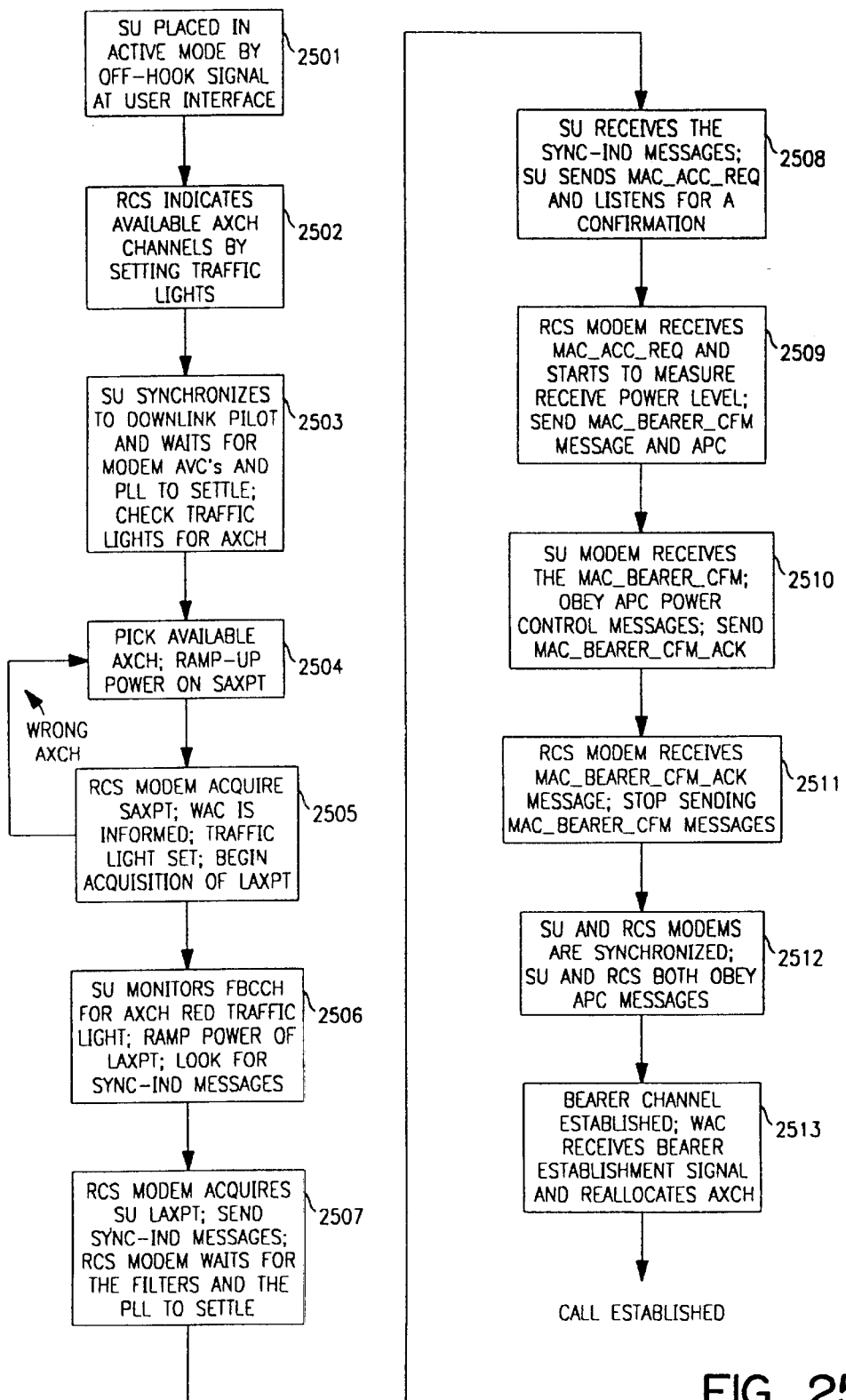
FIG. 25 is a flow-chart diagram of an exemplary call establishment algorithm for an outgoing call request used by the present invention for establishing a bearer channel between an RCS and an SU.

For the Outgoing Call Connection shown in FIG. 25, the SU is placed in active mode by the off-hook signal at the user interface at step 2501. Next, at step 2502, the RCS indicates available AXCH channels by setting the respective traffic lights. At step 2503, the SU synchronizes to the downlink pilot, waits for the SU modem vector correlator filters and phase lock loop to settle, and the SU checks service type and traffic lights for an available AXCH. Steps 2504 through 2513 are identical to the procedure steps 2404 through 2413 for the incoming call connection procedure of FIG. 24, and therefore are not explained in detail.

In the previous procedures for incoming call connection and outgoing call connection, the power ramping-up process consists of the following events. The SU starts from very low transmit power and increases its power level while transmitting the short code SAXPT; once the RCS modem detects the short code it turns off the traffic light. Upon detecting the changed traffic light, the SU continues ramping-up at a slower rate this time sending the LAXPT. Once the RCS modem acquires the LAXPT and sends a message on CTCH to indicate this, the SU keeps its transmit (TX) power constant and sends the MAC-access-request message. This message is answered with a MAC_BEARER_CFM message on the CTCH. Once the SU receives the MAC_BEAER_CFM message it switches to the traffic channel (TRCH) which is the dial tone for POTS.

When the SU captures a specific user channel AXCH, the RCS assigns a code seed for the SU through the CTCH. The code seed is used by the spreading code generator in the SU modem to produce the assigned code for the reverse pilot of the SU, and the spreading codes for associated channels for traffic, call control, and signaling. The SU reverse pilot spreading code sequence is synchronized in phase to the RCS system global pilot spreading code, and the traffic, call control and signaling spreading codes are synchronized in phase to the SU reverse pilot spreading code.

If the SU is successful in capturing a specific user channel, the RCS establishes a terrestrial link with the remote processing unit to correspond to the specific user channel. For the DECT V5.1 standard, once the complete link from the RDU to the LE is established using the V5.1 ESTABLISHMENT message, a corresponding V5.1 ESTABLISHMENT ACK message is returned from the LE to the RDU, and the SU is sent a CONNECT message indicating that the transmission link is complete.

XXVIII. Support of Special Service Types

The system of the present invention includes a bearer channel modification feature which allows the transmission rate of the user information to be switched from a lower rate to a higher rate. The bearer channel modification (BCM) method is used to change a 32 kbs ADPCM channel to a 64 kbs PCM channel to support high speed data and fax communications through the spread-spectrum communication system of the present invention. Although the details of this technique are described in Section XXXXV hereinafter entitled "CDMA Communication System Which Selectively Suppresses Data Transmissioning During Establishment Of A Communication Channel", the process is briefly described below:

First, a bearer channel on the RF interface is established between the RCS and SU, and a corresponding link exists between the RCS terrestrial interface and the remote processing unit, such as an RDU. The digital transmission rate of the link between the RCS and remote processing unit normally corresponds to a data encoded rate, which may be, for example, ADPCM at 32 kbs. The WAC controller of the RCS monitors the encoded digital data information of the link received by the line interface of the MUX. If the WAC controller detects the presence of the 2100 Hz tone in the digital data, the WAC instructs the SU through the assigned logical control channel and causes a second, 64 kbs duplex link to be established between the RCS modem and the SU. In addition, the WAC controller instructs the remote processing unit to establish a second 64 kbs duplex link between the remote processing unit and the RCS. Consequently, for a brief period, the remote processing unit and the SU exchange the same data over both the 32 kbs and the 64 kbs links through the RCS. Once the second link is established, the remote processing unit causes the WAC controller to switch transmission only to the 64 kbs link, and the WAC controller instructs the RCS modem and the SU to terminate and tear down the 32 kbs link. Concurrently, the 32 kbs terrestrial link is also terminated and torn down.

Another embodiment of the BCM method incorporates a negotiation between the external remote processing unit, such as the RDU, and the RCS to allow for redundant channels on the terrestrial interface, while only using one bearer channel on the RF interface. The method described is a synchronous switchover from the 32 kbs link to the 64 kbs link over the air link which takes advantage of the fact that the spreading code sequence timing is synchronized between the RCS modem and SU. When the WAC controller detects the presence of the 2100 Hz tone in the digital data, the WAC controller instructs the remote processing unit to establish a second 64 kbs duplex link between the remote processing unit and the RCS. The remote processing unit then sends 32 kbs encoded data and 64 kbs data concurrently to the RCS. Once the remote processing unit has established the 64 kbs link, the RCS is informed and the 32 kbs link is terminated and torn down. The RCS also informs the SU that the 32 kbs link is being torn down and to switch processing to receive unencoded 64 kbs data on the channel. The SU and RCS exchange control messages over the bearer control channel of the assigned channel group to identify and determine the particular subepoch of the bearer channel spreading code sequence within which the RCS will begin transmitting 64 kbit/sec data to the SU. Once the subepoch is identified, the switch occurs synchronously at the identified subepoch boundary. This synchronous switchover method is more economical of bandwidth since the system does not need to maintain capacity for a 64 kbs link in order to support a switchover.

In previously described embodiments of the BCM feature, the RCS will tear down the 32 kbs link first, but one skilled in the art would know that the RCS could tear down the 32 kbs link after the bearer channel has switched to the 64 kbs link.

As another special service type, the system of the present invention includes a method for conserving capacity over the RF interface for ISDN types of traffic. This conservation occurs while a known idle bit pattern is transmitted in the ISDN D-channel when no data information is being transmitted. The CDMA system of the present invention includes a method to prevent transmission of redundant information carried on the D-channel of ISDN networks for signals transmitted through a wireless communication link. The advantage of such method is that it reduces the amount of information transmitted and consequently the transmit power and channel capacity used by that information. The method is described as it is used in the RCS. In the first step, the controller, such as the WAC of the RCS or the SU controller of the SU, monitors the output D-channel from the subscriber line interface for a pre-determined channel idle pattern. A delay is included between the output of the line interface and the CDMA modem. Once the idle pattern is detected, the controller inhibits the transmission of the spread message channel through a message included in the control signal to the CDMA modem. The controller continues to monitor the output D-channel of the line interface until the presence of data information is detected. When data information is detected, the spread message channel is activated. Because the message channel is synchronized to the associated pilot which is not inhibited, the corresponding CDMA modem of the other end of the communication link does not have to reacquire synchronization to the message channel.

XXIX. Drop Out Recovery

The RCS and SU each monitor the CDMA bearer channel signal to evaluate the quality of the CDMA bearer channel connection. Link quality is evaluated using the SPRT process employing adaptive quantile estimation. The SPRT process uses measurements of the received signal power; and if the SPRT process detects that the local spreading code generator has lost synchronization with the received signal spreading code or if it detects the absence or low level of a received signal, the SPRT declares loss of lock (LOL).

When the LOL condition is declared, the receiver modem of each RCS and SU begins a Z-search of the input signal with the local spreading code generator. Z-search is well known in the art of CDMA spreading code acquisition and detection and is described in *Digital Communications and Spread Spectrum Systems,* by Robert E. Ziemer and Roger L. Peterson, at pages 492–94 which is incorporated herein by reference. The Z-search algorithm of the present invention tests groups of eight spreading code phases ahead and behind the last known phase in larger and larger spreading code phase increments.

During the LOL condition detected by the RCS, the RCS continues to transmit to the SU on the assigned channels, and continues to transmit power control signals to the SU to maintain SU transmit power level. The method of transmitting power control signals is described below. Successful reacquisition desirably takes place within a specified period of time. If reacquisition is successful, the call connection continues, otherwise the RCS tears down the call connection by deactivating and deallocating the RCS modem assigned by the WAC, and transmits a call termination signal to a remote call processor, such as the RDU, as described previously.

When the LOL condition is detected by the SU, the SU stops transmission to the RCS on the assigned channels which forces the RCS into a LOL condition, and starts the reacquisition algorithm. If reacquisition is successful, the call connection continues, and if not successful, the RCS tears down the call connection by deactivating and deallocating the SU modem as described previously.

XXX. Power Control

The power control feature of the present invention is used to minimize the amount of transmit power used by an RCS and the SUs of the system, and the power control subfeature that updates transmit power during bearer channel connection is defined as automatic power control (APC). APC data is transferred from the RCS to an SU on the forward APC channel and from an SU to the RCS on the reverse APC channel. When there is no active data link between the two, the maintenance power control (MPC) subfeature updates the SU transmit power.

Transmit power levels of forward and reverse assigned channels and reverse global channels are controlled by the APC algorithm to maintain sufficient signal power to interference noise power ratio (SIR) on those channels, and to stabilize and minimize system output power. The present invention uses a closed loop power control mechanism in which a receiver decides that the transmitter should incrementally raise or lower its transmit power. This decision is conveyed back to the respective transmitter via the power control signal on the APC channel. The receiver makes the decision to increase or decrease the transmitter's power based on two error signals. One error signal is an indication of the difference between the measured and desired despread signal powers, and the other error signal is an indication of the average received total power.

As used in the described embodiment of the invention, the term near-end power control is used to refer to adjusting the transmitter's output power in accordance with the APC signal received on the APC channel from the other end. This means the reverse power control for the SU and forward power control for the RCS; and the term far-end APC is used to refer to forward power control for the SU and reverse power control for the RCS (adjusting the opposite end's transmit power).

In order to conserve power, the SU modem terminates a transmission and powers-down while waiting for a call, defined as the sleep phase. Sleep phase is terminated by an awaken signal from the SU controller. The SU modem acquisition circuit automatically enters the reacquisition phase and begins the process of acquiring the downlink pilot, as described previously.

XXXI. Closed Loop Power Control Algorithms

The near-end power control consists of two steps: first, the initial transmit power is set; and second, the transmit power is continually adjusted according to information received from the far-end using APC.

For the SU, initial transmit power is set to a minimum value and then ramped up, for example, at a rate of 1 dB/ms until either a ramp-up timer expires (not shown) or the RCS changes the corresponding traffic light value on the FBCH to "red" indicating that the RCS has locked to the SU's short pilot SAXPT. Expiration of the timer causes the SAXPT transmission to be shut down, unless the traffic light value is set to red first, in which case the SU continues to ramp-up transmit power but at a much lower rate than before the "red" signal was detected.

For the RCS, initial transmit power is set at a fixed value, corresponding to the minimum value necessary for reliable operation as determined experimentally for the service type and the current number of system users. Global channels, such as global pilot or, FBCH, are always transmitted at the fixed initial power, whereas traffic channels are switched to APC.

The APC bits are transmitted as one bit up or down signals on the APC channel. In the described embodiment, the 64 kbs APC data stream is not encoded or interleaved. Far-end power control consists of the near-end transmitting power control information for the far-end to use in adjusting its transmit power. The APC algorithm causes the RCS or the SU to transmit +1 if the following inequality holds, otherwise −1.

$$a_1 e_1 - a_2 e_2 > 0 \qquad \text{Equation (45)}$$

Here, the error signal $e_1$ is calculated as:

$$e_1 = P_d - (1 + SNR_{REQ}) P_N \qquad \text{Equation (46)}$$

where $P_d$ is the despread signal plus noise power, $P_N$ is the despread noise power, and $SNR_{REQ}$ is the desired despread signal to noise ratio for the particular service type; and:

$$e_2 = P_r - P_o \qquad \text{Equation (47)}$$

where Pr is a measure of the received power and Po is the automatic gain control (AGC) circuit set point. The weights $a_1$ and $a_2$ in Equation (45) are chosen for each service type and APC update rate.

XXXII. Maintenance Power Control

During the sleep phase of the SU, the interference noise power of the CDMA RF channel may change. The present invention includes a maintenance power control feature (MPC) which periodically adjusts the SU's initial transmit power with respect to the interference noise power of the CDMA channel. The MPC is the process whereby the transmit power level of an SU is maintained within close proximity of the minimum level for the RCS to detect the SU's signal. The MPC process compensates for low frequency changes in the required SU transmit power.

The maintenance control feature uses two global channels: one is called the status channel (STCH) on reverse link, and the other is called the check-up channel (CUCH) on forward link. The signals transmitted on these channels carry no data and they are generated the same way the short codes used in initial power ramp-up are generated. The STCH and CUCH codes are generated from a "reserved" branch of the global code generator.

The MPC process is as follows. At random intervals, the SU sends a symbol length spreading code periodically for 3 ms on the status channel (STCH). If the RCS detects the sequence, it replies by sending a symbol length code sequence within the next 3 ms on the check-up channel (CUCH). When the SU detects the response from the RCS, it reduces its transmit power by a particular step size. If the SU does not see any response from the RCS within that 3 ms period, it increases its transmit power by the step size. Using this method, the RCS response is transmitted at a power level that is enough to maintain a 0.99 detection probability at all SU's.

The rate of change of traffic load and the number of active users is related to the total interference noise power of the CDMA channel. The update rate and step size of the maintenance power update signal for the present invention is determined by using queuing theory methods well known in the art of communication theory, such as outlined in "Fundamentals of Digital Switching" (Plenum-New York) edited by McDonald and incorporated herein by reference. By modeling the call origination process as an exponential random variable with mean 6.0 mins, numerical computation shows the maintenance power level of a SU should be updated once every 10 seconds or less to be able to follow the changes in interference level using 0.5 dB step size. Modeling the call origination process as a Poisson random variable with exponential interarrival times, arrival rate of $2 \times 10^{-4}$ per second per user, service rate of $1/360$ per second, and the total subscriber population is 600 in the RCS service area also yields by numerical computation that an update rate of once every 10 seconds is sufficient when 0.5 dB step size is used.

Figure 26:
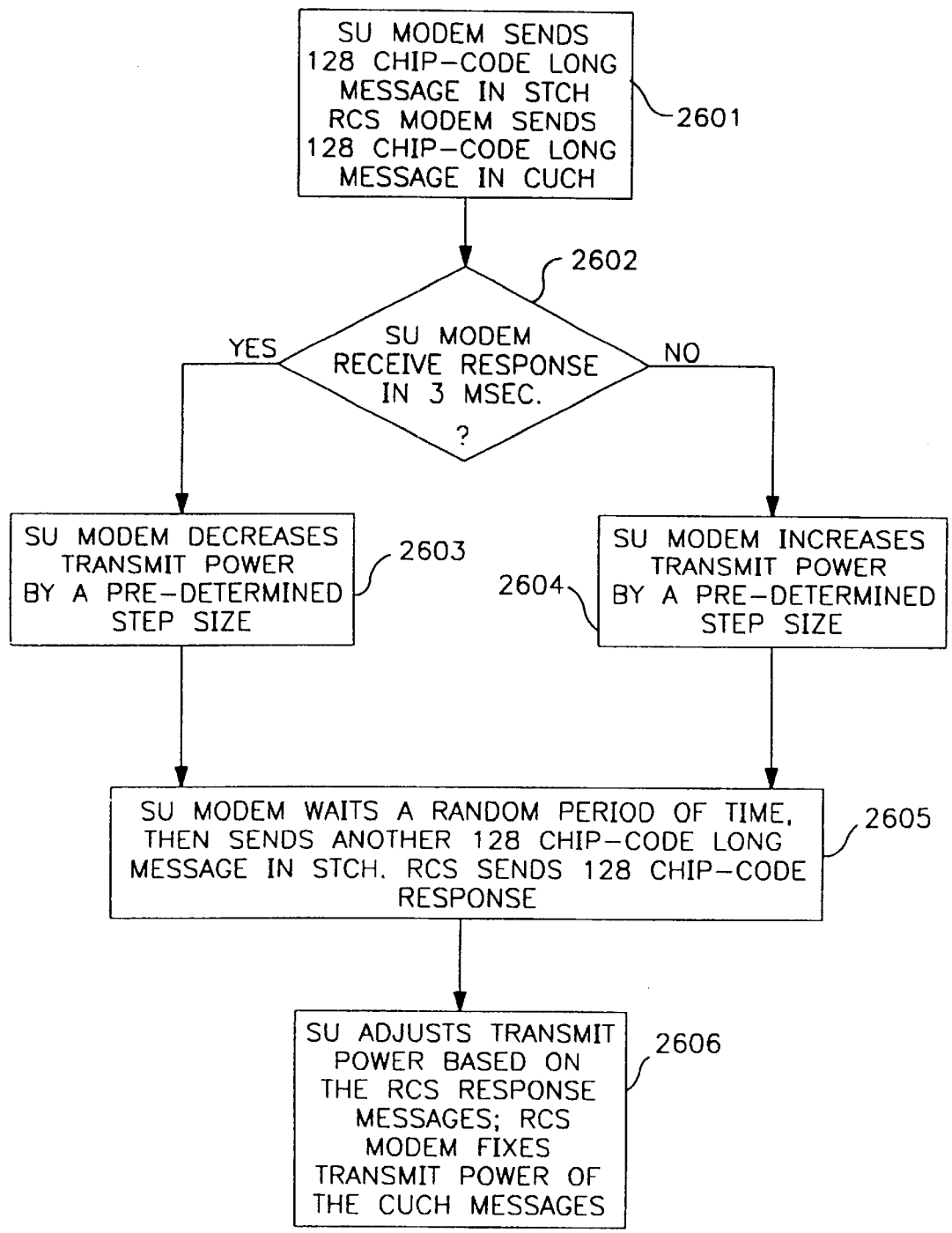
FIG. 26 is a flow-chart diagram of an exemplary maintenance power control algorithm of the present invention.

Maintenance power adjustment is performed periodically by the SU which changes from sleep phase to awake phase and performs the MPC process. Consequently, the process for the MPC feature is shown in FIG. 26 and is as follows: First, at step 2601, signals are exchanged between the SU and the RCS maintaining a transmit power level that is close to the required level for detection: the SU periodically sends a symbol length spreading code in the STCH and the RCS periodically sends a symbol length spreading code in the CUCH as response.

Next, at step 2602, if the SU receives a response within 3 ms after the STCH message it sent, it decreases its transmit power by a particular step size at step 2603; but if the SU does not receive a response within 3 ms after the STCH message, it increases its transmit power by the same step size at step 2604.

The SU waits, at step 2605, for a period of time before sending another STCH message, this time period is determined by a random process which averages 10 seconds. Thus, the transmit power of the STCH messages from the SU is adjusted based on the RCS response periodically, and the transmit power of the CUCH messages from the RCS is fixed.

XXXIII. Mapping of Power Control Signal to Logical Channels For APC

Power control signals are mapped to specified logical channels for controlling transmit power levels of forward and reverse assigned channels. Reverse global channels are also controlled by the APC algorithm to maintain sufficient signal power to interference noise power ratio (SIR) on those reverse channels, and to stabilize and minimize system output power. The present invention uses a closed loop power control method in which a receiver periodically decides to incrementally raise or lower the output power of the transmitter at the other end. The method also conveys that decision back to the respective transmitter.

TABLE 13

APC Signal Channel Assignments

| Link Channels and Signals | Call/Connection Status | Power Control Method Initial Value | Continuous |
|---|---|---|---|
| Reverse link AXCH AXPT | being established | as determined by power ramping | APC bits in forward APC channel |
| Reverse link APC, OW, TRCH, pilot signal | in-progress | level established during call set-up | APC bits in forward APC channel |
| Forward link APC, OW, TRCH | in-progress | fixed value | APC bits in reverse APC channel |

Forward and reverse links are independently controlled. For a call/connection in process, forward link (TRCHs APC, and OW) power is controlled by the APC bits transmitted on the reverse APC channel. During the call/connection establishment process, reverse link (AXCH) power is also controlled by the APC bits transmitted on the forward APC channel. Table 13 summarizes the specific power control methods for the controlled channels.

The required SIRs of the assigned channels TRCH, APC and OW and reverse assigned pilot signal for any particular SU are fixed in proportion to each other and these channels are subject to nearly identical fading, therefore, they are power controlled together.

XXXIV. Adaptive Forward Power Control

Figure 27:
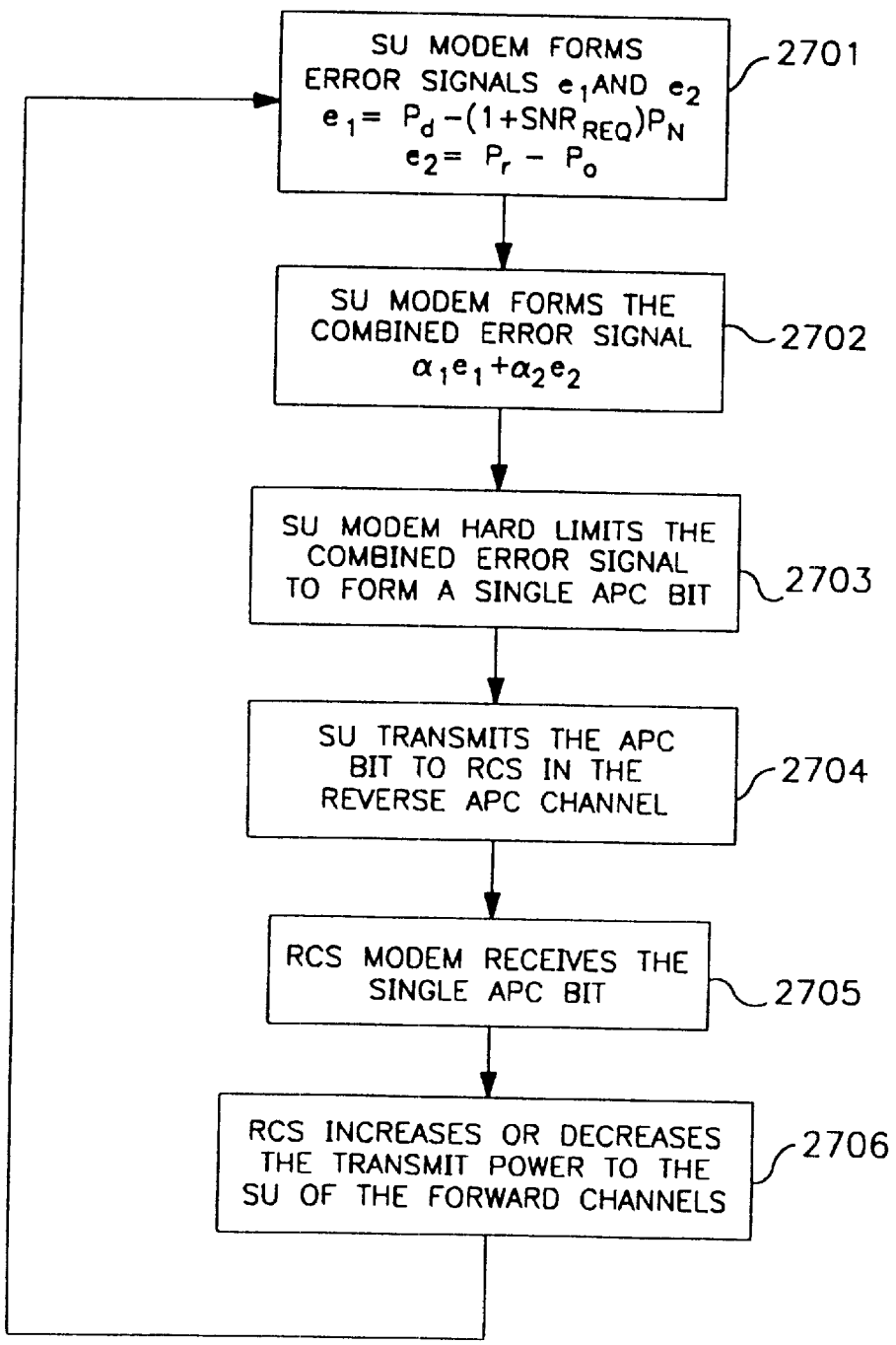
FIG. 27 is a flow-chart diagram of an exemplary automatic forward power control algorithm of the present invention.

The AFPC process attempts to maintain the minimum required SIR on the forward channels during a call/connection. The AFPC recursive process, shown in FIG. 27, consists of the steps of having an SU form the two error signals $e_1$ and $e_2$ in step 2701 where:

$$e_1 = P_d - (1 + SNR_{REQ})P_N \qquad \text{Equation (48)}$$

$$e_2 = P_r - P_o \qquad \text{Equation (49)}$$

and $P_d$ is the despread signal plus noise power, $P_N$ is the despread noise power, $SNR_{REQ}$ is the required signal to noise ratio for the service type, $P_r$ is a measure of the total received power, and $P_o$ is the AGC set point. Next, the SU modem forms the combined error signal $\alpha_1 e_1 + \alpha_2 e_2$ in step 2702. Here, the weights $\alpha_1$ and $C\alpha_2$ are chosen for each service type and APC update rate. In step 2703, the SU hard limits the combined error signal and forms a single APC bit. The SU transmits the APC bit to the RCS in step 2704 and RCS modem receives the bit in step 2705. The RCS increases or decreases its transmit power to the SU in step 2706 and the algorithm repeats starting from step 2701.

XXXV. Adaptive Reverse Power Control

Figure 28:
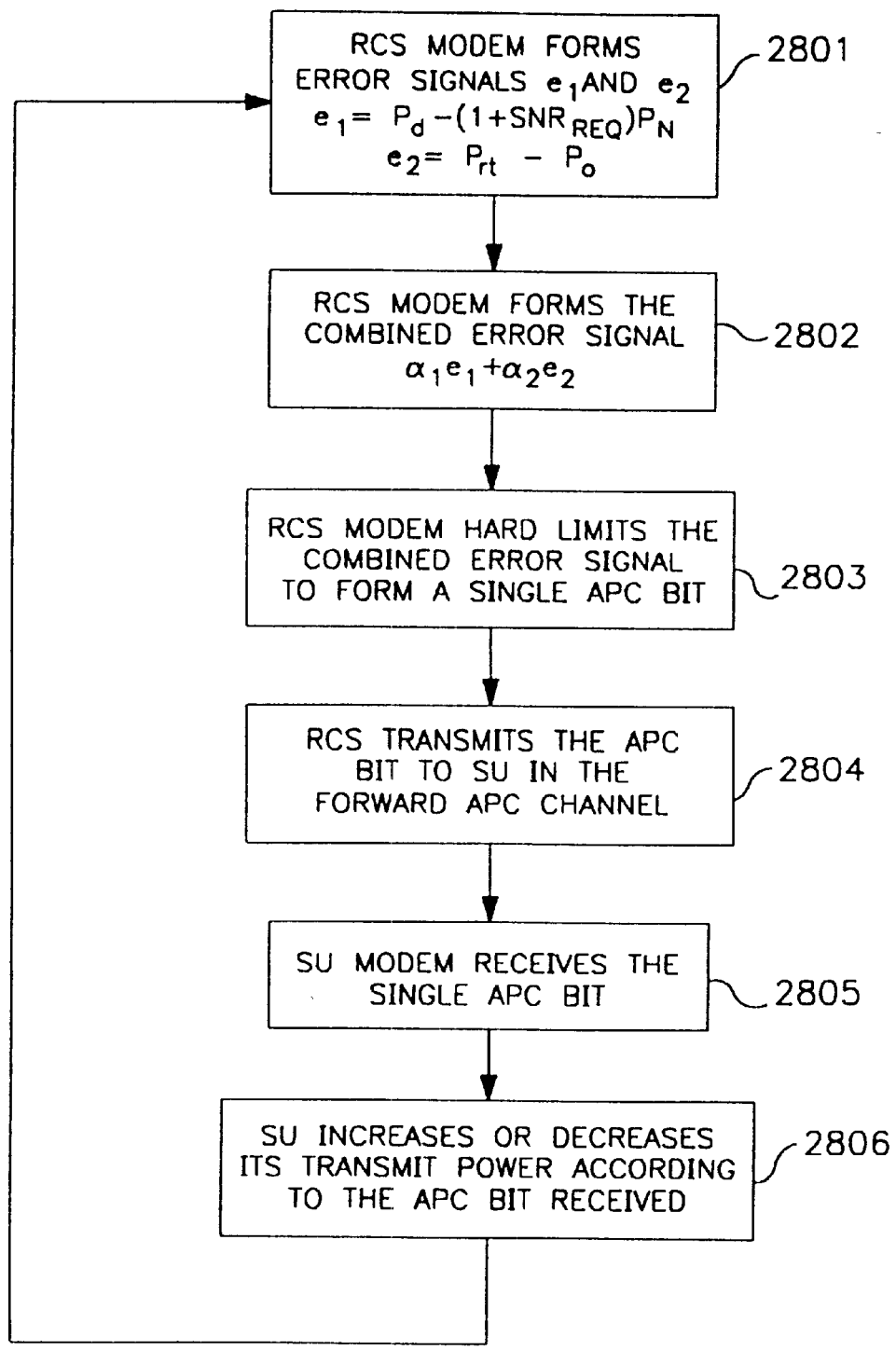
FIG. 28 is a flow-chart diagram of an exemplary automatic reverse power control algorithm of the present invention.

The ARPC process maintains the minimum desired SIR on the reverse channels to minimize the total system reverse output power, during both call/connection establishment and while the call/connection is in progress. The recursive ARPC process, shown in FIG. 28, begins at step 2801 where the RCS modem forms the two error signals $e_1$ and $e_2$ in step 2801 where:

$$e_1 = P_d - (1 + SNR_{REQ}) P_N \qquad \text{Equation (50)}$$

$$e_2 = P_{rt} - P_o \qquad \text{Equation (51)}$$

and $P_d$ is the despread signal plus noise power, $P_N$ is the despread noise power, $SNR_{REQ}$ is the desired signal to noise ratio for the service type, $P_{rt}$ is a measure of the average total power received by the RCS, and $P_o$ is the AGC set point. The RCS modem forms the combined error signal $\alpha_1 e_1 + \alpha_2 e_2$ in step 2802 and hard limits this error signal to determine a single APC bit in step 2803. The RCS transmits the APC bit to the SU in step 2804, and the bit is received by the SU in step 2805. Finally, the SU adjusts its transmit power according to the received APC bit in step 2806, and the algorithm repeats starting from step 2801.

TABLE 14

Symbols/Thresholds Used for APC Computation

| Service or Call Type | Call/Connection Status | Symbol (and Threshold) Used for APC Decision |
|---|---|---|
| Don't care | being established | AXCH |
| ISDN D SU | in-progress | one 1/64-kbs symbol from TRCH (ISDN-D) |
| ISDN 1B + D SU | in-progress | TRCH (ISDN-B) |
| ISDN 2B + D SU | in-progress | TRCH (one ISDN-B) |
| POTS SU (64 KBPS PCM) | in-progress | one 1/64-KBPS symbol from TRCH, use 64 KBPS PCM threshold |
| POTS SU (32 KBPS ADPCM) | in-progress | one 1/64-KBPS symbol from TRCH, use 32 KBPS ADPCM threshold |
| Silent Maintenance Call (any SU) | in-progress | OW (continuous during a maintenance call) |

XXXVI. SIR and Multiple Channel Types

The required SIR for channels on a link is a function of channel format (e.g. TRCH, OW), service type (e.g. ISDN B, 32 KBPS ADPCM POTS), and the number of symbols over which data bits are distributed (e.g. two 64 kbs symbols are integrated to form a single 32 kbs ADPCM POTS symbol). Despreader output power corresponding to the required SIR for each channel and service type is predetermined. While a call/connection is in progress, several user CDMA logical channels are concurrently active; each of these channels transfers a symbol every symbol period. The SIR of the symbol from the nominally highest SIR channel is measured, compared to a threshold and used to determine the APC step up/down decision each symbol period. Table 14 indicates the symbol (and threshold) used for the APC computation by service and call type.

XXXVII. APC Parameters

APC information is always conveyed as a single bit of information, and the APC data rate is equivalent to the APC update rate. The APC update rate is 64 kbs. This rate is high enough to accommodate expected Rayleigh and Doppler fades and allow for a relatively high (~0.2) bit error rate (BER) in the uplink and downlink APC channels, which minimizes capacity devoted to the APC.

The power step up/down indicated by an APC bit is nominally between 0.1 and 0.01 dB. The dynamic range for power control is 70 dB on the reverse link and 12 dB on the forward link for the exemplary embodiment of the present system.

XXXVIII. An Alternative Embodiment of Multiplexing of APC information

The dedicated APC and OW logical channels described previously can also be multiplexed together in one logical channel. The APC information is transmitted at 64 kbs. continuously whereas the OW information occurs in data bursts. The alternative multiplexed logical channel includes the unencoded, non-interleaved 64 kbs. APC information on, for example, the in-phase channel and the OW information on the quadrature channel of the QPSK signal.

XXXIX. Closed Loop Power Control Implementation

The closed loop power control during a call connection responds to two different variations in overall system power. First, the system responds to local behavior such as changes in power level of an SU, and second, the system responds to changes in the power level of the entire group of active users in the system.

Figure 29:
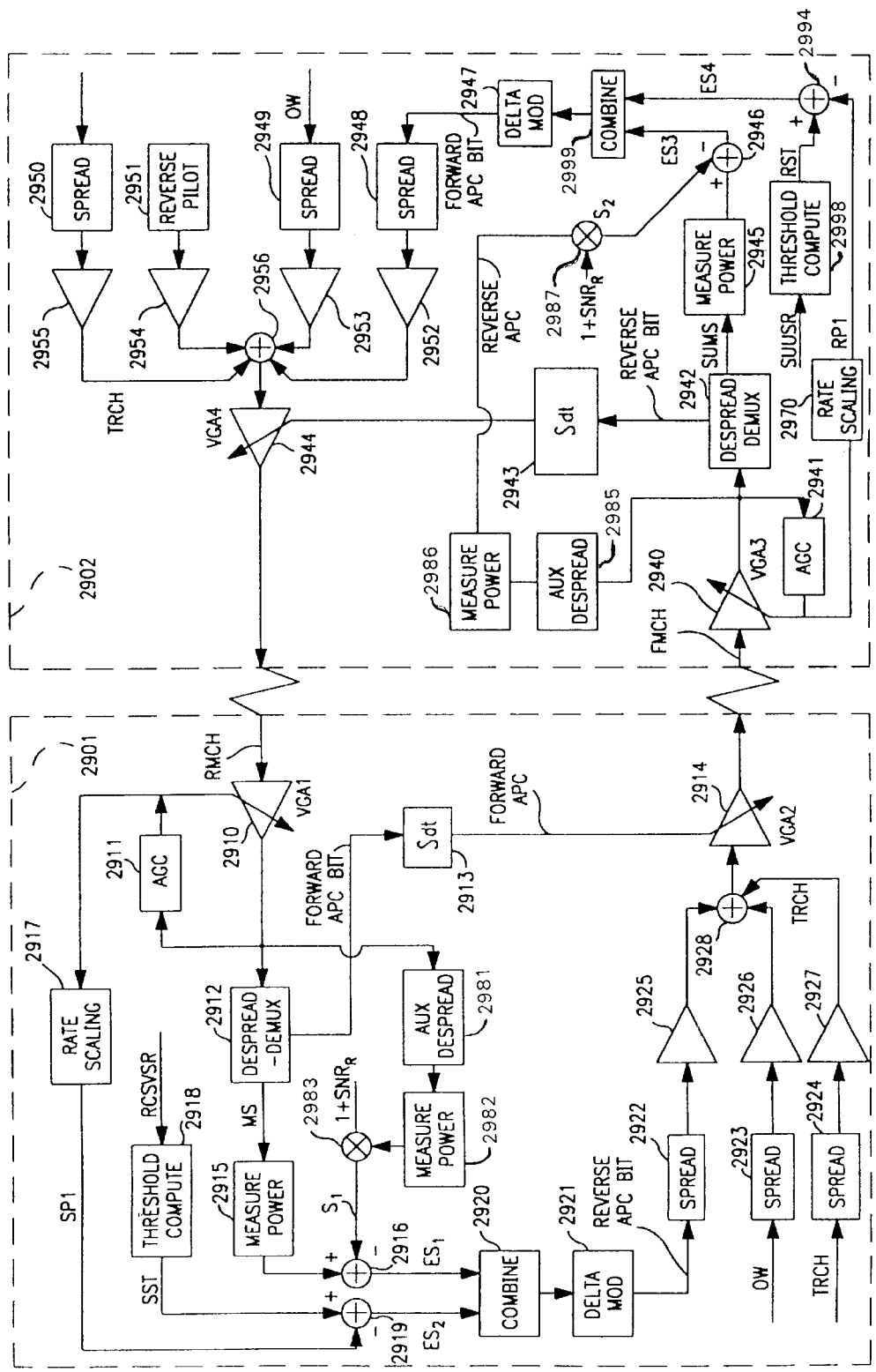
FIG. 29 is a block diagram of an exemplary closed loop power control system of the present invention when the bearer channel is established.

The power control system of the exemplary embodiment of the present invention is shown in FIG. 29. As shown, the circuitry used to adjust the transmitted power is similar for the RCS (shown as the RCS power control module 2901) and SU (shown as the SU power control module 2902). Beginning with the RCS power control module 2901, the reverse link RF channel signal is received at the RF antenna and demodulated to produce the reverse CDMA signal RMCH. The signal RMCH is applied to the variable gain amplifier (VGA1) 2910 which produces an input signal to the AGC circuit 2911. The AGC 2911 produces a variable gain amplifier control signal into the VGA1 2910. This signal maintains the level of the output signal of VGA1 2910 at a near constant value. The output signal of VGA1 is despread by the despread-demultiplexer (demux) 2912, which produces a despread user message signal MS and a forward APC bit. The forward APC bit is applied to the integrator 2913 to produce the forward APC control signal. The forward APC control signal controls the forward link VGA2 2914 and maintains the forward link RF channel signal at a minimum desired level for communication.

The signal power of the despread user message signal MS of the RCS power module 2901 is measured by the power measurement circuit 2915 to produce a signal power indication. The output of the VGA1 is also despread by the AUX despreader 2981 which despreads the signal by using an uncorrelated spreading code, and hence obtains a despread noise signal. The power measurement by measure power 2982 of this signal is multiplied at multiplier 2983 by 1 plus the desired signal to noise ratio ($SNR_R$) to form the threshold signal S1. The difference between the despread signal power and the threshold value S1 is produced by the subtracter 2916. This difference is the error signal ES1, which is an error signal relating to the particular SU transmit power level. Similarly, the control signal for the VGA1 2910 is applied to the rate scaling circuit 2917 to reduce the rate of the control signal for VGA1 2910. The output signal of scaling circuit 2917 is a scaled system power level signal SP1. The threshold compute logic 2918 calculates the system signal threshold value SST from the RCS user channel power data signal RCSUSR. The complement of the scaled system power level signal, SP1, and the system signal power threshold value SST are applied to the adder 2919 which produces second error signal ES2. This error signal is related to the system transmit power level of all active SUs. The input error signals ES1 and ES2 are combined in the combiner 2920 produce a combined error signal input to the delta modulator (DM1) 2921, and the output signal of the DM1 is the reverse APC bit stream signal, having bits of value +1 or −1, which for the present invention is transmitted as a 64 kbs signal.

The reverse APC bit is applied to the spreading circuit 2922, and the output signal of the spreading circuit 2922 is the spread-spectrum forward APC message signal. Forward OW and traffic signals are also provided to spreading circuits 2923, 2924, producing forward traffic message signals 1, 2, . . . N. The power level of the forward APC signal, the forward OW, and traffic message signals are adjusted by the respective amplifiers 2925, 2926 and 2927 to produce the power level adjusted forward APC, OW and TRCH channels signals. These signals are combined by the adder 2928 and applied to the VGA2 2914, which produces forward link RF channel signal.

The forward link RF channel signal including the spread forward APC signal is received by the RF antenna of the SU, and demodulated to produce the forward CDMA signal FMCH. This signal is provided to the variable gain amplifier (VGA3) 2940. The output signal of VGA3 is applied to the AGC 2941 which produces a variable gain amplifier control signal to VGA3 2940. This signal maintains the level of the output signal of VGA3 at a near constant level. The output signal of VGA3 2940 is despread by the despread demux 2942, which produces a despread user message signal SUMS and a reverse APC bit. The reverse APC bit is applied to the integrator 2943 which produces the reverse APC control signal. This reverse APC control signal is provided to the reverse APC VGA4 2944 to maintain the reverse link RF channel signal at a minimum power level.

The despread user message signal SUMS is also applied to the power measurement circuit 2945 producing a power measurement signal, which is added to the complement of threshold value S2 in the adder 2946 to produce error signal ES3. The signal ES3 is an error signal relating to the RCS transmit power level for the particular SU. To obtain threshold S2, the despread noise power as measured by measure power 2986 indication from the AUX despreader 2985 is multiplied using multiplier 2987 by 1 plus the desired signal to noise ratio $SNR_R$. The AUX despreader 2985 despreads the input data using an uncorrelated spreading code, hence its output is an indication of the despread noise power. Similarly, the control signal for the VGA3 is applied to the rate scaling circuit to reduce the rate of the control signal for VGA3 in order to produce a scaled received power level RP1. The threshold compute circuit 2998 computes the received signal threshold-RST from the SU measured power signal SUUSR. The complement of the scaled received power level RP1 and the received signal threshold RST are applied to the adder 2994 which produces error signal ES4. This error is related to the RCS transmit power to all other SUs. The input error signals ES3 and ES4 are combined in the combiner 2999 and input to the delta modulator DM2 2947. The output signal of DM2 2947 is the forward APC bit stream signal, with bits having value of value +1 or −1. In the exemplary embodiment of the present invention, this signal is transmitted as a 64 kbs signal.

The forward APC bit stream signal is applied to the spreading circuit 2948, to produce the output reverse spread-spectrum APC signal. Reverse OW and traffic signals are also input to spreading circuits 2949, 2950, producing reverse OW and traffic message signals 1, 2, . . . N, and the reverse pilot is generated by the reverse pilot generator 2951. The power level of the reverse APC message signal, reverse OW message signal, reverse pilot, and the reverse traffic message signals are adjusted by amplifiers 2952, 2953, 2954, 2955 to produce the signals which are combined by the adder 2956 and input to the reverse APC VGA4 2944. It is this VGA4 2944 which produces the reverse link RF channel signal.

Figure 30:
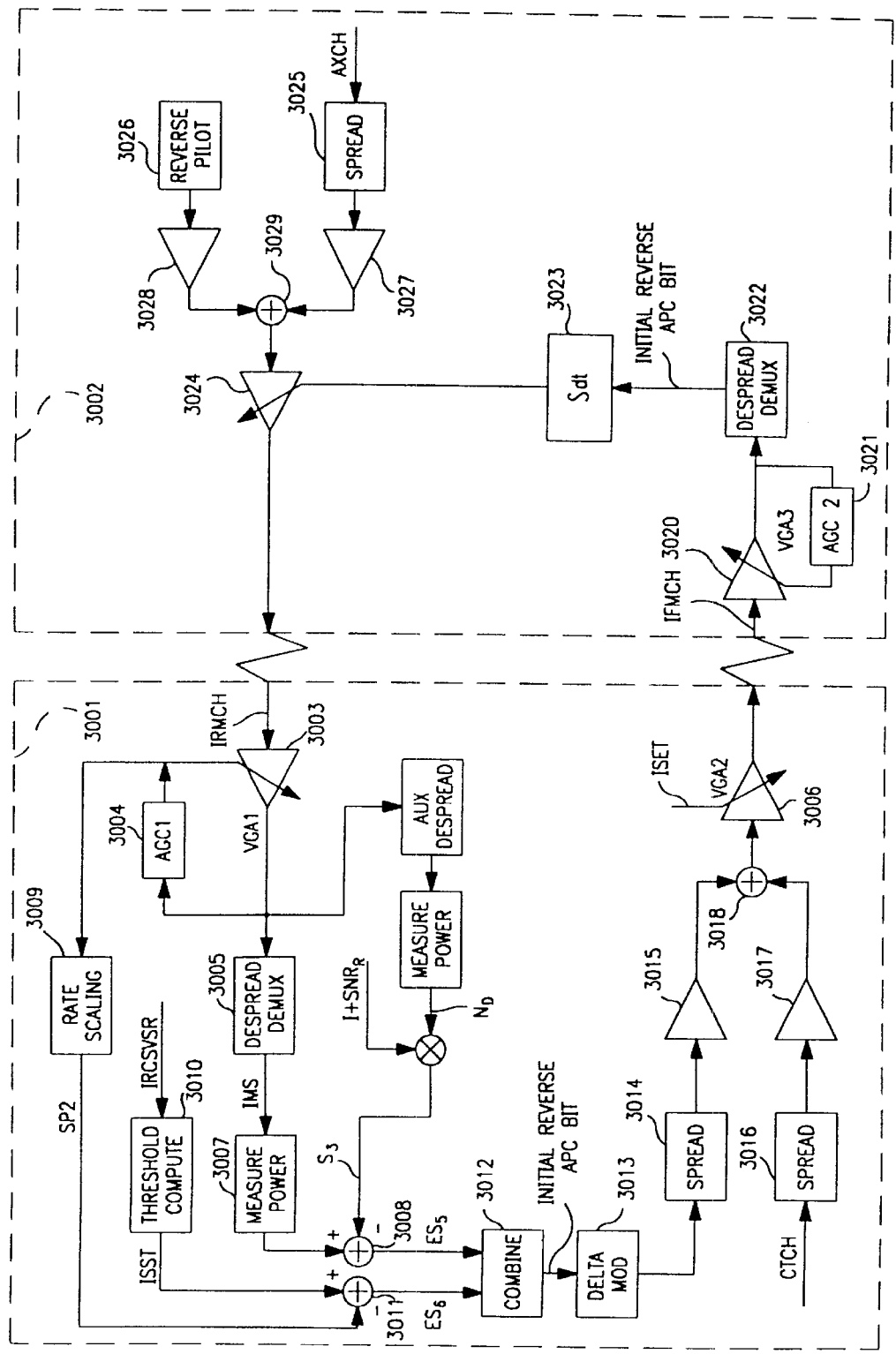
FIG. 30 is a block diagram of an exemplary closed loop power control system of the present invention during the process of establishing the bearer channel.

During the call connection and bearer channel establishment process, the closed loop power control of the present invention is modified, and is shown in FIG. 30. As shown, the circuits used to adjust the transmitted power are different for the RCS, shown as the initial RCS power control module 3001; and for the SU, shown as the initial SU power control module 3002. Beginning with the initial RCS power control module 3001, the reverse link RF channel signal is received at the RF antenna and demodulated producing the reverse CDMA signal IRMCH which is received by the first variable gain amplifier (VGA1) 3003. The output signal of VGA1 is detected by the AGC circuit (AGC1) 3004 which provides a variable gain amplifier control signal to VGA1 3003 to maintain the level of the output signal of VAG1 at a near constant value. The output signal of VGA1 is despread by the despread demultiplexer 3005, which produces a despread user message signal IMS. The forward APC control signal, ISET, is set to a fixed value, and is applied to the forward link variable gain amplifier (VGA2) 3006 to set the forward link RF channel signal at a predetermined level.

The signal power of the despread user message signal IMS of the Initial RCS power module 3001 is measured by the power measure circuit 3007, and the output power measurement is subtracted from a threshold value S3 in the subtracter 3008 to produce error signal ES5, which is an error signal relating to the transmit power level of a particular SU. The threshold S3 is calculated by multiplying using a multiplier 3083 the despread power measurement by measure power 3082 obtained from the AUX despreader 3081 by 1 plus the desired signal to noise ratio $SNR_R$. The AUX despreader 3081 despreads the signal using an uncorrelated spreading code, hence its output signal is an indication of despread noise power. Similarly, the VGA1 control signal is applied to the rate scaling circuit 3009 to reduce the rate of the VGA1 control signal in order to produce a scaled system power level signal SP2. The threshold computation logic 3010 determines an initial system signal threshold value (ISST) computed from the user channel power data signal (IRCSUSR). The complement of the scaled system power level signal SP2 and the ISST are provided to the adder 3011 which produces a second error signal ES6, which is an error signal relating to the system transmit power level of all active SUs. The value of ISST is the desired transmit power for a system having the particular configuration. The input error signals ES5 and ES6 are combined in the combiner 3012 produce a combined error signal input to the delta modulator (DM3) 3013. DM3 produces the initial reverse APC bit stream signal, having bits of value +1 or −1, which in the exemplary embodiment is transmitted as a 64 kbs signal.

The reverse APC bit stream signal is applied to the spreading circuit 3014, to produce the initial spread-spectrum forward APC signal. The CTCH information is spread by the spreader 3016 to form the spread CTCH message signal. The spread APC and CTCH signals are scaled by the amplifiers 3015 and 3017, and combined by the combiner 3018. The combined signal is applied to VAG2 3006, which produces the forward link RF channel signal.

The forward link RF channel signal including the spread forward APC signal is received by the RF antenna of the SU and demodulated to produce the initial forward CDMA signal (IFMCH) which is applied to the variable gain amplifier (VGA3) 3020. The output signal of VGA3 is detected by the AGC circuit (AGC2) 3021 which produces a variable gain amplifier control signal for the VGA3 3020. This signal maintains the output power level of the VGA3 3020 at a near constant value. The output signal of VAG3 is despread by the despread demultiplexer 3022, which produces an initial reverse APC bit that is dependent on the output level of VGA3. The reverse APC bit is processed by the integrator 3023 to produce the reverse APC control signal. The reverse APC control signal is provided to the reverse APC VGA4 3024 to maintain the reverse link RF channel signal at a defined power level.

The global channel AXCH signal is spread by the spreading circuits 3025 to provide the spread AXCH channel signal. The reverse pilot generator 3026 provides a reverse pilot signal, and the signal power of AXCH and the reverse pilot signal are adjusted by the respective amplifiers 3027 and 3028. The spread AXCH channel signal and the reverse pilot signal are summed by the adder 3029 to produce reverse link CDMA signal. The reverse link CDMA signal is received by the reverse APC VGA4 3024, which produces the reverse link RF channel signal output to the RF transmitter.

XXXX. System Capacity Management

The system capacity management algorithm of the present invention optimizes the maximum user capacity for an RCS area, called a cell. When the SU comes within a certain value of maximum transmit power, the SU sends an alarm message to the RCS. The RCS sets the traffic lights which control access to the system, to "red" which, as previously described, is a flag that inhibits access by the SU's. This condition remains in effect until the call to the alarming SU terminates, or until the transmit power of the alarming SU, measured at the SU, is a value less than the maximum transmit power. When multiple SUs send alarm messages, the condition remains in effect until either all calls from alarming SUs terminate or until the transmit power of the alarming SU, measured at the SU, is less than the maximum transmit power. An alternative embodiment monitors the bit error rate measurements from the FEC decoder, and holds the RCS traffic lights at "red" until the bit error rate is less than a predetermined value.

The blocking strategy of the present invention includes a method which uses the power control information transmitted from the RCS to an SU, and the received power measurements at the RCS. The RCS measures its transmit power level, detects that a maximum value is reached and determines when to block new users. An SU preparing to enter the system blocks itself if the SU reaches the maximum transmit power before successful completion of a bearer channel assignment.

Each additional user in the system has the effect of increasing the noise level for all other users, which decreases the signal to noise ratio (SNR) that each user experiences. The power control algorithm maintains a desired SNR for each user. Therefore, in the absence of any other limitations, addition of a new user into the system has only a transient effect and the desired SNR is regained.

The transmit power measurement at the RCS is done by measuring either the root mean square (rms) value of the baseband combined signal or by measuring the transmit power of the RF signal and feeding it back to digital control circuits. The transmit power measurement may also be made by the SUs to determine if the unit has reached its maximum transmit power. The SU transmit power level is determined by measuring the control signal of the RF amplifier, and scaling the value based on the service type, such as POTS, FAX, or ISDN.

The information that an SU has reached the maximum power is transmitted to the RCS by the SU in a message on the assigned channels. The RCS also determines the condition by measuring reverse APC changes because, if the RCS sends APC messages to the SU to increase SU transmit power, and the SU transmit power measured at the RCS is not increased, the SU has reached the maximum transmit power.

The RCS does not use traffic lights to block new users who have finished ramping-up using the short codes. These users are blocked by denying them the dial tone and letting them time out. The RCS sends all 1's (go down commands) on the APC channel to make the SU lower its transmit power. The RCS also sends either no CTCH message or a message with an invalid address which would force the FSU to abandon the access procedure and start over. The SU, however, does not start the acquisition process immediately because the traffic lights are red.

When the RCS reaches its transmit power limit, it enforces blocking in the same manner as when an SU reaches its transmit power limit. The RCS turns off all the traffic lights on the FBCH, starts sending all 1 APC bits (go down commands) to those users who have completed their short code ramp-up but have not yet been given a dial tone, and either sends no CTCH message to these users or sends messages with invalid addresses to force them to abandon the access process.

The self blocking process of the SU is as follows. When the SU starts transmitting the AXCH, the APC starts its power control operation using the AXCH and the SU transmit power increases. While the transmit power is increasing under the control of the APC it is monitored by the SU controller. If the transmit power limit is reached, the SU abandons the access procedure and starts over.

XXXXI. System Synchronization

Figure 10:
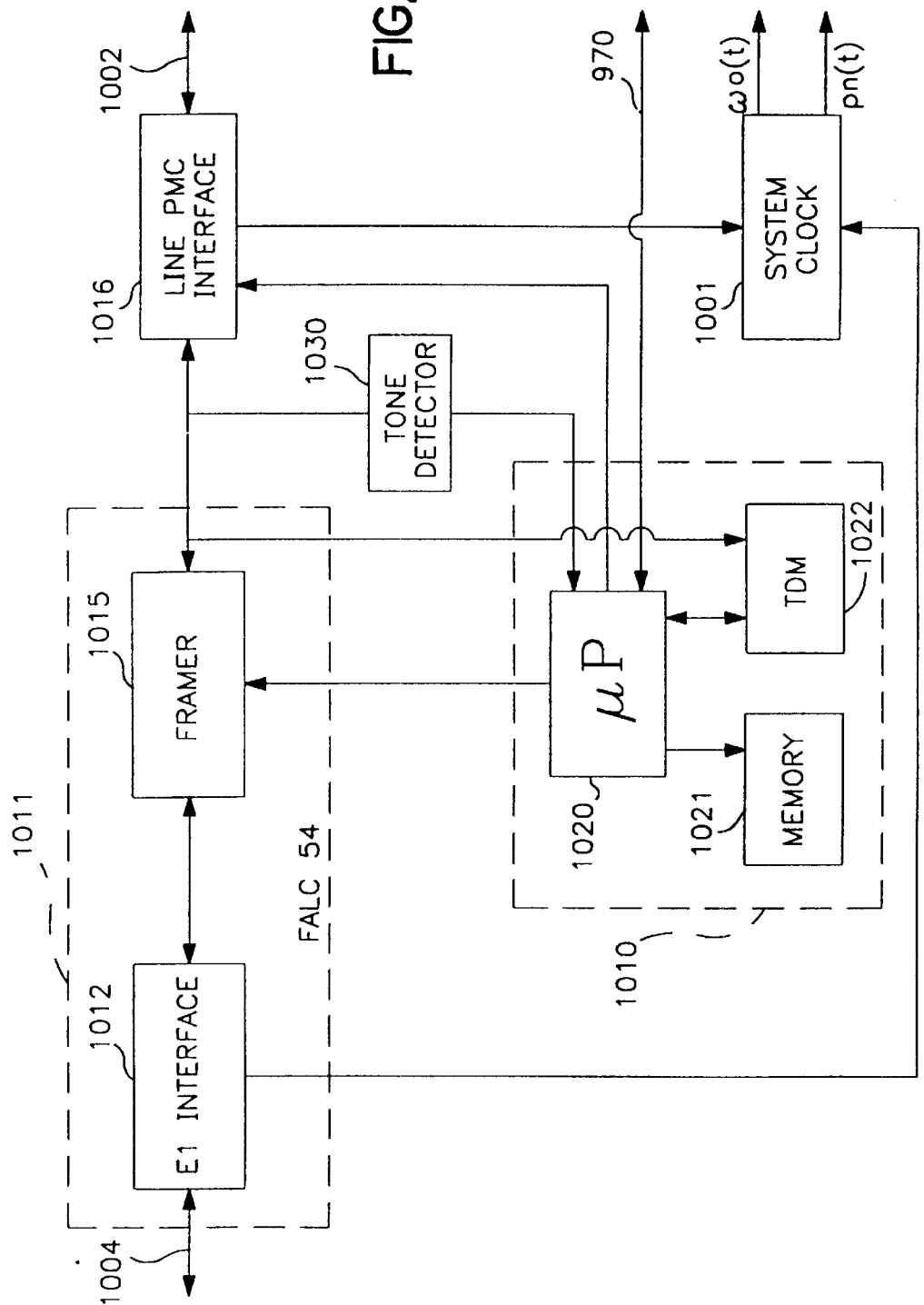
FIG. 10 is a block diagram of the elements of an exemplary multiplexer suitable for use in the RCS shown in FIG. 9.

The RCS is synchronized either to the PSTN network clock signal through one of the line interfaces, as shown in FIG. 10 or to the RCS system clock oscillator, which free-runs to provide a master timing signal for the system. The global pilot channel, and therefore all logical channels within the CDMA channel, are synchronized to the system clock signal of the RCS. The global pilot (GLPT) is transmitted by the RCS and defines the timing at the RCS transmitter.

The SU receiver is synchronized to the GLPT, and so behaves as a slave to the network clock oscillator. However, the SU timing is retarded by the propagation delay. In the present embodiment of the invention, the SU modem extracts a 64 KHz and 8 KHz clock signal from the CDMA RF receive channel, and a PLL oscillator circuit creates 2 MHz and 4 MHz clock signals The SU transmitter and hence the LAXPT or ASPT are slaved to the timing of the SU receiver. The RCS receiver is synchronized to the LAXPT or the ASPT transmitted by the SU, however, its timing may be retarded by the propagation delay. Hence, the timing of the RCS receiver is that of the RCS transmitter retarded by twice the propagation delay.

Furthermore, the system can be synchronized via a reference received from a GPS receiver. In a system of this type, a GPS receiver in each RCS provides a reference clock signal to all submodules of the RCS. Because each RCS receives the same time reference from the GPS, all of the system clock signals in all of the RCSs are synchronized.

The present invention also performs multichannel filtering. Details of this technique can be found in Section XXXXVI hereinafter entitled "Efficient Multichannel Filtering For CDMC Modems".

XXXXII. A Method Of Controlling Initial Power Ramp-up in CDMA Systems by Using Short Codes The use of the same frequency spectrum by a plurality of SUs increases the efficiency of a CDMA communication system. However, it also causes a gradual degradation of the performance of the system as the number of SUs increase. Each SU detects communication signals with its unique spreading code as valid signals and all other signals are viewed as noise. The stronger the signal from an SU arrives at the BS, the more interference the BS experiences when receiving and demodulating signals from other SUs. Ultimately, the power from one SU may be great enough to terminate communications of other SUs. Accordingly, it is extremely important in wireless CDMA communication systems to control the transmission power of all SUs. The control of transmission power is particularly critical when an SU is attempting to initiate communications with a BS and a power control loop has not yet been established. Typically, the transmission power required from an SU changes continuously as a function of the propagation loss, interference from other SUs, channel noise, fading and other channel characteristics. Therefore, an SU does not know the power level at which it should start transmitting. If the SU begins transmitting at a power level that is too high, it may interfere with the communications of other SUs and may even terminate the communications of other SUs. If the initial transmission power level is too low, the SU will not be detected by the BS and a communication link will not be established.

The present invention comprises a novel method of controlling transmission power during the establishment of a channel in a CDMA communication system by utilizing the transmission of a short code from an SU to a BS during initial power ramp-up. The short code is a sequence for detection by the BS which has a much shorter period than a conventional spreading code. The ramp-up starts from a power level that is guaranteed to be lower than the required power level for detection by the BS. The SU quickly increases transmission power while repeatedly transmitting the short code until the signal is detected by the BS. Once the BS detects the short code, it sends an indication to the SU to cease increasing transmission power. The use of short codes limits power overshoot and interference to other SUs and permits the BS to quickly synchronize to the spreading code used by the SU.

Figure 31:
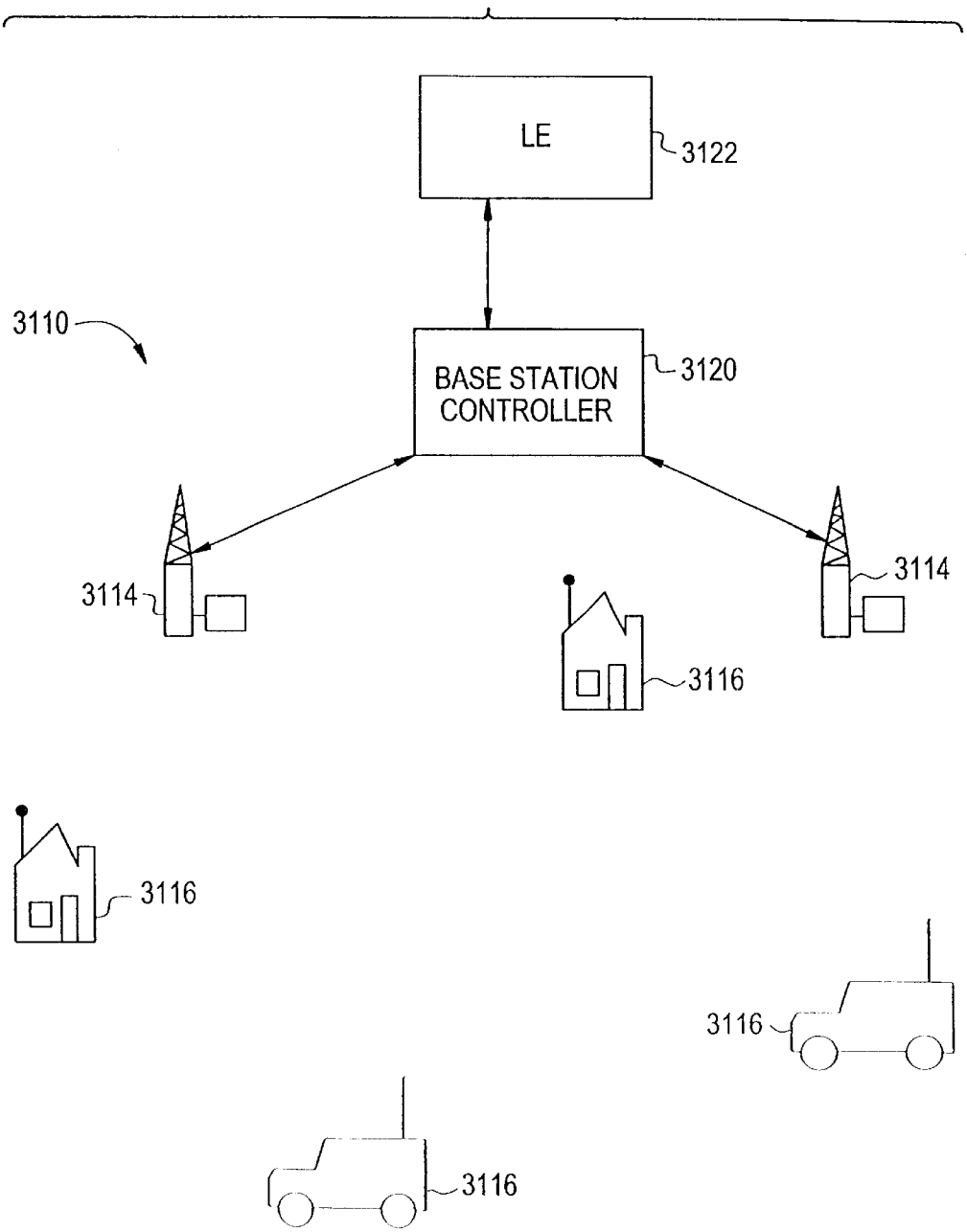
FIG. 31 is a schematic overview of an exemplary code division multiple access communication system in accordance with the present invention.

A communication network 3110 in one embodiment of the present invention is shown in FIG. 31. The communication network 3110 generally comprises one or more BSs 3114, each of which is in wireless communication with a plurality of SUs 3116, which may be fixed or mobile. Each SU 3116 communicates with either the closest BS 3114 or the BS 3114 which provides the strongest communication signal. The BSs 3114 also communicate with a base station controller 3120, which coordinates communications among base stations 3114. The communication network 3110 may also be connected to a local exchange (LE) 3122, wherein the base station controller 3120 also coordinates communications between the BSs 3114 and the LE 3122. Preferably, each BS 3114 communicates with the base station controller 3120 over a wireless link, although a land line may also be provided. A land line is particularly applicable when a BS 3114 is in close proximity to the base station controller 3120.

The base station controller 3120 performs several functions. Primarily, the base station controller 3120 provides all of the operations, administrative and maintenance (OA&M) signaling associated with establishing and maintaining all of the wireless communications between the SUs 3116, the BSs 3114 and the base station controller 3120. The base station controller 3120 also provides an interface between the wireless communication system 3110 and the LE 3122. This interface includes multiplexing and demultiplexing of the communication signals that enter and leave the system 3110 via the base station controller 3120. Although the wireless communication system 3110 is shown employing antennas to transmit RF signals, one skilled in the art should recognize that communications may be accomplished via microwave or satellite uplinks. Additionally, the functions of the base station controller 3120 may be combined with a BS 3114 to form a "master base station".

Figure 32:
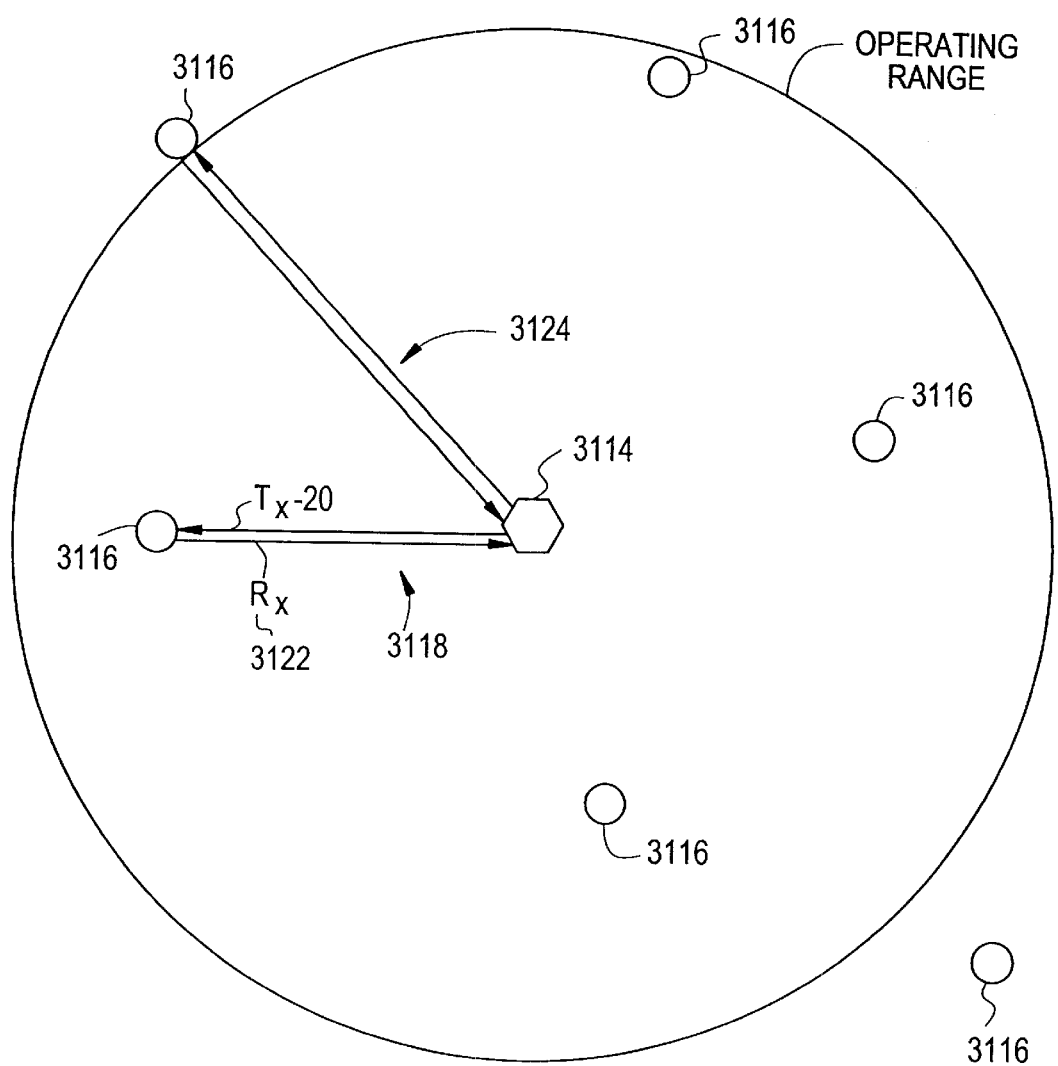
FIG. 32 is a diagram showing the operating range of a base station.

Referring to FIG. 32, the propagation of signals between a BS 3114 and a plurality of SUs 3116 is shown. A two-way communication channel (link) 3118 comprises a signal transmitted 3120 (Tx) from the BS 3114 to the SU 3116 and a signal received 3122 (Rx) by the BS 3114 from the SU 3116. The Tx signal 3120 is transmitted from the BS 31114 and is received by the SU 3116 after a propagation delay $\Delta t$. Similarly, the Rx signal originates at the SU 3116 and terminates at the BS 3114 after a further propagation delay $\Delta t$. Accordingly, the round trip propagation delay is $2\Delta t$. In the preferred embodiment, the BS 3114 has an operating range of approximately 30 kilometers. The round trip propagation delay 3124 associated with an SU 3116 at the maximum operating range is 200 microseconds.

It should be apparent to those of skill in the art that the establishment of a communication channel between a BS and an SU is a complex procedure as herinbefore described involving many tasks performed by the BS and the SU which are outside the scope of the present invention. This aspect of present invention is directed to initial power ramp-up and synchronization during the establishment of a communication channel.

Figure 33:
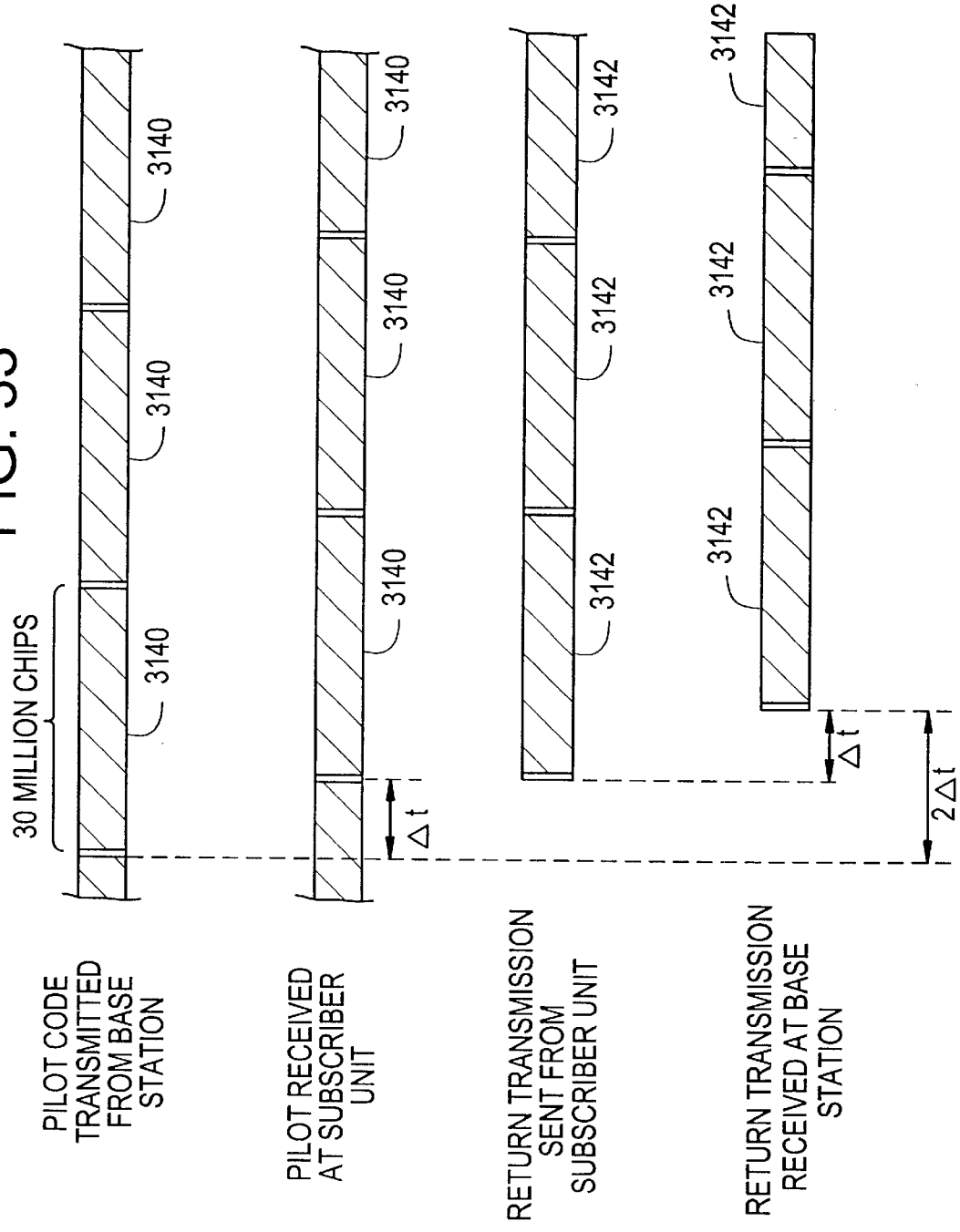
FIG. 33 is a timing diagram of communication signals between a base station and a subscriber unit.

Referring to FIG. 33, the signaling between a BS 3114 and an SU 3116 is shown. In accordance with the present invention, the BS 3114 continuously transmits a pilot code 3140 to all of the SUs 3116 located within the transmitting range of the base station 3114. The SU 3116 must acquire the pilot code 3140 transmitted by the BS 3114 before it can receive or transmit any data. Acquisition is the process whereby the SU 3116 aligns its locally generated spreading code with the received pilot code 3140. The SU 3116 searches through all of the possible phases of the received pilot code 3140 until it detects the correct phase, (the beginning of the pilot code 3140 ).

The SU 3116 then synchronizes its transmit spreading code to the received pilot code 3140 by aligning the beginning of its transmit spreading code to the beginning of the pilot code 3140. One implication of this receive and transmit synchronization is that the SU 3116 introduces no additional delay as far as the phase of the spreading codes are concerned. Accordingly, as shown in FIG. 33, the relative delay between the pilot code 3140 transmitted from the base station 3114 and the SU's transmit spreading code 3142 received at the BS 3114 is $2\Delta t$, which is solely due to the round trip propagation delay.

In the preferred embodiment, the pilot code is 29,877,120 chips in length and takes approximately 2 to 5 seconds to transmit, depending on the spreading factor. The length of the pilot code 3140 was chosen to be a multiple of the data symbol no matter what kind of data rate or bandwidth is used. As is well known by those of skill in the art, a longer pilot code 3140 has better randomness properties and the frequency response of the pilot code 3140 is more uniform. Additionally, a longer pilot code 3140 provides low channel cross correlation, thus increasing the capacity of the system 3110 to support more SUs 3116 with less interference. The use of a long pilot code 3140 also supports a greater number of random short codes. For synchronization purposes, the pilot code 3140 is chosen to have the same period as all of the other spreading codes used by the system 3110. Thus, once a SU 3116 acquires the pilot code 3140, it is synchronized to all other signals transmitted from the BS 3114.

During idle periods, when a call is not in progress or pending, the SU 3116 remains synchronized to the BS 3114 by periodically reacquiring the pilot code 3140. This is necessary for the SU 3116 to receive and demodulate any downlink transmissions, in particular paging messages which indicate incoming calls.

When a communication link is desired, the BS 3114 must acquire the signal transmitted from the SU 3116 before it can demodulate the data. The SU 3116 must transmit an uplink signal for acquisition by the BS 3114 to begin establishing the two-way communication link. A critical parameter in this procedure is the transmission power level of the SU 3116. A transmission power level that is too high can impair communications in the whole service area, whereas a transmission power level that is too low can prevent the BS 3114 from detecting the uplink signal.

The SU 3116 starts transmitting at a power level guaranteed to be lower than what is required and increases transmission power output until the correct power level is achieved. This avoids sudden introduction of a strong interference, hence improving system 3110 capacity.

Figure 34:
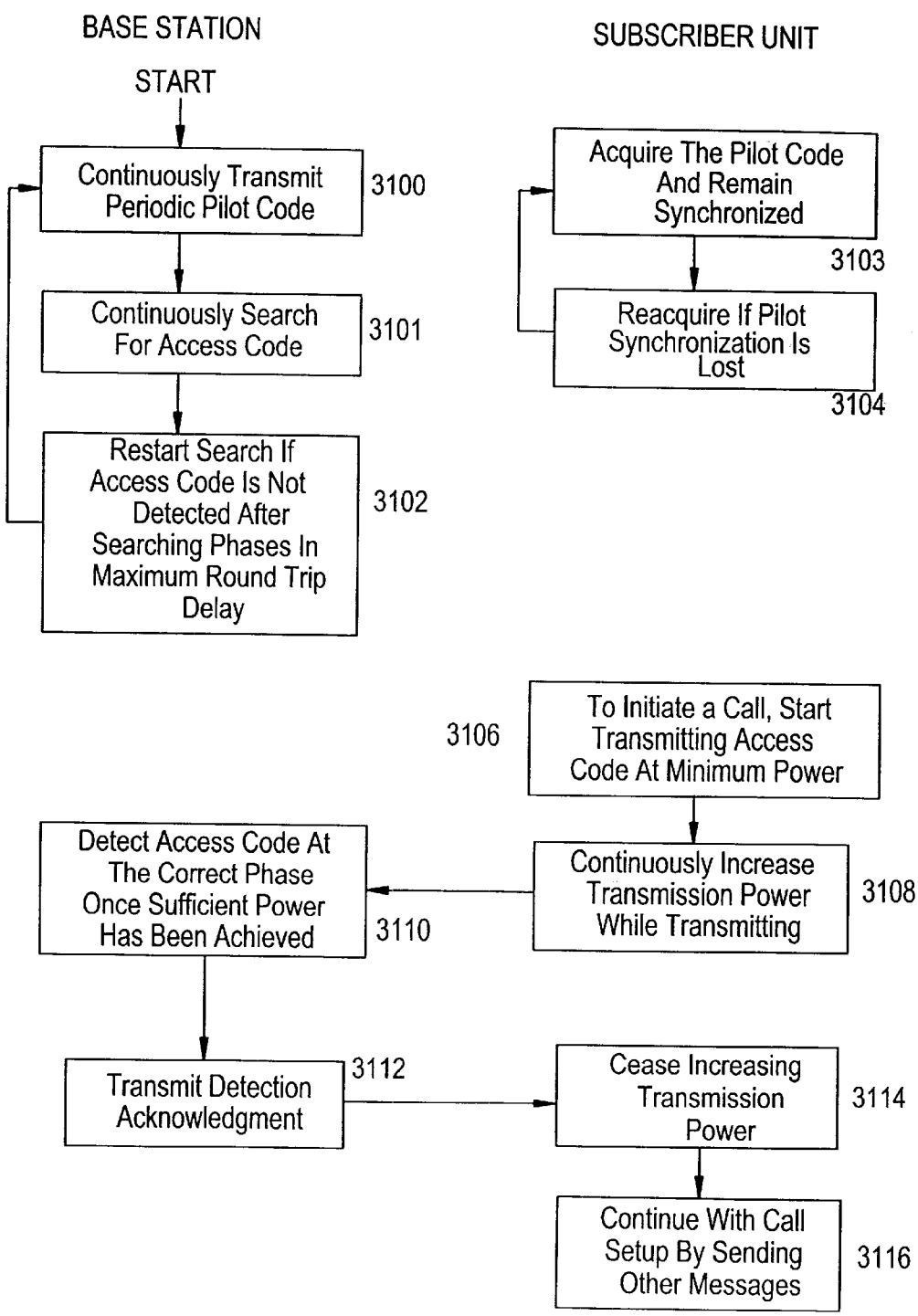
FIG. 34 is a flow diagram of the establishment of a communication channel between a base station and a subscriber unit.

The establishment of a communication channel in accordance with this embodiment of the present invention and the tasks performed by the BS 3114 and an SU 3116 are shown in FIG. 34. Although many SUs 3116 may be located within the operating range of the BS 3114, reference will be made hereinafter to a single SU 3116 for simplicity in explaining the operation of the present invention. Additionally, although the terminology "access code" is used herein as referring to the spreading code used with the "access signal", access code and access signal may be used interchangeably. Finally, the terminology "confirmation signal" and "acknowledgement signal" may also be used interchangeably.

The BS 3114 begins by continuously transmitting a periodic pilot code 3140 to all SUs 3116 located within the operating range of the BS 3114 (step 3100). As the BS 3114 transmits the pilot code 3140 (step 3100), the BS 3114 searches (step 3101) for an "access code" 3142 transmitted by an SU 3116. The access code 3142 is a known spreading code transmitted from an SU 3116 to the BS 3114 during initiation of communications and power ramp-up. The BS 3114 must search through all possible phases (time shifts) of the access code 3142 transmitted from the SU 3116 in order to find the correct phase. This is called the "acquisition" or the "detection" process (step 3101). The longer the access code 3142, the longer it takes for the BS 3114 to search through the phases and acquire the correct phase.

As previously explained, the relative delay between signals transmitted from the BS 3114 and return signals received at the BS 3114 corresponds to the round trip propagation delay $2\Delta t$. The maximum delay occurs at the maximum operating range of the BS 3114, known as the cell boundary. Accordingly, the BS 3114 must search up to as many code phases as there are in the maximum round trip propagation delay, which is typically less code phases than there are in a code period.

For a data rate Rb and spreading code rate Rc, the ratio L=Rc/Rb is called the spreading factor or the processing gain. In the preferred embodiment of the present invention, the cell boundary radius is 30 km, which corresponds to approximately between 1000 and 2500 code phases in the maximum round trip delay, depending on the processing gain.

If the BS 3114 has not detected the access code after searching through the code phases corresponding to the maximum round trip delay, the search is repeated starting from the phase of the pilot code 3140 which corresponds to zero delay (step 3102).

During idle periods, the pilot code 3140 from the BS 3114 is received at the subscriber unit 3116 which periodically synchronizes its transmit spreading code generator thereto (step 3103). If synchronization with the pilot code 3140 is lost, the SU 3116 reacquires the pilot code 3140 and resynchronizes (step 3104).

When it is desired to initiate a communication link, the SU 3116 starts transmitting the access code 3142 back to the BS 3114 (step 3106). The SU 3116 continuously increases the transmission power while retransmitting the access code 3142 (step 3108) until it receives an acknowledgment from the BS 3114. The BS 3114 detects the access code 3142 at the correct phase once the minimum power level for reception has been achieved (step 3111). The BS 3114 subsequently transmits an access code detection acknowledgment signal (step 3113) to the SU 3116. Upon receiving the acknowledgment, the SU ceases the transmission power increase (step 3115). With the power ramp-up completed, closed loop power control and call setup signaling is performed (step 3117) to establish the two-way communication link.

Although this embodiment limits SU 3116 transmission power, acquisition of the subscriber unit 3116 by the BS 3114 in this manner may lead to unnecessary power overshoot from the SU 3116, thereby reducing the performance of the system 3110.

Figure 35:
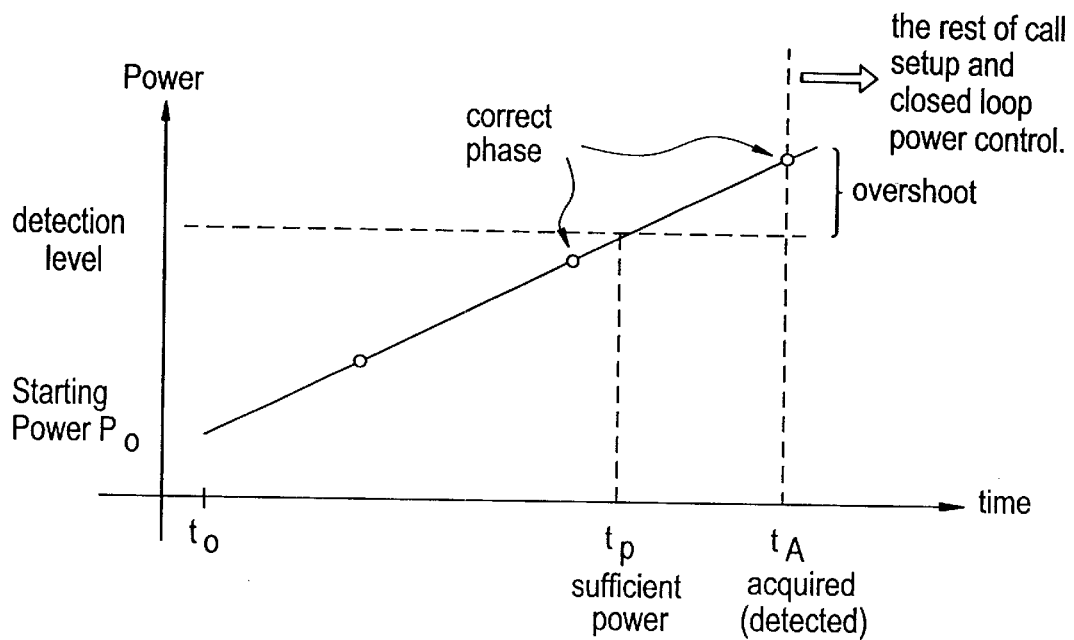
FIG. 35 is a graph of the transmission power output from a subscriber unit.

The transmission power output profile of the SU 3116 is shown in FIG. 35. At $t_0$, the SU 3116 starts transmitting at the starting transmission power level $P_0$, which is a power level guaranteed to be less than the power level required for detection by the BS 3114. The SU 3116 continually increases the transmission power level until it receives the detection indication from the BS 3114. For the BS 3114 to properly detect the access code 3142 from the SU 3116 the access code 3142 must: 1) be received at a sufficient power level; and 2) be detected at the proper phase. Accordingly, referring to FIG. 35, although the access code 3142 is at a sufficient power level for detection by the BS 3114 at $t_P$, the BS 3114 must continue searching for the correct phase of the access code 3142 which occurs at $t_A$.

Since the SU 3116 continues to increase the output transmission power level until it receives the detection indication from the BS 3114, the transmission power of the access code 3142 exceeds the power level required for detection by the BS 3114. This causes unnecessary interference to all other SUs 3116. If the power overshoot is too large, the interference to other SUs 3116 may be so severe as to terminate ongoing communications of other SUs 3116.

The rate that the SU 3116 increases transmission power to avoid overshoot may be reduced, however, this results in a longer call setup time. Those of skill in the art would appreciate that adaptive ramp-up rates can also be used, yet these rates have shortcomings and will not appreciably eliminate power overshoot in all situations.

This embodiment of the present invention utilizes "short codes" and a two-stage communication link establishment procedure to achieve fast power ramp-up without large power overshoots. The spreading code transmitted by the SU 3116 is much shorter than the rest of the spreading codes (hence the term short code), so that the number of phases is limited and the BS 3114 can quickly search through the code. The short code used for this purpose carries no data.

Figure 36B:
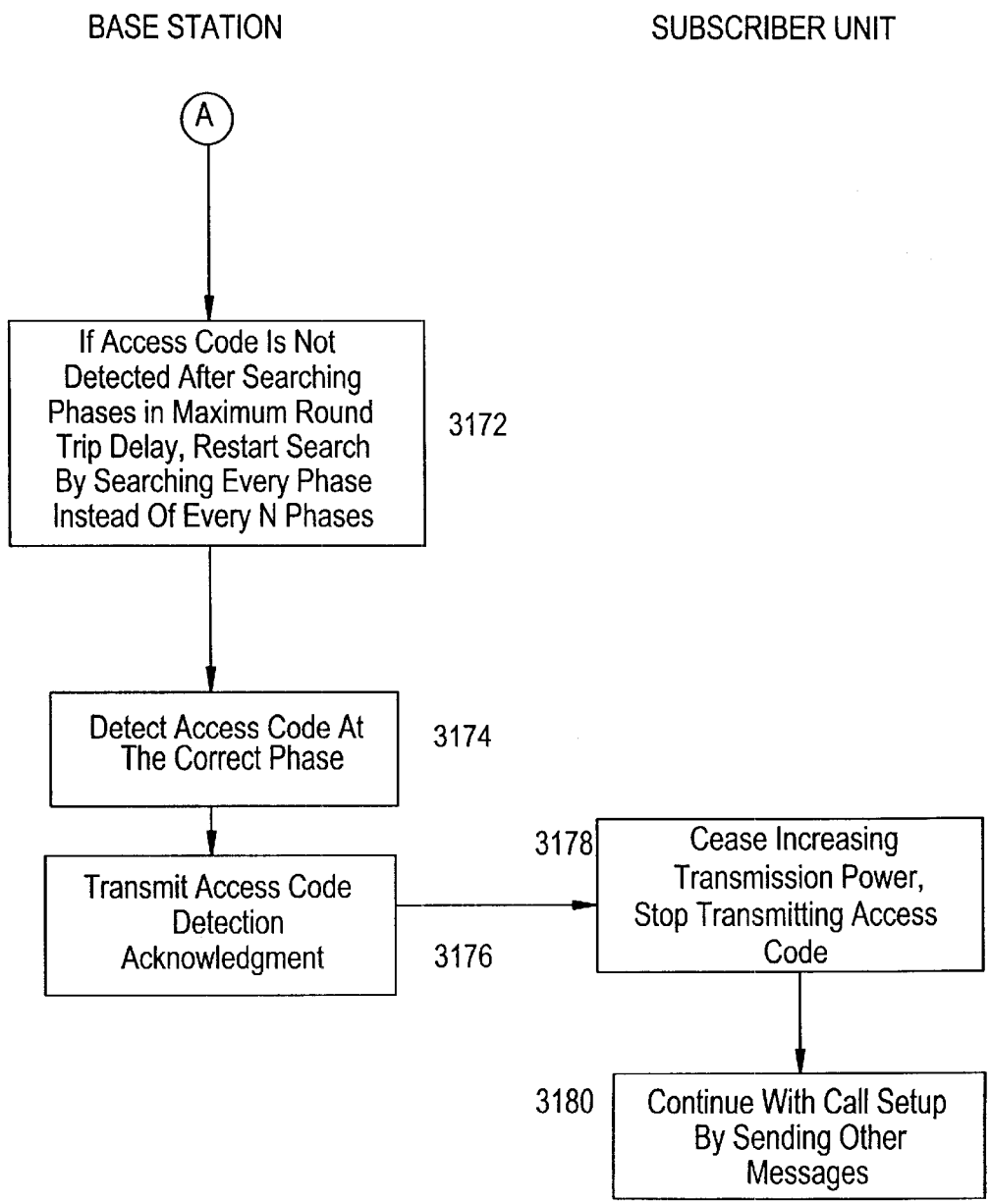

The tasks performed by the BS 3114 and the SU 3116 to establish a communication channel using short codes in accordance with this embodiment of the present invention are shown in FIGS. 36A and 36B. During idle periods, the BS 3114 periodically and continuously transmits the pilot code to all SUs 3116 located within the operating range of the BS 3114 (step 3150). The BS 3114 also continuously searches for a short code transmitted by the SU 3116 (step 3152). The SU 3116 acquires the pilot code and synchronizes its transmit spreading code generator to the pilot code. The SU 3116 also periodically checks to ensure it is synchronized. If synchronization is lost, the SU 3116 reacquires the pilot signal transmitted by the BS (step 3156).

When a communication link is desired, the SU 3116 starts transmitting a short code at the minimum power level $P_0$ (step 3158) and continuously increases the transmission power level while retransmitting the short code (step 3160) until it receives an acknowledgment from the BS 3114 that the short code has been detected by the BS 3114.

The access code in the preferred embodiment, as previously described herein, is approximately 30 million chips in length. However, the short code is much smaller. The short code can be chosen to be any length that is sufficiently short to permit quick detection. There is an advantage in choosing a short code length such that it divides the access code period evenly. For the access code described herein, the short code is preferably chosen to be 32, 64 or 128 chips in length. Alternatively, the short code may be as short as one symbol length, as will be described in detail hereinafter.

Since the start of the short code and the start of the access code are synchronized, once the BS 3114 acquires the short code, the BS 3114 knows that the corresponding phase of the access code is an integer multiple of N chips from the phase of the short code where N is the length of the short code. Accordingly, the BS 3114 does not have to search all possible phases corresponding to the maximum round trip propagation delay.

Using the short code, the correct phase for detection by the BS 3114 occurs much more frequently. When the minimum power level for reception has been achieved, the short code is quickly detected (step 3162) and the transmission power overshoot is limited. The transmission power ramp-up rate may be significantly increased without concern for a large power overshoot. In the preferred embodiment of the present invention, the power ramp-up rate using the short code is 1 dB per millisecond.

The BS 3114 subsequently transmits a short code detection indication signal (step 3164) to the SU 3116 which enters the second stage of the power ramp-up upon receiving this indication. In this stage, the SU 3116 ceases transmitting the short code (step 3166) and starts continuously transmitting a periodic access code (step 3166). The SU 3116 continues to ramp-up its transmission power while transmitting the access code, however the ramp-up rate is now much lower than the previous ramp-up rate used with the short code (step 3168). The ramp-up rate with the access code is preferably 0.05 dB per millisecond. The slow ramp-up avoids losing synchronization with the base station 3114 due to small changes in channel propagation characteristics.

At this point, the BS 3114 has detected the short code at the proper phase and power level (step 3162). The BS 3114 must now synchronize to the access code which is the same length as all other spreading codes and much longer than the short code. Utilizing the short code, the BS 3114 is able to detect the proper phase of the access code much more quickly. The BS 3114 begins searching for the proper phase of the access code (step 3170). However, since the start of the access code is synchronized with the start of the short code, the BS 3114 is only required to search every N chips; where N=the length of the short code. In summary, the BS 3114 quickly acquires the access code of the proper phase and power level by: 1) detecting the short code; and 2) determining the proper phase of the access code by searching every N chips of the access code from the beginning of the short code.

If the proper phase of the access code has not been detected after searching the number of phases in the maximum round trip delay the BS 3114 restarts the search for the access code by searching every chip instead of every N chips (step 3172). When the proper phase of the access code has been detected (step 3174) the BS 3114 transmits an access code detection acknowledgment (step 3176) to the SU 3116 which ceases the transmission power increase (step 3178) upon receiving this acknowledgment. With the power ramp-up completed, closed loop power control and call setup signaling is performed (step 3180) to establish the two-way communication link.

Figure 37:
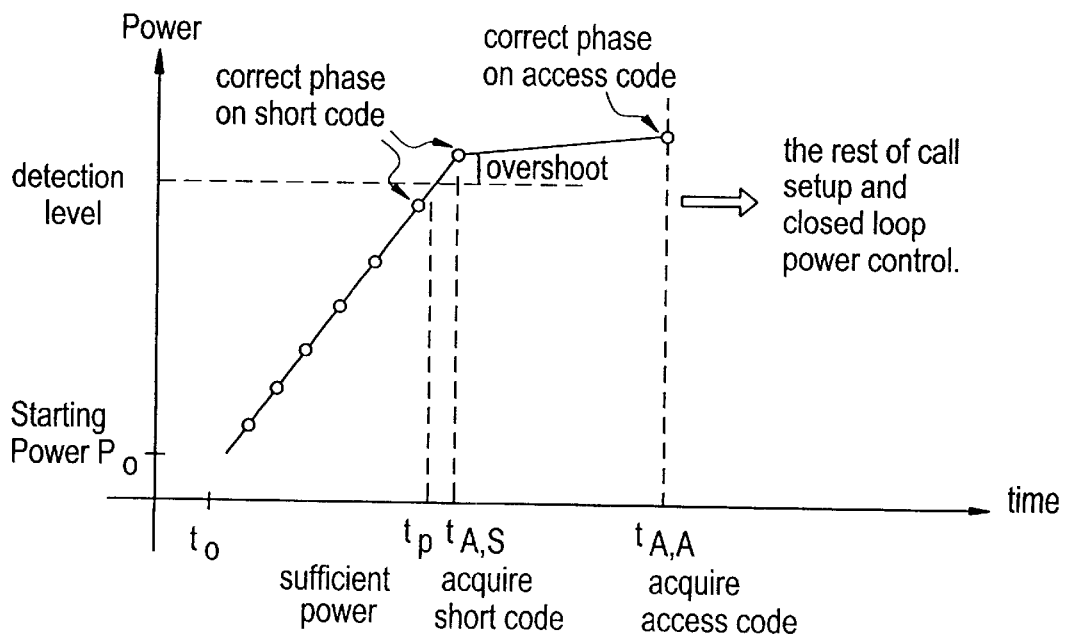
FIG. 37 is a graph of the transmission power output from a subscriber unit using short codes.

Referring to FIG. 37, although the starting power level $P_0$ is the same as in the prior embodiment, the SU 3116 may ramp-up the transmission power level at a much higher rate by using a short code. The short code is quickly detected after the transmission power level surpasses the minimum detection level, thus minimizing the amount of transmission power overshoot.

Figure 38:
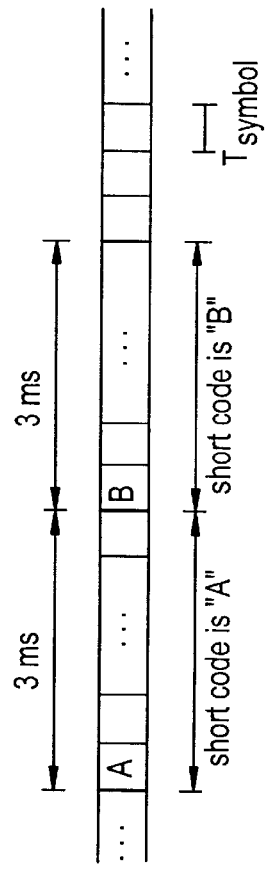
FIG. 38 shows the adaptive selection of short codes.

Although the same short code may be reused by the SU 3116, in the preferred embodiment of the present invention the short codes are dynamically selected and updated in accordance with the following procedure. Referring to FIG. 38, the period of the short code is equal to one symbol length and the start of each period is aligned with a symbol boundary. The short codes are generated from a regular length spreading code. A symbol length portion from the beginning of the spreading code is stored and used as the short code for the next 3 milliseconds. Every 3 milliseconds, a new symbol length portion of the spreading code replaces the old short code. Since the spreading code period is an integer multiple of 3 milliseconds, the same short codes are repeated once every period of the spreading code.

Figure 39:
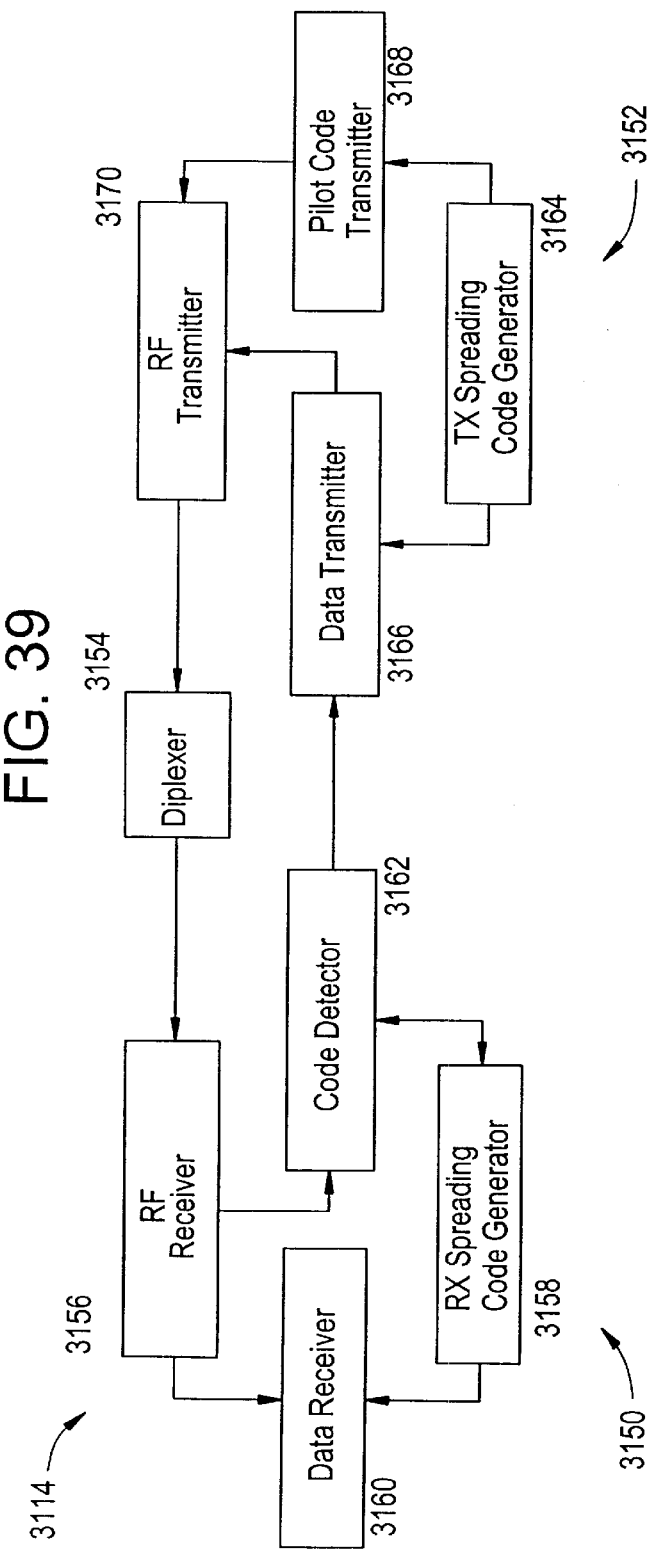
FIG. 39 is a block diagram of a base station in accordance with the present invention.

A block diagram of the BS 3114 is shown in FIG. 39. Briefly described, the BS 3114 comprises a receiver section 3150, a transmitter section 3152 and a diplexer 3154. An RF receiver 3156 receives and down-converts the RF signal received from the diplexer 3154. The receive spreading code generator 3158 outputs a spreading code to both the data receiver 3160 and the code detector 3162. In the data receiver 3160, the spreading code is correlated with the baseband signal to extract the data signal which is forwarded for further processing. The received baseband signal is also forwarded to the code detector 3162 which detects the access code or the short code from the SU 3116 and adjusts the timing of the spreading code generator 3158 to establish a communication channel 3118.

In the transmitter section 3152 of the BS 3114, the transmit spreading code generator 3164 outputs a spreading code to the data transmitter 3166 and the pilot code transmitter 3168. The pilot code transmitter 3168 continuously transmits the periodic pilot code. The data transmitter 3166 transmits the short code detect indication and access code detect acknowledgment after the code detector 3162 has detected the short code or the access code respectively. The data transmitter also sends other message and data signals. The signals from the data transmitter 3166 and the pilot code transmitter 3168 are combined and up-converted by the RF transmitter 3170 for transmission to the SUs 3116.

Figure 40:
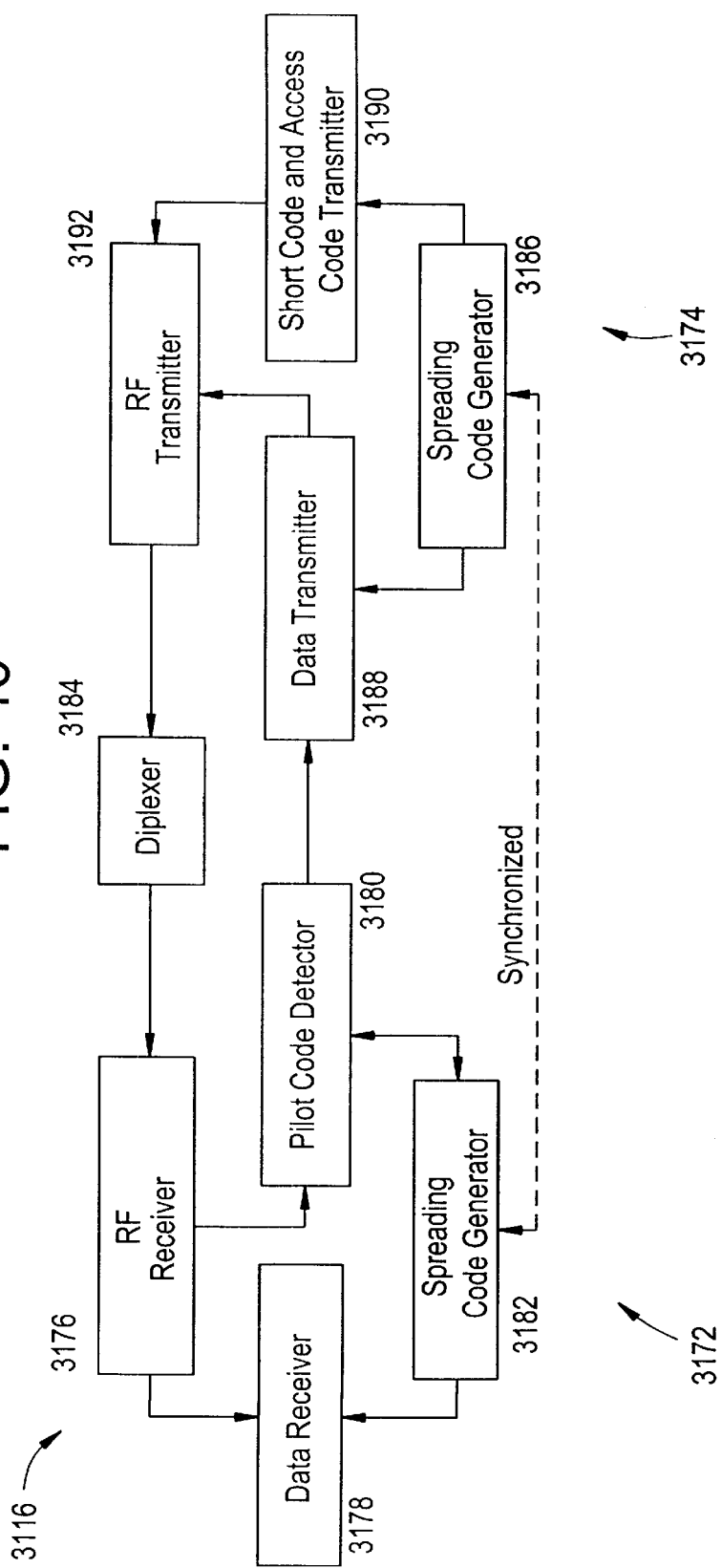
FIG. 40 is a block diagram of an exemplary subscriber unit in accordance with the present invention.

A block diagram of the SU 3116 is shown in FIG. 40. Briefly described, the SU 3116 comprises a receiver section 3172, a transmitter section 3174 and a diplexer 3184. An RF receiver 3176 receives and down-converts the RF signal received from the diplexer 3184. A pilot code detector 3180 correlates the spreading code with the baseband signal to acquire the pilot code transmitted by the BS 3114. In this manner, the pilot code detector 3180 maintains synchronization with the pilot code. The receiver spreading code generator 3182 generates and outputs a spreading code to the data receiver 3178 and the pilot code detector 3180. The data receiver 3178 correlates the spreading code with the baseband signal to process the short code detect indication and the access code detect acknowledgment transmitted by the BS 3114.

The transmitter section 3174 comprises a spreading code generator 3186 which generates and outputs spreading codes to a data transmitter 3188 and a short code and access code transmitter 3190. The short code and access code transmitter 3190 transmits these codes at different stages of the power ramp-up procedure as hereinbefore described. The signals output by the data transmitter 3188 and the short code and access code transmitter 3190 are combined and up-converted by the RF transmitter 3192 for transmission to the BS 3114. The timing of the receiver spreading codegenerator 3182 is adjusted by the pilot code detector 3180 through the acquisition process. The receiver and transmitter spreading code generators 3182, 3186 are also synchronized.

Figure 41A:
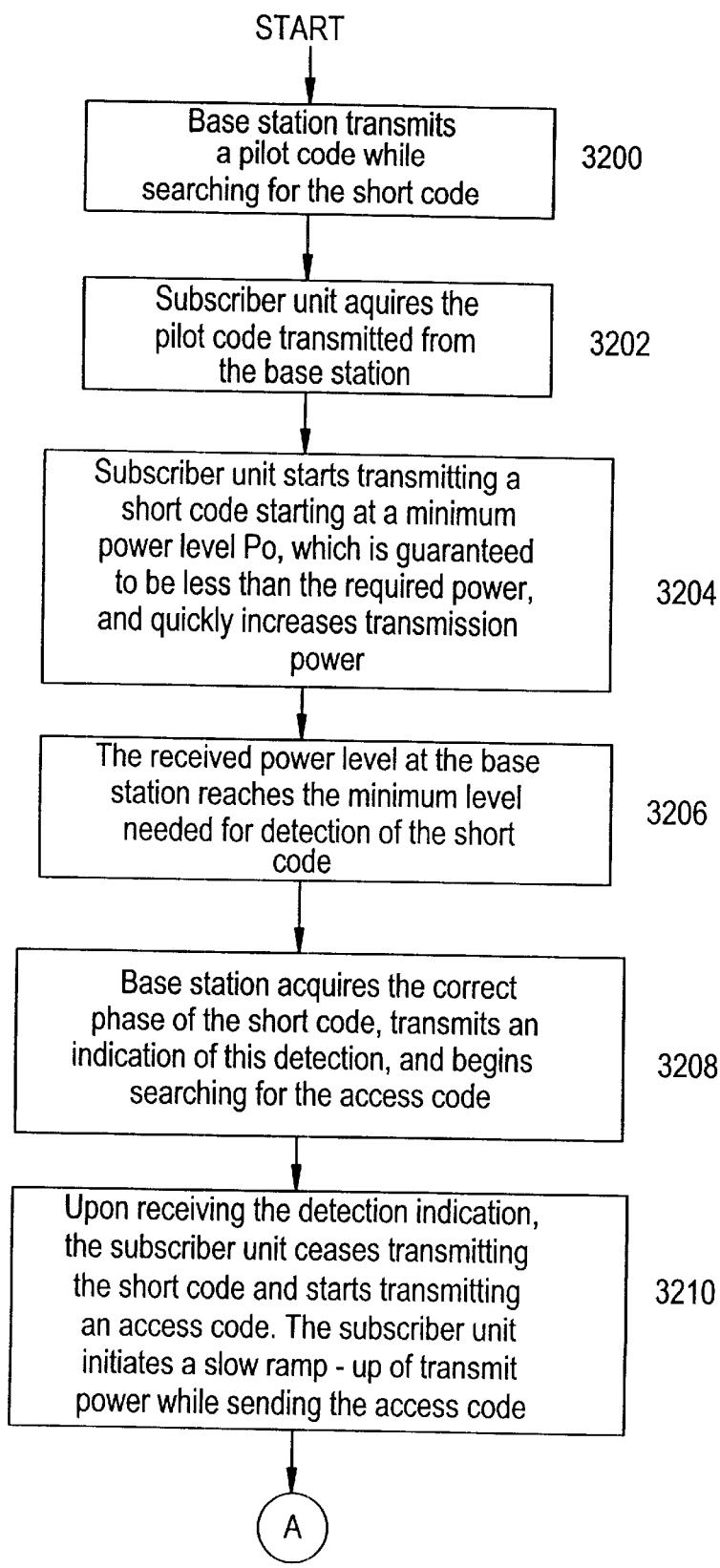
FIGS. 41A and 41B are flow diagrams of a ramp-up procedure implemented in accordance with the present invention.
Figure 41B:
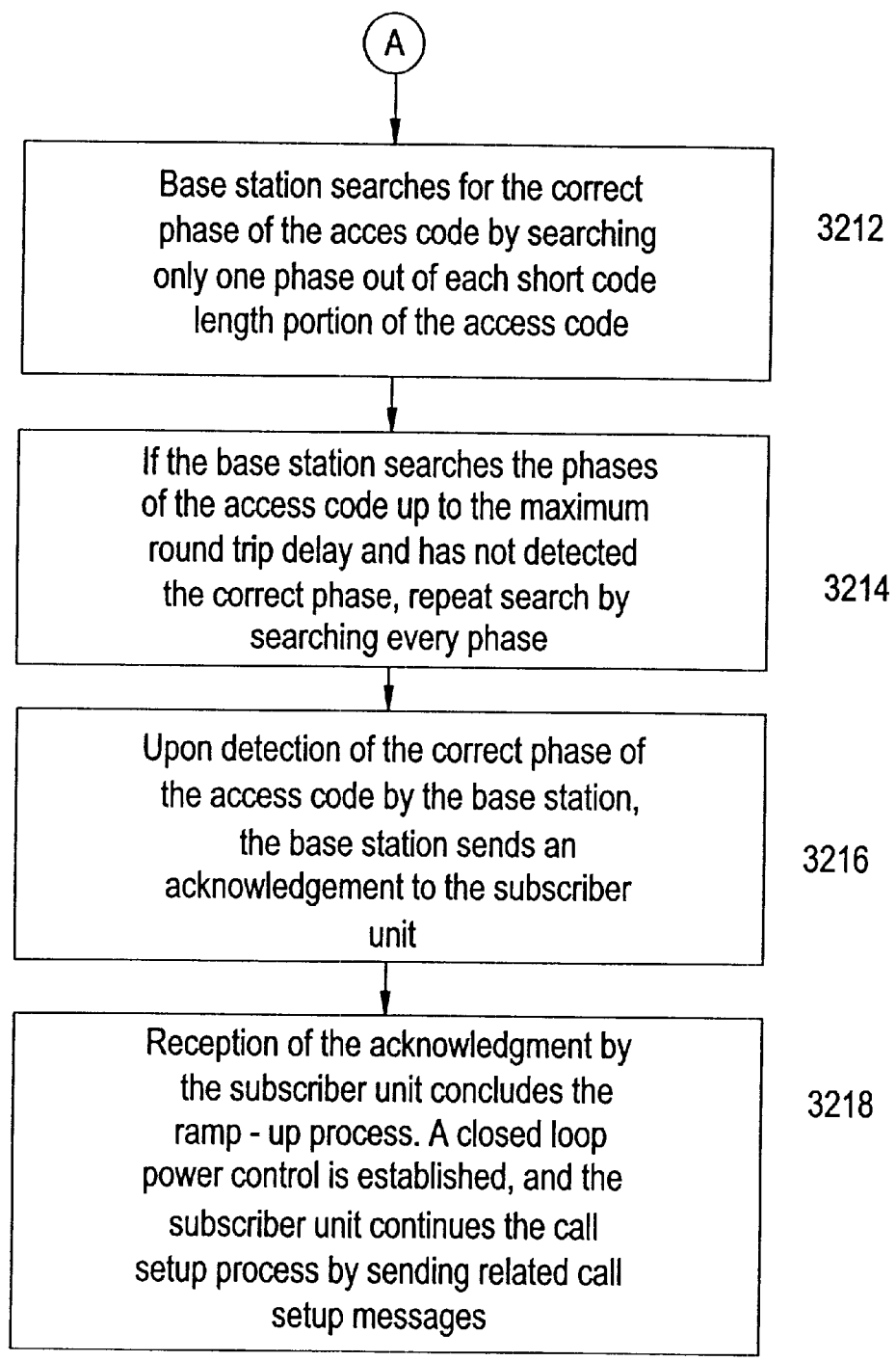

An overview of the ramp-up procedure in accordance with this embodiment of the invention is summarized in FIGS. 41A and 41B. The BS 3114 transmits a pilot code while searching for the short code (step 3200). The SU 3116 acquires the pilot code transmitted from the BS 3114 (step 3202), starts transmitting a short code starting at a minimum power level $P_0$ which is guaranteed to be less than the required power, and quickly increases transmission power (step 3204). Once the received power level at the BS 3114 reaches the minimum level needed for detection of the short code (step 3206) the BS 3114 acquires the correct phase of the short code, transmits an indication of this detection, and begins searching for the access code (step 3208). Upon receiving the detection indication, the SU 3116 ceases transmitting the short code and starts transmitting an access code. The SU 3116 initiates a slow ramp-up of transmit power while sending the access code (step 3210). The BS 3114 searches for the correct phase of the access code by searching only one phase out of each short code length portion of the access code (step 3212). If the BS 3114 searches the phases of the access code up to the maximum round trip delay and has not detected the correct phase, the search is repeated by searching every phase (step 3214). Upon detection of the correct phase of the access code by the BS 3114, the BS 3114 sends an acknowledgment to the SU 3116 (step 3216). Reception of the acknowledgment by the SU 3116 concludes the ramp-up process. A closed loop power control is established, and the SU 3116 continues the call setup process by sending related call setup messages (step 3218).

XXXXIII. Virtual Locating of a Fixed SU to Reduce Re-Acquisition Time

Figure 42:
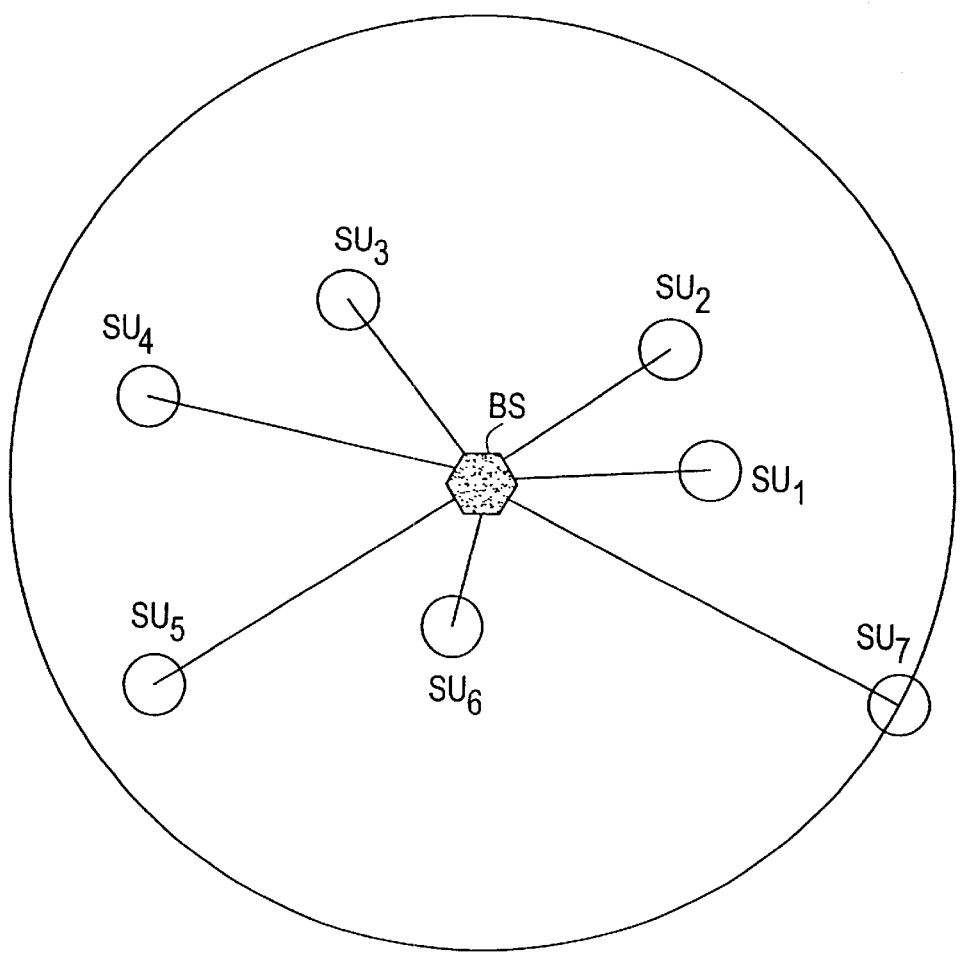
FIG. 42 is a prior art CDMA communication system.

A typical CDMA communication system is shown in FIG. 42. The system comprises a BS and a plurality of fixed subscriber units $SU_1$–$SU_7$ located at various distances from the BS. The BS constantly transmits a forward pilot signal. The SUs maintain epoch alignment between the forward pilot signal and their internal PN code generator such that all signals transmitted from an SU are at the same PN code phase at which the forward pilot is received. The BS receives signals from SUs with a code phase difference between its forward pilot signal and the received signal corresponding to the two-way signal propagation delay between the BS and the SU.

For the BS to detect a signal, it must align the phase of its receive PN code generator to the phase of the received signal, thus "acquiring" the signal. The BS can receive an access signal with any code phase difference within the range of the cell. Therefore, the BS must test all code phases associated with the range of possible propagation delays of the cell to acquire the access signal.

Once a communication channel is established between the BS and the SU, the transmission power of the SU is controlled by a closed loop APC algorithm which prevents the power from each SU from excessively interfering with other SUs. During channel establishment, before the closed loop power control begins, an SU's transmission power is kept to a minimum by ramping-up from a low level and establishing the channel without the SU significantly overshooting (on the order of less than 3 dB) the minimum power necessary to operate the channel.

To establish a channel, each SU transmits an access signal for detection by the BS. The BS acquires the access signal and transmits a confirmation signal to each SU. The time required for the BS to acquire the access signal contributes directly to the time elapsed between a SU going "off-hook", establishing a communication channel, connecting to the LE and receiving a dial tone. It is desirable to receive a dial tone within 150 msec of detection of "off-hook".

Figure 43:
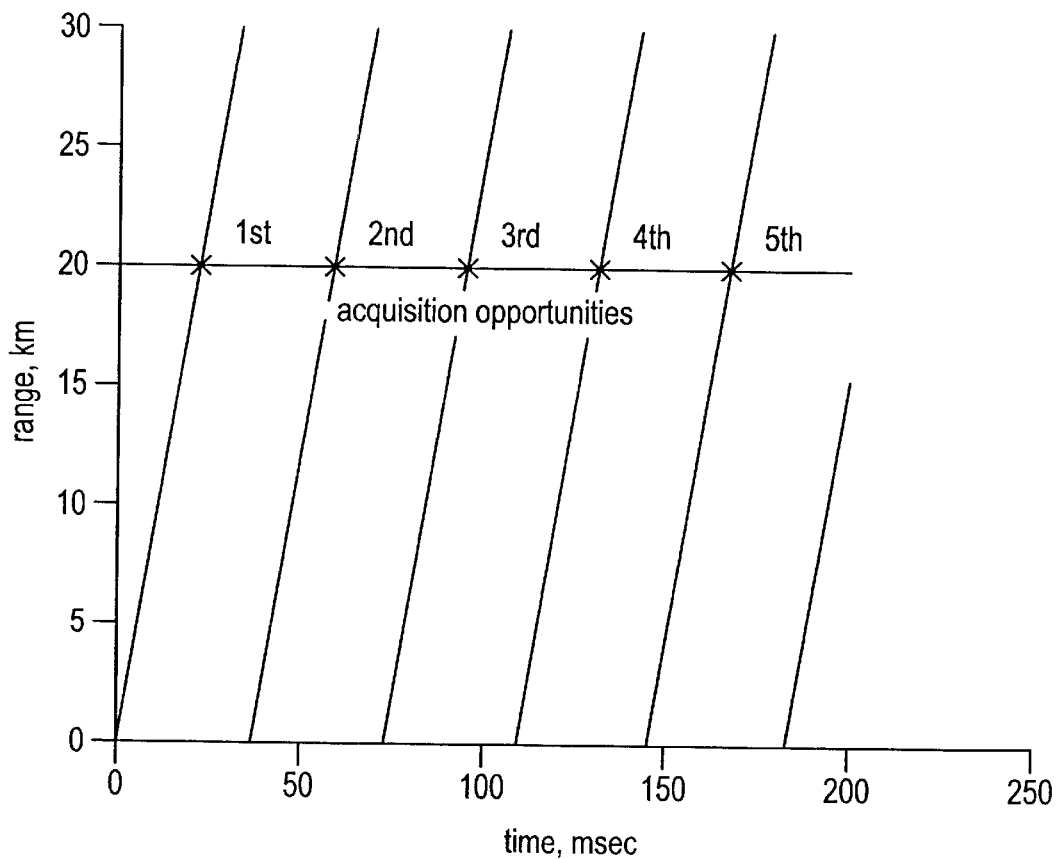
FIG. 43 is a graph of the distribution of acquisition opportunities of the system of FIG. 42.

The time distribution of acquisition opportunities is shown in FIG. 43 for a typical prior art SU located 20 km from a BS in a 30 km cell. For a BS which tests 8 code phases simultaneously at a PN rate of 12.48 MHz and a symbol rate of 64,000 symbols per second and takes an average of 7.5 symbol periods to accept or reject a particular group of code phases, the average time to test all code phase delays within the cell is approximately 37 msec, and any one SU can only be detected during an approximately 100 $\mu$sec window during that period. Assuming that the selection of initial SU transmission power level is 15–20 dB below the proper level and a slow ramp-up rate of between 0.05 and 0.1 dB/msec, it could take 4–5 such 37 msec time periods, (or an average of approximately 200 msec,) for the BS to acquire a SU. This introduces an unacceptable delay in the channel establishment process which should be less than 150 msec. Accordingly, there is a need to reduce the amount of time required for a BS to acquire an SU.

The present invention includes a method of reducing the re-acquisition time of a fixed SU by a BS in a CDMA communication system by utilizing virtual locating of the SU. A BS acquires SUs by searching only those code phases concomitant with the largest propagation delay possible in the cell, as if all SUs were located at the periphery of the cell. An SU which has never been acquired by the BS varies the delay between the PN code phase of its received and transmitted signals over the range of possible delays in a cell and slowly ramps-up its transmission power until it is acquired by the BS. Upon initial acquisition by the BS the SU ceases ramping-up its power and varying the delay and internally stores the final value of the delay in memory. For subsequent re-acquisition, the SU adds the delay value between the PN code phase of its received and transmitted signals, making the subscriber virtually appear to be at the periphery of the cell. This permits a quick ramp-up of transmission power by the SU and reduced acquisition time by the BS.

Figure 44:
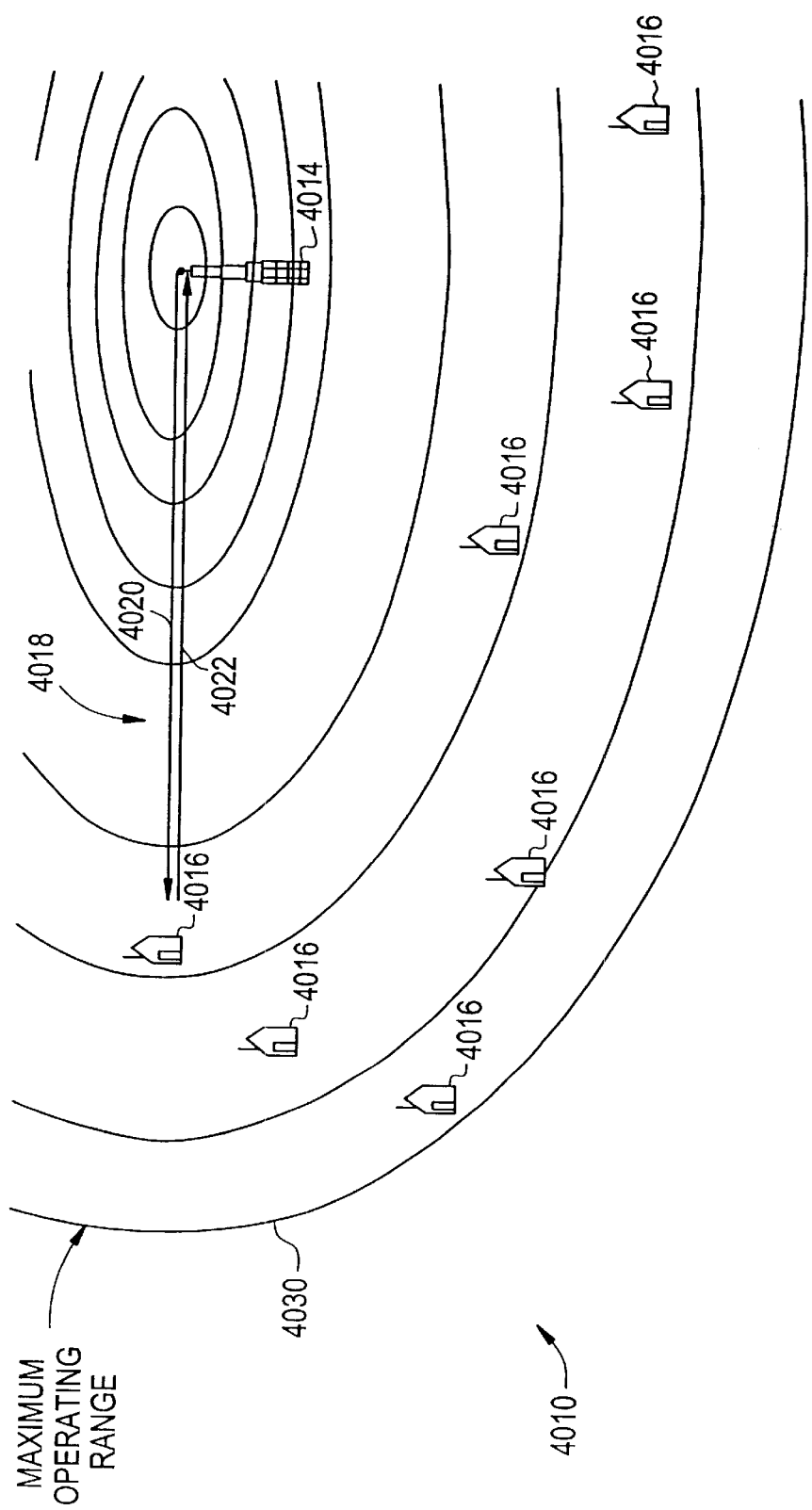
FIG. 44 is a diagram showing the propagation of signals between a base station and a plurality of subscriber units.

Referring to FIG. 44, the propagation of certain signals in the establishment of a communication channel 4018 between a BS 4014 and a plurality of SUs 4016 is shown. The forward pilot signal 4020 is transmitted from the BS 4014 at time t0, and is received by a SU 4016 after a propagation delay Δt. To be acquired by the BS 4014 the SU 4016 transmits an access signal 4022 which is received by the BS 4014 after a further propagation delay of Δt. Accordingly, the round trip propagation delay is 2Δt. The access signal 4022 is transmitted epoch aligned to the forward pilot signal 4020, which means that the code phase of the access signal 4022 when transmitted is identical to the code phase of the received forward pilot signal 4020.

The round trip propagation delay depends upon the location of an SU 4016 with respect to the BS 4014. Communication signals transmitted between a SU 4016 located closer to the BS 4014 will experience a shorter propagation delay than an SU 4016 located further from the BS 4014. Since the BS 4014 must be able to acquire SUs 4016 located at any position within the cell 4030, the BS 4014 must search all code phases of the access signal corresponding to the entire range of propagation delays of the cell 4030.

It should be apparent to those of skill in the art that the establishment of a communication channel between a BS 4014 and an SU 4016 is a complex procedure involving many tasks performed by the BS 4014 and the SU 4016 which are outside the scope of the present invention. The present invention is directed to decreasing the reacquisition time of a fixed SU 4016 by a BS 4014 during the re-establishment of a communication channel.

Figure 45:
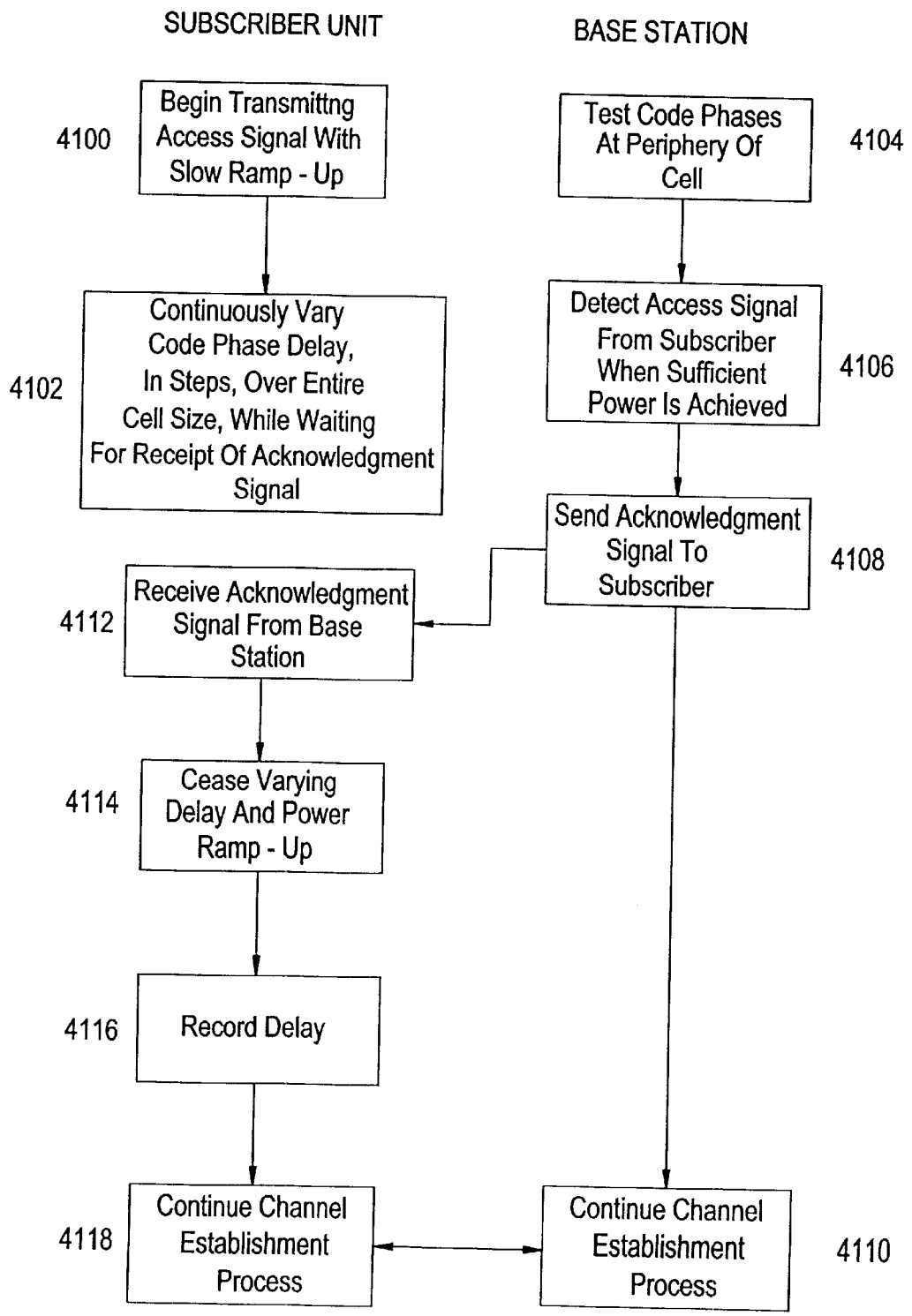
FIG. 45 is a flow diagram of an exemplary embodiment of the initial establishment of a communication channel between a base station and a subscriber unit using slow initial acquisition.

Referring to FIG. 45, the tasks associated with initial acquisition of an SU 4016 by a BS 4014 in accordance with the preferred embodiment of the present invention are shown. When an SU 4016 desires the establishment of a channel 4018 with a BS 4014 with which it has never established a channel, the SU 4016 has no knowledge of the two-way propagation delay. Accordingly, the SU 4016 enters the initial acquisition channel establishment process.

The SU 4016 selects a low initial power level and zero code phase delay, (epoch aligning the code phase of the transmitted access signal 4022 to the code phase of the received forward pilot signal 4020), and commences transmitting the access signal 4022 while slowly (0.05–0.1 dB/msec) ramping-up transmission power (step 4100). While the SU 4016 is awaiting receipt of the acknowledgement signal from the BS 4014, it varies the code phase delay in predetermined steps from zero to the delay corresponding to the periphery of the cell 4030, (the maximum code phase delay), allowing sufficient time between steps for the BS 4014 to detect the access signal 4022 (step 4102). If the SU 4016 reaches the code phase delay corresponding to the periphery of the cell 4030, it repeats the process of varying the code phase delay while continuing the slow power ramp-up (step 4102).

In order to acquire SUs 4016 desiring access, the BS 4014 continuously transmits a forward pilot signal 4020 and attempts to detect the access signals 4022 from SUs 4016 (step 4104). Rather than test for access signals 4022 at all code phase delays within the cell 4030 as with current systems, the BS 4014 need only test code phase delays centered about the periphery of the cell 4030.

The BS 4014 detects the access signal 4022 (step 4106) when the SU 4016 begins transmitting with sufficient power at the code phase delay which makes the SU 4016 appear to be at the periphery of the cell 4030, thereby "virtually" locating the SU 4016 at the periphery of the cell 4030. The BS 4014 then transmits an acknowledgement to the SU 4016 which confirms that the access signal 4022 has been received (step 4108) and continues with the channel establishment process (step 4110).

Once the SU 4016 receives the acknowledgement signal (step 4112), it ceases the ramp-up of transmission power, ceases varying the code phase delay (step 4114) and records the value of the code phase delay for subsequent re-acquisitions (step 4116). The SU 4016 then continues the channel establishment process including closed-loop power transmission control (step 4118).

Figure 46:
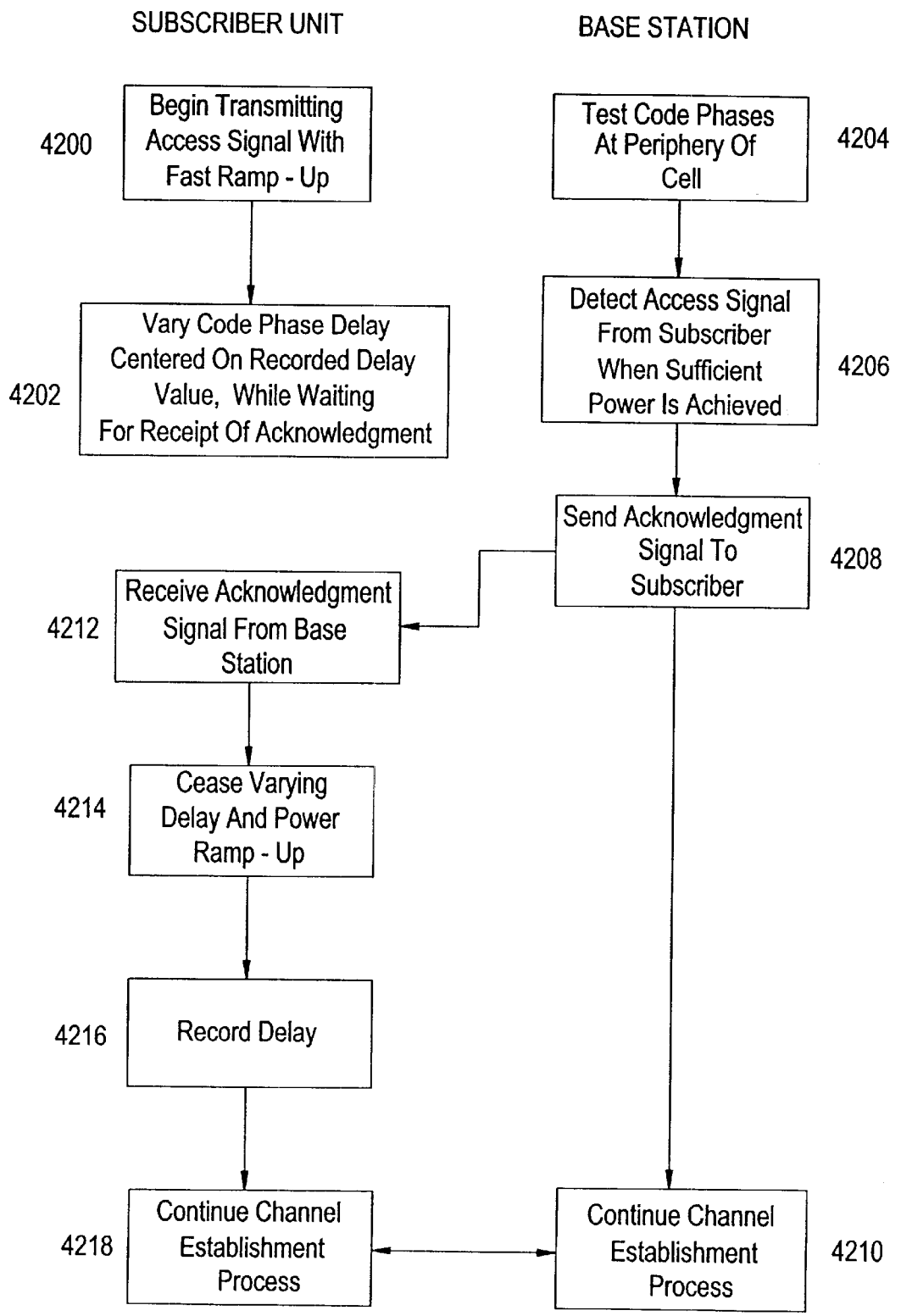
FIG. 46 is a flow diagram of an exemplary embodiment of the reestablishment of a communication channel between a base station and a subscriber unit using fast re-acquisition.

On subsequent re-acquisitions when an SU 4016 desires the establishment of a channel 4018 with a BS 4014, the SU 4016 enters the re-acquisition channel establishment process shown in FIG. 46. The SU 4016 selects a low initial power level and the code phase delay recorded during the initial acquisition process, (shown in FIG. 45), and commences continuously transmitting the access signal 4022 while quickly (1 dB/msec) ramping-up transmission power (step 4200). While the SU 4016 is awaiting receipt of the acknowledgement signal from the BS 4014, it slightly varies the code phase delay of the access signal 4022 about the recorded code phase delay, allowing sufficient time for the BS 4014 to detect the access signal 4022 before changing the delay (step 4202). The BS 4014 as in FIG. 45, transmits a forward pilot signal 4020 and tests only the code phase delays at the periphery of the cell 4030 in attempting to acquire the SUs 4016 within its operating range (step 4204). The BS 4014 detects the access signal 4022 when the SU 4016 transmits with sufficient power at the code phase delay which makes the SU 4016 appear to be at the periphery of the cell 4030 (step 4206). The BS 4014 transmits an acknowledgement to the SU 4016 which confirms that the access signal 4022 has been received (step 4208) and continues with the channel establishment process (step 4210).

When the SU 4016 receives the acknowledgement signal (step 4212) it ceases power ramp-up, ceases varying the code phase delay (step 4214) and records the present value of the code phase delay for subsequent re-acquisitions (step 4216). This code phase delay may be slightly different from the code phase delay initially used when starting the reacquisitions process (step 4202). The SU 4016 then continues the channel establishment process at the present power level (step 4218). If an SU 4016 has not received an acknowledgement signal from the BS 4014 after a predetermined time, the SU 4016 reverts to the initial acquisition process described in FIG. 45.

Figure 47:
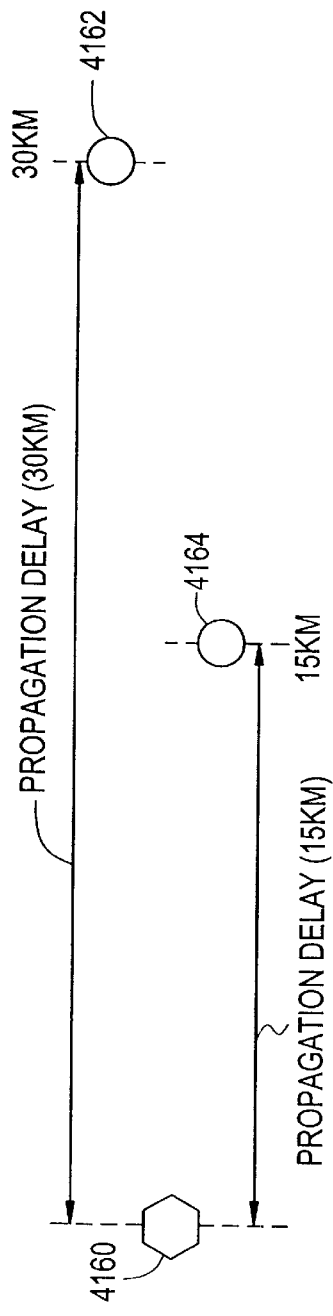
FIG. 47 is a diagram of the communications between a base station and a plurality of subscriber units.

The effect of introducing a code phase delay in the Tx 4020 and Rx 4022 communications between the BS 4014 and an SU 4016 will be explained with reference to FIGS. 47 and 48. Referring to FIG. 47A, a BS 4160 communicates with two SUs 4162, 4164. The first SU 4162 is located 30 km from the BS 4160 at the maximum operating range. The second SU 4164 is located 15 km from the BS 4160. The propagation delay of Tx and Rx communications between the first SU 4162 and the BS 4160 will be twice that of communications between the second SU 4164 and the BS 4160.

Figure 48:
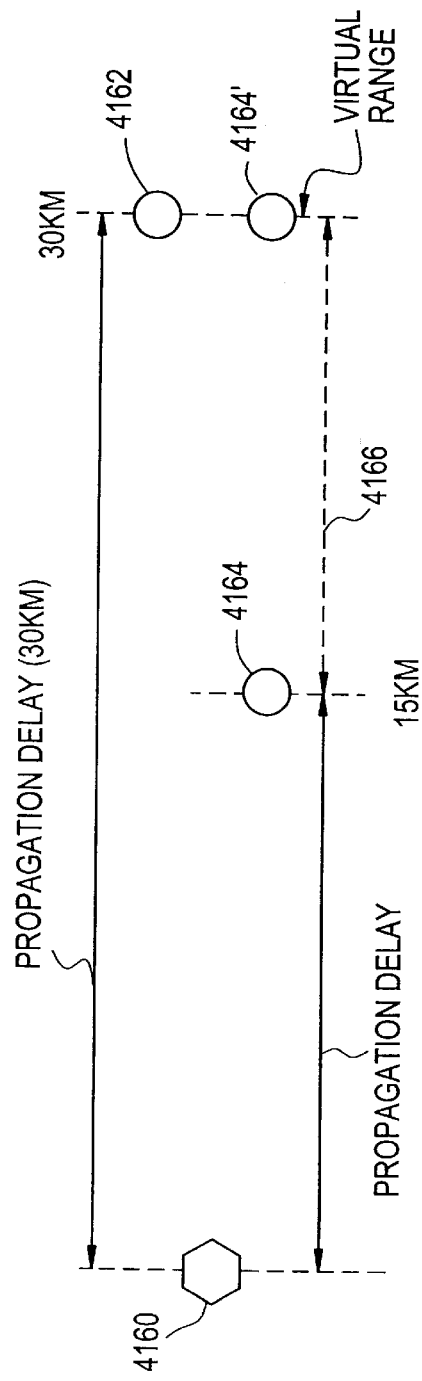
FIG. 48 is a diagram of the base station and a subscriber unit which has been virtually located.

Referring to FIG. 48, after an added delay value 4166 is introduced into the Tx PN generator of the second SU 4164 the propagation delay of communications between the first SU 4162 and the BS 4160 will be the same as the propagation delay of communications between the second SU 4164 and the BS 4160. Viewed from the BS 4160, it appears as though the second SU 4164 is located at the virtual range 4164'.

Figure 49:
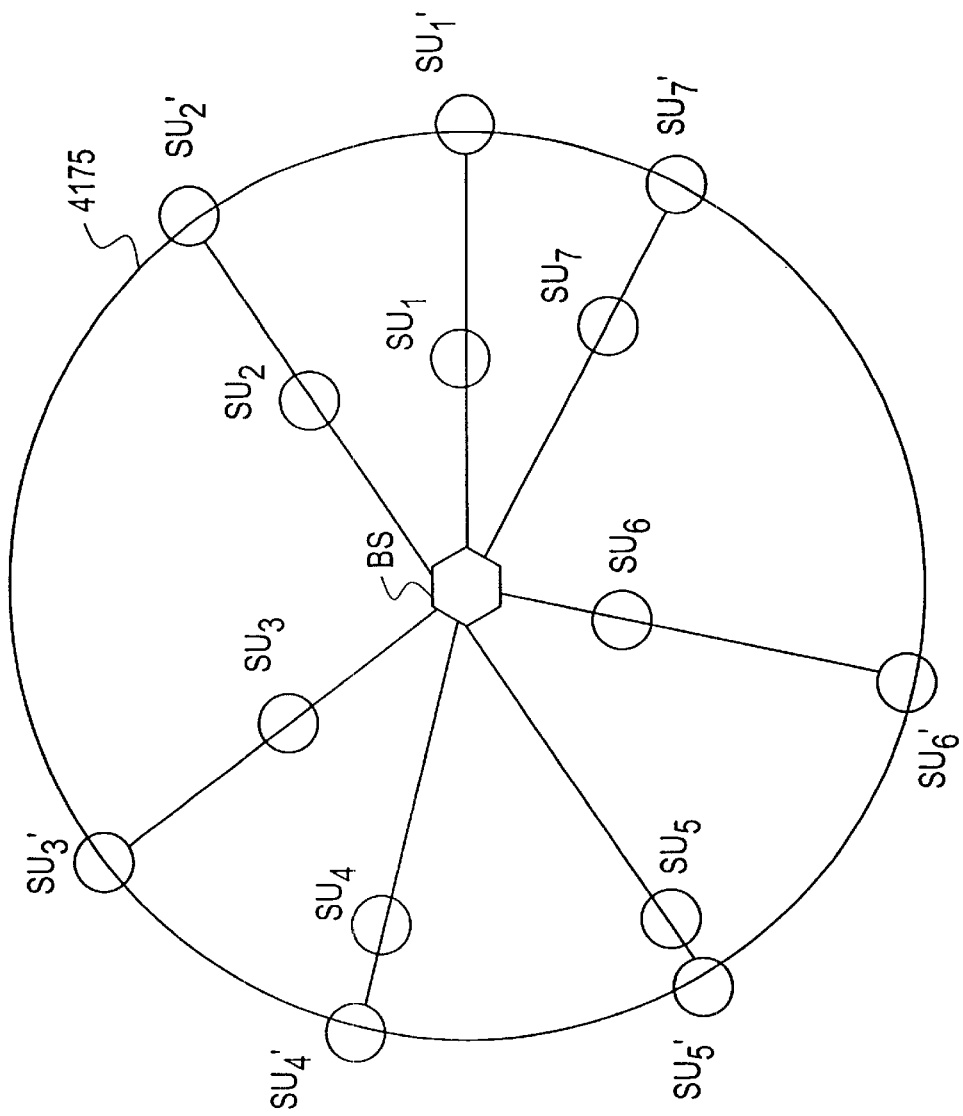
FIG. 49 is a schematic overview of a plurality of subscriber units which have been virtually located.

Referring to FIG. 49, it can be seen that when a plurality of SUs $SU_1$–$SU_7$ are virtually relocated $SU_1$–$SU_7$ to the virtual range 4175, the BS must only test the code phase delays centered about the virtual range 4175.

Utilizing the present invention, an SU 4016 which has achieved a sufficient power level will be acquired by the BS 4014 in approximately 2 msec. Due to the shorter acquisition time, the SU 4016 can ramp-up at a much faster rate, (on the order of 1 dB/msec), without significantly overshooting the desired power level. Assuming the same 20 dB power back-off, it would take the SU 4016 approximately 20 msec to reach the sufficient power level for detection by the BS 4014. Accordingly, the entire duration of the re-acquisition process of the present invention is approximately 22 msec, which is an order of magnitude reduction from prior art reacquisition methods.

Figure 50:
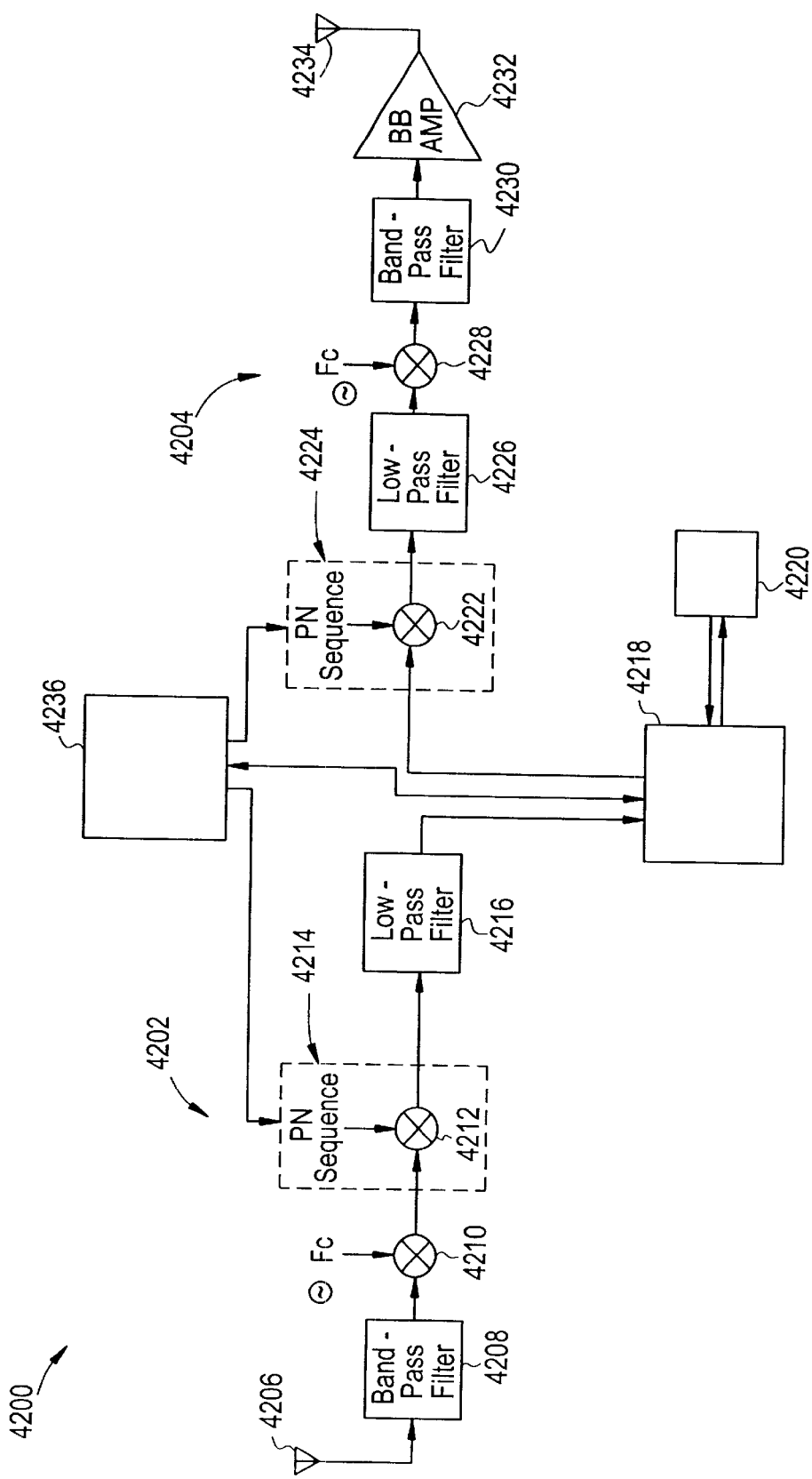
FIG. 50 is a subscriber unit made in accordance with one embodiment of the present invention.

An SU 4200 made in accordance with one embodiment of the present invention is shown in FIG. 50. The SU 4200 includes a receiver section 4202 and a transmitter section 4204. An antenna 4206 receives a signal from the BS 4014, which is filtered by a band-pass filter 4208 having a bandwidth equal to twice the chip rate and a center frequency equal to the center frequency of the spread spectrum system's bandwidth. The output of the filter 4208 is down-converted by a mixer 4210 to a baseband signal using a constant frequency (Fc) local oscillator. The output of the mixer 4210 is then spread spectrum decoded by applying a PN sequence to a mixer 4212 within the PN Rx generator 4214. The output of the mixer 4212 is applied to a low pass filter 4216 having a cutoff frequency at the data rate (Fb) of the PCM data sequence. The output of the filter 4216 is input to a codec 4218 which interfaces with the communicating entity 4220.

A baseband signal from the communicating entity 4220 is pulse code modulated by the codec 4218. Preferably, a 32 kilobit per second adaptive pulse code modulation (ADPCM) is used. The PCM signal is applied to a mixer 4222 within a PN Tx generator 4224. The mixer 4222 multiplies the PCM data signal with the PN sequence. The output of the mixer 4222 is applied to low-pass filter 4226 whose cutoff frequency is equal to the system chip rate. The output of the filter 4226 is then applied to a mixer 4228 and suitably up-converted, as determined by the carrier frequency Fc applied to the other terminal. The up-converted signal is then passed through a band-pass filter 4230 and to a broadband RF amplifier 4232 which drives an antenna 4234.

The microprocessor 4236 controls the acquisition process as well as the Rx and Tx PN generators 4214, 4224. The microprocessor 4236 controls the code phase delay added to the Rx and Tx PN generators 4214,4224 to acquire the forward pilot signal 4020, and for the SU 4200 to be acquired by the BS 4014, and records the code phase difference between these PN generators. For re-acquisition the microprocessor 4236 adds the recorded delay to the Tx PN generator 4224.

The BS 4014 uses a configuration similar to the SU 4016 to detect PN coded signals from the SU 4200. The microprocessor (not shown) in the BS 4014 controls the Rx PN generator in a similar manner to make the code phase difference between Rx PN generator and the Tx PN generator equivalent to the two-way propagation delay of the SU's 4016 virtual location. Once the BS 4014 acquires the access signal 4022 from the SU 4016, all other signals from the SU 4016 to the BS 4014 (traffic, pilot, etc.) use the same code phase delay determined during the acquisition process.

It should be noted that although the invention has been described herein as the virtual locating of SUs 4016 at the periphery of the cell 4030 the virtual location can be at any fixed distance from the BS 4014.

Figure 51:
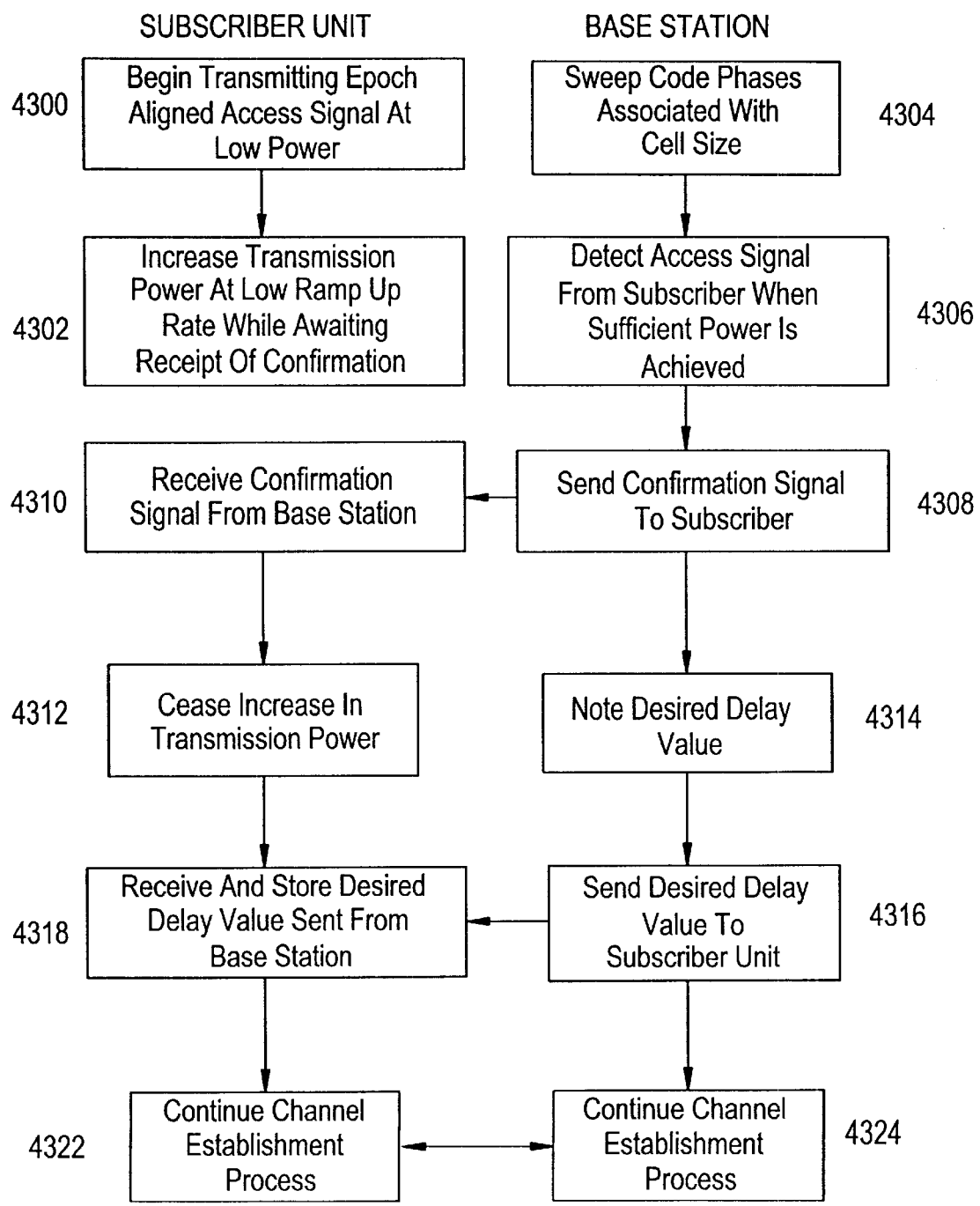
FIG. 51 is a flow diagram of an alternative embodiment of the initial establishment of a communication channel between a base station and a subscriber unit using slow initial acquisition.

Referring to FIG. 51, the tasks associated with initial acquisition of a "never-acquired" SU 4016 by a BS 4014 in accordance with an alternative embodiment of the present invention are shown. The SU 4016 continuously transmits an epoch aligned access signal 4022 to the BS 4014 (step 4300) when the establishment of a channel 4018 is desired. While the SU 4016 is awaiting the receipt of a confirmation signal from the BS 4014, it continuously increases the transmission power as it continues transmission of the access signal 4022 (step 4302).

To detect SUs which have never been acquired, the B S 4014 transmits a forward pilot signal 4020 and sweeps the cell by searching all code phases corresponding to the entire range of propagation delays of the cell (step 4304) and detects the epoch aligned access signal 4022 sent from the SU 4016 after the transmission has achieved sufficient power for detection (step 4306). The BS 4014 transmits an acknowledgement to the SU 4016 (step 4308) which confirms that the access signal 4022 has been received. The SU 4016 receives the acknowledgment signal (step 4310) and ceases the increase in transmission power (step 4312).

The BS 4014 determines the desired code phase delay of the SU 4016 by noting the difference between the Tx and Rx PN generators 4224, 4214 after acquiring the SU 4016. The desired code phase delay value is sent to the SU 4016 (step 4316) as an OA&M message, which receives and stores the value (step 4318) for use during re-acquisition, and continues with the channel establishment process (steps 4322 and 4324).

Figure 52:
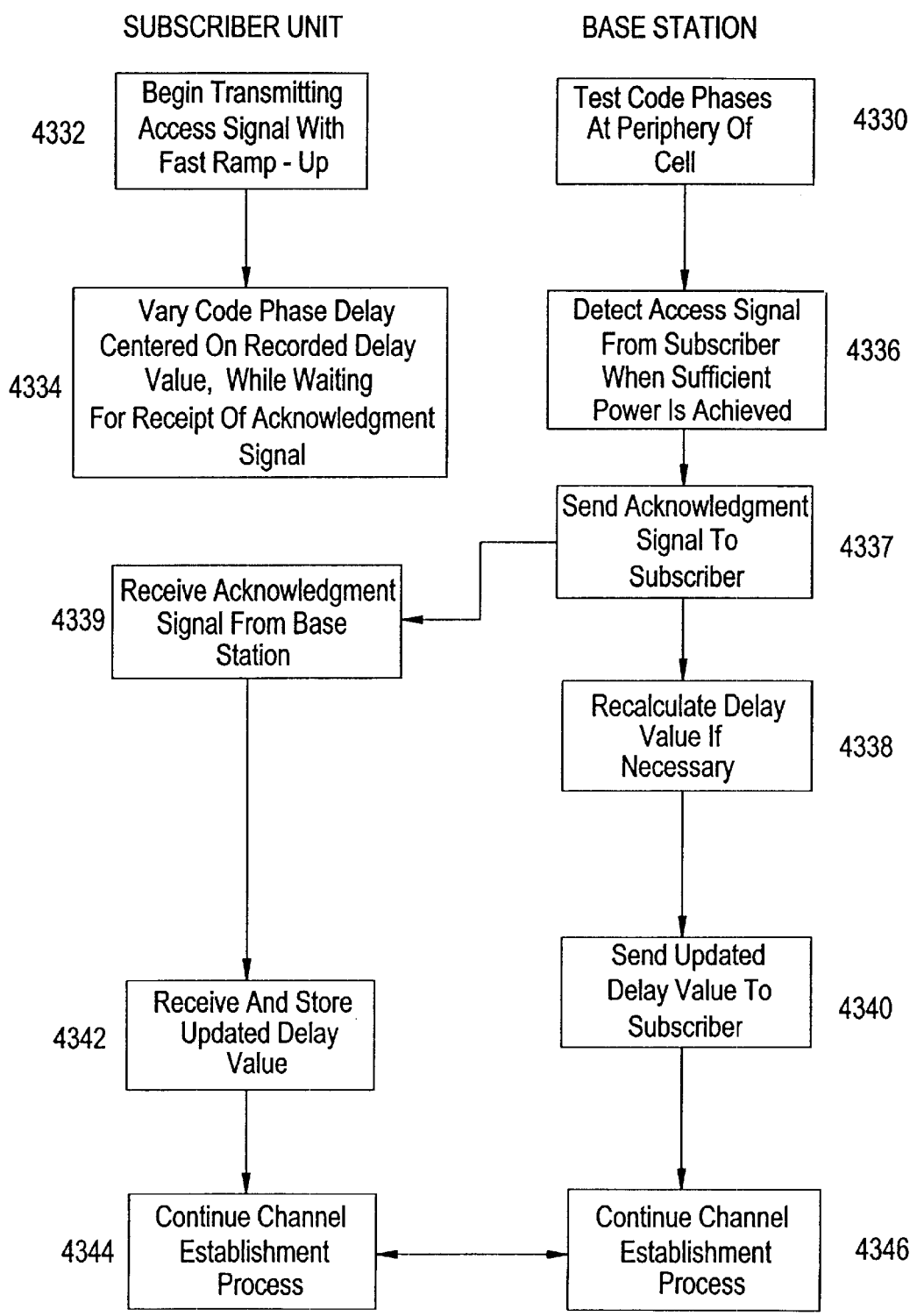
FIG. 52 is a flow diagram of an alternative embodiment of the reestablishment of a communication channel between a base station and a subscriber unit using fast re-acquisition.

Referring to FIG. 52, an alternative method of fast reacquisition in accordance with the present invention is shown. When a communication channel must be reestablished between the SU 4016 and the BS 4014, the SU 4016 transmits the access signal 4022 with the desired code phase delay as in the preferred embodiment.

With all of the previously acquired SUs 4016 at the same virtual range, the BS 4014 need only search the code phase delays centered about the periphery of the cell to acquire the access signals 4022 of such SUs 4016 (step 4330). Thus, an SU 4016 may ramp-up power rapidly to exploit the more frequent acquisition opportunities. The SU 4016 implements the delay the same way as in the preferred embodiment. The BS 4014 subsequently detects the SU 4016 at the periphery of the cell (step 4336), sends an acknowledgment signal to the SU (step 4337) and recalculates the desired code phase delay value, if necessary. Recalculation (step 4338) compensates for propagation path changes, oscillator drift and other communication variables. The BS 4014 sends the updated desired code phase delay value to the SU 4016 (step 4340) which receives and stores the updated value (step 4342). The SU 4016 and the BS 4014 then continue the channel establishment process communications (steps 4344 and 4346).

Note that this embodiment requires the BS to search both the code phase delays centered on the periphery of the cell to re-acquire previously acquired SUs and the code phase delays for the entire cell to acquired SUs which have never been acquired.

Figure 53:
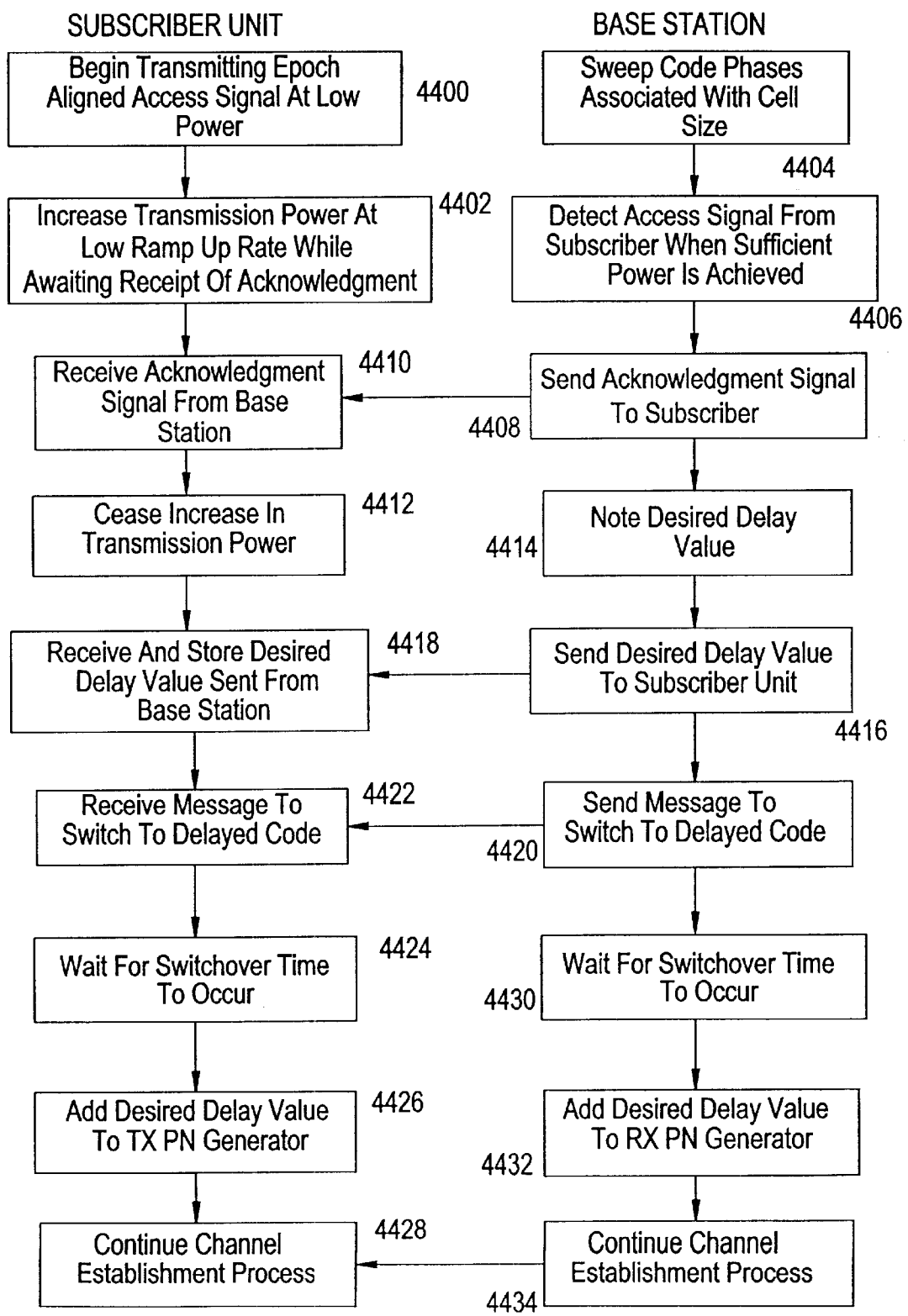
FIG. 53 is a flow diagram of an alternative embodiment of the initial establishment of a communication channel between a base station and a subscriber unit using slow initial acquisition.

Referring to FIG. 53, the tasks associated with initial acquisition of a never-acquired SU 4016 by a BS 4014 in accordance with a second alternative embodiment of the present invention are shown. In the embodiment shown in FIG. 51, when a never-acquired SU 4016 is acquired, the access signal 4020 remains epoch aligned to the forward pilot signal 4020. In this embodiment, the BS 4014 and SU 4016 change the code phase alignment of the access signal 4022 from epoch aligned to delayed, (by the code phase delay), to make the SU 4016 appear at the periphery of the cell. This change is performed at a designated time.

Steps 4400 through 4418 are the same as the corresponding steps 4300 through 4318 shown in FIG. 51. However, after the BS 4014 sends the desired delay value to the SU 4016 (step 4416) the BS 4014 sends a message to the SU 4016 to switch to the desired delay value at a time referenced to a sub-epoch of the forward pilot signal 4020 (step 4420). The SU 4016 receives this message (step 4422), and both units 4014, 4016 wait until the switchover time is reached (steps 4424, 4430). At that time, the BS 4014 adds the desired delay value to its Rx PN operator (step 4432) and the SU 4016 adds the same desired delay value to its Tx PN generator (step 4426). The SU 4016 and the BS 4014 then continue the channel establishment process communication (step 4428, 4434).

Figure 54:
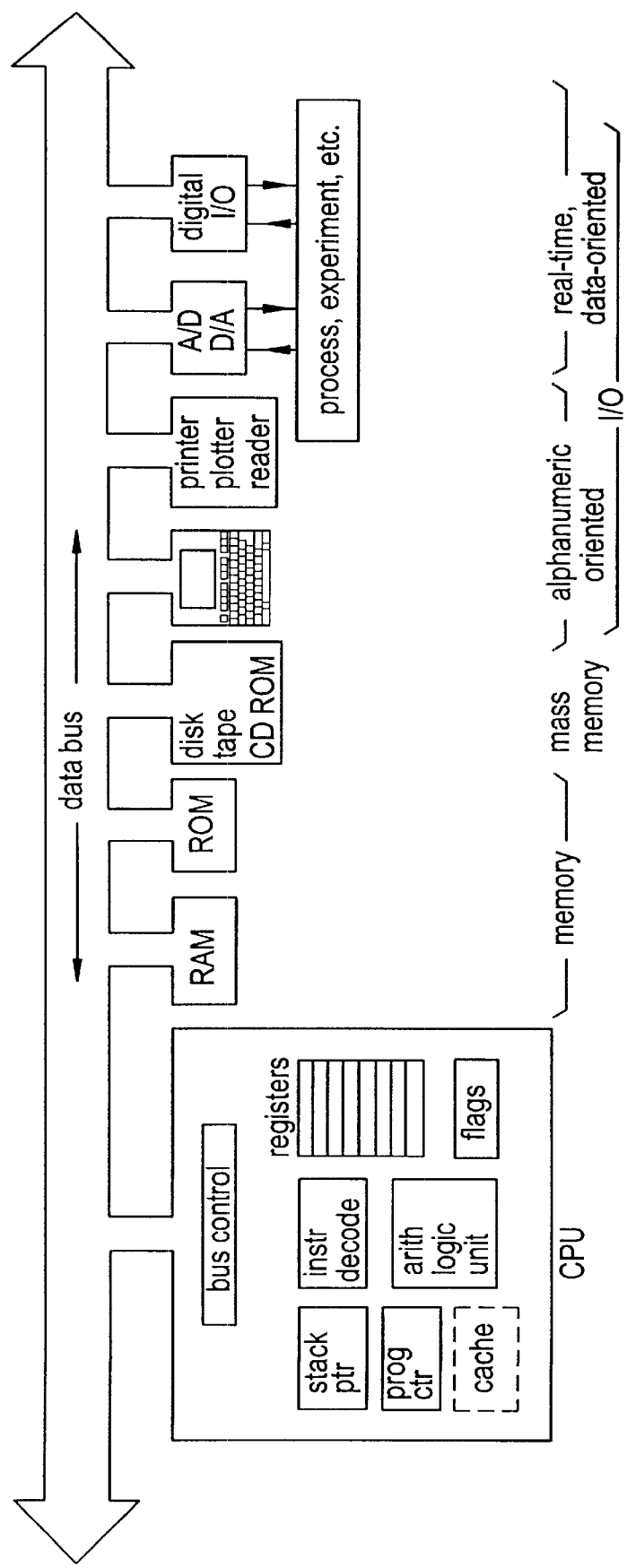
FIG. 54 is a block diagram of a prior art data communication bus.

XXXXIV. Parallel Packetized Intermodule Arbitrated High Speed Control And Data Bus For communication within a digital device, such as between a CPU (central processing unit), memory, peripherals, I/O (input/output) devices, or other data processors, a communication bus may be employed. As shown in FIG. 54, a communication bus is a set of shared electrical conductors for the exchange of digital words. In this manner, communication between devices is simplified, thereby obviating separate interconnections.

A communication bus typically contains a set of data lines, address lines for determining which device should transmit or receive, and control and strobe lines that specify the type of command is executing. The address and strobe lines communicate one-way from the CPU. Typically, all data lines are bidirectional. Data lines are asserted by the CPU during the write instruction, and by the peripheral device during read. Both the CPU and peripheral device use three-state drivers for the data lines.

In a computer system where several data processing devices exchange data on a shared data bus, the two normal states of high and low voltage (representing the binary 1's and 0's) may be implemented by an active voltage pullup. However, when several processing modules are exchanging data on a data bus, a third output state, open circuit, must be added so that another device located on the bus can drive the same line.

Three-state or open-collector drivers are used so that devices connected to the bus can disable their bus drivers, since only one device is asserting data onto the bus at a given time. Each bus system has a defined protocol for determining which device asserts data. A bus system is designed so that, at most, one device has its drivers enabled at one time with all other devices disabled (third state). A device knows to assert data onto the bus by recognizing its own address on the control lines. The device looks at the control lines and asserts data when it sees its particular address on the address lines and a read pulse. However, there must be some external logic ensuring that the three-state devices sharing the same lines do not talk at the same time or bus contention will result.

Bus control logic or a "bus master" executes code for the protocol used to arbitrate control of the bus. The bus master may be part of a CPU or function independently. More importantly, control of the bus may be granted to another device. More complex bus systems permit other devices located on the bus to master the bus.

Data processing systems have processors which execute programmed instructions stored in a plurality of memory locations. As shown in FIG. 54, the processed data is transferred in and out of the system onto the bus, by using I/O devices interconnecting with other digital devices. A bus protocol, or handshaking rules delineate a predetermined series of steps to permit data exchange between the devices.

To move data on a shared bus, the data, recipient and moment of transmission must be specified. Therefore, data, address and a strobe line must be specified. There are as many data lines as there are bits in a word to enable a whole word to be transferred simultaneously. Data transfer is synchronized by pulses on additional strobe bus lines. The number of address lines determines the number of addressable devices.

Communication buses are either synchronous or asynchronous. In a synchronous bus, data is asserted onto or retrieved from the bus synchronously with strobing signals generated by the CPU or elsewhere in the system. However, the device sending the data does not know if the data was received. In an asynchronous bus, although handshaking between communicating devices assures the sending device that the data was received, the hardware and signaling complexity is increased.

In most high-speed, computationally intensive multichannel data processing applications, digital data must be moved very rapidly to or from another processing device. The transfer of data is performed between memory and a peripheral device via the bus without program intervention. This is also known as direct memory access (DMA). In DMA transfers, the device requests access to the bus via special bus request lines and the bus master arbitrates how the data is moved, (either in bytes, blocks or packets), prior to releasing the bus to the CPU.

A number of different types of bus communication systems and protocols are currently in use today to perform data transfer. As shown in the table of FIG. 55, various methods have been devised to manipulate data between processing devices. Data communication buses having powerful synchronous/high-level data link control SDLC/HDLC protocols exist, along with standardized parallel transmission such as small computer system interface (SCSI) and carrier-sense multiple-access/collision-detection (CSMA/CD) (Ethernet) networks. However, in specialized, high-speed applications, a simplified data communication bus is desired.

The present invention includes a parallel packetized intermodule arbitrated high speed control data bus system which allows high speed communications between microprocessor modules in a more complex digital processing environment. The system features a simplified hardware architecture featuring fast first-in/first-out (FIFO) queuing operating at 12.5 MHz, TTL CMOS compatible level clocking signals, single bus master arbitration, synchronous clocking, DMA, and unique module addressing for multiprocessor systems. The present invention includes a parallel data bus with sharing bus masters residing on each processing module decreeing the communication and data transfer protocols.

The high-speed intermodule communication bus (HSB) is used for communication between various microprocessor modules. The data bus is synchronous and completely bidirectional. Each processing module that communicates on the bus will have the described bus control architecture. The HSB comprises eight shared parallel data lines for the exchange of digital data and two additional lines for arbitration and clock signals. No explicit bus request or grant signals are required. The HSB can also be configured as a semi-redundant system, duplicating data lines while maintaining a single component level. The bus is driven by three-state gates with resistor pullups serving as terminators to minimize signal reflections.

To move data on the HSB, each processing module must specify the data, the recipient, and the moment when the data is valid. Only one message source, known as the bus master, is allowed to drive the bus at any given time. Since the data flow is bidirectional, the bus arbitration scheme establishes a protocol of rules to prevent collisions on the data lines when a given processing module microprocessor is executing instructions. The arbitration method depends on the detection of collisions present only on the arbitration bus and uses state machines on each data processing module to determine bus status. Additionally, the arbitration method is not daisy chained, allowing greater system flexibility.

The state machines located on each processing module are the controlling interface between the microprocessor used within a given processing module and the HSB. The circuitry required for the interface is comprised of a transmit FIFO, receive FIFO, miscellaneous directional/bidirectional signal buffers and the software code for the state machines executed in an erasable programmable logic device (EPLD).

Figure 56:
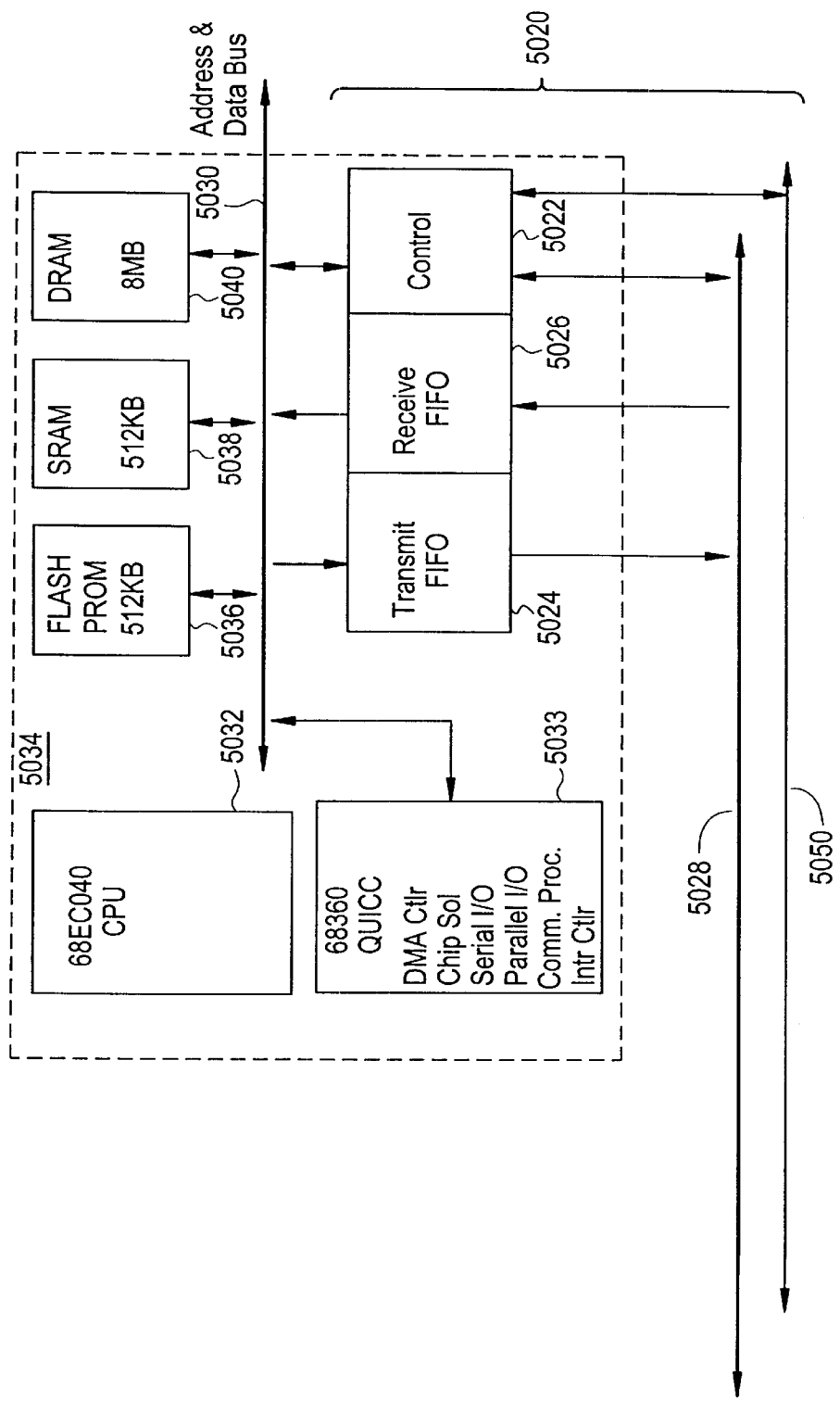
FIG. 56 is a simplified block diagram of an embodiment of the present invention.
Figure 57A:
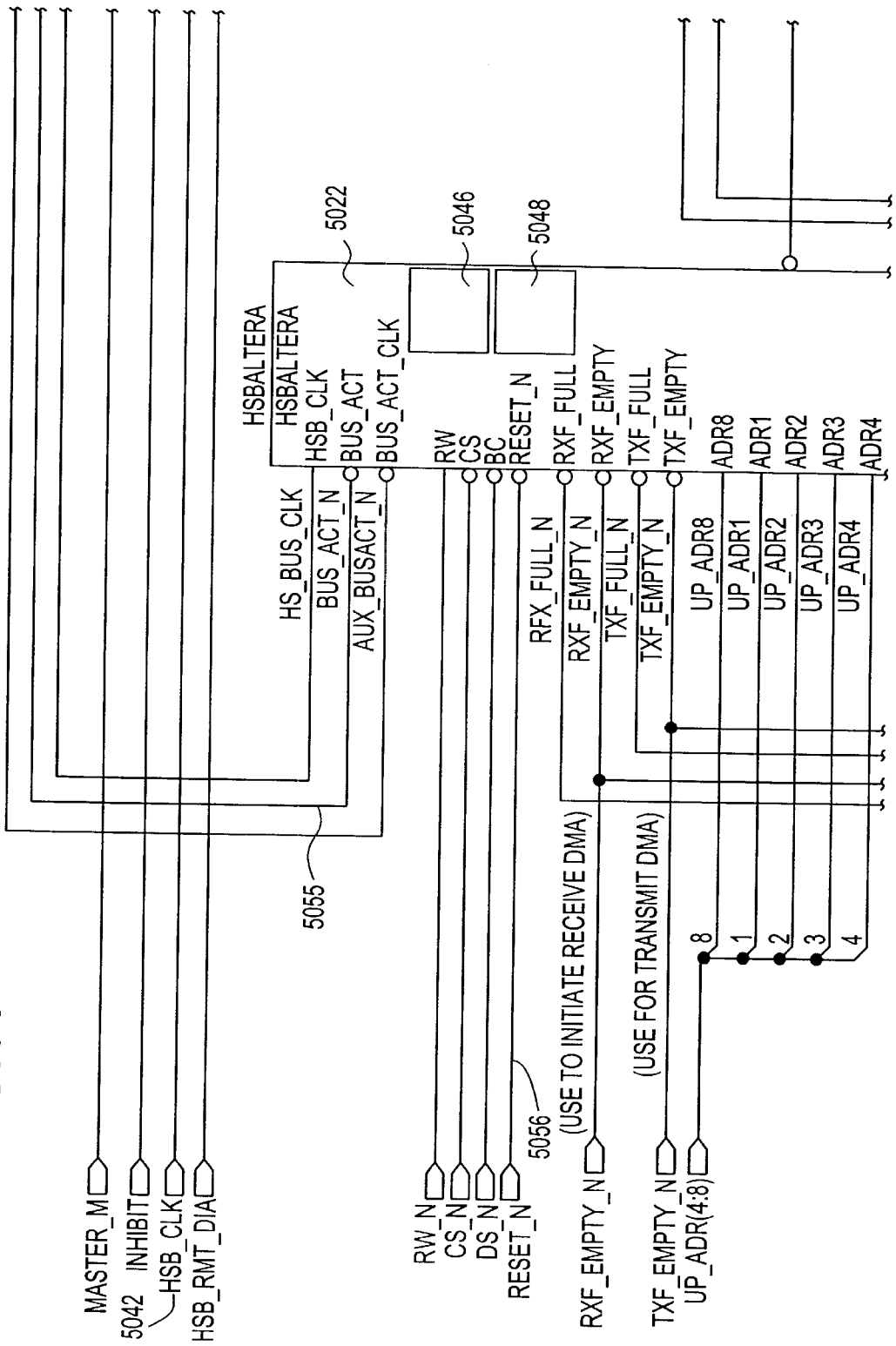
FIG. 57A–E is an electrical schematic of an embodiment of the present invention.
Figure 57B:
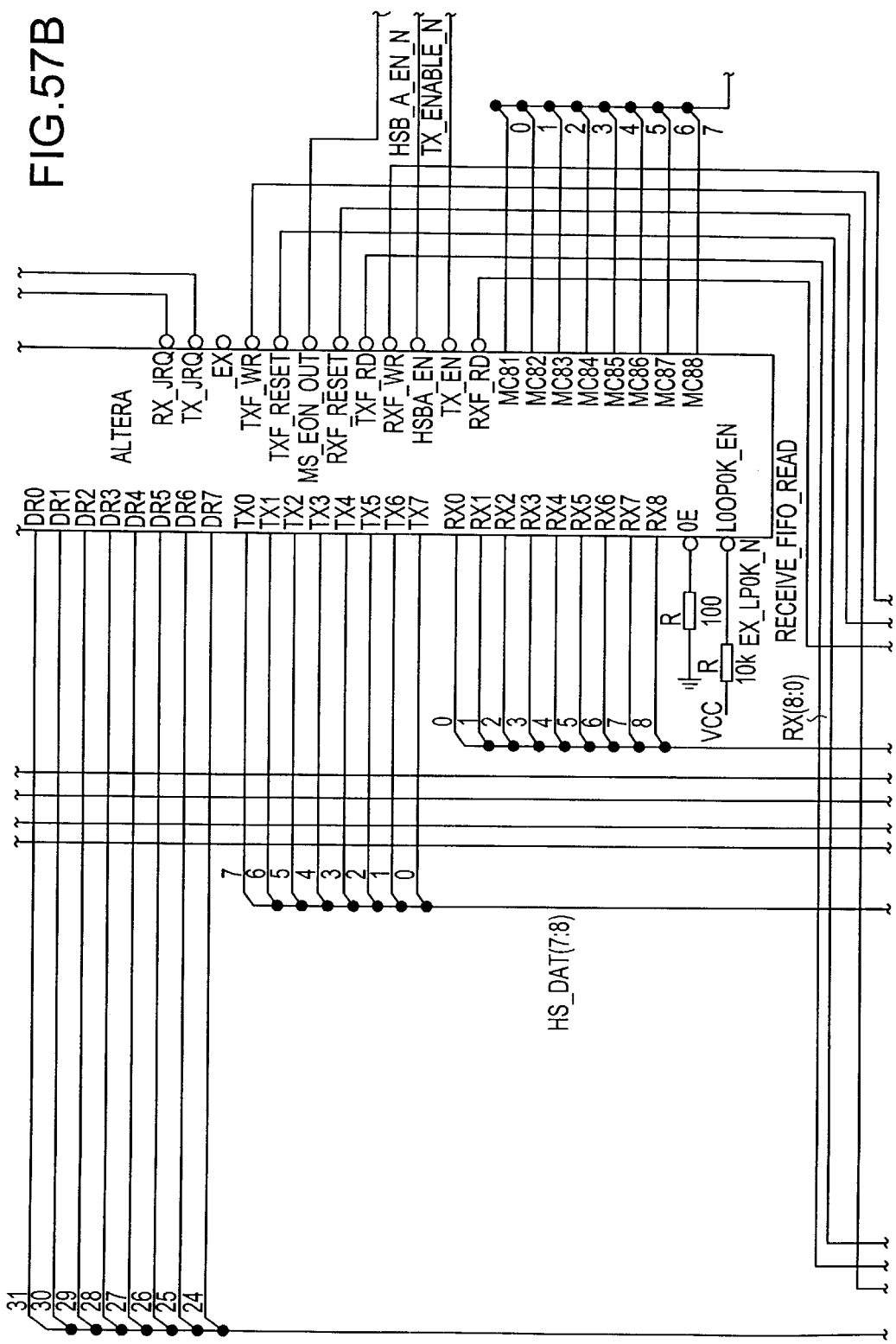
Figure 57C:
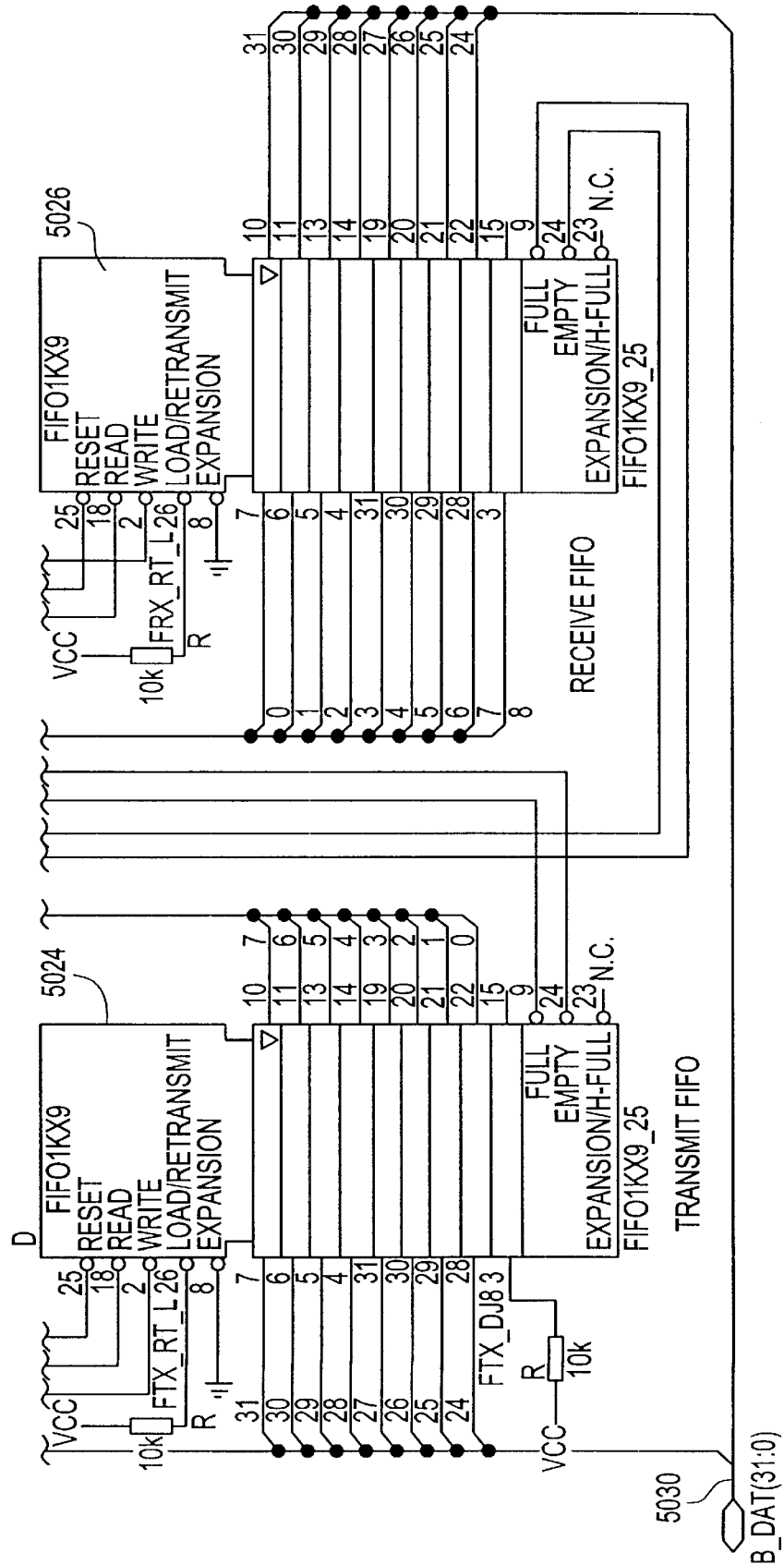
Figure 57D:
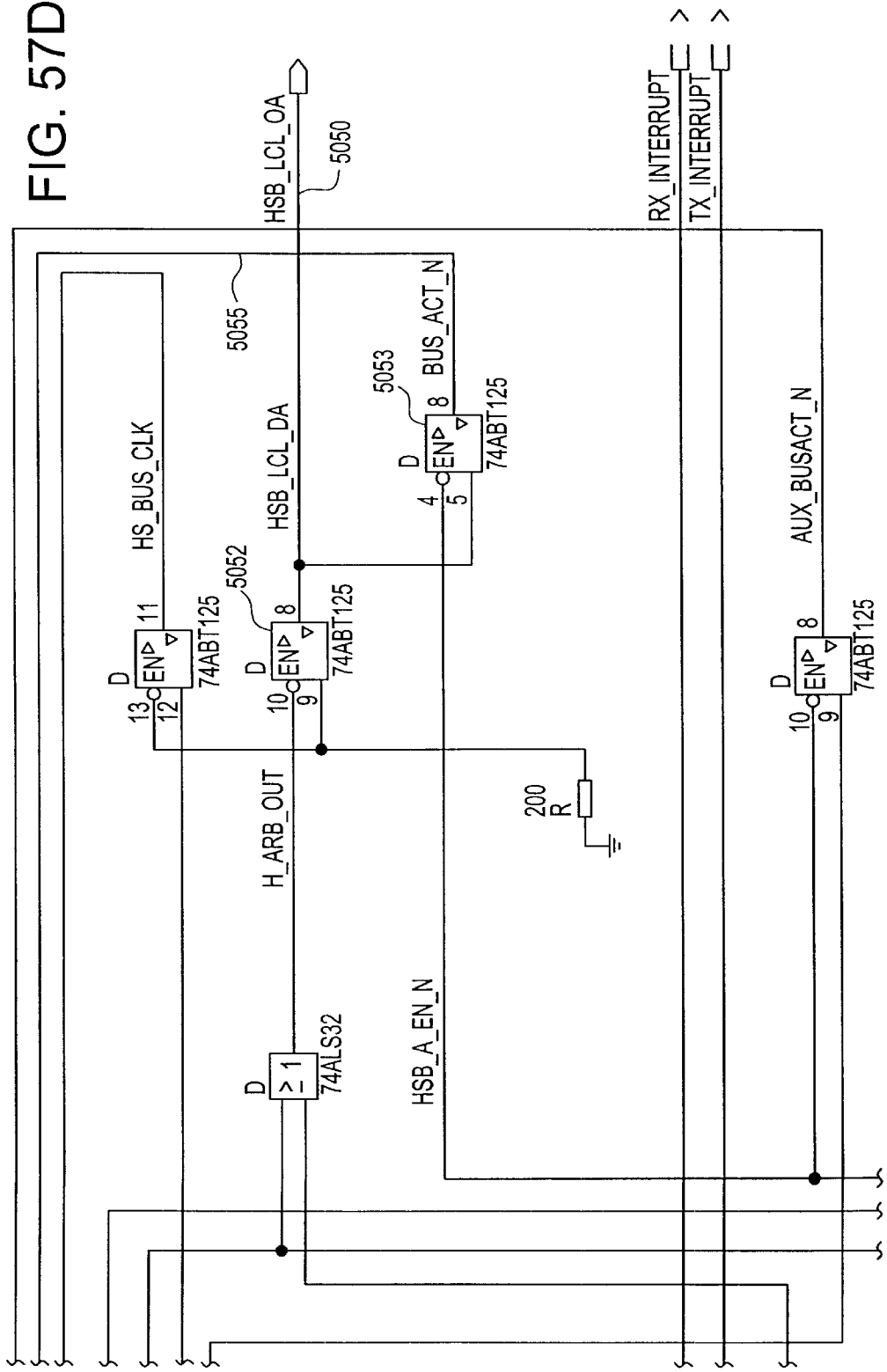
Figure 57E:
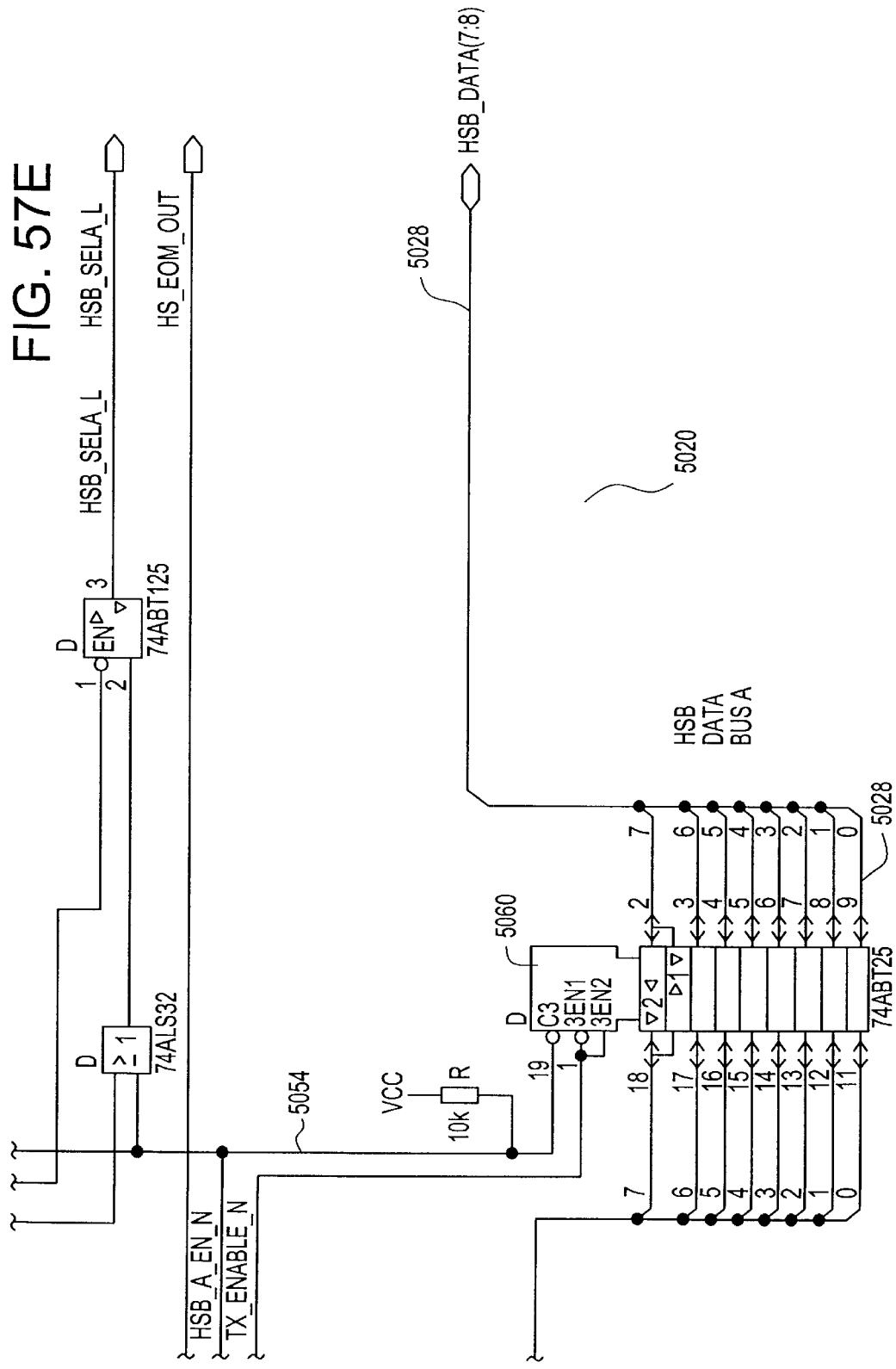

The HSB 5020 of the present invention is shown in simplified form in FIG. 56. The preferred embodiment comprises a bus controller 5022, a transmit FIFO 5024, a receive FIFO 5026, an eight bit parallel data bus 5028 and a serial arbitration bus 5050. The ends of the bus 5028 are terminated with a plurality of resistive dividers to minimize signal reflections. An internal 8 bit address and data bus 5030 couples the transmit 5024 and receive 5026 FIFOs and bus controller 5022 to a CPU 5032 and DMA controller 5033 located on a given processor module 5034. The internal address and data bus 5030 also permits communication between the CPU 5032 and bus controller 5022 and various memory elements such as PROM 5036, SRAM 5038, and DRAM 5040 required to support the applications of the data processing module 5034.

The HSB 5020 is a packetized message transfer bus system. Various processor modules 5034 can communicate data, control and status messages via the present invention.

The HSB 5020 provides high speed service for a plurality of processor modules 5034 with minimum delay. The message transfer time between modules is kept short along with the overhead of accessing the data bus 5028 and queuing each message. These requirements are achieved by using a moderately high clock rate and a parallel data bus 5028 architecture. Transmit 5024 and receive 5026 FIFOs are used to simplify and speed up the interface between a processor module 5034 CPU 5032 and the data bus 5028.

Referring to FIGS. 57A–D, a common clock signal (HSB_CLK) 5042 comprising a TTL compatible CMOS level signal with a frequency nominally 12.5 MHz and a duty cycle of approximately 50% synchronizes all HSB 5020 components and executions. The clock 5042 pulse may originate in any part of the complete digital system and its origination is beyond the scope of this disclosure.

The parallel data bus 5028 (HSB_DAT) lines 0–7, provides 8 bidirectional TTL compatible CMOS level signals. Only one message source, the bus controller or master 5022, is allowed to drive the bus 5028 at any one time; A bus arbitration scheme determines which out of a plurality of processing module may become bus master and when.

The relationship of the data 5028 and control signal transitions to the clock 5042 edges are important to recovering the data reliably at a receiving module. Data is clocked out from a transmitting module 5034 onto the data bus 5028 with the negative or trailing edge of the clock signal 5042. The data is then clocked on the positive or leading edge of the clock signal 5042 at an addressed receiving module. This feature provides a sufficient setup and hold time of approximately 40 ns without violating the minimum setup time for octal register 5060.

Before data can be transmitted on the data bus 5028, the bus controller 5022 must obtain permission from the arbitration bus 5050 to prevent a possible data collision. The message source must win an arbitration from a potential multiplicity of processor module 5034 access requests. The winner is granted temporary bus mastership for sending a single message. After the transfer of data is complete, bus mastership is relinquished, thereby permitting bus 5028 access by other processor modules 5034.

No explicit bus request and grant signals are required with the serial arbitration method of the present invention. The preferred method eliminates complex signaling and signal lines, along with the requisite centralized priority encoder and usual granting mechanism. The arbitration method is not daisy chained so that any processor module location on the bus 5028 may be empty or occupied without requiring a change to address wiring.

In the present invention, the open-collector arbitration bus 5050 permits multiple processing modules 5034 to compete for control of the data bus 5028. Since no processing module 5034 in the digital system knows apriori if another processing module has accessed the arbitration bus 5050, modules within the HSB system may drive high and low level logic signals on the HSB simultaneously, causing arbitration collisions. The collisions occur without harm to the driving circuit elements. However, the collisions provide a method of determining bus activity.

The arbitration bus 5050 includes pullup resistors connected to a regulated voltage source to provide a logic 1 level. The arbitration bus driver 5052 connects the arbitration bus 5050 to ground to drive a logic 0 level. This results in a logic 1 only when no other processing module 5034 drives a logic 0. The arbitration bus 5050 will be low if any processing module 5034 arbitration bus 5050 driver 5052 asserts a logic 0.

As known to those familiar with the art, the connection is called "wired-OR" since it behaves like a large NOR gate with the line going low if any device drives high (DeMorgan's theorem). An active low receiver inverts a logic 0 level, producing an equivalent OR gate. Using positive-true logic conventions yields a "wired-AND," using negative logic yields a "wired-OR." This is used to indicate if at least one device is driving the arbitration bus 5050 and does not require additional logic. Therefore, if a processing module 5034 asserts a logic 1 on the arbitration bus 5050 and monitors a logic 0, via buffer 5053 on monitor line 5055 (BUS_ACT_N), the processing module 5034 bus controller 5022 determines that a collision has occurred and that it has lost the arbitration for access.

The arbitration method depends on the detection of collisions and uses state machines 5046 and 5048 within the bus controller 5022 on each processing module 5034 to determine arbitration bus 5050 status as arbitration proceeds. All transitions on the arbitration bus 5050 are synchronized to the bus clock 5042. Each processor module 5034 has a unique programmed binary address to present to the arbitration bus 5050. The device address in the current embodiment is six bits, thereby yielding 63 unique processing module 5034 identifications.

Each processing module 5034 bus controller 5022 located on the HSB 5020 monitors, (via a buffer 5053), and interrogates, (via a buffer 5052), the arbitration bus (HSBI_ARB1_N) 5050. Six or more high level signals clocked indicate that the bus is not busy. If a processing module 5034 desires to send a message, it begins arbitration by serially shifting out its own unique six bit address onto the arbitration bus 5050 starting with the most significant bit. Collisions will occur on the arbitration bus 5050 bit by bit as each bit of the six bit address is shifted out and examined. The first detected collision drops the processing module 5034 wishing to gain access out of the arbitration. If the transmit state machine 5046 of the sending module 5034 detects a collision it will cease driving the arbitration bus 5050, otherwise it proceeds to shift out the entire six bit address. Control of the data bus 5028 is achieved if the entire address shifts out successfully with no errors.

A priority scheme results since logic 0's pull the arbitration bus 5050 low. Therefore, a processor module 5034 serially shifting a string of logic 0's that constitute its address will not recognize a collision until a logic 1 is shifted. Addresses having leading zeroes effectively have priority when arbitrating for the bus 5050. As long as bus 5028 traffic is not heavy, this effect will not be significant.

In an alternative embodiment, measures can be taken to add equity between processor modules 5034 if required. This can be done by altering module arbitration ID's or the waiting period between messages.

Once a processor module 5034 assumes bus mastership it is free to send data on the data bus 5028. The bus controller 5022 enables its octal bus transceiver (driver) 5060 and transmits at the clock 5042 rate. The maximum allowed message length is 512 bytes. Typically, messages will be 256 bytes or shorter. After a successful arbitration, the arbitration bus 5050 is held low by the transmitting processor module 5034 during this period as an indication of a busy arbitration bus 5050.

Once the data transfer is complete, the bus controller 5022 disables its octal bus transceiver (drivers) 5060 via line 5054 (HSB_A_EN_N) and releases the arbitration bus 5050 to high. Another arbitration anywhere in the system may then take place.

An alternative embodiment allows bus 5028 arbitration to take place simultaneous with data transfer improving on data throughput throughout the digital system. In the preferred embodiment, the delay is considered insignificant obviating the added complexity.

The bus controller 5022 is required to control the interface between the processing module 5034 microprocessor 5032 and the HSB 5020 and between the HSB and the bus (data bus 5028 and arbitration bus 5050) signals. In the preferred embodiment the bus controller 5022 is an Altera 7000 series erasable programmable logic device (EPLD). The 8 bit internal data bus 5030 interfaces the bus controller 5022 with the processor module 5034 CPU 5032. The processor module 5034 CPU 5032 will read and write directly to the bus controller 5022 internal registers via the internal data bus 5030. The bus controller 5022 monitors the arbitration bus 5050 for bus status. This is necessary to gain control for outgoing messages and to listen and recognize its address to receive incoming messages. The bus controller 5022 monitors and controls the data FIFO's 5024 and 5025, DMA controller 5033 and bus buffer enable 5054.

The components used in the preferred embodiment are shown in Table 15.

TABLE 15

| QTY | MANUFAC-TURER | PART NUMBER | DESCRIPTION | ELE-MENT |
|---|---|---|---|---|
| 1 | IDT or Samsung | IDT7202LA-50J KM75C02AJ50 | 1K × 9 Receive FIFO | 5024 |
| 1 | IDT or Samsung | IDT7204LA-50J KM75C04AJ50 | 4K × 9 Transmit FIFO | 5026 |

TABLE 15-continued

| QTY | MANUFAC-TURER | PART NUMBER | DESCRIPTION | ELE-MENT |
|---|---|---|---|---|
| 1 | TI or TI | SN74ABT125 SN74BCT125 | Quad tristate driver | 5058 |
| 3 | TI or TI | SN74ABT245 SN74BCT245 | TTL Octal Buffers | 5060 |
| 1 | Altera | 7128E | erasable programmable logic device | 5022 |

Address decoding and DMA gating are required and are performed in the bus controller 5022. The bus controller 5022 also contains a number of internal registers that can be read or written to. The CPU 5032 communicates with and instructs the bus controller 5022 over the 8 bit internal data bus 5030.

Loading the transmit FIFO 5024 is handled by the bus controller 5028, DMA and address decoding circuits contained within the bus controller 5022. Gaining access to the bus 5028 and unloading the FIFO 5024 is handled by the transmit state machine.

On power up, the bus controller 5022 receives a hardware reset 56. The application software running on the processor module 5034 CPU 5032 has the option of resetting the bus controller 5022 via a write strobe if the application requires a module reset. After a reset, the bus controller 5022 monitors the arbitration bus 5050 on line 5055 to determine bus activity and to sync with the data bus 5028.

After a period of inactivity the bus controller 5022 knows that the bus 5028 is between messages and not busy. A processor module 5034 can then request control of the bus via arbitration. If no messages are to be sent, the bus controller 5022 continues to monitor the arbitration bus 5050.

The processor module CPU 5032 writes messages into the transmit FIFO 5024 at approximately 20 Mbps. The DMA controller, a Motorola 68360 5033 running at 25 MHz will be able to DMA the transmit FIFO 5024 at approximately 12.5 Mbps. Since only one message is allowed in the transmit FIFO 5024 at any one time, the CPU 5032 must buffer additional transmit messages in its own RAM 5040. Since the maximum allowable message length is 512 bytes with anticipated messages averaging 256 bytes, a FIFO length of 1 Kb is guaranteed not to overflow. Once a message has been successfully sent, the transmit FIFO 5024 flags empty and the next message can be loaded.

A typical 256 byte message sent by a processing module 5034 CPU 5032 at 12.5 MBps will take less than 21 $\mu$sec from RAM 5040 to transmit FIFO 5024. Bus arbitration should occupy not more than 1 $\mu$sec if the bus is not busy. Total elapsed time from the loading of one transmit message to the next is approximately 43 to 64 $\mu$sec. Since not many messages can queue during this period, circular RAM buffers are not required.

Figure 58:
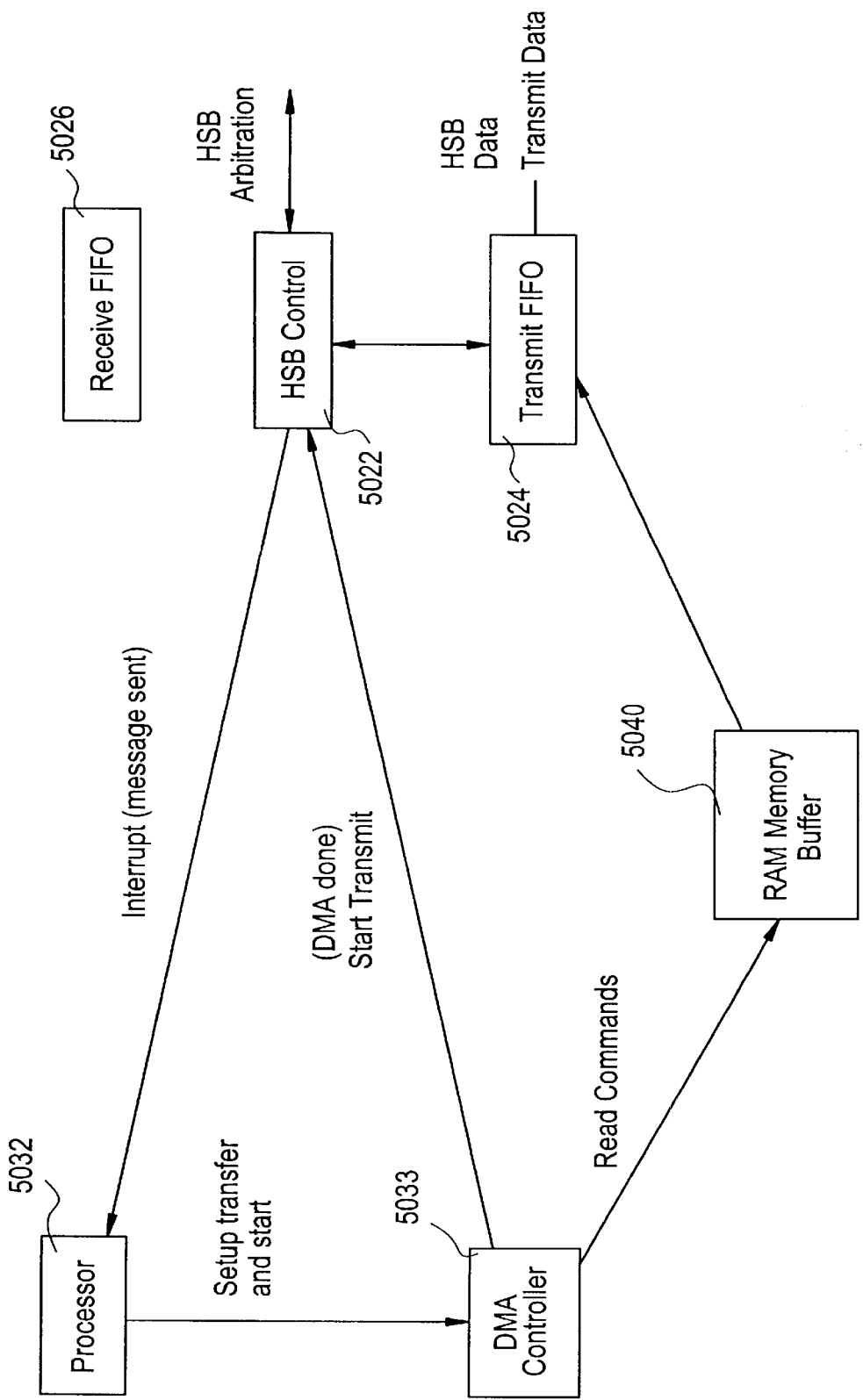
FIG. 58 is a block diagram of the message transmit DMA.
Figure 60:
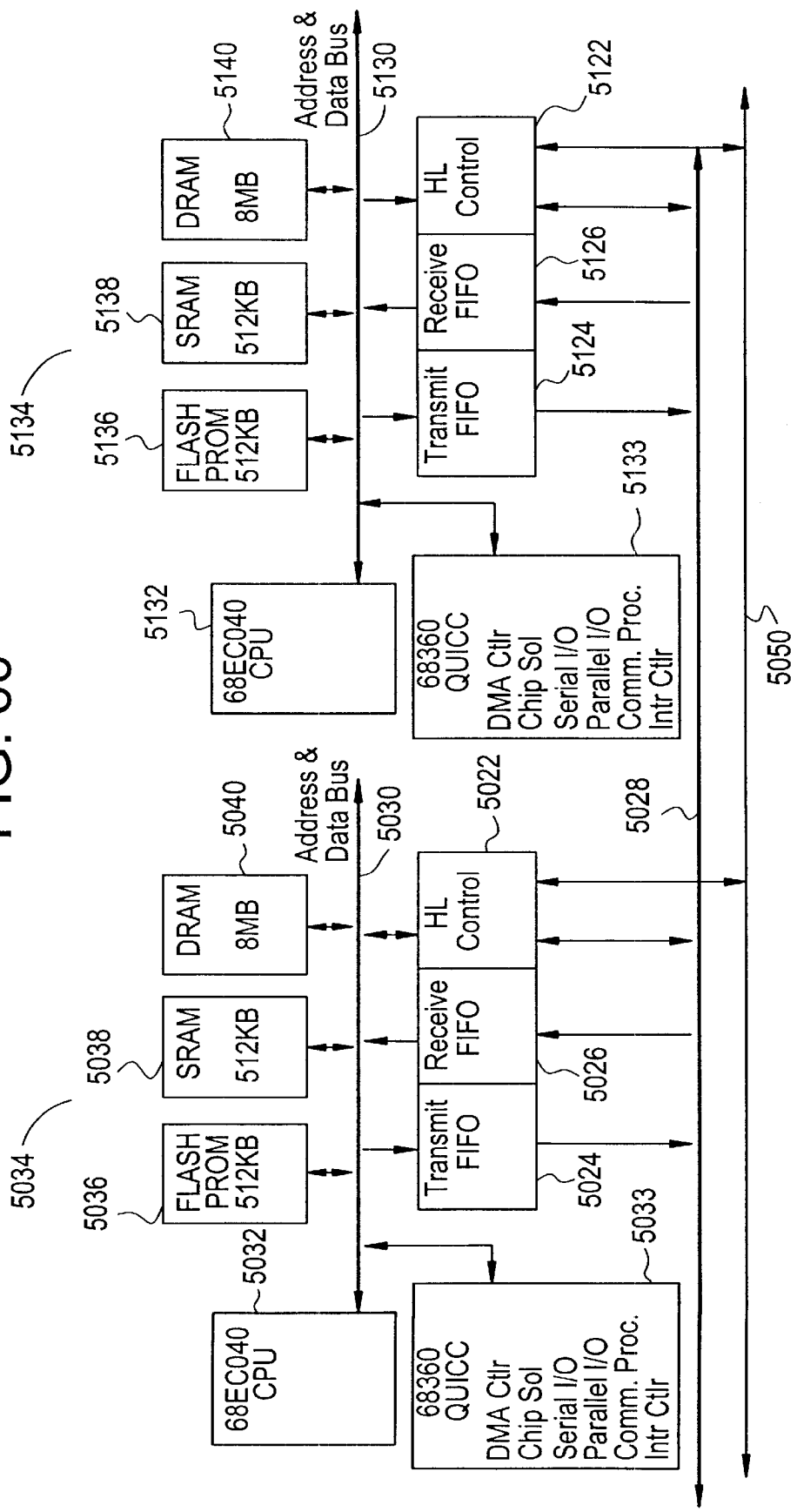
FIG. 60 is a block diagram of the digital processor system.

As shown in FIGS. 58 and 60, during DMA transfers, the DMA controller 5033 disables the processor module 5034 CPU 5032 and assumes control of the internal data bus 5030. The DMA transfer is brought about by the processor module 5034 or by a request from another processor module 5134. The other processor 5134 successfully arbitrates control of the data bus 5028 and signals the processor module CPU 5032. The CPU 5032 gives permission and releases control of bus 5030. The processor module CPU 5032 signals the DMA controller 5033 to initiate a data transfer. The DMA controller 5033 generates the necessary addresses and tracks the number of bytes moved and in what direction. A byte and address counter are a part of the DMA controller 5033. Both are loaded from the processor module CPU 5032 to setup the desired DMA transfer. On command from the CPU 5032, a DMA request is made and data is moved from RAM memory 5040 to the transmit FIFO 5024.

A transfer on the bus 5028 is monitored by each processing module 5034 located on the bus 5028. Each bus controller 5022 in the entire processor system contains the destination addresses of all devices on the bus 5028. If a match is found, the input to that receiving processing module 5034 FIFO 5026 is enabled. Since multiple messages may be received by this FIFO 5026, it must have more storage than a transmit FIFO 5024. The receive FIFO 5026 has at a minimum 4KBx9 of storage. This amount of storage will allow at least 16 messages to queue within the receive FIFO 5026 based on the message length of 256 bytes. A message burst from multiple sources could conceivably cause multiple messages to temporarily congest the receive FIFO 5026. The receiving module CPU 5032 must have a suitable message throughput from the receive FIFO 5026 or else a data overflow will result in lost information. DMA is used to automatically transfer messages from the receive FIFO 5026 to RAM 5040. The transfer time from the receive FIFO 5026 to RAM 5040 is typically 21 $\mu$sec.

Figure 59:
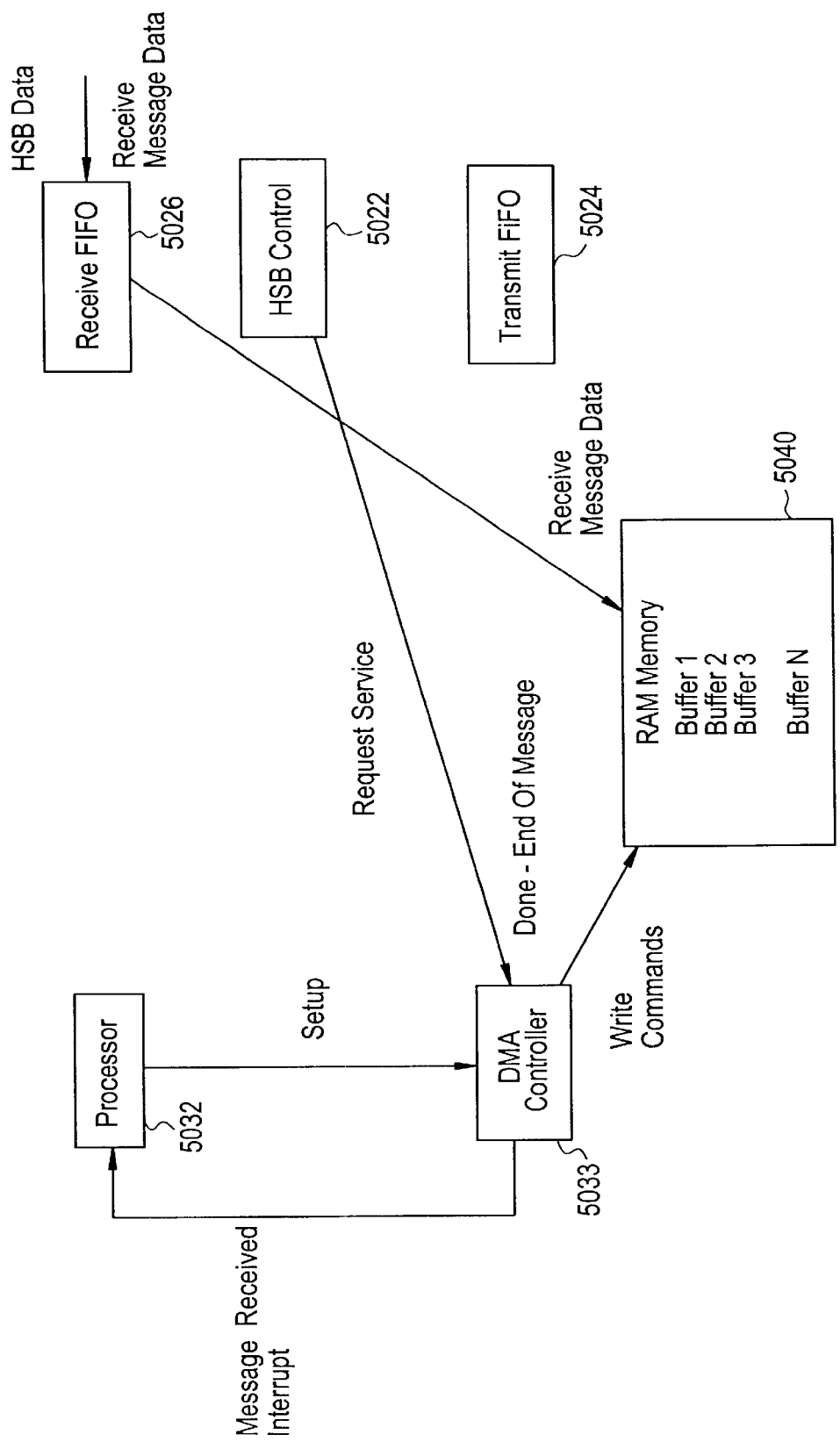
FIG. 59 is a block diagram of the message receive DMA.

When a message is received by the bus controller 5022, a request for DMA service is made. Referring to FIG. 59, the DMA controller 5033 generates a message received hardware interrupt (DMA DONE) and signals processor module CPU 5032 that it has control of the internal bus 5030. An interrupt routine updates the message queue pointer and transfers the contents of receive FIFO 5026 to RAM memory 5040. The DMA controller 5033 is then readied for the next message to be received and points to the next available message buffer. This continues until all of the contents of the receive FIFO 5026 are transferred. An end of message signal is sent by the receive FIFO 5026 to the DMA controller 5033 via the bus controller 5022. The processor module 5034 CPU 5032 then regains control of the internal communication bus 5030.

The total elapsed time that it takes for a source to destination message transfer is approximately 64 to 85 $\mu$sec. As shown in FIG. 60, the time is computed from when a processor module 5034 starts to send a message, load its transmit FIFO 5024, arbitrate and acquire the data bus 5028, transfer the data to the destination receive FIFO 5126, bus the message to the CPU 5132 and then finally transfer the message into RAM 5140 of the recipient module 5134. The actual throughput is almost 200 times that of a 8 KBps time slot on a PCM highway.

Controlling the HSB 5020 requires two state machines; one transmitting information 5070, the other receiving information 5072. Both state machines are implemented in the bus controller 5022 as programmable logic in the form of Altera's MAX+PLUS II, Version 6.0 state machine syntax.

Any arbitrary state machine has a set of states and a set of transition rules for moving between those states at each clock edge. The transition rules depend both on the present state and on the particular combination of inputs present at the next clock edge. The Altera EPLD 5022 used in the preferred embodiment contains enough register bits to represent all possible states and enough inputs and logic gates to implement the transition rules.

Figure 61:
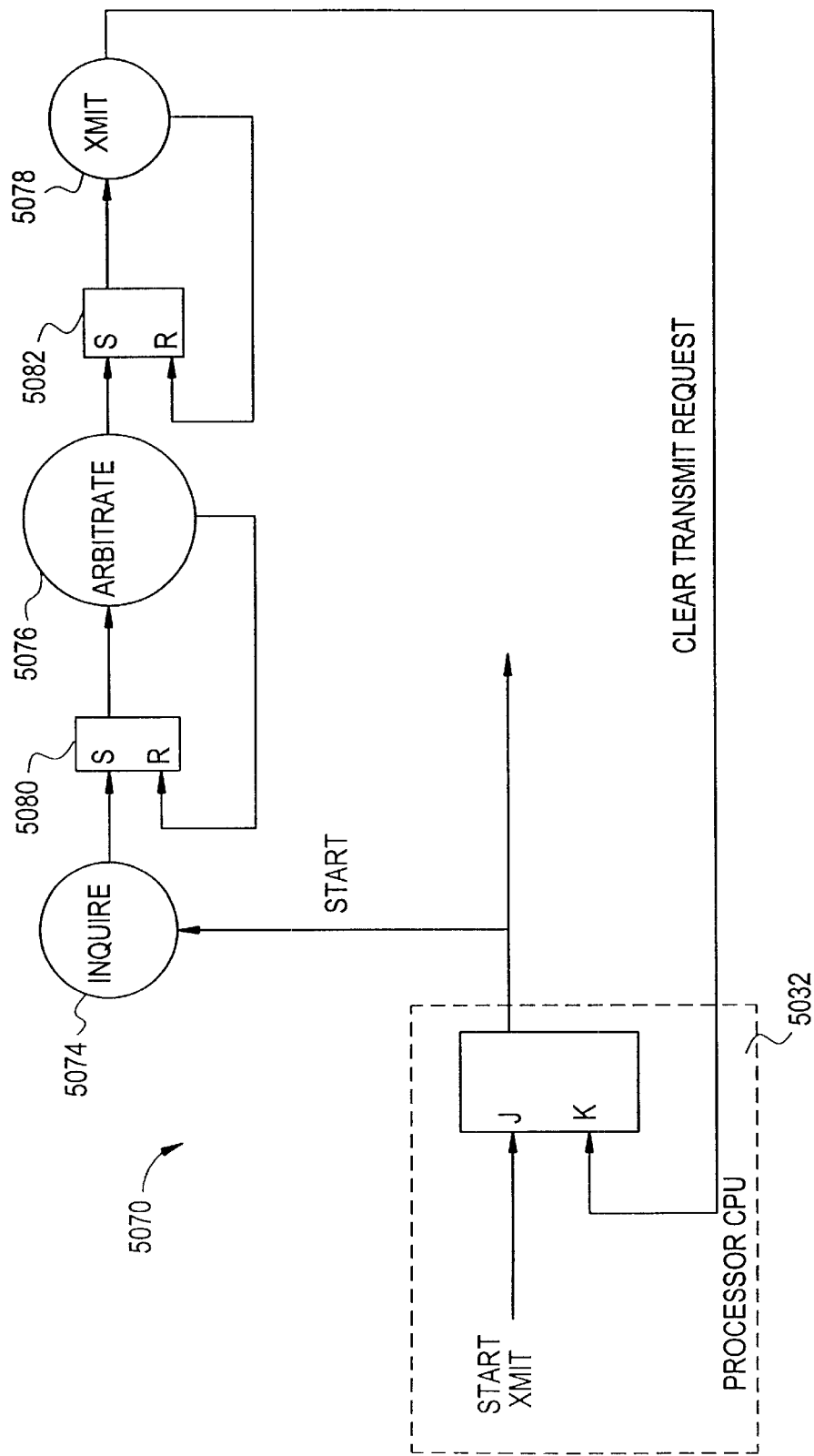
FIG. 61 is a general flow diagram of the transmit instruction.

A general transmit program flow diagram 5070 for the transmit state machine is shown in FIG. 61. Within the general flow diagram 5070 are three state machine diagrams for the inquire 5074, arbitrate 5076 and transmit 5078 phases of the transmit state machine.

Figure 62:
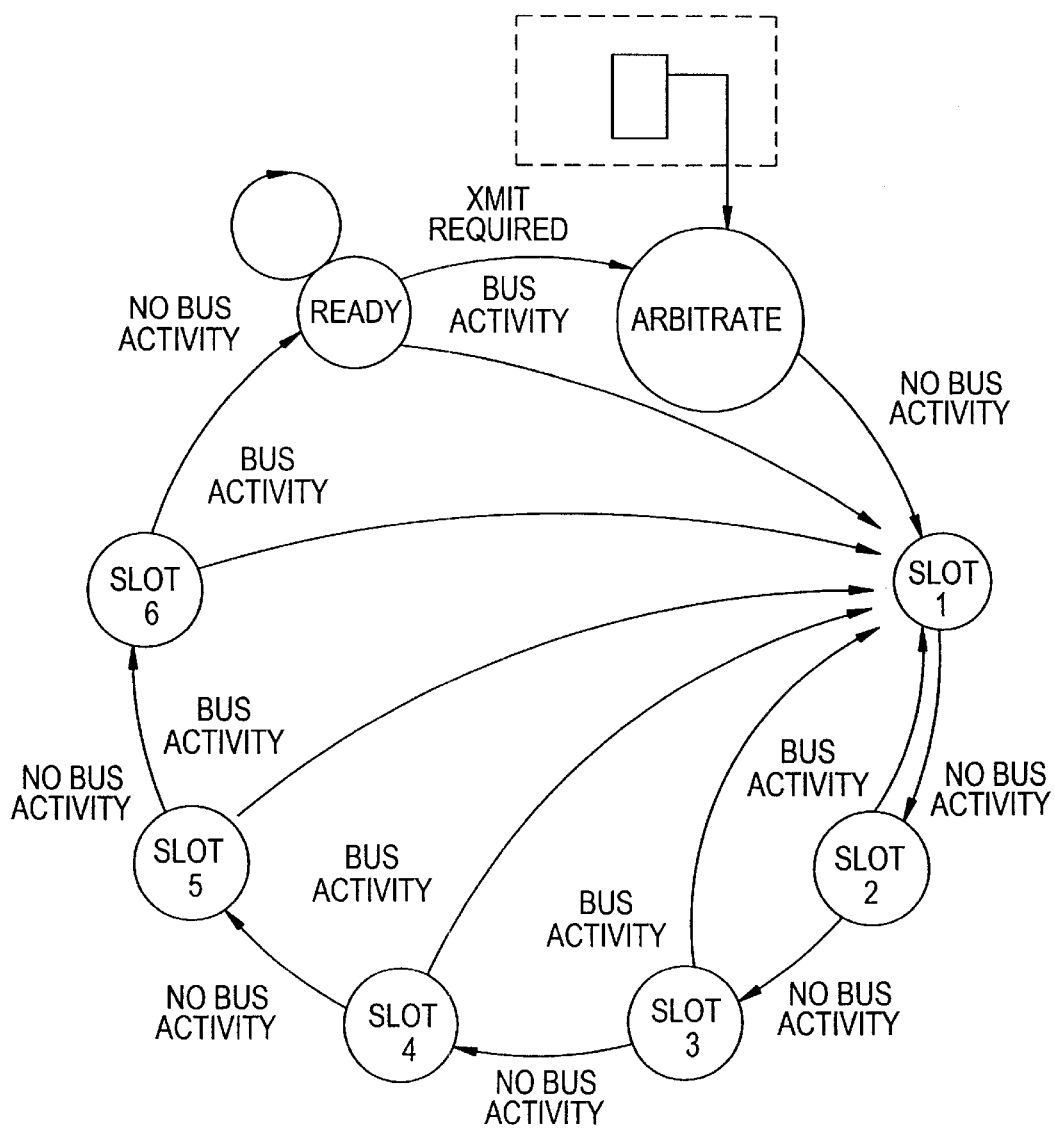
FIG. 62 is a state diagram of the inquiry phase.

The processor module CPU 5032 initiates the inquire phase 5074. As shown in FIG. 62, eight states are shown along with the transition rules necessary for the bus controller 5022 to sense bus activity. After initiation, a transmit request is forwarded to the bus controller 5022 to see if there is bus activity. The bus controller 5022 monitors the arbitration bus 5050 for a minimum of 7 clock cycles. Six internal bus controller addresses are examined for collisions. If no collisions are detected, a request to arbitrate is made on the inactive bus.

Figure 63:
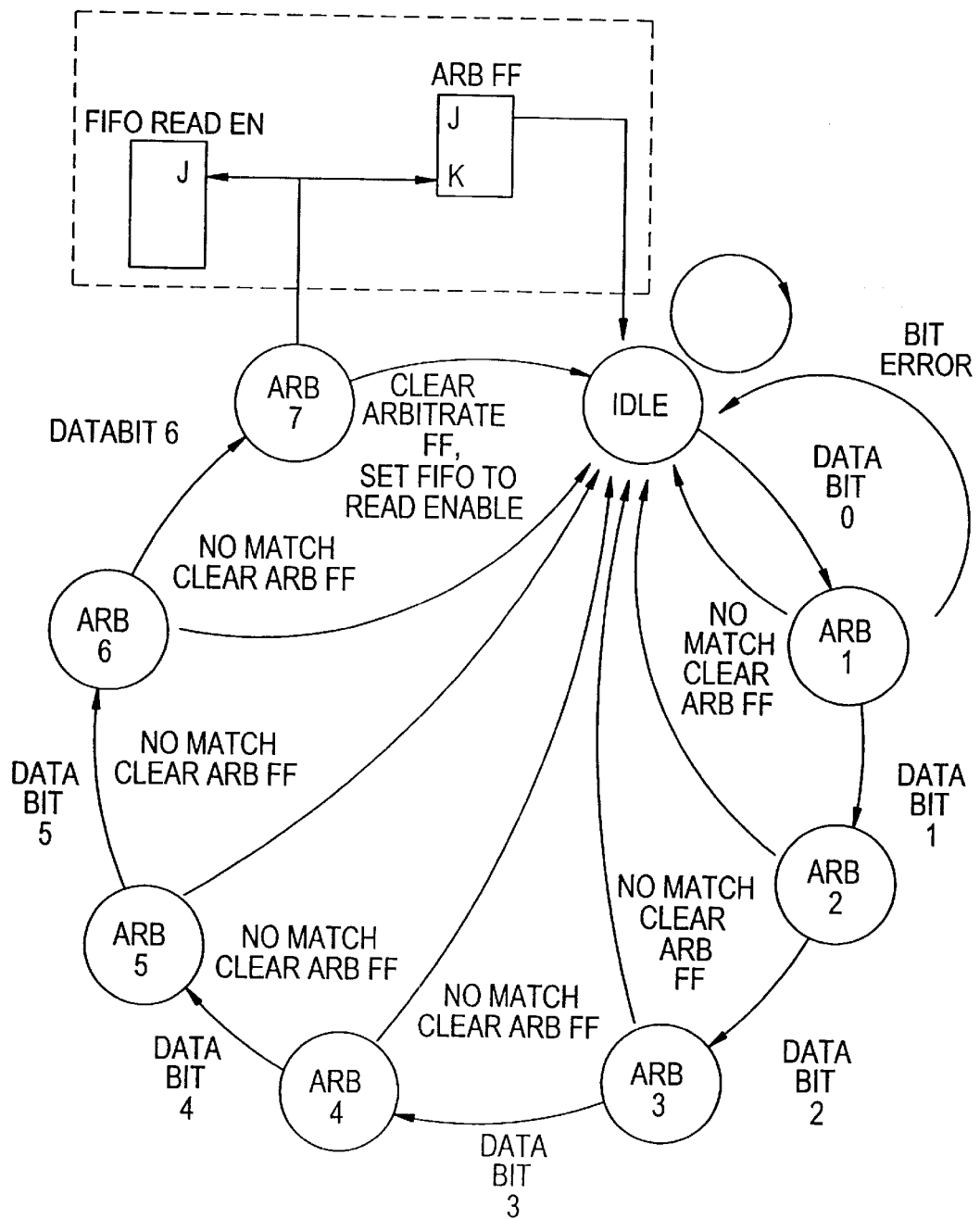
FIG. 63 is a state diagram of the arbitrate phase.

As shown in FIG. 63, the arbitrate request sets a flip-flop 5080 and begins sending out a unique identifier followed by six address bits on the arbitration line (HSBI_ARB1_N) 5050. A collision is detected if any of the bits transmitted are not the same as monitored. If the six bits are successfully shifted onto the bus 5028, then that particular bus controller 5022 has bus mastership and seizes the bus. A transmit FIFO 5024 read enable is then set. If any one of the bits suffers a collision, the arbitration bus 5050 is busy and the processor module 5034 stops arbitrating.

Figure 64:
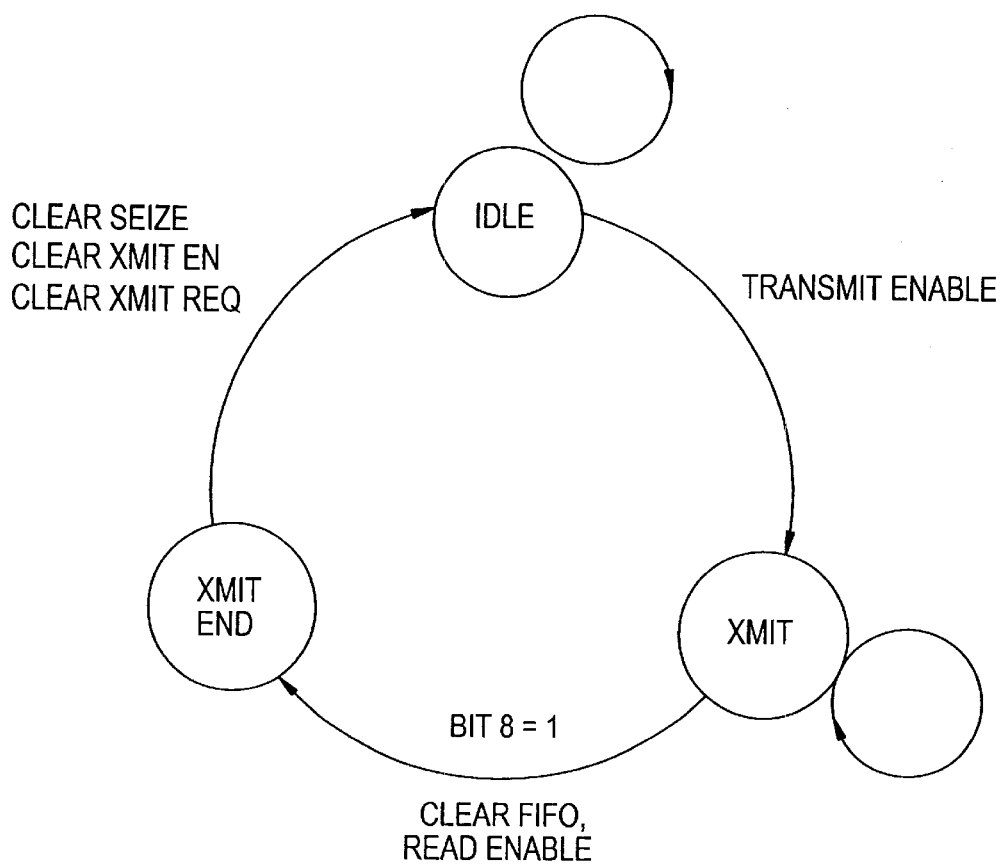
FIG. 64 is a state diagram of the transmit phase.

Referencing FIG. 64, the transmit FIFO 5024 read enable sets a flip-flop 5082 and initiates a transmit enable. The contents of transmit FIFO 5024 are output through the bus controller 5022, through octal bus transceiver 5060, onto the data bus 5028. The data is transmitted until an end of message flag is encountered. Once the transmit FIFO 5024 is emptied, a clear transmit request signal is output, returning the bus controller 5022 back to monitoring the bus 5028.

Figure 65:
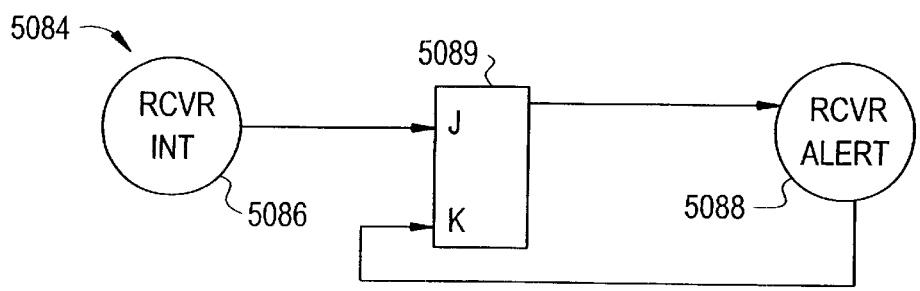
FIG. 65 is a general flow diagram of the receive instruction.

The state machine for controlling the receive FIFO 5026 is similarly reduced into two state machines. As shown in FIG. 65, a general flow diagram is shown for controlling the receive FIFO 5026.

Figure 66:
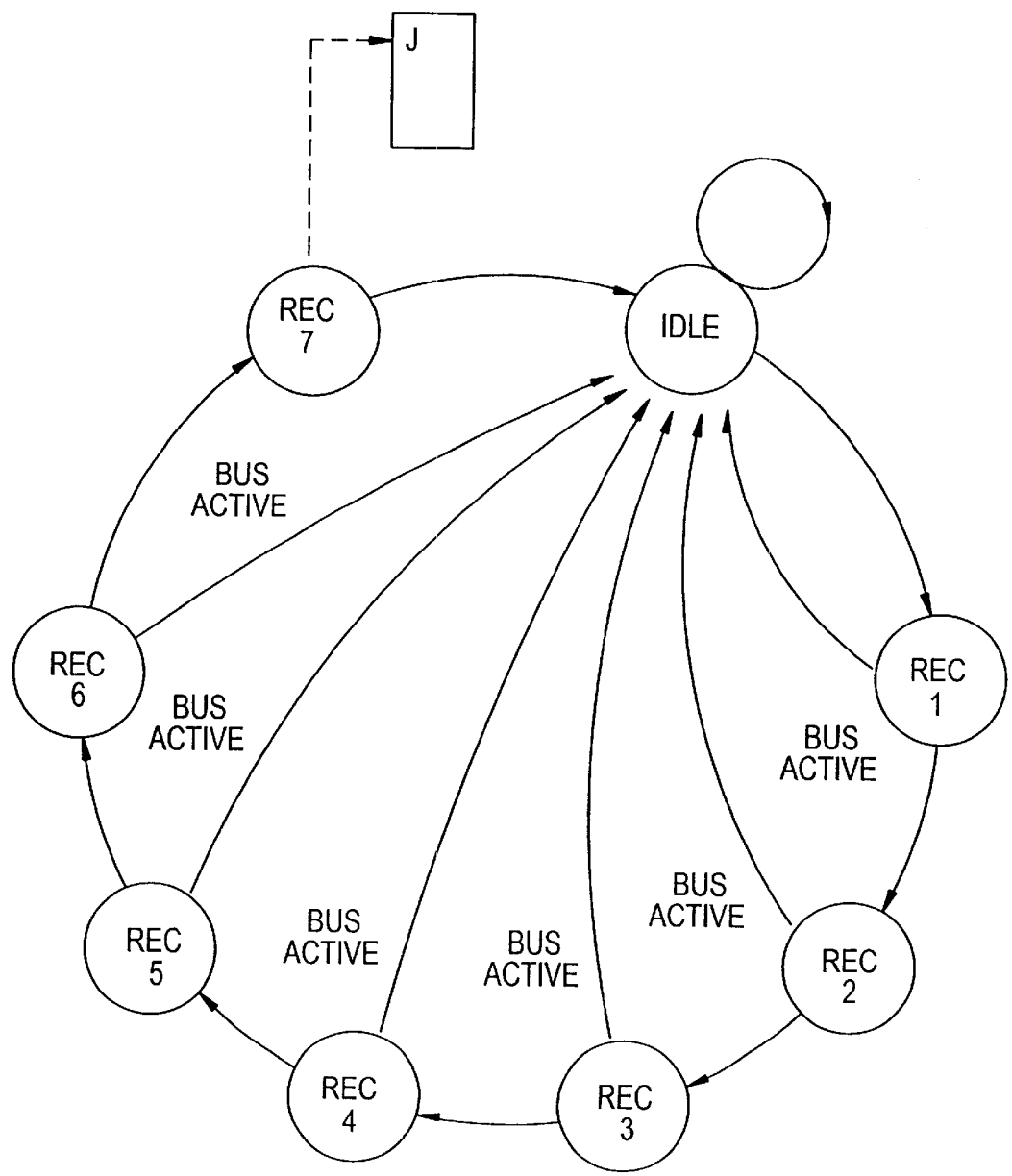
FIG. 66 is a state diagram of the delay phase.

Referencing FIG. 66, the bus controller 5022 monitors the arbitration bus 5050 for a period lasting seven clock cycles. Bus activity is determined by the reception of a leading start bit from another processor module 5034 bus controller 5022. If after seven clock cycles the bus has not been seized, a receive alert signal is input to receive flip-flop 5089.

Figure 67:
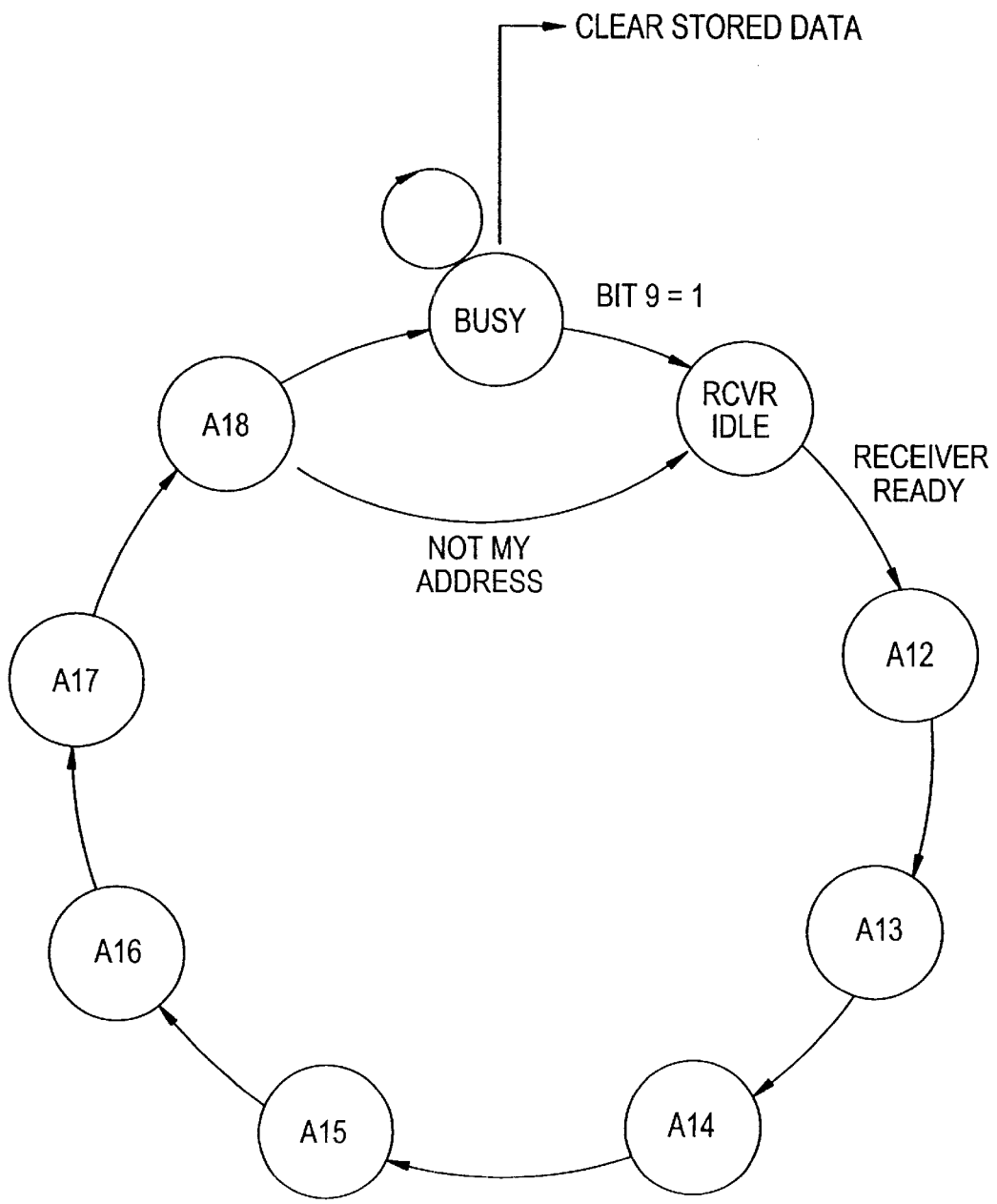
FIG. 67 is a state diagram of the receive phase.

As shown in FIG. 67, the bus controller 5022 examines the first bit of data transmitted and compares it with its own address. If the first data bit is the unique identifier for that bus controller 5022, data is accumulated until an end of message flag is encountered. If the first data bit is not the unique identifier of the listening bus controller 5022, the bus controller 5022 returns to the listening state.

There are two embodiments for the software to transmit messages. The first embodiment will allow waiting an average of 5050 $\mu$sec to send a message since there are no system interrupts performed. This simplifies queuing and unqueuing messages. The second embodiment assumes that messages are being sent fast, the operating system is fast and preemptive, system interrupts are handled quickly, and idling of the processor 5032 is not allowed while messaging.

Upon completion of the transmit DMA, data bus 5028 arbitration must take place. After the data bus 5028 has been successfully arbitrated, the bus controller 5022 may release the transmit FIFO 5024 thereby placing the contents on the data bus 5028. An empty flag signals a complete transfer to the bus controller 5022 and processor module 5034 CPU 5032.

XXXXV. CDMA Communication System which Selectively Suppresses Data Transmissions During Establishment of a Communication Channel One of the problems associated with wireless communication of data is that many different types of communicating nodes are currently in use including computers, facsimile machines, automatic calling and answering equipment and other types of data networks. These nodes may be able to communicate at a plurality of different data rates and must be properly synchronized to avoid losing data during the establishment or maintenance of a communication.

The present invention includes a feature which prevents the transmission of data between communicating nodes until the data communication rate required by the communicating nodes has been completely established throughout the system. The system selectively suppresses the confirmation tone that a receiving node sends to an originating node. Accordingly, the transmission of voice, facsimile or modem data is prevented until the communication path has been established at the desired communication rate. This permits the system to reliably transport encoded data at a plurality of data rates across a telecommunication system which may lack precise synchronization.

Figure 68:
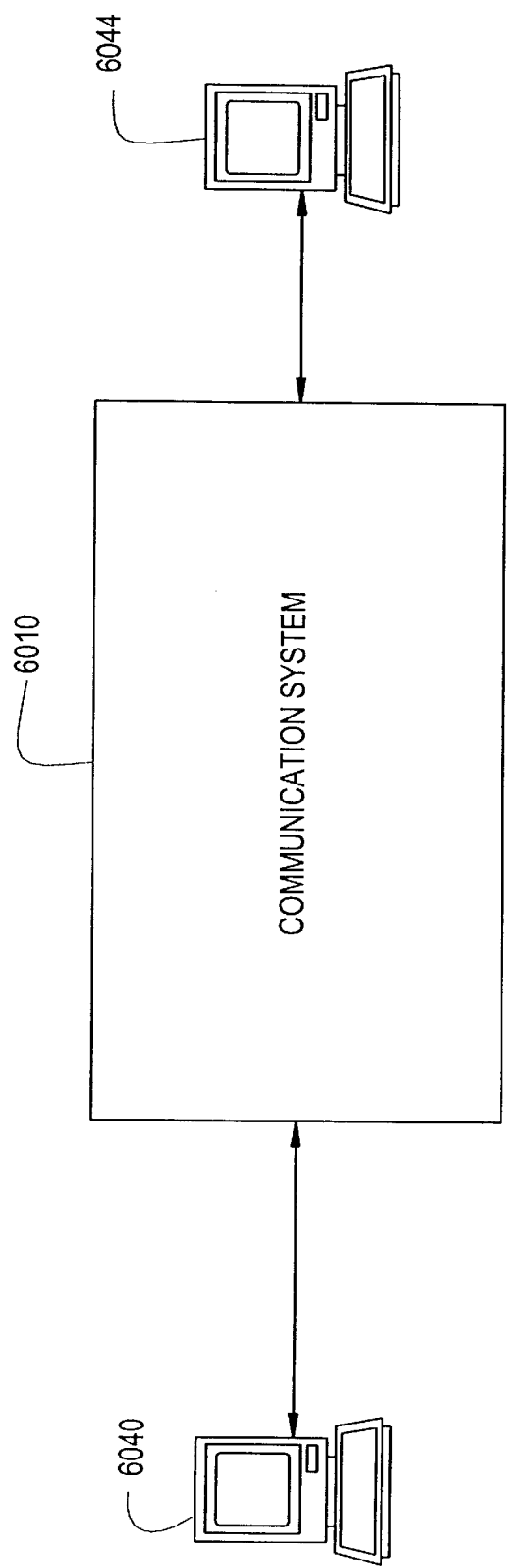
FIG. 68 is a block diagram of a communication system in accordance with the present invention connected to originating and terminating nodes.

Referring to FIG. 68, the communication system 6010 is generally connected to originating nodes 6040 and terminating nodes 6044. In order to conserve as much bandwidth as possible, the communication system 6010 selectively allots the bandwidth required for supporting the data transmission rate required by the originating and terminating nodes 6040, 6044. In this manner, the system 6010 ensures that the bandwidth is utilized efficiently. Voiced communications may be effectively transmitted across a 32 Kbs ADPCM channel. However, a high speed fax or data modem signal requires at least a 64 Kbs pulse code modulation (PCM) signal to reliably transmit the communication. Many other types of modulation techniques and data transmission rates may also be utilized by originating and terminating nodes 6040, 6044. The system 6010 must be able to effectively allocate bandwidth and dynamically switch between these data communication rates and modulation schemes on demand.

The communication system 6010 provides a communication link between the originating and terminating nodes 6040, 6044. The originating and terminating nodes 6040, 6044 may comprise computers, facsimile machines, automatic calling and answering equipment, data networks or any combination of this equipment. For robust communication of data it is imperative to ensure that the communication system 6010 switches to the data transmission rate required by the communicating nodes 6040, 6044 prior to the transmission of any data.

Figure 69:
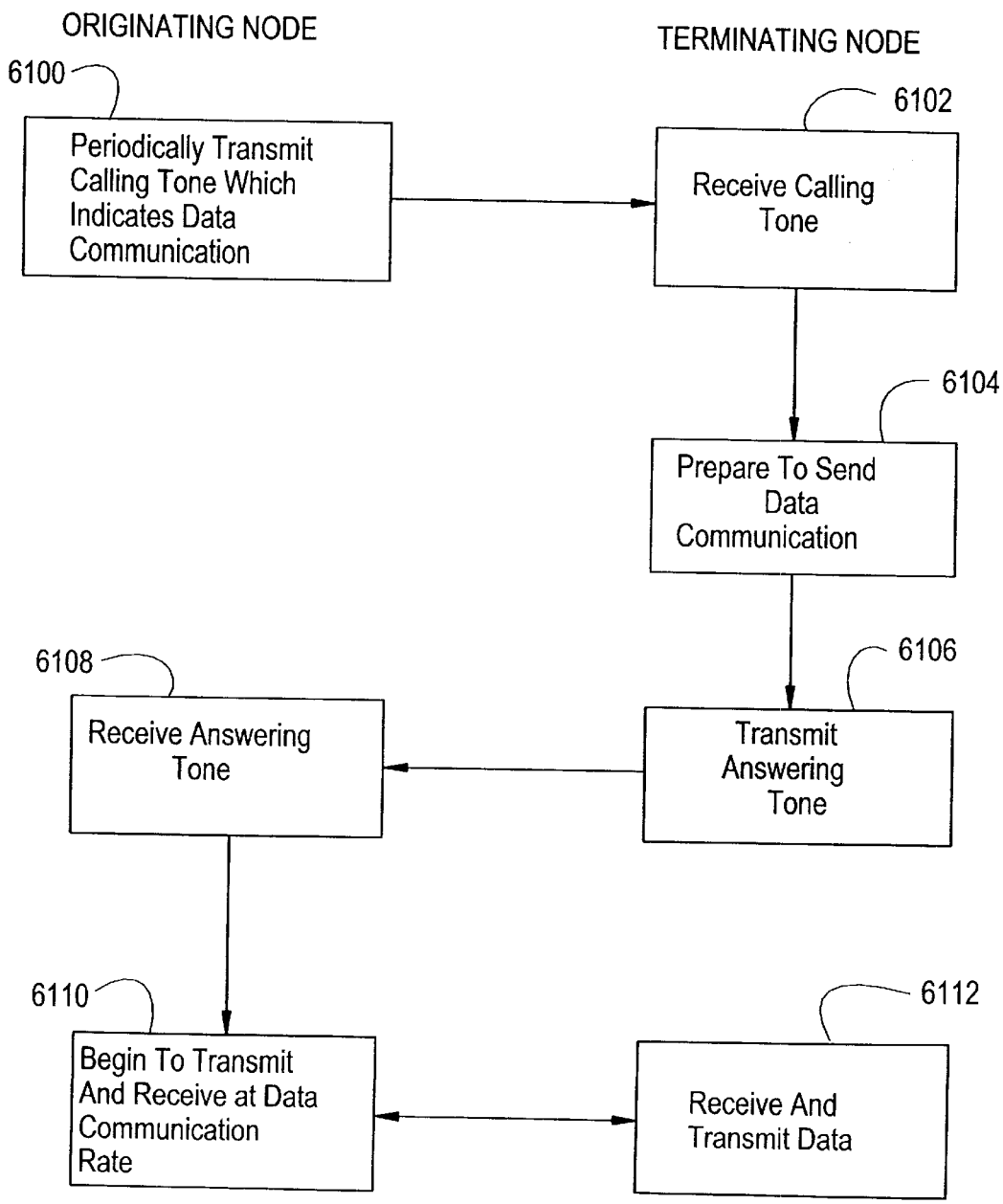
FIG. 69 is a flow diagram of the establishment of a communication channel between originating and terminating nodes in accordance with the prior art.

Referring to FIG. 69, the typical procedure for establishing communications between originating nodes 6040 and terminating nodes is shown. The originating node 6040 periodically transmits a calling tone (step 6100) which indicates that a data communication, (not a voice communication), is to be transmitted. The calling tone which is sent from the originating node 6040 to the terminating node 6044 is detected by the terminating node 6044 (step 6102) which initiates several actions. First, the terminating node 6044 prepares to send a data communication (step 6104). Next, the terminating node 6044 transmits an answering tone (step 6106) to the originating node 6040 to confirm that the terminating node 6044 has received the calling tone. Upon receipt of the answering tone (step 6108), the originating node 6040 begins the transmission of data (step 6110), which is received by the terminating node 6044 (step 6112). With the communication link established at the data transmission rate, the originating and terminating 6040, 6044 nodes transmit and receive data until termination of the communication.

One problem with this process is that the transmission rate of the communication system 6010 is transparent to both the communicating and terminating nodes 6040, 6044. Modification of the transmission rate from a low rate that supports voice communication to a high rate that supports encoded data communication ensures that data will be reliably and quickly transmitted over a communication channel. However, the new transmission rate must be completely established throughout the communication system 6010 to prevent false interpretation of tones transmitted by the originating node 6040. The originating node 6040 may begin transmission of data at a high rate before the system 6010 has fully switched from 32 Kbs ADPCM to 64 Kbs PCM resulting in loss of data.

In order to obviate tone misinterpretation and to prevent the resulting erroneous operation of the originating or transmitting nodes 6040, 6044, the present invention blocks the transmission of the confirming tone to the originating node 6040 until the new data transmission rate has been completely established throughout the communication system 6010. This prevents the reception of the answering tone at the transmitting node 6040 and ensures the reliable transportation of encoded data at a higher rate across a communication system 6010 which lacks the precise synchronization which would otherwise be required.

Figure 70:
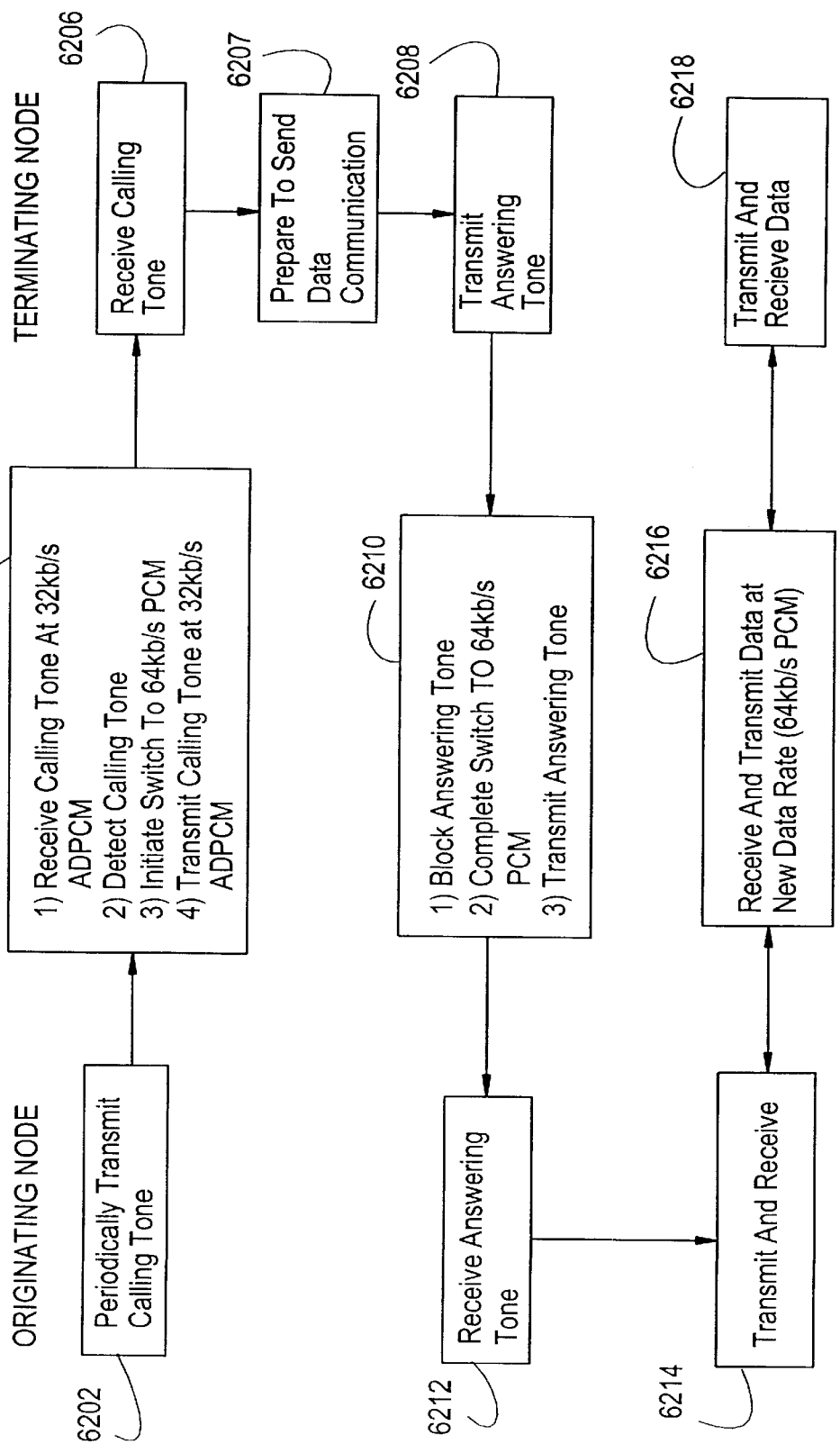
FIG. 70 is a flow diagram of the establishment of a communication channel between originating and terminating nodes in accordance with the present invention.

The operation of the system 6010 of the present invention will be explained with reference to FIG. 70. The communication system 6010 facilitates communications between an originating node 6040 and a terminating node 6044. As shown, the actions of the originating node 6040 (steps 6202, 6212 and 6214) and the actions of the terminating node 6044 (steps 6206, 6207, 6208 and 6218) are the same as in FIG. 69. The operation of the communication system 6010 is transparent to both the originating node 6040 and the terminating node 6044.

In operation, the originating node 6040 periodically transmits a calling tone (step 6202) which indicates a data communication. The communication system 6010 performs several actions in response to receipt of the calling tone (step 6204). First, the calling tone is received at 32 Kbs ADPCM which is the standard communication setting for voice communications. The system 6010 detects the calling tone and initiates a switch to 64 Kbs PCM in order to handle the high-speed data transmission. This switch must be implemented by the BS 6014, the SU 6016 and the controller 6020. Although the system 6010 immediately begins the switching over to the new data transmission rate, the process takes approximately 1500 msec to implement. Accordingly, the system 6010 transmits the calling tone to the terminating node 6044 at 32 Kbs ADPCM.

The terminating node 6044 detects the calling tone (step 6206) and prepares to send a data communication (step 6207). The terminating node 6044 subsequently transmits the answering tone (step 6208) which, when received by the originating node, will cause the originating node 6040 to begin transmission of data.

The communication system 6010 receives the answering tone from the terminating node 6044. However, the system 6010 does not forward the answering tone to the originating node 6040 until the switch to 64 Kbs PCM has been established throughout the system 6010. After the system 6010 has confirmed that the switch to 64 Kbs PCM has been achieved, it permits the answering tone to pass through to the originating node 6040, which receives the tone (step 6212). In response to the answering tone, the originating node 6040 begins transmission of data (step 6214). The system 6010 receives the data and begins transmission of data at the new data transmission rate of 64 kbs PCM (step 6216) to the terminating node 6044 which receives the data (step 6218). Since the communication channel has been established, the originating and terminating nodes 6040, 6044 continue to communicate over the system 6010 in this manner (steps 6214, 6216 and 6218) until the communication is terminated.

Figure 71:
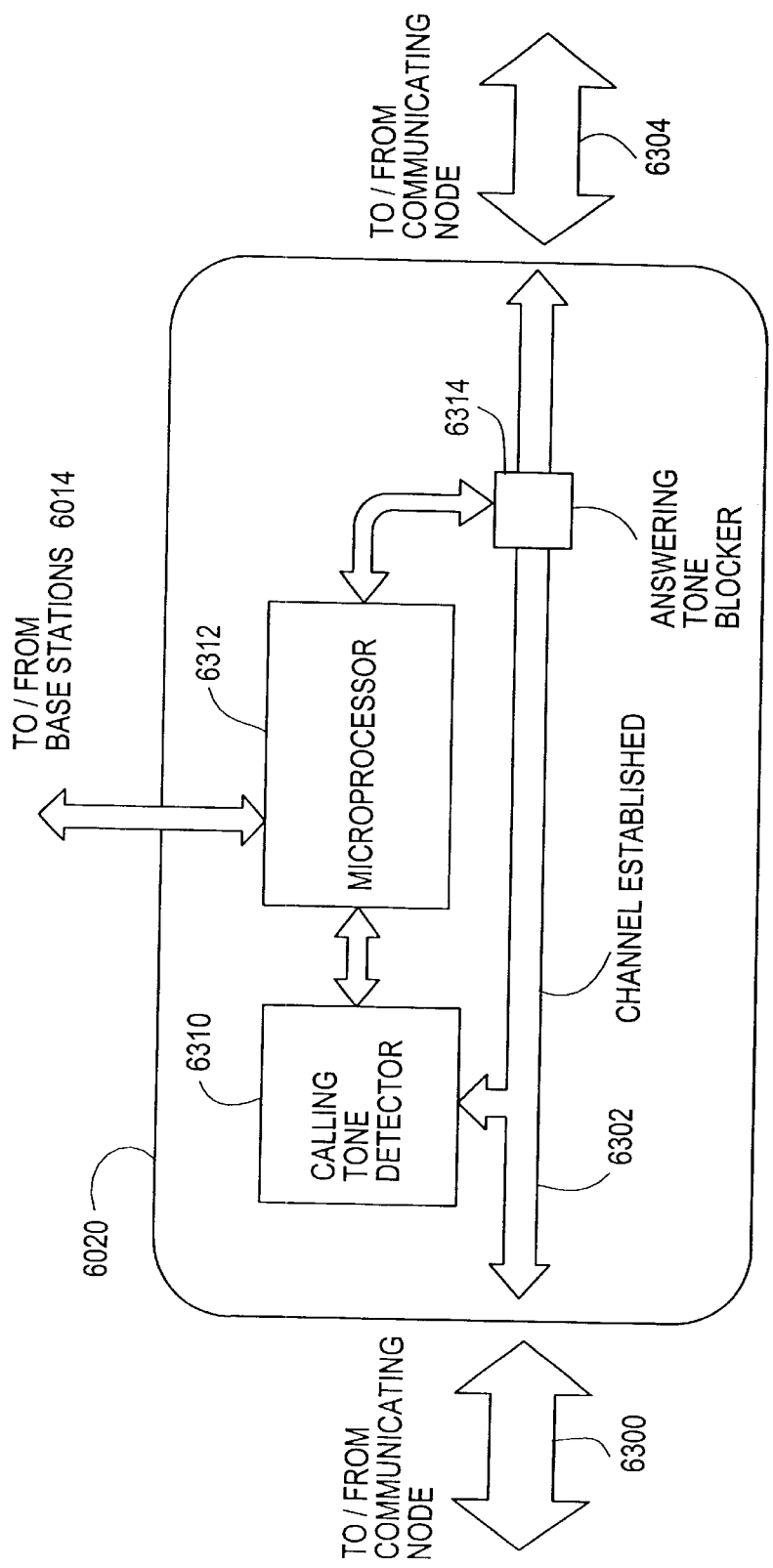
FIG. 71 is a block diagram of a base station in accordance with the teachings of the present invention.

Referring to FIG. 71, a more detailed block diagram of the controller 6020 is shown. The controller 6020 controls at least a portion of the communication link between two communicating nodes 6040, 6044. This link comprises the transmission path 6300 from a first communicating node to the controller 6020, the transmission path 6302 within the controller 6020, and the transmission path 6304 from the controller 6020 to the second communicating node. The transmission paths 6300, 6304 to and from the controller 6020 may include a plurality of BSs 6014 and SUs 6016 which are controlled by the controller 6020.

It should be appreciated by those of skill in the art that the establishment of a communication channel between communicating nodes 6040, 6044 is a complex procedure involving a plurality of tasks performed by the BS 6014, the SU 6016 and the controller 6020. A detailed description of the entire procedure is outside the scope of the present invention. Accordingly, only those portions of the procedure for establishment of a communication channel relevant to the present invention will be described hereinafter.

The communications between an originating node 6040 and a terminating node 6044 are transmitted over a virtual channel as is well known by those of skill in the art. Since the entire spectrum is used by the CDMA communication system 6010, communications from the originating node 6040 to the terminating node 6044 are transmitted over the same frequency band as communications from the terminating node 6044 to the originating node 6040. After the virtual channel has been established, the originating and terminating nodes 6040, 6044 may freely communicate.

The controller 6020 includes a calling tone detector 6310, a microprocessor 6312 and an answering tone blocker 6314. The calling tone detector 6310 monitors the communication channel which has been established in order to detect the calling tone. When a calling tone is transmitted from an originating node 6040, the calling tone detector 6310 detects the calling tone, which causes the controller 6020 to initiate the switch to a higher data transmission rate. The microprocessor 6312 subsequently informs any other BSs 6014 or SUs 6016 through which the communication is to be routed (hereinafter called communicating equipment) to initiate the switch to the higher data transmission rate.

The microprocessor 6312 activates the answering tone blocker 6314 which will prevent the answering tone from being transmitted through the system 6010. Each piece of communicating equipment 6014, 6016, 6020 transmits an acknowledgment to the microprocessor 6312 of the controller 6020 when the higher data transmission rate has been achieved. The microprocessor 6312 subsequently deactivates the answering tone blocker 6314 which permits the answering tone to be forwarded to the originating node 6040. The communicating nodes 6040, 6044 commence data transmission over the communication system 6010 at the higher data transmission rate.

Although the invention has been described in part by making detailed reference to the preferred embodiment, such detail is intended to be instructive rather than restrictive. For example, the functions performed by the controller 6020 shown in FIG. 71 may, in an alternative embodiment, be performed by a BS 6014 coupled with either the originating or terminating nodes 6040. The functions of a BS 6014 may also be combined with the controller 6020, to form a master base station. Additionally, different data rates and modulation schemes may be employed.

XXXXVI. Efficient Multichannel Filtering For CDMA Modems

Each communication channel within a CDMA communication system typically uses DSP (digital signal processing) hardware and software to filter, weight, and combine each signal prior to transmission. The weighting, filtering and combining of multiple signal channels is performed in the transmit circuitry of a CDMA communication system BS.

Prior art CDMA modems require many multipliers and binary adders for channel weighting and combining. The filter operation used is equivalent to that of a FIR (finite impulse response or transversal) structure. Each individual FIR filter used also requires many multipliers and adders.

A multiplier implemented in digital form is inefficient and expensive. The expense is directly related to logic gate count. Binary adders are less costly than binary multipliers, however, their use should be minimized. To implement a design using binary multiplication and addition into an ASIC (application specific integrated circuit) would be expensive to manufacture and would result in a more inefficient and slower signal throughput.

The disadvantage with prior art CDMA modems is the ability to weight, filter, and combine a plurality of single bit valued signal channels efficiently and accurately. When a multiplicity of signal processing channels are involved, the consistency between channels becomes important and the cost of hardware per channel escalates. In a CDMA communication system, it is necessary to use the minimum amount of power to achieve the minimum required bit error rate (BER) for maximum user capacity.

Each channel must have appropriate individual weights applied so that the same relative amplitudes are transmitted. After the weighting operation, each data stream is represented by multibit values. These are typically summed together in a large digital summing circuit that consists of a tree of numerous two input adders. The weighted and summed digital values are then filtered in a conventional FIR filter. The multipliers in the FIR process the multibit data and weighting coefficients to the desired precision. A multichannel filter for a CDMA modem constructed according to the teachings of the prior art would require separate FIR integrated circuits rather than total integration onto an economical ASIC (application specific integrated circuit).

The efficient, multichannel filter for CDMA modems of the present invention allows multiple channels consisting of serial, digital bit streams to be filtered by digital signal processing techniques performing sample weighting and summing functions. Each individual channel may have custom weighting coefficients or weighting coefficients common for all channels. If the weighting coefficients are by adaption, the same approach may be taken.

The multichannel FIR filter presented is implemented with no multipliers and a reduction in the number of adders. To increase the speed of operation, the filter structure utilizes look-up tables (LUTs) storing the weighting coefficients. The invention can be constructed either as a FPGA (field programmable gate array) or an ASIC. The use of LUTs save significant chip resources and manufacturing costs.

The multichannel FIR filter for CDMA modems in accordance with one aspect of the present invention is described with reference to the drawing figures where like numerals represent like elements throughout. Such modems are used in multichannel wireless communication stations in conjunction with the transmission and reception of communication signals.

By way of background, many systems have the property of having their outputs at a given instant of time depend not only on the input at the time, but on the entire, or immediate history of the input. Such systems are said to have memory, averaging past and present samples in arriving at an output. It is necessary to separate systems with memory into the classes of discrete and continuous systems. A discrete system is one whose inputs and outputs are sequences of numerical values rather than continuous functions of time.

A sequence of discrete values can be represented as $x_k$, where the value x is a quantity such as voltage. The subscript k represents the sequence number. Very often in digital signal processing, $x_k$ represents a sampled waveform or signal where the subscript specifies the point in time at which the sample was taken. However, the subscript can represent an alternative meaning such as distance in a spatially sampled application. For a system to be physically realizable, the output must depend only on the present and past history of the input. No real system can have an output that depends on the future of the input. The dependence of the output of any physically realizable system on the input is indicated by:

$$y_k = f(x_k, x_{k-1}, x_{k-2}, \ldots, x_{k-n}) \quad \text{Equation (52)}$$

where the input variables are $x_k$, the output variable is $y_k$, and f(*) is any arbitrary function of n+1 variables. Although this function is too broadly defined to be analyzed in general, the subset of linear operations becomes very useful for a plurality of signal processing applications. These functions also prove to be much more tractable in analysis.

If the output depends on the previous n samples of the input (a system having a finite memory) in a linear fashion, Equation (1) can be written as:

$$y_k = \sum_{j=0}^{N} a_j x_{k-j} + b \quad \text{Equation (53)}$$

Such a linear system is characterized by the N+1 weighting variables $a_j$, and by the bias b. An unbiased, discrete linear system is characterized by the weighting variables ($a_0$, $a_1, \ldots, a_n$). If the input $x_k$ is a delta function (unity for one sample and zero for all others), it can be seen that the output of Equation (2) is the sequence of weighting variables $a_0$, $a_1, \ldots, a_n$. Therefore, the response to the input completely characterizes an unbiased, linear system.

Figure 72:
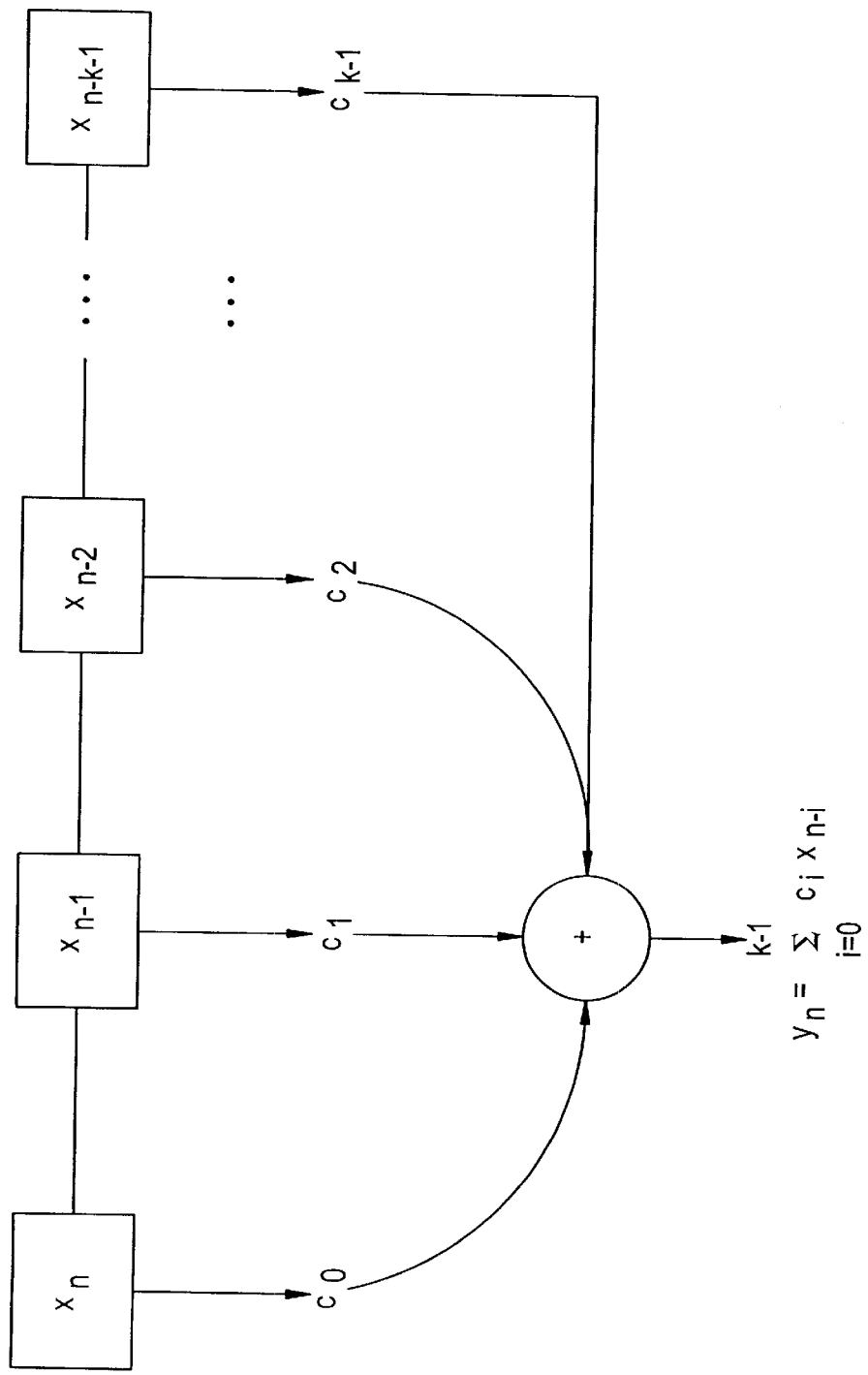
FIG. 72 is a block diagram of a prior art single input FIR filter.

There are certain types of linear systems with memory that can be analyzed using linear techniques. Even though digital signal processing is discrete by nature, if the input is samples of a continuous input and is sampled sufficiently fast, it is possible to simulate a continuous system using the samples as the input variables. The output then appears as a linear system with a long memory. One such system is a FIR filter 7020. A fixed coefficient FIR filter is characterized by the input/output Equation 54 as follows:

$$y_k = \sum_{j=0}^{N-1} c_i x_{k-j} \quad \text{Equation (54)}$$

as shown in FIG. 72, or expanded as $$y_k = c_0 x_k + c_1 x_{k-1} + \ldots + c_{k-1} x_{k-(N-1)} \quad \text{Equation (55)}$$

where the FIR filter has an impulse response $c_0, c_1, \ldots ; x_k$ represents the discrete input signal samples at time k; $c_i$ are the filter coefficient weights; N are the number of taps; and $y_k$ represents the output at time k. As shown in FIG. 72, the block diagram forms a tapped delay line with the coefficients being known as tap weights.

Figure 73:
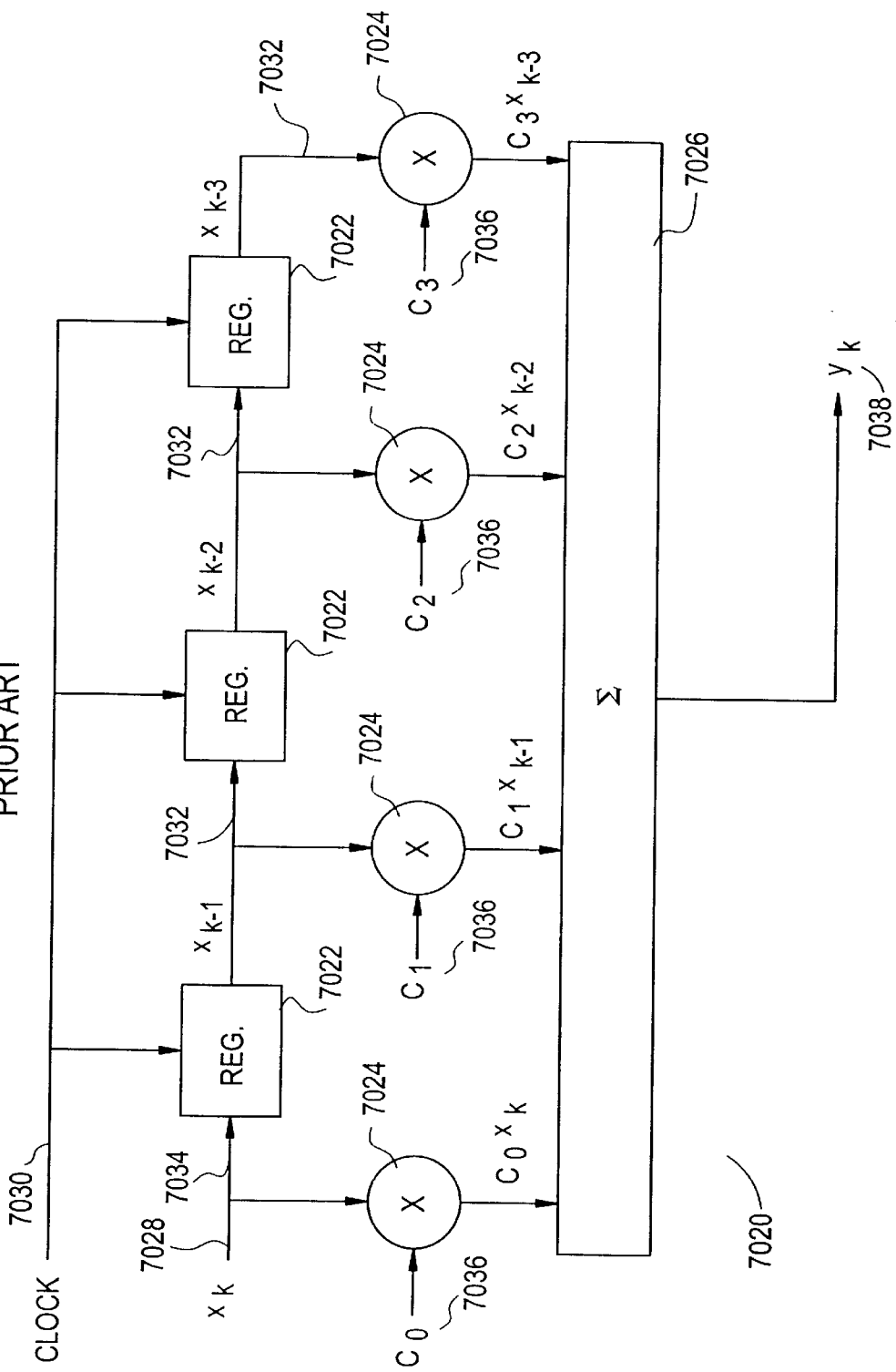
FIG. 73 is a block diagram of a prior art single input FIR filter structure.

Digital filters are presently a common requirement for digital signal processing systems. In the field of discrete systems, the most popular type of digital filter using convolution is the FIR. FIR filters have two advantages. The first is that FIR filters are inherently stable. The finite length of the impulse response guarantees that the output will go to zero within N samples. The second advantage is that FIR filters can be designed and implemented. The FIR filter 7020 can be physically realized by using digital shift registers 7022, multipliers 7024 and summers 7026 as shown in FIG. 73. The discrete signals 7028 are shifted into registers 7022 by a sampling clock pulse 7030. The registers 7022 hold past values 7032 of the sampled signal 7028 as well as present values 7034 required for mathematical convolution. The past 7032 and present 7034 values are multiplied 7024 by filter weighting coefficients 7036, summed 7026 and then output 7038.

Figure 74:
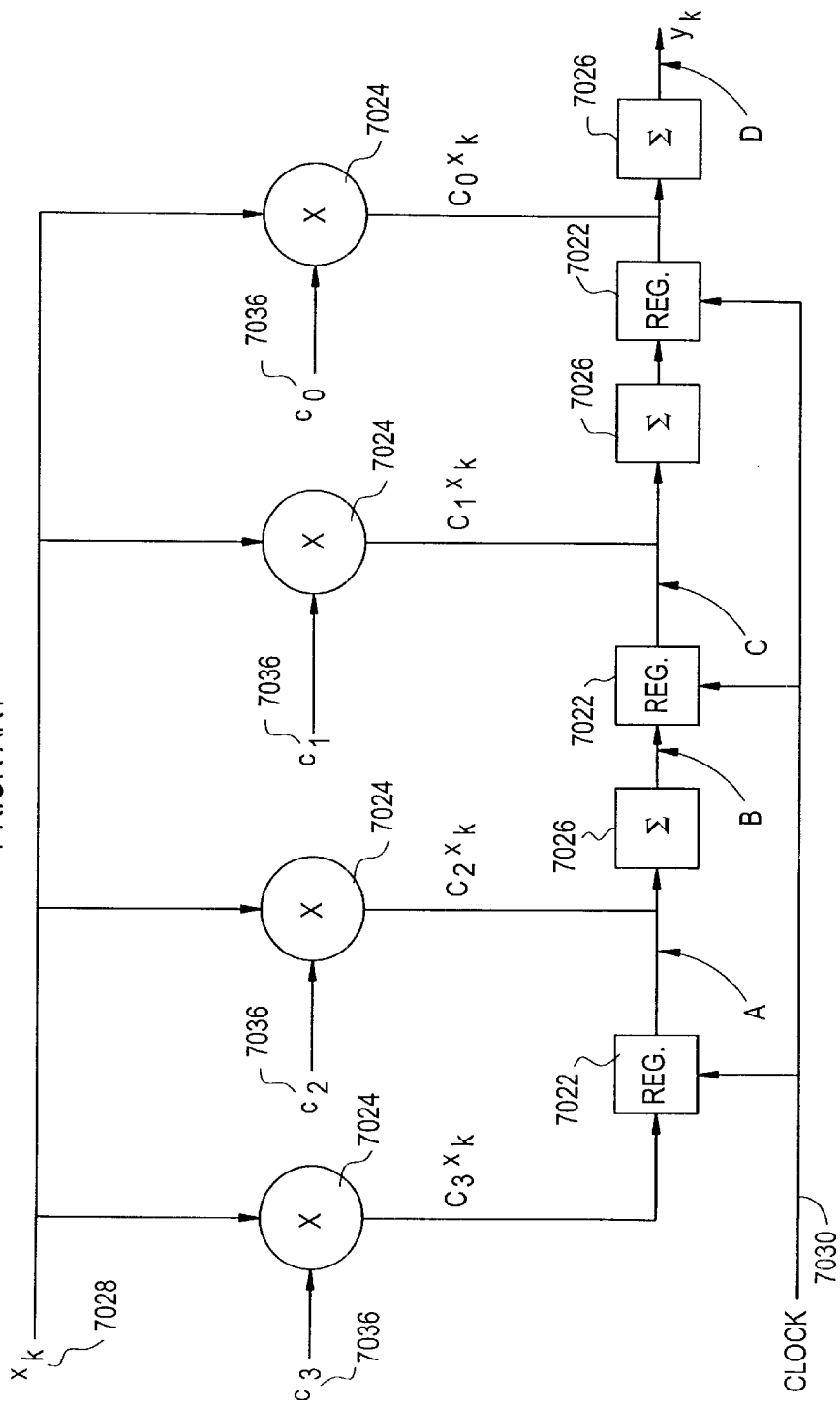
FIG. 74 is a block diagram of an alternative implementation of a prior art, single input FIR filter structure.

Another way of representing a FIR filter structure 7020 is shown in FIG. 74. The operation described can be shown to be the equivalent of FIG. 73 since:

$$A = c_3 x_{k-1} \quad \text{Equation (56)}$$

$$B = c_3 x_{k-1} + c_2 x_k \quad \text{Equation (57)}$$

$$C = c_3 x_{k-2} + c_2 x_{k-1} \quad \text{Equation (58)}$$

resulting in $$D = y_k = c_3 x_{k-3} + c_2 x_{k-2} + c_1 x_{k-1} + c_0 x_k \quad \text{Equation (59)}$$

$$= \sum_{j=0}^{3} c_j x_{k-j}$$

$$= c_k * x_k$$

As can be seen in FIGS. 73 and 74 the weighting 7036 of the discrete input samples 7028 relies upon many multipliers 7024.

Figure 75A:
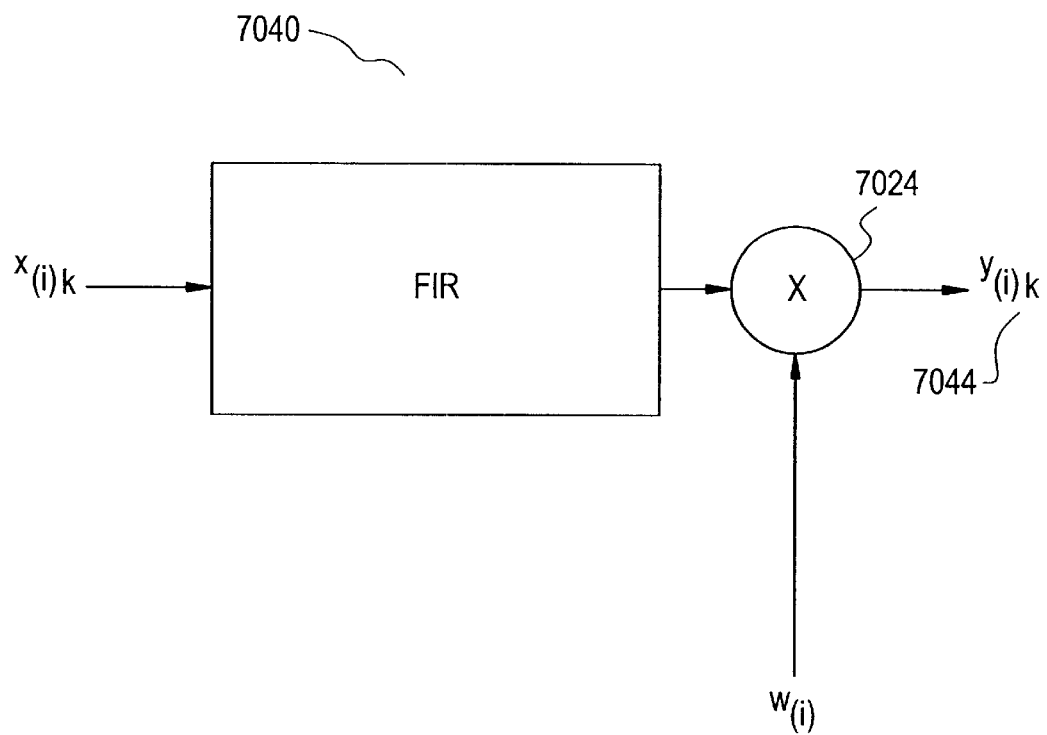
FIG. 75A is a block diagram of a single channel of a multichannel FIR filter.

A single channel of a multichannel FIR filter 7040 for CDMA modems is shown in simplified form in FIG. 75A. The multichannel FIR filter 7040 is shown as a single element with a multichannel input sequence $x_{(i)k}$ entering the filter 7040 and the filtered result $y_{(i)k}$ exiting. The subscript "i" identifies which channel from a plurality channels is being filtered. The multiple single bit data/signal streams represent serial data streams that have been modulated with a pseudo noise (PN) spreading code. Each channel could represent user traffic channels at various data rates. Various types of signaling data might comprise other channels.

A typical example of an integrated service digital network (ISDN) CDMA modem would require five channels. Two channels would be 64 kbps traffic channels (B1 and B2), a 16 kbps auxiliary signaling and packet channel (D), an order wire channel (OW), and a reverse automatic power control channel (APC).

For maximum user capacity in a CDMA system it is necessary to use the minimum amount of power to achieve the required BER. Each channel must have the appropriate individual weight applied so that the correct relative amplitudes are transmitted. After the weighting operation the individual data streams become multibit values. The data streams are summed together in a large digital summing circuit that consists of a tree of numerous two input adders. The weighted and summed digital values are then filtered in a conventional FIR filter. The FIR filter is required to pulse shape the input waveforms while suppressing out-of-band emissions. The multipliers in the FIR must handle the multibit data and coefficients to the desired precision.

In FIG. 75B, four signal channels are input individually into separate FIR filters 7020, (the clock signal has been omitted for clarity). The individually filtered signals are then weighted using multipliers 7024 with a channel specific weighting coefficient 7037 $w_{(i)}$ for power control, equalizing the power or gain between individual channels, before being input to a multichannel summer 7046. Since all users occupy the same frequency spectrum and time allocation in spread spectrum communication systems, it is desired that each user is received with the same power level. The result, $y_{(i)k}$ 7044, is a weighted sum of the individually FIR filtered multiple signal channels.

A CDMA transmitter combines many channels of varying types of digital signals (serial digital voice, power control, ISDN data). Typically, each channel is modulated with a different spreading code. The spreading code allows a CDMA receiver to recover the combined-signals by use of the proper code during demodulation. Alternatively, any set of orthogonal functions could be combined with the preferred embodiment and later separated by correlation.

The output 7044 of the multichannel FIR filter 7040 is a weighted and filtered average. Although each channel has been described as a single bit valued serial data stream, multi-bit values or levels may be processed with the identical multichannel filter structure.

Figure 76:
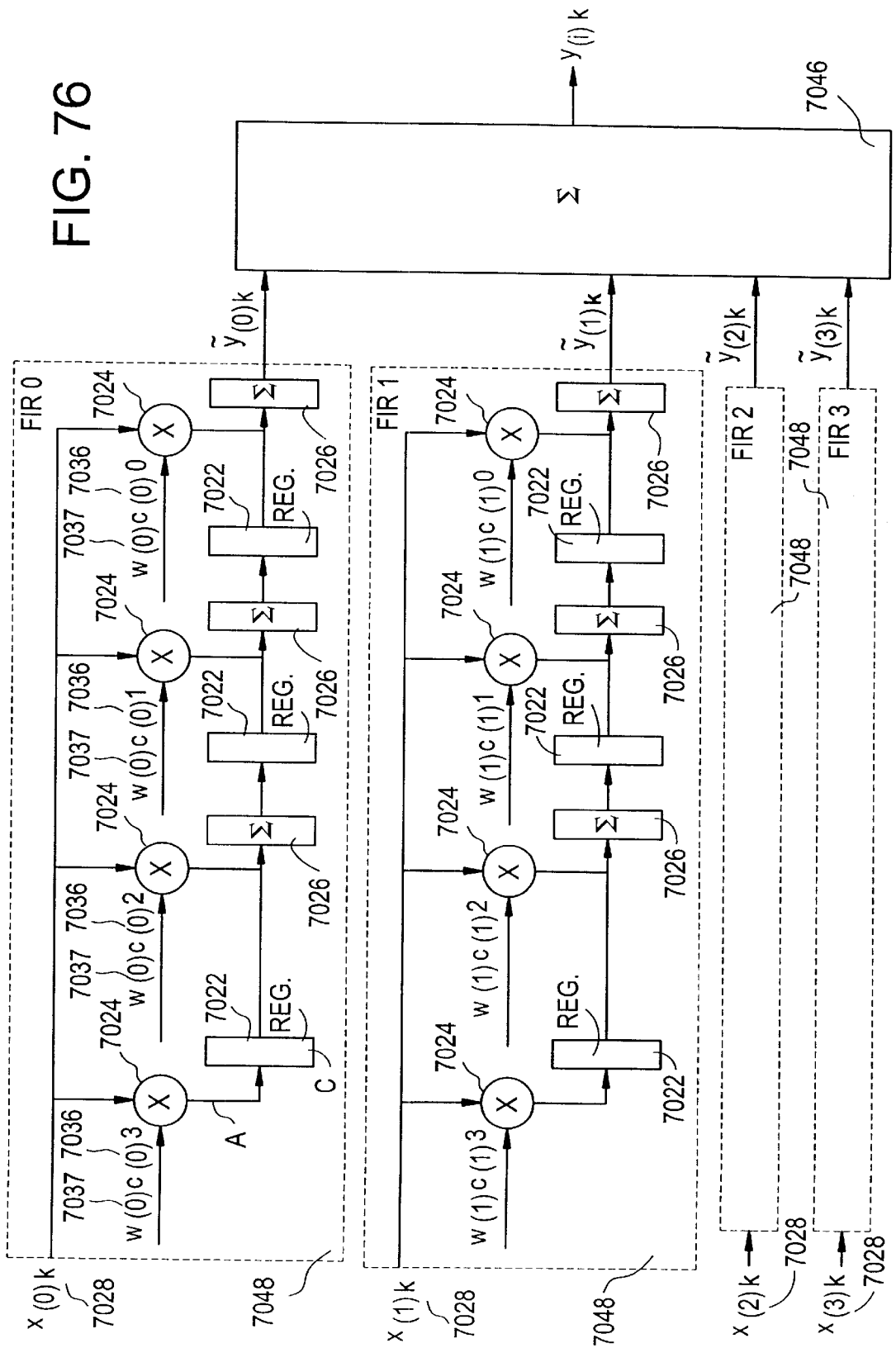
FIG. 76 is a block diagram showing a first refinement.

Referencing FIG. 76, the multichannel FIR filter 7040 is shown using four tap FIR filters 7048. The weighting of the discrete samples is performed by conventional multipliers 7024. Each FIR structure is comprised of shift registers 7022 and summers 7026 for past 7032 and present 7034 sampled signals. Each tap weight coefficient 7036 is multiplied by the respective channel power control weighting factor 7037. The result is the same as shown in FIG. 75B, but with the external multipliers inside the FIR 7048 structures.

Figure 77:
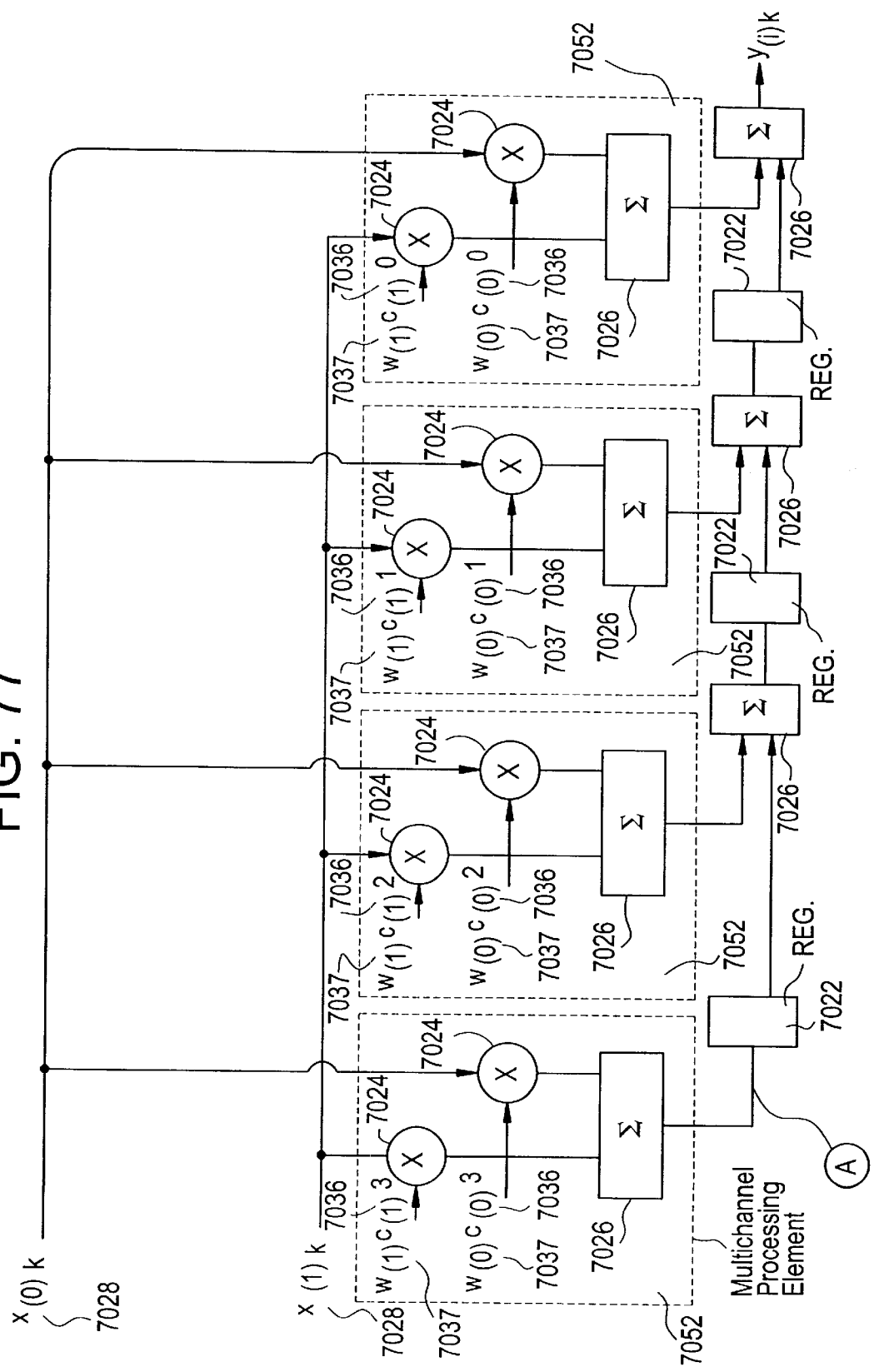
FIG. 77 is a block diagram showing a second refinement.

Hardware reduction is accomplished by sharing FIR registers and adders as shown in FIG. 77. Each multichannel processing element 7052 performs part of the channel weighting 7037, the FIR tap coefficient 7036 multiply 7024, and the summing 7026 of the multiple channels for that tap. The partitioning of the discrete functions reveals the preferred embodiment.

Figure 78:
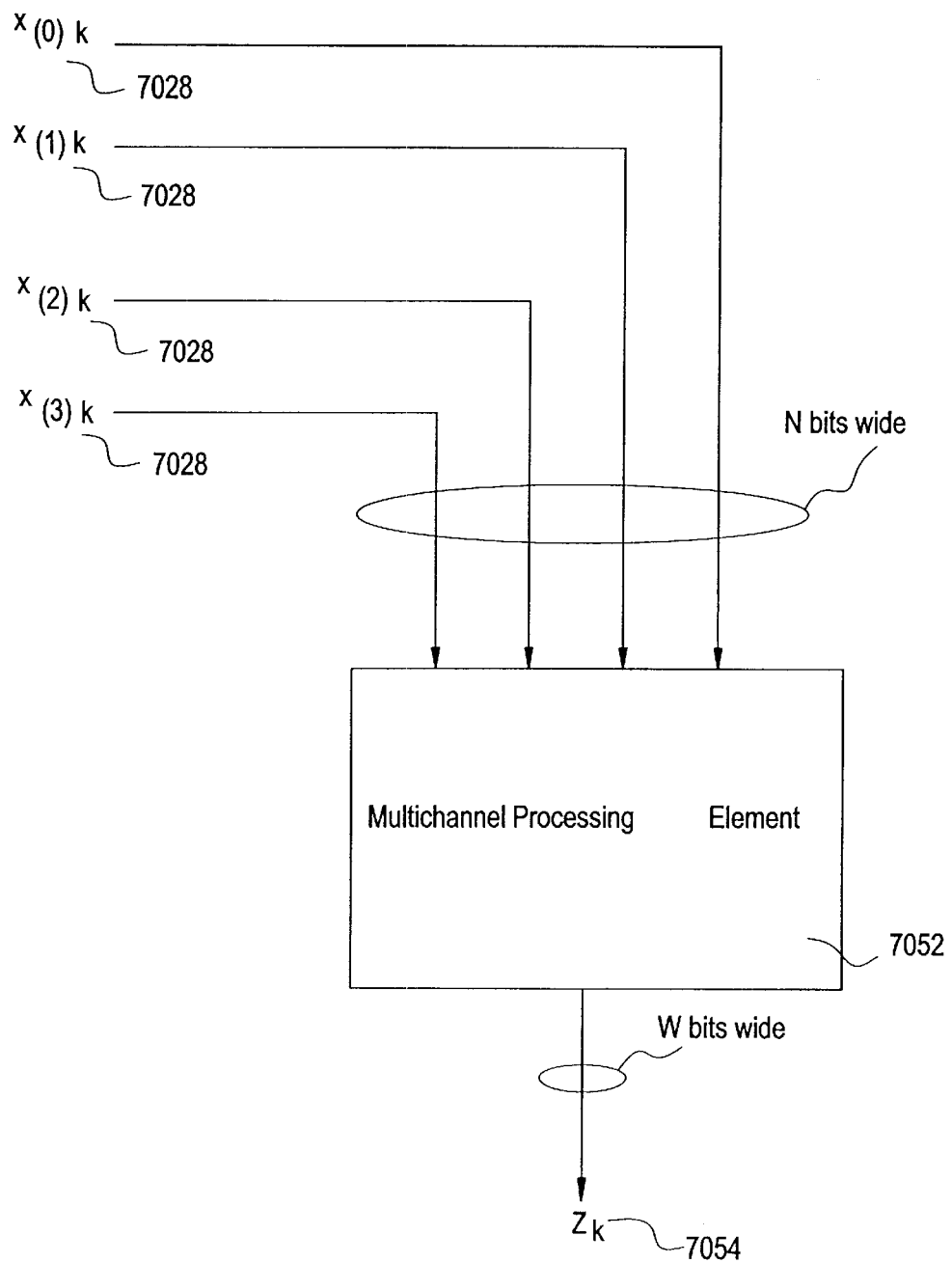
FIG. 78 is a block diagram of the multichannel processing element.
Figure 79A:
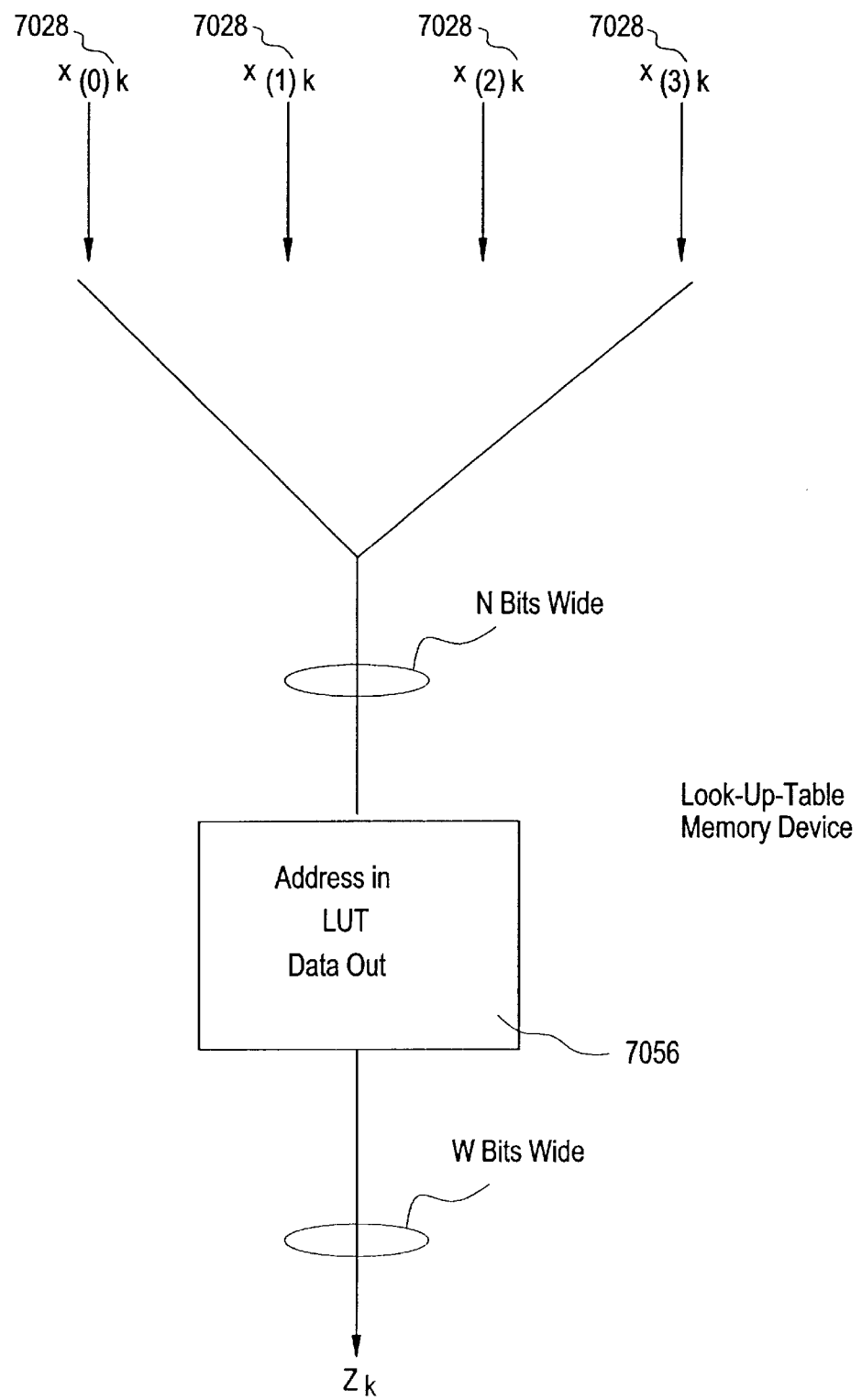
FIG. 79A is a global block diagram of a LUT table.

FIG. 78 shows the multichannel processing element 7052 as a processing block with "N" single bit input signals $x_{(o)k}$, $x_{(1)k}, \ldots, x_{(N)k}$. The computed output $z_k$ 7054 contains "W" bits of resolution. The discrete input signals 7028 form a vector. This vector can be assigned an overall value by weighting each bit with an increasing power of two. In the alternative, the multichannel signal bits are treated as a binary valued word. The output of the processing block is a "W" bit wide function of the N bit binary input argument. The block performs the equivalent logical function of a memory device where the input signal bits form an address and the computed values are contents of the selected memory word. A memory based LUT 7056 can perform an arbitrary function quickly and efficiently as shown in FIG. 79A.

A mathematical function f of an argument x with a result of y is expressed as y=f(x). The function performs a mapping of all values of x into another space of y values. A LUT performs this mapping for the values of interest in the preferred embodiment. The LUT memory device is presented with an address of a location within the memory circuit. The value previously stored at that location is delivered to the memory output data bus. The values of interest of x, which are discrete, are mapped into a binary number. Since the multichannel signals are represented by zero or one logic levels, they are used as bits to form a binary number. Every possible combination of channel values is therefore assigned a state number. This operation is represented as:

$$\sum_{j=0}^{M-1} x_j 2^j = x_{M-1} 2^{M-1} + \ldots x_3 2^3 + x_2 2^2 + x_1 2^1 + x$$

$$= x_{M-1} 2^{M-1} + \ldots x_3 8 + x_2 4 + x_1 2 + x_0$$

Equation (60)

Each state is a binary number that references an address in the LUT. The output value from the LUT is the precomputed value of the function resultant that would occur given the argument corresponding to that address. This is illustrated as a tabular representation of the LUT contents. The function to be performed is the weighted sum of the multiple channels for a given single tap of the FIR structure.

For example, in an application using 4 channels (M=4), the LUT contents located at the 2nd tap of the multichannel FIR (j=2) would be as shown in Table 16.

TABLE 16

| Values of x $x_3, x_2, x_1, x_0$ | Address Computation of A | LUT Value Stored At Location A |
|---|---|---|
| 0000 | 0 | 0 |
| 0001 | 1 = 1 | $w_0 c_2$ |
| 0010 | 2 = 2 | $w_1 c_2$ |
| 0011 | 2 + 1 = 3 | $w_1 c_2 + w_0 c_2$ |
| 0100 | 4 = 4 | $w_2 c_2$ |
| 0101 | 4 + 1 = 5 | $w_2 c_2 + w_0 c_2$ |
| ... | ... | ... |
| ... | ... | ... |
| ... | ... | ... |
| 1101 | 8 + 4 + 1 = 13 | $w_3 c_2 + w_2 c_2 + w_0 c_2$ |
| 1110 | 8 + 4 + 2 = 14 | $w_3 c_2 + w_2 c_2 + w_1 c_2$ |
| 1111 | 8 + 4 + 2 + 1 = 15 | $w_3 c_2 + w_2 c_2 + w_1 c_2 + w_0 c_2$ |

Figure 79B:
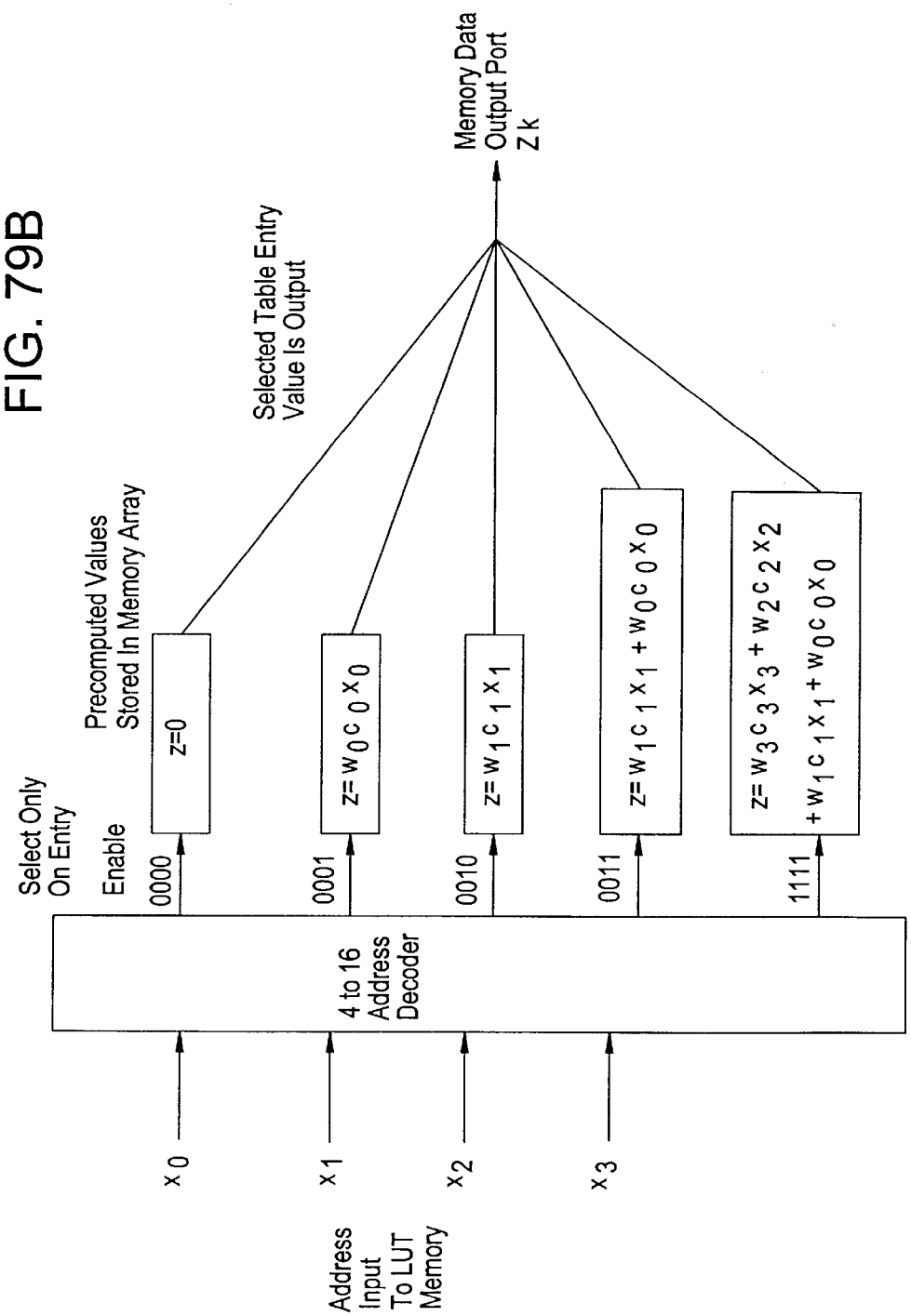
FIG. 79B is a detailed block diagram showing the multichannel LUT input of the present invention.

The LUT 7056 memory words contain precomputed values corresponding to the current input address value as shown in FIG. 79B. The memory can be implemented in either ROM or RAM, depending upon the application.

In the preferred embodiment, ROM (read only memory) is used to store permanent LUT values. This is implemented efficiently as an integrated circuit. ROM is appropriate for time invariant systems where the required channel weights and filter coefficients are known a priori. RAM (random access memory) allows new values to be written over old. LUT values can be computed and loaded to achieve adaptivity. RAM is not as space efficient as ROM but is still efficient considering the increased flexibility.

Figure 80:
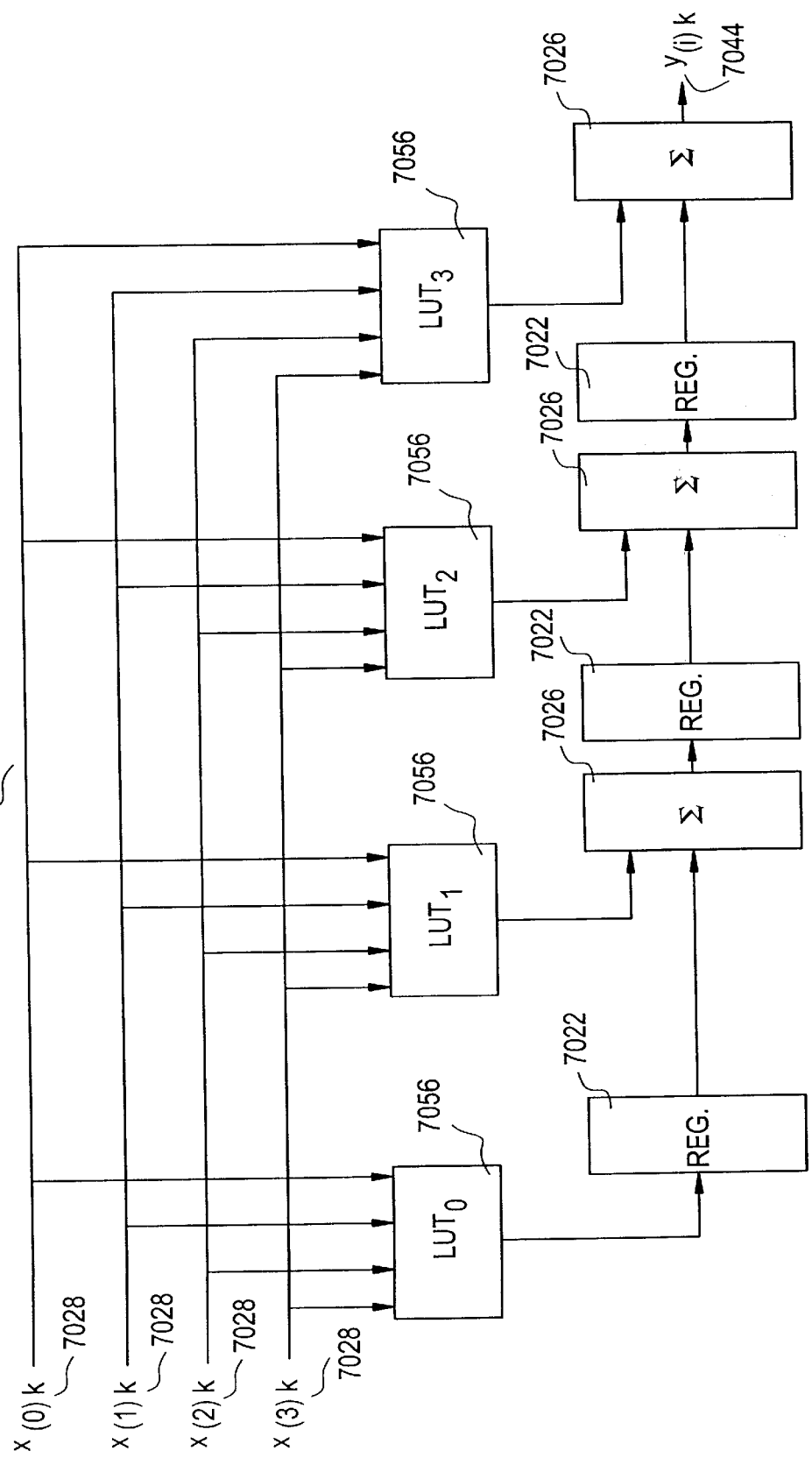
FIG. 80 is a detailed block diagram of an embodiment of the present invention.

The preferred embodiment of the multichannel FIR filter 7040 for CDMA modems according to the present invention is shown in FIG. 80. The filter structure uses LUTs 7056 rather than the inefficient multichannel processing elements 7052 which require a plurality of multipliers 7024 and summers 7026.

The signal bits form the address word which is applied to the LUT 7056. There is a LUT 7056 for each filter tap required. The contents of each LUT 7056 is computed as:

$$L_j(D_N, D_{N-1} \ldots, D_2, D_1) = C_j \sum_{i=1}^{N} D_i W_i$$

Equation (61)

As shown, any combination of signal values has its weighted sum precomputed. The multiplication of each tap coefficient of the FIR function is included in the precomputed table.

The weighted and filtered single channel operation of FIG. 75A with and N tap FIR can be expressed as $$y_{(i)k} = w_i \sum_{j=0}^{N-1} c_{(i)j} x_{(i)k-j} = w_i [c_{(i)j} * x_{(i)j}] \quad \text{Equation (62)}$$

An M channel multichannel version of this is shown in FIG. 75B and can be expressed as $$y_{(i)k} = \sum_{i=0}^{M-1} y_{(i)k} = \sum_{i=0}^{M-1} \left( w_i \sum_{j=0}^{M-1} c_{(i)j} x_{(i)k-j} \right) \quad \text{Equation (63)}$$

$$y_{(i)k} = \sum_{i=0}^{M-1} w_i [c_{(i)j} * x_{(i)j}] \quad \text{Equation (64)}$$

This is the desired weighted sum of convolutions or FIR filtering operations. The convolution is performed in FIR filters 7020, the weighting in multipliers 7024 and the summation in adders 7046. The convolution achieved is identical to that originally presented in Equation 74. The summation and weights are a result of the extension to a multichannel process.

The preferred embodiment shows an improved filter for multichannel CDMA FIR filtering modem applications. It has been shown that the signal processing operation over multiple channels, as shown in FIGS. 75A and 75B, can be implemented using no multipliers and a reduced number of adders.

While the present invention has been described in terms of the preferred embodiment, other variations which are within the scope of the invention as outlined in the claims below will be apparent to those skilled in the art.

What is claimed is:

1. A pilot adaptive vector correlator for correcting phase rotation of a plurality of received-multipath signals of a spread-spectrum signal having a pilot-spreading-code signal, comprising:

pilot-despreading means for generating a plurality of replicas of the pilot-spreading-code signal, with each of the plurality of replicas of the pilot-spreading-code signal having a different phase, said pilot-despreading means for despreading, using the plurality of replicas of the pilot-spreading-code signal, the plurality of received-multipath signals of the spread-spectrum signal as a plurality of despread-multipath signals;

said pilot-despreading means thereby generating a noise-power level when each pilot-spreading-code signal embedded in each of the plurality of received-multipath signals of the spread-spectrum signal is not in phase with any of the plurality of replicas of the pilot-spreading-code signal;

said pilot-despreading means thereby generating one or more detected-pilot signals, when one or more pilot-spreading-code signals embedded in the received-multipath signals of the spread-spectrum signal is in phase with one or more of the plurality of replicas of the pilot-spreading-code signal, respectively;

a pilot adder for combining a plurality of weighted-despread-multipath signals, as a combined-pilot signal;

phase-locked means, coupled to said pilot adder, for phase locking to the combined-pilot signal and for generating, from the phase-locked combined-pilot signal, a derotation-phaser signal;

correction means, coupled between said pilot-despreading means, said phase-locked means and said pilot adder, for multiplying and filtering each of the plurality of despread-multipath signals by the derotation-phaser signal, thereby generating a plurality of weighting signals, respectively;

said correction means for multiplying the plurality of despread-multipath signals by the plurality of weighting signals, to generate the plurality of weighted-despread-multipath signals, respectively;

acquisition-decision means, coupled to said pilot-despreading means, responsive to the one or more detected-pilot signals from said pilot-despreading means, for determining whether the one or more detected-pilot signals are synchronized to one or more of the plurality of replicas of the pilot-spreading-code signal;

said acquisition-decision means, responsive to detecting no synchronization, for sending a control signal to said pilot-despreading means, for offsetting the phase of one or more of the plurality of replicas of the pilot-spreading-code signals; and said acquisition-decision means, responsive to detecting synchronization, for maintaining synchronization between the plurality of received-multipath signals and the plurality of replicas of the pilot-spreading-code signal.

2. The adaptive vector correlator as set forth in claim 1, for correcting phase rotation of a plurality of received-message-multipath signals of a message-spread-spectrum signal having a message-spreading-code signal, comprising:

message-despreading means for generating a plurality of replicas of the message-spreading-code signal, with the plurality of replicas of the message-spreading-code signal synchronized to the plurality of replicas of the pilot-spreading code signal, with each of the plurality of replicas of the message-spreading-code signal having a different phase, said message-despreading means for despreading, using the plurality of replicas of the message-spreading-code signal, the plurality of received-message-multipath signals of the message-spread-spectrum signal as a plurality of despread-message-multipath signals;

said message-despreading means thereby generating one or more detected-message signals, when one or more message-spreading-code signals embedded in the received-message-multipath signals of the message-spread-spectrum signal is in phase with one or more of the plurality of replicas of the message-spreading-code signal, respectively;

message-correction means, coupled to said pilot-correction means, for multiplying the plurality of despread-message-multipath signals by the plurality of weighting signals, to generate a plurality of weighted-despread-message signals, respectively; and a message adder for combining the plurality of weighted-despread-message signals as a combined-message.

3. The pilot adaptive vector correlator as set forth in claim 1 or 2, with said pilot despreading means including:

a code generator for generating the plurality of replicas of the pilot-spreading-code signal;

a plurality of correlators, coupled to said code generator, with each of the plurality of correlators using one of the plurality of replica of the pilot-spreading-code signal, said plurality of correlators for correlating the spread-spectrum signal with the plurality of replicas of the pilot-spreading-code signal;

said plurality of correlators thereby generating the noise-power level when each pilot-spreading-code signal embedded in each of the plurality of received-multipath signals of the spread-spectrum signal is not in phase with any of the plurality of replicas of the pilot-spreading-code signal; and said plurality of correlators for generating one or more detected-pilot signals and the noise-power level, when one or more pilot-spreading-code signals embedded in the received-multipath signals of the spread-spectrum signal is in phase with one or more of the plurality of replicas of the pilot-spreading-code signal, respectively.

4. The adaptive vector correlator as set forth in claim 1 or 2, with said pilot despreading means including a plurality of correlators for correlating the spread-spectrum signal with a plurality of phases of the plurality of replicas of the pilot-spreading-code signal, respectively.

5. The adaptive vector correlator as set forth in claim 1 or 2, with said pilot adder including means for adding the plurality of weighted-despread-multipath signals as the combined-pilot signal.

6. The adaptive vector correlator as set forth in claim 3, with said pilot adder including means for adding the plurality of weighted-despread-multipath signals as the combined-pilot signal.

7. The adaptive vector correlator as set forth in claim 4, with said pilot adder including means for adding the plurality of weighted-despread-multipath signals as the combined-pilot signal.

8. The adaptive vector correlator as set forth in claim 2, with said message adder including means for adding the plurality of weighted-despread-message signals as the combined-message signal.

9. The adaptive vector correlator as set forth in claim 3, with said message adder including means for adding the plurality of weighted-despread-message signals as the combined-message signal.

10. The adaptive vector correlator as set forth in claim 4, with said message adder including means for adding the plurality of weighted-despread-message signals as the combined-message signal.

11. A pilot adaptive vector correlator for correcting phase rotation of a plurality of received multipath signals of a spread-spectrum signal having a pilot-spreading-code signal, comprising:

a pilot-code generator for generating a plurality of replicas of the pilot-spreading-code signal, with each of the plurality of replicas of the pilot-spreading-code signal having a different phase;

a plurality of pilot-correlators, coupled to said pilot-code generator, for despreading, using the plurality of replicas of the pilot-spreading-code signal, the plurality of received-multipath signals of the spread-spectrum signal as a plurality of despread-multipath signals;

said plurality of pilot-correlators thereby generating a noise-power level when each pilot-spreading-code signal embedded in each of the plurality of received-multipath signals of the spread-spectrum signal is not in phase with any of the plurality of replicas of the pilot-spreading-code signal;

said plurality of pilot-correlators thereby generating one or more detected-pilot signals, when one or more pilot-spreading-code signals embedded in the received-multipath signals of the spread-spectrum signal is in phase with one or more of the plurality of replicas of the pilot-spreading-code signal, respectively;

a pilot adder for combining a plurality of weighted-despread-multipath signals, as a combined-pilot signal;

a phase-locked-loop (PLL) circuit, coupled to said pilot adder, for phase locking to the combined-pilot signal and for generating, from the phase-locked combined-pilot signal, a derotation-phaser signal;

a correction circuit, coupled between said plurality of pilot-correlators, said PLL circuit and said pilot adder, for multiplying and filtering each of the plurality of despread-multipath signals by the derotation-phaser signal, to generate a plurality of weighting signals, respectively;

said correction circuit for multiplying the plurality of despread-multipath signals by the plurality of weighting signals, to generate the plurality of weighted-despread-multipath signals, respectively;

an acquisition-decision circuit, coupled to said plurality of pilot-correlators, responsive to the one or more detected-pilot signals from said plurality of pilot-correlators, for determining whether the one or more detected-pilot signals are synchronized to one or more of the plurality of replicas of the pilot-spreading-code signal;

said acquisition-decision circuit, responsive to detecting no synchronization, for sending a control signal to said plurality of pilot-correlators, for offsetting the phase of one or more of the plurality of replicas of the pilot-spreading-code signals; and said acquisition-decision circuit, responsive to detecting synchronization, for maintaining synchronization between the plurality of received-multipath signals and the plurality of replicas of the pilot-spreading-code signal.

12. The adaptive vector correlator as set forth in claim 11, for correcting phase rotation of a plurality of received-message-multipath signals of a message-spread-spectrum signal having a message-spreading-code signal, comprising:

a message-code generator for generating a plurality of replicas of the message-spreading-code signal, with the plurality of replicas of the message-spreading-code signal synchronized to the plurality of replicas of the pilot-spreading code signal, with each of the plurality of replicas of the message-spreading-code signal having a different phase;

a plurality of message correlators, coupled to said message-code generator, for despreading, using the plurality of replicas of the message-spreading-code signal, the plurality of received-message-multipath signals of the message-spread-spectrum signal as a plurality of despread-message-multipath signals;

said plurality of message correlators thereby generating one or more detected-message signals, when one or more message-spreading-code signals embedded in the received-message-multipath signals of the message-spread-spectrum signal is in phase with one or more of the plurality of replicas of the message-spreading-code signal, respectively;

a message-correction circuit, coupled to said plurality of message correlators, for multiplying the plurality of despread-message-multipath signals by the plurality of weighting signals, to generate a plurality of weighted-despread-message signals, respectively; and a message adder for combining the plurality of weighted-despread-message signals as a combined-message.

13. The adaptive vector correlator as set forth in claim 11 or 12, with said pilot adder including means for adding the plurality of weighted-despread-multipath signals as the combined-pilot signal.

14. The pilot adaptive vector correlator as set forth in claim 11 or 12, with said message adder including means for adding the plurality of weighted-despread-message signals as the combined-message signal.

15. A pilot adaptive vector correlation method for correcting phase rotation of a plurality of received multipath signals of a spread-spectrum signal having a pilot-spreading-code signal, comprising the steps of:

generating a plurality of replicas of the pilot-spreading-code signal, with each of the plurality of replicas of the pilot-spreading-code signal having a different phase;

despreading, using the plurality of replicas of the pilot-spreading-code signal, the plurality of received-multipath signals of the spread-spectrum signal as a plurality of despread-multipath signals;

generating a noise-power level when each pilot-spreading-code signal embedded in each of the plurality of received-multipath signals of the spread-spectrum signal is not in phase with any of the plurality of replicas of the pilot-spreading-code signal;

generating one or more detected-pilot signals, when one or more pilot-spreading-code signals embedded in the received-multipath signals of the spread-spectrum signal is in phase with one or more of the plurality of replicas of the pilot-spreading-code signal, respectively;

combining a plurality of weighted-despread-multipath signals, as a combined-pilot signal;

phase locking to the combined-pilot signal;

generating, from the phase-locked combined-pilot signal, a derotation-phaser signal;

multiplying and filtering each of the plurality of despread-multipath signals by the derotation-phaser signal, to generate a plurality of weighting signals, respectively;

multiplying the plurality of despread-multipath signals by the plurality of weighting signals, to generate the plurality of weighted-despread-multipath signals, respectively;

determining, from the one or more detected-pilot signals, whether the one or more detected-pilot signals are synchronized to one or more of the plurality of replicas of the pilot-spreading-code signal;

sending, in response to detecting no synchronization, a control signal for offsetting the phase of one or more of the plurality of replicas of the pilot-spreading-code signals; and maintaining, in response to detecting synchronization, synchronization between the plurality of received-multipath signals and the plurality of replicas of the pilot-spreading-code signal.

16. The method as set forth in claim 15, for correcting phase rotation of a plurality of received-message-multipath signals of a message-spread-spectrum signal having a message-spreading-code signal, further comprising the steps of:

generating a plurality of replicas of the message-spreading-code signal, with the plurality of replicas of the message-spreading-code signal synchronized to the plurality of replicas of the pilot-spreading code signal, with each of the plurality of replicas of the plurality of replicas of the message-spreading-code signal having a different phase;

despreading, using the plurality of replicas of the message-spreading-code signal, the plurality of received-message-multipath signals of the message-spread-spectrum signal as a plurality of despread-message-multipath signals;

generating one or more detected-message signals, when one or more message-spreading-code signals embedded in the received-message-multipath signals of the message-spread-spectrum signal is in phase with one or more of the plurality of replicas of the message-spreading-code signal, respectively;

multiplying the plurality of despread-message-multipath signals by the plurality of weighting signals, to generate a plurality of weighted-despread-message signals, respectively; and combining the plurality of weighted-despread-message signals as a combined-message.

17. The method as set forth in claim 15 or 16, with the step of combining the plurality of weighted-despread-multipath signals as a combined-pilot further including the step of adding the plurality of weighted-despread-multipath signals as a combined-pilot signal.

18. The method as set forth in claim 15 or 16, with the step of combining the plurality of weighted-despread-message signals as a combined-message further including the step of adding the plurality of weighted-despread-message signals as a combined-message.

* * * * *

UNITED STATES PATENT AND TRADEMARK OFFICE
CERTIFICATE OF CORRECTION

PATENT NO. : 6,456,608 B1
DATED : September 24, 2002
INVENTOR(S) : Gary R. Lomp

It is certified that error appears in the above-identified patent and that said Letters Patent is hereby corrected as shown below:

Title page,
Item [56], References Cited, U.S. PATENT DOCUMENTS, please delete
"6,229,043 B1 * 5/2001 Lomp et al. ..........375/150" and insert therefor:
-- 6,229,843 B1 * 5/2001 Lomp et al. ............375/150 --.

Drawings,
Please replace Figure 30 as follows:

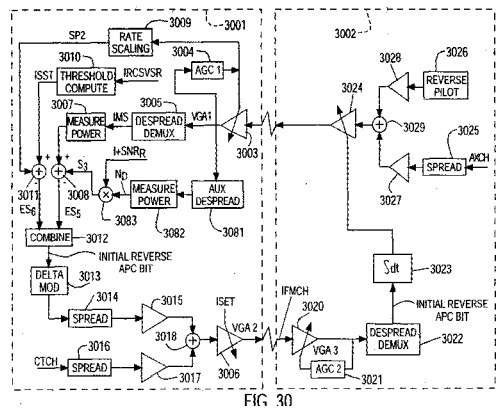

FIG. 30

Column 66,
Line 56, after the word "weights", delete "α, and Cα$_2$" and insert therefor -- α$_1$ and α$_2$ --.

Column 72,
Line 47, after "signals", insert therefor -- . --.

Signed and Sealed this

Seventeenth Day of August, 2004

JON W. DUDAS
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 6,456,608 B1 | |
| APPLICATION NO. | : 09/765048 | |
| DATED | : September 24, 2002 | |
| INVENTOR(S) | : Gary R. Lomp | |

It is certified that error appears in the above-identified patent and that said Letters Patent is hereby corrected as shown below:

ON THE TITLE PAGE

Item (63), Related U.S. Application Data, page 1, in the second and third lines of this section on page 1, left column, after "Pat. No. 6,215,778, which is a", delete "continuation" and insert --division--.

Item (63), Related U.S. Application Data, in the fourth line of this section on page 1, left column, after "now Pat. No. 5,799,010", delete all subsequent text in this section beginning with ", application No. 09/765,048" through and including "Pat. No. 5,754,803".

IN THE SPECIFICATION

At column 1, line 10, after "which is a", delete "continuation" and insert --division--.

At column 1, line 14, after "30, 1995.", delete from "This application" through and including "U.S. Pat. No. 5,754,803." on line 37.

Signed and Sealed this
First Day of September, 2015

Michelle K. Lee
*Director of the United States Patent and Trademark Office*